US012787309B2

(12) United States Patent
Tanaka et al.

(10) Patent No.: US 12,787,309 B2
(45) Date of Patent: Nov. 3, 2026

(54) SEMICONDUCTOR DEVICE AND METHOD FOR MANUFACTURING SAME

(71) Applicant: ROHM CO., LTD., Kyoto (JP)

(72) Inventors: Bungo Tanaka, Kyoto (JP); Keiji Wada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 303 days.

(21) Appl. No.: 18/744,752

(22) Filed: Jun. 17, 2024

(65) Prior Publication Data

US 2024/0339490 A1 Oct. 10, 2024

Related U.S. Application Data

(63) Continuation of application No. PCT/JP2022/041560, filed on Nov. 8, 2022.

(30) Foreign Application Priority Data

Dec. 17, 2021 (JP) ................................ 2021-204863
Dec. 17, 2021 (JP) ................................ 2021-204864
Dec. 24, 2021 (JP) ................................ 2021-210542

(51) Int. Cl.
*H10D 1/47* (2025.01)
*H10W 42/00* (2026.01)
*G01R 19/00* (2006.01)

(52) U.S. Cl.
CPC .............. *H10D 1/47* (2025.01); *H10W 42/00* (2026.01); *G01R 19/0084* (2013.01)

(58) Field of Classification Search
None
See application file for complete search history.

(56) References Cited

U.S. PATENT DOCUMENTS

2023/0069542 A1* 3/2023 Lo .......................... H10D 1/474

FOREIGN PATENT DOCUMENTS

JP 2016-136608 A 7/2016
JP 2017079254 A * 4/2017

OTHER PUBLICATIONS

International Search Report and Written Opinion mailed on Jan. 31, 2023, received for International Application No. PCT/JP2022/041560, filed on Nov. 8, 2022, 11 pages including English Translation.

* cited by examiner

*Primary Examiner* — Sue A Purvis
*Assistant Examiner* — Jordan M Klein
(74) *Attorney, Agent, or Firm* — XSENSUS LLP

(57) ABSTRACT

A semiconductor device includes a substrate, a lower insulating film that is formed on the substrate, a resistor that is formed on the lower insulating film, and an upper insulating film that is formed on the lower insulating film such as to cover the resistor. The lower insulating film includes a first nitride film and a first SiO-based insulating film that is formed on the first nitride film and the upper insulating film includes a second nitride film. The resistor is formed on the first SiO-based insulating film and a lower surface of a peripheral edge portion of the second nitride film is joined to an upper surface of the first nitride film.

16 Claims, 96 Drawing Sheets

5

SEMICONDUCTOR DEVICE AND METHOD FOR MANUFACTURING SAME

CROSS-REFERENCE TO RELATED APPLICATIONS

The present application is a continuation application of PCT Application No. PCT/JP2022/041560, filed on Nov. 8, 2022, which corresponds to Japanese Patent Application No. 2021-204863 and Japanese Patent Application No. 2021-204864 filed on Dec. 17, 2021, in the Japan Patent Office and Japanese Patent Application No. 2021-210542 filed on Dec. 24, 2021, in the Japan Patent Office, and the entire disclosures of these applications are incorporated herein by reference.

TECHNICAL FIELD

The present disclosure relates to a semiconductor device and a method for manufacturing the same.

BACKGROUND ART

As a vehicle driving battery installed in a hybrid vehicle or an electric automobile, that which is high in output voltage is used. Also, the output voltage of the vehicle driving battery is boosted and supplied to a motor drive circuit. Such a vehicle is thus provided with a voltage monitoring device (high voltage monitor) arranged to monitor the high voltage supplied to the motor drive circuit.

A voltage monitoring device constituted of a first chip that drops a signal of high voltage and a second chip that signal processes the signal dropped by the first chip is disclosed in Japanese Patent Application Publication No. 2016-136608 mentioned below. In Japanese Patent Application Publication No. 2016-136608, although a circuit diagram of a resistor circuit of the first chip is disclosed, a specific configuration of a plurality of resistor elements inside the first chip is not disclosed.

In Japanese Patent Application Publication No. 2017-79254 mentioned below, a structure of a single resistor element inside a first chip that drops a signal of high voltage is disclosed. Specifically, a first silicon oxide film is formed on a silicon substrate, a first nitride film is formed on the first silicon oxide film, and a thin film resistor portion is formed on the first nitride film. In a region excluding a peripheral edge portion on the first nitride film, a second silicon oxide film is formed such as to cover the thin film resistor portion.

A first lead-out electrode connected to one end portion of the thin film resistor portion and a second lead-out electrode connected to another end portion of the thin film resistor portion are formed on the second silicon oxide film. On the first nitride film, a second nitride film is formed such as to cover exposed surfaces of the first lead-out electrode, the second silicon oxide film, and the first nitride film. A first opening arranged to expose a portion of an upper surface of the first lead-out electrode and a second opening arranged to expose a portion of an upper surface of the second lead-out electrode are formed in the second nitride film. Contact portions arranged to connect an outer wiring are thereby formed in the first lead-out electrode and the second lead-out electrode.

DESCRIPTION OF EMBODIMENTS

[1] On the First Disclosure

Figure 1:
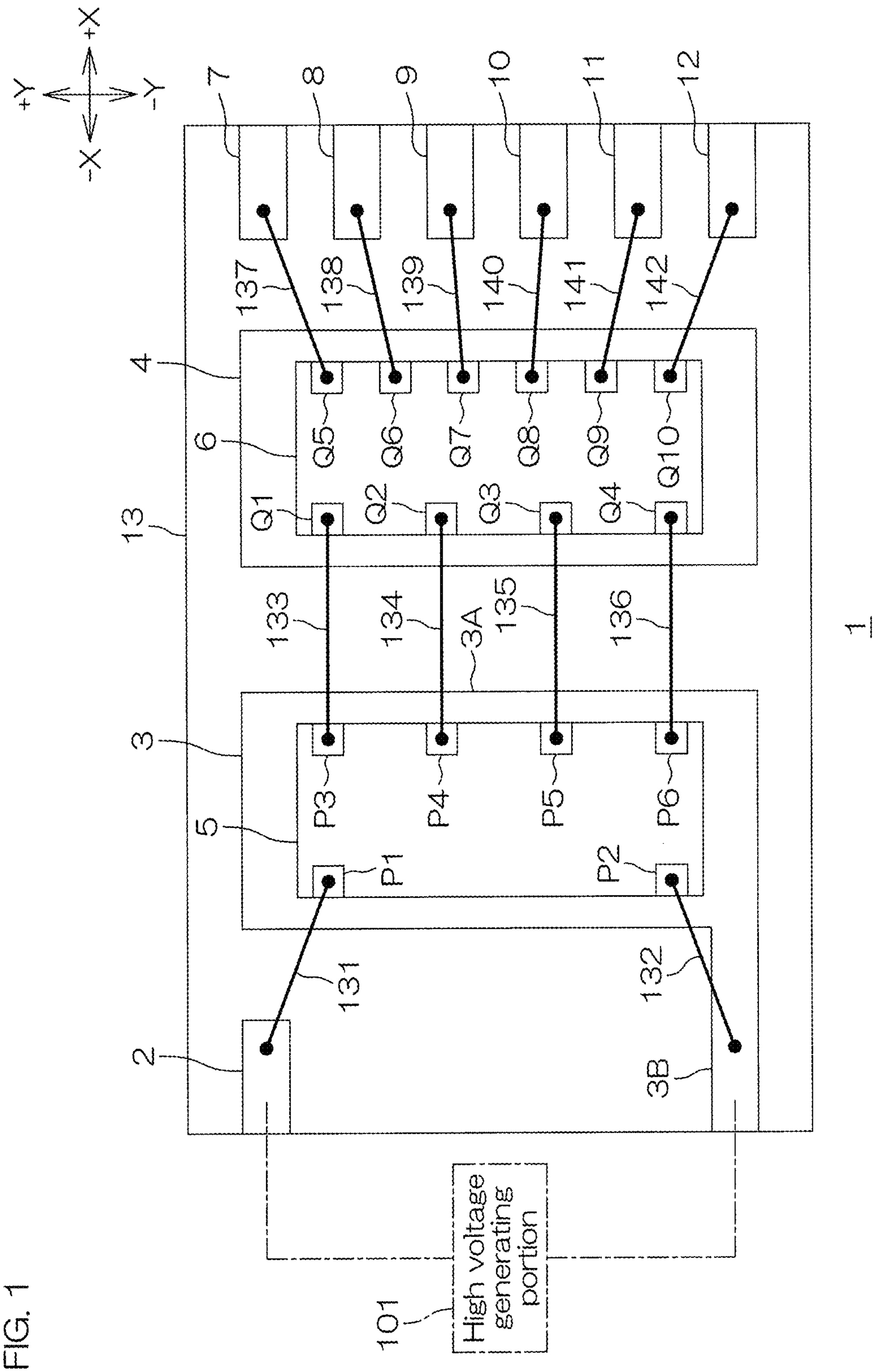
FIG. 1 is an illustrative plan view showing a semiconductor device according to a preferred embodiment of each of a first disclosure, a second disclosure, and a third disclosure.

A preferred embodiment of the first disclosure provides a semiconductor device including a substrate, a lower insulating film that is formed on the substrate, a resistor that is formed on the lower insulating film, and an upper insulating film that is formed on the lower insulating film such as to cover the resistor and where the lower insulating film includes a first nitride film and a first SiO-based insulating film that is formed on the first nitride film, the upper insulating film includes a second nitride film, the resistor is formed on the first SiO-based insulating film, and a lower surface of a peripheral edge portion of the second nitride film is joined to an upper surface of the first nitride film.

With this arrangement, a semiconductor device that includes a resistor and is a semiconductor device having a novel arrangement and enabling improvement of moisture resistance can be obtained.

In the preferred embodiment of the first disclosure, the lower insulating film includes an insulating film laminated structure that is formed on the substrate and in which a nitride film and an SiO-based insulating film are laminated alternately, a second SiO-based insulating film that is formed on the insulating film laminated structure, the first nitride film that is formed on the second SiO-based insulating film, and the first SiO-based insulating film that is formed in a region of the first nitride film upper surface excluding a peripheral edge portion and the resistor is formed on the first SiO-based insulating film.

In the preferred embodiment of the first disclosure, a first metal and a second metal that are formed on the insulating film laminated structure and are covered by the second SiO-based insulating film, a first via that penetrates through a laminated film of the second SiO-based insulating film, the first nitride film, and the first SiO-based insulating film and electrically connects the first metal and one end portion of the resistor, and a second via that penetrates through the laminated film and electrically connects the second metal and another end portion of the resistor are included.

In the preferred embodiment of the first disclosure, the upper insulating film includes a third SiO-based insulating film that is formed on the first SiO-based insulating film such as to cover the resistor and the second nitride film that is formed on the first nitride film such as to cover the third SiO-based insulating film.

In the preferred embodiment of the first disclosure, a third metal that is formed on the third SiO-based insulating film and is a third metal electrically connected to the first metal or the second metal via a third via that penetrates through a laminated film of the second SiO-based insulating film, the first nitride film, the first SiO-based insulating film, and the third SiO-based insulating film is included and the second nitride film is formed on the first nitride film such as to cover exposed surfaces of the third metal, the third SiO-based insulating film, the first SiO-based insulating film, and the first nitride film.

In the preferred embodiment of the first disclosure, an opening that exposes a portion of an upper surface of the third metal is formed in the second nitride film.

In the preferred embodiment of the first disclosure, the lower insulating film includes an insulating film laminated structure that is formed on the substrate and in which a nitride film and an SiO-based insulating film are laminated alternately, the first nitride film that is formed on the insulating film laminated structure, a fourth SiO-based insulating film that is formed in a region on the first nitride film excluding a peripheral edge portion, and a fifth SiO-based insulating film that is formed on the fourth SiO-based insulating film, the first SiO-based insulating film is constituted of the fourth SiO-based insulating film and the fifth SiO-based insulating film, and the resistor is formed on the fifth SiO-based insulating film.

In the preferred embodiment of the first disclosure, a first metal and a second metal that are formed on the fourth SiO-based insulating film and are covered by the fifth SiO-based insulating film, a first via that penetrates through the fifth SiO-based insulating film and electrically connects the first metal and one end portion of the resistor, and a second via that penetrates through the fifth SiO-based insulating film and electrically connects the second metal and another end portion of the resistor are included.

In the preferred embodiment of the first disclosure, the upper insulating film includes a sixth SiO-based insulating film that is formed on the fifth SiO-based insulating film such as to cover the resistor and the second nitride film that is formed on the first nitride film such as to cover the first SiO-based insulating film.

In the preferred embodiment of the first disclosure, a third metal that is formed on the sixth SiO-based insulating film and is a third metal electrically connected to the first metal or the second metal via a third via that penetrates through a laminated film of the fifth SiO-based insulating film and the sixth SiO-based insulating film is included and the second nitride film is formed on the first nitride film such as to cover exposed surfaces of the third metal, the sixth SiO-based insulating film, the fifth SiO-based insulating film, the fourth SiO-based insulating film, and the first nitride film.

In the preferred embodiment of the first disclosure, an opening that exposes a portion of an upper surface of the third metal is formed in the second nitride film.

In the preferred embodiment of the first disclosure, the lower insulating film includes a seventh Si-based insulating film that is formed on the substrate, the first nitride film that is formed on the seventh SiO-based insulating film, and the first SiO-based insulating film that is formed in a region of the first nitride film upper surface excluding a peripheral edge portion and the resistor is formed on the first SiO-based insulating film.

In the preferred embodiment of the first disclosure, the upper insulating film includes an eighth SiO-based insulating film that is formed on the first SiO-based insulating film such as to cover the resistor and the second nitride film that is formed on the eighth SiO-based insulating film.

In the preferred embodiment of the first disclosure, a first lead-out electrode that is formed on the eighth SiO-based insulating film and is electrically connected to one end portion of the resistor and a second lead-out electrode that is formed on the eighth SiO-based insulating film and is electrically connected to another end portion of the resistor are included and the second nitride film is formed on the first nitride film such as to cover exposed surfaces of the first lead-out electrode, the second lead-out electrode, the eighth SiO-based insulating film, the first SiO-based insulating film, and the first nitride film.

In the preferred embodiment of the first disclosure, a first opening that exposes a portion of an upper surface of the first lead-out electrode and a second opening that exposes a portion of an upper surface of the second lead-out electrode are formed in the second nitride film.

A preferred embodiment of the first disclosure provides a method for manufacturing a semiconductor device including a step of forming a lower insulating film on a substrate, a step of forming a resistor on the lower insulating film, and a step of forming an upper insulating film, including a second nitride film, on the lower insulating film such as to cover the resistor and where the step of forming the lower insulating film includes a step of forming a first nitride film on the substrate and a step of forming a first SiO-based insulating film on the first nitride film and, in the step of forming the upper insulating film, a lower surface of a peripheral edge portion of the second nitride film is joined to an upper surface of the first nitride film.

With this manufacturing method, a semiconductor device that includes a resistor and is a semiconductor device having a novel arrangement and enabling improvement of moisture resistance can be manufactured.

In the following, preferred embodiments of the first disclosure shall be described in detail based on FIG. 1 to FIG. 12.

Figure 2:
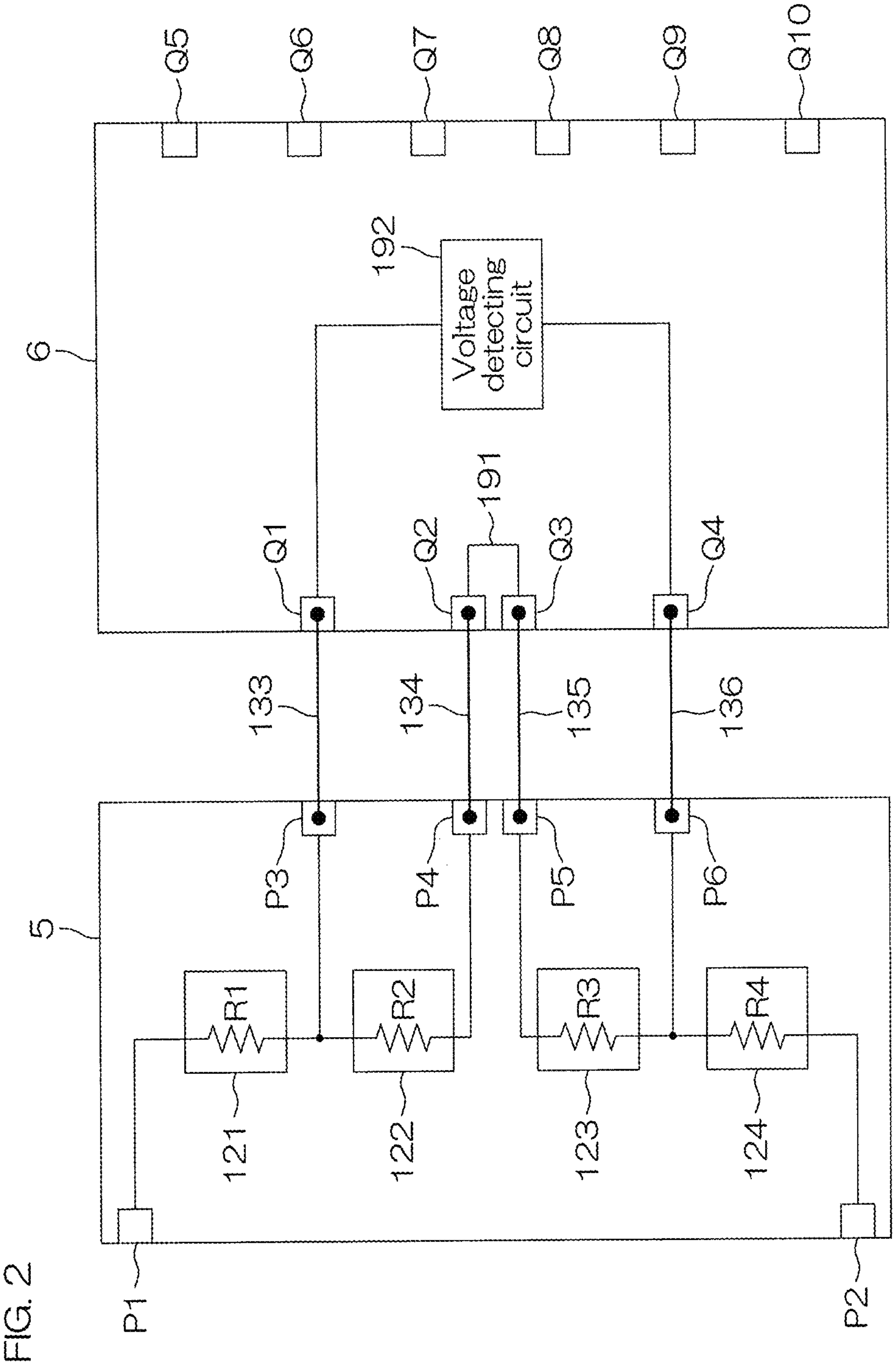
FIG. 2 is a schematic view mainly showing the general electrical arrangement of a first chip and the general electrical arrangement of a second chip.

FIG. 1 is an illustrative plan view showing a semiconductor device according to a preferred embodiment of the present invention. FIG. 2 is a schematic view mainly showing the general electrical arrangement of a first chip and the general electrical arrangement of a second chip.

Figure 3:
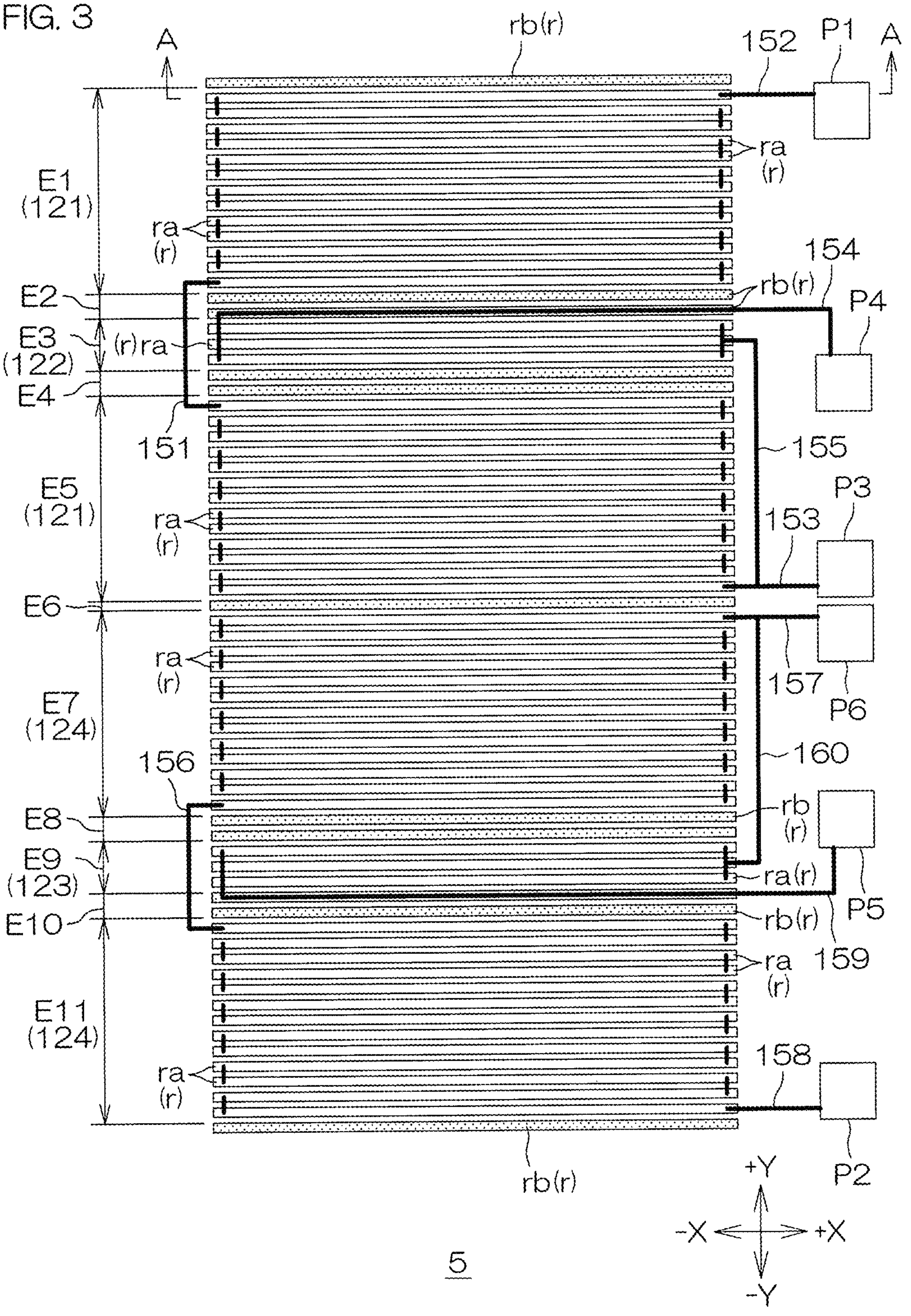
FIG. 3 is an illustrative plan view of the first chip.

For convenience of description, a +X direction, a −X direction, a +Y direction, and a −Y direction shown in FIG. 1 and FIG. 3 are used at times in the following description. The +X direction is a predetermined direction along a front surface of a semiconductor device 1 in plan view and the +Y direction is a direction along the front surface of the semiconductor device 1 in plan view and is a direction that is orthogonal to the +X direction. The −X direction is a direction opposite to the +X direction and the −Y direction is a direction opposite to the +Y direction. The +X direction and the −X direction shall be referred to simply as the "X direction" when referred to collectively. The +Y direction and the −Y direction shall be referred to simply as the "Y direction" when referred to collectively.

The semiconductor device 1 includes a first lead 2, a first frame 3, a second frame 4, a first chip 5 that is fixed on the first frame 3, a second chip 6 that is fixed on the second frame 4, second to seventh leads 7 to 12 that are connected to the second chip 6, wirings 131 to 142, and a sealing resin 13 that seals the above.

In plan view, the first frame 3 includes a main body portion 3A of a rectangular shape that is long in the Y direction and a lead portion 3B that extends in the −X direction from a −Y side end portion of a −X side edge of the main body portion 3A. The first lead 2 is disposed at an interval to a −X side with respect to a +Y side end portion of the −X side edge of the main body portion 3A of the first frame 3.

In plan view, the second frame 4 is disposed at an interval to a +X side with respect to the main body portion 3A of the first frame 3. The second frame 4 has a rectangular shape that is long in the Y direction in plan view. In plan view, the second to seventh leads 7 to 12 are disposed at an interval to the +X side with respect to the second frame 4. In plan view, the second to seventh leads 7 to 12 are disposed at intervals in the Y direction.

With each of the first lead 2, the lead portion 3B, and the second to seventh leads 7 to 12, a portion (for example, a lower surface and an outer end surface) is exposed from the sealing resin 13.

The first chip 5 includes a plurality of terminals P1 to P6. The terminal P1 is connected to the first lead 2 via the wiring 131. The terminal P2 is connected to the lead portion 3B via the wiring 132. A positive electrode of a high voltage generating portion 101 is connected to the first lead 2. A negative electrode of the high voltage generating portion 101 is connected to the lead portion 3B.

As shown in FIG. 2, the first chip 5 includes first to fourth resistor circuits 121 to 124 arranged to drop a high voltage of the high voltage generating portion 101 (see FIG. 1). The first to fourth resistor circuits 121 to 124 are connected in series.

One end of the first resistor circuit 121 is connected to the terminal P1. Another end of the first resistor circuit 121 is connected to one end of the second resistor circuit 122. A connection point of the first resistor circuit 121 and the second resistor circuit 122 is connected to the terminal P3.

Another end of the second resistor circuit 122 is connected to the terminal P4. One end of the third resistor circuit 123 is connected to the terminal P5. Another end of the third resistor circuit 123 is connected to one end of the fourth resistor circuit 124. A connection point of the third resistor circuit 123 and the fourth resistor circuit 124 is connected to the terminal P6. Another end of the fourth resistor circuit 124 is connected to the terminal P2.

As shall be described below, the terminal P4 and the terminal P5 are connected to each other by a wiring passing through the second chip 6. That is, the other end of the second resistor circuit 122 and the one end of the third resistor circuit 123 are electrically connected.

In the following, a resistance value of the first resistor circuit 121 shall be R1, a resistance value of the second resistor circuit 122 shall be R2, a resistance value of the third resistor circuit 123 shall be R3, and a resistance value of the fourth resistor circuit 124 shall be R4.

R2 is less than R1 and a ratio (R2/R1) of R2 with respect to R1 is set in advance. R3 is less than R4 and a ratio (R3/R4) of R3 with respect to R4 is set in advance. The ratio (R2/R1) and the ratio (R3/R4) are set to the same predetermined value (for example, 1/999).

The second chip 6 includes a plurality of terminals Q1 to Q10. The terminals Q1 to Q4 are connected to the terminal P3 to the terminal P6 via the wirings 133 to 136, respectively. The terminals Q5 to Q10 are connected to the second to seventh leads 7 to 12 via the wirings 137 to 142 (see FIG. 1), respectively. As shown in FIG. 2, the terminal Q2 and the terminal Q3 are connected by a wiring 191 inside the second chip 6.

The second chip 6 includes a voltage detecting circuit 192 that is connected between the terminal Q1 and the terminal Q4. The voltage detecting circuit 192 detects a voltage that is in accordance with a voltage between a connection point of the first resistor circuit 121 and the second resistor circuit 122 and a connection point of the third resistor circuit 123 and the fourth resistor circuit 124. The voltage detecting circuit 192 includes an operational amplifier. The terminals Q5 to Q10 (second to seventh leads 7 to 12) are used to supply a power supply voltage to the operational amplifier inside the second chip 6 and output an output signal of the voltage detecting circuit 192.

FIG. 3 is an illustrative plan view of the first chip 5.

A plurality of unit resistors r (hereinafter referred to as the "resistors r") that extend in the X direction are disposed at intervals in the Y direction in plan view in the first chip 5. The plurality of resistors r include real resistors ra that are used as constituent elements of any of the resistor circuits 121 to 124 and dummy resistors rb that are not used as constituent elements of any of the resistor circuits 121 to 124. In FIG. 3, dot hatching is applied to the dummy resistors rb for clarification.

In this preferred embodiment, the plurality of resistors r are disposed at a predetermined pitch interval in the Y direction. In this preferred embodiment, a resistor r at the most +Y side is a dummy resistor rb (referred to hereinafter as the "+Y side dummy resistor rb"). A resistor r at the most −Y side is a dummy resistor rb (referred to hereinafter as the "−Y side dummy resistor rb").

A region between the +Y side dummy resistor rb and the −Y side dummy resistor rb is divided in the Y direction into eleven regions E1 to E11 to form the first to fourth resistor circuits 121 to 124, etc. The regions E1 to E11 include regions of the same size and regions differing in size.

The regions E1 to E11 shall be referred to respectively as the first region E1, the second region E2, . . . , the tenth region E10, and the eleventh region E11 from the +Y direction side. In this preferred embodiment, the sixth region E6 is disposed at a Y-direction center of the region between the +Y side dummy resistor rb and the −Y side dummy resistor rb.

Sizes of the first region E1, the fifth region E5, the seventh region E7, and the eleventh region E11 are substantially equal and larger than those of the other regions E2, E3, E4, E8, E9, and E10. The sizes of the third region E3 and the ninth region E9 are substantially equal. The respective sizes of the second region E2, the fourth region E4, the eighth region E8, and the tenth region E10 are substantially equal. The sixth region 6E is the smallest among the first to eleventh regions E1 to E11.

The plurality of resistors r included in each of the first region E1, the third region E3, the fifth region E5, the seventh region E7, the ninth region E9, and the eleventh region E11 are real resistors ra. The resistors r included in each of the second region E2, the fourth region E4, the sixth region E6, the eighth region E8, and the tenth region E10 are dummy resistors rb.

The first resistor circuit 121 includes the plurality of real resistors ra inside the first region E1 and the plurality of real resistors ra inside the fifth region E5. The first resistor circuit 121 is constituted of a series circuit of all the real resistors ra inside the regions E1 and E5.

Specifically, inside the region E1, −X side end portions of the real resistors ra of odd number rows (odd numbers) from a +Y side end are respectively connected to −X side end portions of the real resistors ra of even number rows (even numbers) that are adjacent to −Y sides thereof. Also, +X side end portions of the real resistors ra of even number rows from a +Y side end are respectively connected to +X side end portions of the real resistors ra of odd number rows that are adjacent to −Y sides thereof.

In the region E5, −X side end portions of the real resistors ra of even number rows from a +Y side end are respectively connected to −X side end portions of the real resistors ra of odd number rows that are adjacent to −Y sides thereof. Also, +X side end portions of the real resistors ra of odd number rows from a +Y side end are respectively connected to +X side end portions of the real resistors ra of even number rows that are adjacent to −Y sides thereof.

A −X side end portion of the real resistor ra at a −Y side end inside the region E1 is electrically connected via a wiring 151 to a −X side end portion of the real resistor ra at the +Y side end inside the region E5. Thereby, all of the real resistors ra inside the regions E1 and E5 are connected in series. A +X side end portion of the real resistor ra at the +Y side end inside the region E1 is connected via a wiring 152 to the terminal P1. A +X side end portion of the real resistor ra at a −Y side end inside the region E5 is connected via a wiring 153 to the terminal P3.

The second resistor circuit 122 includes a plurality of real resistors ra inside the third region E3. The second resistor circuit 122 is constituted of a parallel circuit of a plurality (three in the example of FIG. 3) of the real resistors ra inside the third region E3.

Specifically, −X side end portions of the plurality of real resistors ra inside the third region E3 are electrically connected to each other and +X side end portions of these real resistors ra are electrically connected to each other. The −X side end portions of the plurality of real resistors ra inside the third region E3 are connected via a wiring 154 to the terminal P4. The +X side end portions of the plurality of real resistors ra inside the third region E3 are connected via a wiring 155 to the terminal P3.

The plurality of real resistors ra inside the second resistor circuit 122 are disposed between the real resistor ra at the −Y side end inside the first region E1 and the real resistor ra at the +Y side end inside the fifth region E5. That is, the plurality of real resistors ra inside the second resistor circuit 122 are disposed between the two real resistors ra adjacent in the Y direction among the plurality of real resistors ra of the first resistor circuit 121.

The fourth resistor circuit 124 includes the plurality of real resistors ra inside the seventh region E7 and the plurality of real resistors ra inside the eleventh region E11. The fourth resistor circuit 124 is constituted of a series circuit of all the real resistors ra inside the regions E7 and E11.

Specifically, inside the region E7, −X side end portions of the real resistors ra of odd number rows from a +Y side end are respectively connected to −X side end portions of the real resistors ra of even number rows that are adjacent to −Y sides thereof. Also, +X side end portions of the real resistors ra of even number rows from a +Y side end are respectively connected to +X side end portions of the real resistors ra of odd number rows that are adjacent to −Y sides thereof.

In the region E11, −X side end portions of the real resistors ra of even number rows from a +Y side end are respectively connected to −X side end portions of the real resistors ra of odd number rows that are adjacent to −Y sides thereof. Also, +X side end portions of the real resistors ra of odd number rows from a +Y side end are respectively connected to +X side end portions of the real resistors ra of even number rows that are adjacent to −Y sides thereof.

A −X side end portion of the real resistor ra at a −Y side end inside the region E7 is electrically connected via a wiring 156 to a −X side end portion of the real resistor ra at the +Y side end inside the region E11. Thereby, all of the real resistors ra inside the regions E7 and E11 are connected in series. A +X side end portion of the real resistor ra at the +Y side end inside the region E7 is connected via a wiring 157 to the terminal P6. A +X side end portion of the real resistor ra at a −Y side end inside the region E11 is connected via a wiring 158 to the terminal P2.

The third resistor circuit 123 includes a plurality of real resistors ra inside the ninth region E9. The third resistor circuit 123 is constituted of a parallel circuit of a plurality (three in the example of FIG. 3) of the real resistors ra inside the ninth region E9.

Specifically, −X side end portions of the plurality of real resistors ra inside the ninth region E9 are electrically connected to each other and +X side end portions of these real resistors ra are electrically connected to each other. The −X side end portions of the plurality of real resistors ra inside the ninth region E9 are connected via a wiring 159 to the terminal P5. The +X side end portions of the plurality of real resistors ra inside the ninth region E9 are connected via a wiring 160 to the terminal P6.

The plurality of real resistors ra inside the third resistor circuit 123 are disposed between the real resistor ra at the −Y side end inside the seventh region E7 and the real resistor ra at the +Y side end inside the eleventh region E11. That is, the plurality of real resistors ra inside the third resistor circuit 123 are disposed between the two real resistors ra adjacent in the Y direction among the plurality of real resistors ra in the fourth resistor circuit 124.

In this preferred embodiment, the plurality of real resistors ra that constitute the second resistor circuit 122 are disposed between the two real resistors ra adjacent in the Y direction among the plurality of real resistors ra constituting the first resistor circuit 121 and therefore, a high voltage difference is generated between the second resistor circuit 122 and the real resistors ra adjacent thereto of the first resistor circuit 121.

Also, the plurality of real resistors ra that constitute the third resistor circuit 123 are disposed between the two real resistors ra adjacent in the Y direction among the plurality of real resistors ra constituting the fourth resistor circuit 124 and therefore, a high voltage difference is generated between the third resistor circuit 123 and the real resistors ra adjacent thereto of the fourth resistor circuit 124.

Thus, in this preferred embodiment, in order to relax electric fields at locations at which the high voltage differences are generated, arrangements are made to dispose dummy resistors rb at the locations at which the high voltage differences are generated.

Specifically, a plurality of the dummy resistors rb are disposed in each of the second region E2, the fourth region E4, the eighth region E8, and the tenth region E10. The respective regions E2, E4, E8, and E10 shall be referred to collectively as withstand voltage dummy arrangement regions $E_{dummy}$.

Two dummy resistors rb are disposed at the pitch interval in the Y direction in each withstand voltage dummy arrangement region $E_{dummy}$. That is, two dummy resistors rb disposed in two rows are disposed in the withstand voltage dummy arrangement region $E_{dummy}$. Each dummy resistor rb is not electrically connected to the other dummy resistors rb. Also, each dummy resistor rb is not electrically connected to any of the real resistors ra and is not electrically connected to any of the terminals P1 to P6.

In addition, one dummy resistor rb is disposed in the sixth region E6.

Figure 4:
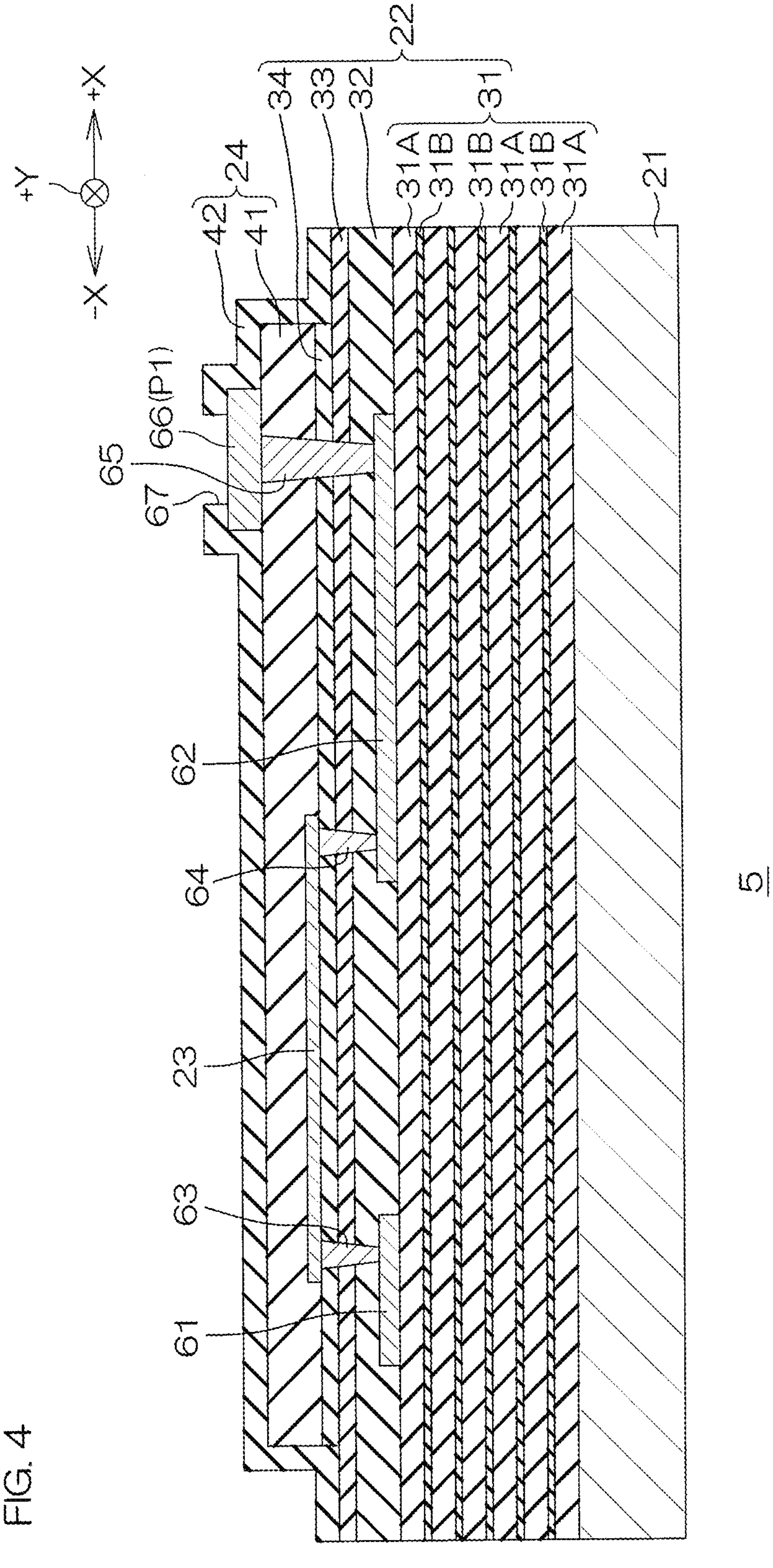
FIG. 4 is a sectional view taken along line A-A of FIG. 3 in the first disclosure.

FIG. 4 is a sectional view taken along line A-A of FIG. 3.

A sectional structure of the first chip 5 shall be described.

The first chip 5 includes a substrate 21, a lower insulating film 22 that is formed on the substrate 21, a resistor 23 that is formed on the lower insulating film 22 and constitutes a resistor r, and an upper insulating film 24 that is formed on the lower insulating film 22 such as to cover the resistor 23.

Further, the first chip 5 includes a first lower metal 61 and a second lower metal 62 that are disposed inside the lower insulating film 22 and an upper metal 66 that is disposed inside the upper insulating film 24.

However, a portion of an upper surface of the upper metal 66 is exposed from the upper insulating film 24.

The substrate 21 is constituted, for example, of an Si substrate. A film thickness of the substrate 21 is, for example, approximately 300 μm.

The lower insulating film 22 includes an insulating film laminated structure 31 that is formed on the substrate 21, a second SiO-based insulating film 32 that is formed on the insulating film laminated structure 31, a first nitride film 33 that is formed on the second SiO-based insulating film 32, and a first SiO-based insulating film 34 that is formed on the first nitride film 33.

In this preferred embodiment and in modification examples 5A to 5E of the first chip 5 to be described below, $SiO_2$ is used as the "SiO-based insulating film." Also, in this preferred embodiment and in the modification examples 5A to 5E of the first chip 5 to be described below, an SiN film is used as the "nitride film."

The insulating film laminated structure 31 has a structure in which a first insulating film 31A constituted of an SiO-based insulating film and a second insulating film 31B constituted of a nitride film having tensile stress are laminated alternately. The number of laminated layers of the first insulating film 31A and the second insulating film 31B may be any number and may differ from the number of laminated layers shown in FIG. 4. The two types of insulating films 31A and 31B are laminated to control warping of the substrate 21, caused by film-forming of the first insulating film 31A, by film-forming of the second insulating film 31B and film-form the insulating film thickly.

A film thickness of the first insulating film 31A is, for example, approximately 2 μm and a film thickness of the second insulating film 31B is, example, approximately 0.3 μm. A thickness of the insulating film laminated structure 31 is, for example, approximately 13.5 μm.

A plurality of lower metals 61 and 62 are disposed on the insulating film laminated structure 31. In the example of FIG. 4, the lower metals 61 and 62 include the first lower metal 61 that is disposed close to a −X side end and the second lower metal 62 that is disposed at a +X side with respect to the first lower metal 61. In this preferred embodiment, the lower metals 61 and 62 are constituted of Al (aluminum). The lower metals 61 and 62 are used to electrically connect the real resistors ra to each other and to connect the real resistors ra to the terminals P1 to P6.

The second SiO-based insulating film 32 is formed on the insulating film laminated structure 31 such as to cover the lower metals 61 and 62. Also, the first nitride film 33 is formed on the second SiO-based insulating film 32. The first nitride film 33 is preferably formed on substantially an entire area of the second SiO-based insulating film 32 upper surface. A film thickness of the second SiO-based insulating film 32 is approximately 0.8 μm. A film thickness of the first nitride film 33 is approximately 0.15 μm.

The first SiO-based insulating film 34 is formed in a region excluding a peripheral edge portion of the first nitride film 33 upper surface. A film thickness of the first SiO-based insulating film 34 is approximately 0.15 μm.

The resistor 23 is formed on the first SiO-based insulating film 34. The resistor 23 is of a rectangular shape that is long in the X direction in plan view. The resistor 23 is disposed such as to extend across the first lower metal 61 and the second lower metal 62 in plan view. In this preferred embodiment, the resistor 23 is constituted of CrSi.

A −X side end portion of a lower surface of the resistor 23 is electrically connected to the first lower metal 61 via a first via 63 that penetrates continuously through the first SiO-based insulating film 34, the first nitride film 33, and the second SiO-based insulating film 32. A +X side end portion of the lower surface of the resistor 23 is electrically connected to a −X side end portion of the second lower metal 62 via a second via 64 that penetrates continuously through the first SiO-based insulating film 34, the first nitride film 33, and the second SiO-based insulating film 32. In this preferred embodiment, the first via 63 and the second via 64 are constituted of W (tungsten).

The upper insulating film 24 includes a third SiO-based insulating film 41 that is formed on the first SiO-based insulating film 34 such as to cover the resistor 23 and a second nitride film 42 that is formed on the third SiO-based insulating film 41. A film thickness of the third SiO-based insulating film 41 is approximately 0.4 μm. A film thickness of the second nitride film 42 is approximately 1.2 μm.

The upper metal 66 is formed on the third SiO-based insulating film 41. In this preferred embodiment and in the first modification example 5A (see FIG. 6) of the first chip 5 to be described below, each upper metal 66 includes any of the terminals P1 to P6 (see FIG. 3). There are cases where the upper metal 66 includes just a terminal and cases where it integrally includes a terminal and a wiring. The upper metal 66 appearing in FIG. 4 includes just the terminal P1. In other words, the upper metal 66 appearing in FIG. 4 constitutes the terminal P1.

In addition, although not appearing in FIG. 4, there are also portions where an upper metal is connected to the first lower metal 61 via an unillustrated via. As such an upper metal, there is an upper metal that constitutes the wiring 154 and the terminal P4 in FIG. 3 and an upper metal that constitutes the wiring 159 and the terminal P5 in FIG. 3.

The upper metal 66 shown in FIG. 4 is disposed such that a portion overlaps with a +X side end portion of the second lower metal 62 in plan view. The upper metal 66 is electrically connected to the +X side end portion of the second lower metal 62 via a third via 65 that penetrates continuously through the third SiO-based insulating film 41, the first SiO-based insulating film 34, the first nitride film 33, and the second SiO-based insulating film 32. In this preferred embodiment, the third via 65 is constituted of W (tungsten). The second lower metal 62 and the third via 65 shown in FIG. 4 constitute the wiring 152 (see FIG. 3).

The second nitride film 42 is formed on the first nitride film 33 such as to cover exposed surfaces of the upper metal 66, the third SiO-based insulating film 41, the first SiO-based insulating film 34, and the first nitride film 33. A peripheral edge portion of a lower surface of the second nitride film 42 is joined to a peripheral edge portion of the upper surface of the first nitride film 33.

An opening 67 arranged to expose a portion of the upper surface of the upper metal 66 is formed in the second nitride film 42. A pad portion arranged to connect wirings to the terminals P1 to P6 is formed by the opening 67.

With this preferred embodiment, improvement of moisture resistance is enabled because all resistors 23 are surrounded by the first nitride film 33 and the second nitride film 42.

With this preferred embodiment, there is a possibility that resistance characteristics of the resistors r will vary due to process variation when the first chip 5 is manufactured. The process variation tends to occur in a stepwise manner along one direction, for example, the −Y direction or the +Y direction.

With this preferred embodiment, a real resistor set that constitutes the second resistor circuit 122 is disposed between two real resistors ra adjacent in the Y direction among a real resistor set that constitutes the first resistor circuit 121. Thereby, a difference is made unlikely to arise between an average value of resistance values of the real resistors ra inside the first resistor circuit 121 and an average value of resistance values of the real resistors ra inside the second resistor circuit 122. Consequently, an error is made unlikely to arise in the ratio (R2/R1) of the resistance value R2 of the second resistor circuit 122 with respect to the resistance value R1 of the first resistor circuit 121.

Similarly, with this preferred embodiment, a real resistor set that constitutes the third resistor circuit 123 is disposed between two real resistors ra adjacent in the Y direction among a real resistor set that constitutes the fourth resistor circuit 124. Thereby, a difference is made unlikely to arise between an average value of resistance values of the real resistors ra inside the fourth resistor circuit 124 and an average value of resistance values of the real resistors ra inside the third resistor circuit 123. Consequently, an error is made unlikely to arise in the ratio (R3/R4) of the resistance value R3 of the third resistor circuit 123 with respect to the resistance value R4 of the fourth resistor circuit 124.

As mentioned above, when the second resistor circuit 122 is disposed as in the preferred embodiment, a high voltage difference is generated between the second resistor circuit 122 and the real resistors ra adjacent thereto of the first resistor circuit 121. Also, when the third resistor circuit 123 is disposed as in the preferred embodiment, a high voltage difference is generated between the third resistor circuit 123 and the real resistors ra adjacent thereto of the fourth resistor circuit 124. However, in the preferred embodiment, the dummy resistors rb are disposed at the locations at which the high voltage differences are generated and therefore, the electric fields at the locations at which the high voltage differences are generated can be relaxed.

FIG. 5A to FIG. 5D are sectional views showing an example of a manufacturing process of the first chip 5 shown in FIG. 3 and FIG. 4 and are sectional views corresponding to the section plane of FIG. 4.

Figure 5A:
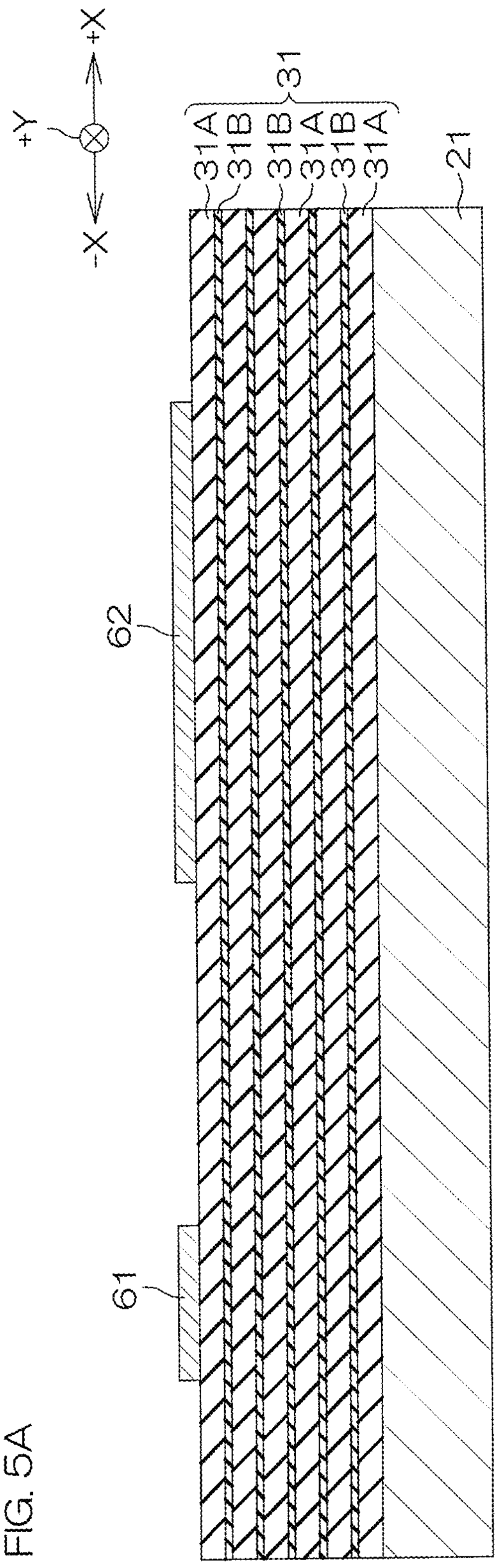
FIG. 5A is a sectional view showing a portion of a manufacturing process of the first chip in the first disclosure shown in FIG. 3 and FIG. 4 and is a sectional view corresponding to the section plane of FIG. 4.

First, as shown in FIG. 5A, the insulating film laminated structure 31 is formed by alternately laminating the first insulating film 31A and the second insulating film 31B on the substrate 21. Then, after forming a metal film (an Al film in this preferred embodiment) that is a material film of the first lower metal 61 and the second lower metal 62 on the insulating film laminated structure 31, the metal film is patterned. The first lower metal 61 and the second lower metal 62 are thereby formed on the insulating film laminated structure 31.

Figure 5B:
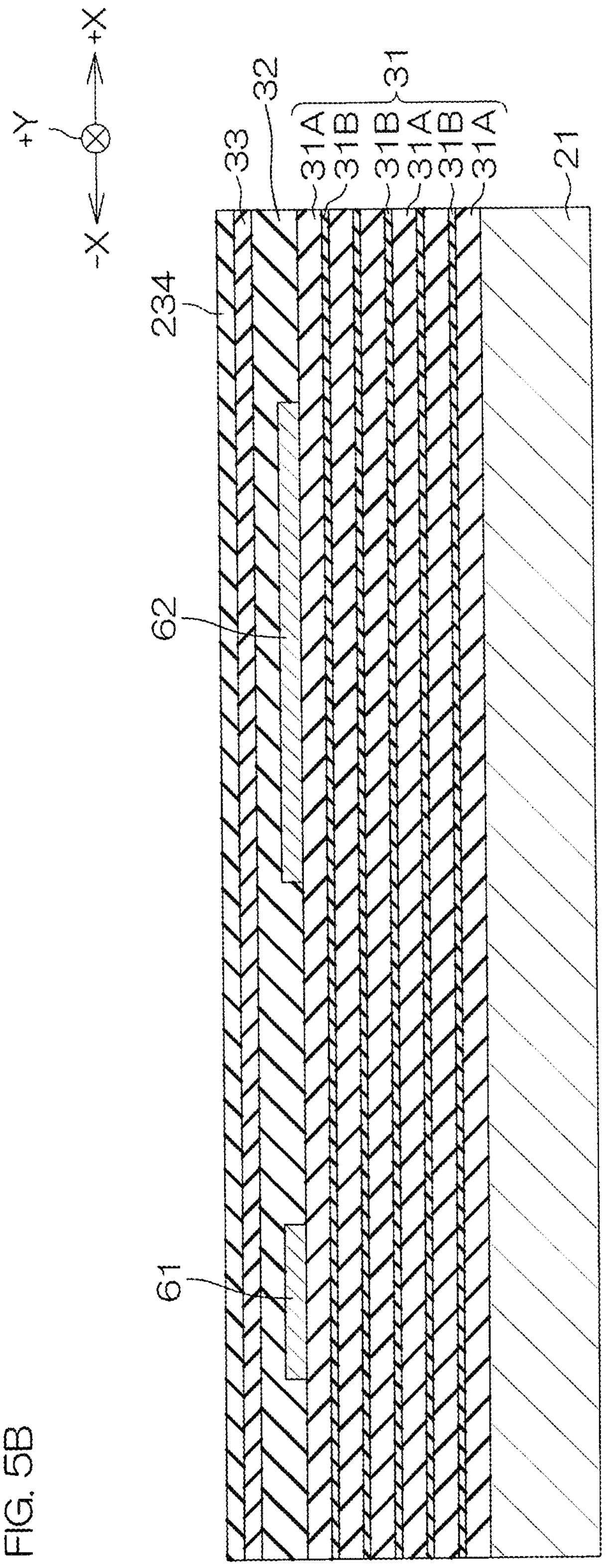
FIG. 5B is a sectional view showing a step subsequent to that of FIG. 5A.

Next, as shown in FIG. 5B, the second SiO-based insulating film 32 is formed on the insulating film laminated structure 31 such as to cover the first lower metal 61 and the second lower metal 62. Next, the first nitride film 33 is formed on the second SiO-based insulating film 32. Next, an insulating material film 234 that is a material film of the first SiO-based insulating film 34 is formed on the first nitride film 33.

Figure 5C:
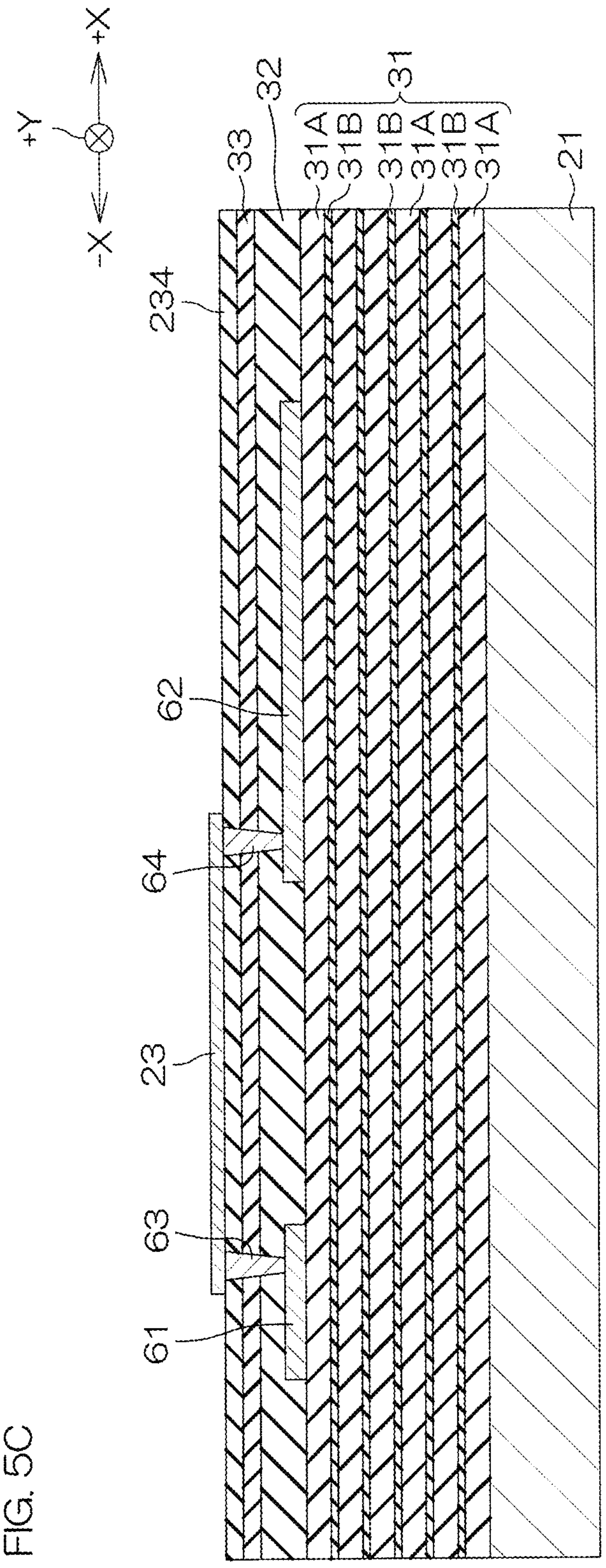
FIG. 5C is a sectional view showing a step subsequent to that of FIG. 5B.

Next, in a laminated film of the second SiO-based insulating film 32, the first nitride film 33, and the insulating material film 234, the first via 63 and the second via 64 that penetrate through the laminated film and with which lower ends reach the first lower metal 61 and the second lower metal 62, respectively, are formed as shown in FIG. 5C. Then, after a resistive material film that is a material film of the resistor 23 is formed on the insulating material film 234, the resistive material film is patterned to form a plurality of resistors 23 (the plurality of real resistors ra and the plurality of dummy resistors rb). Upper ends of the first via 63 and the second via 64 are thereby connected to the resistor 23.

Figure 5D:
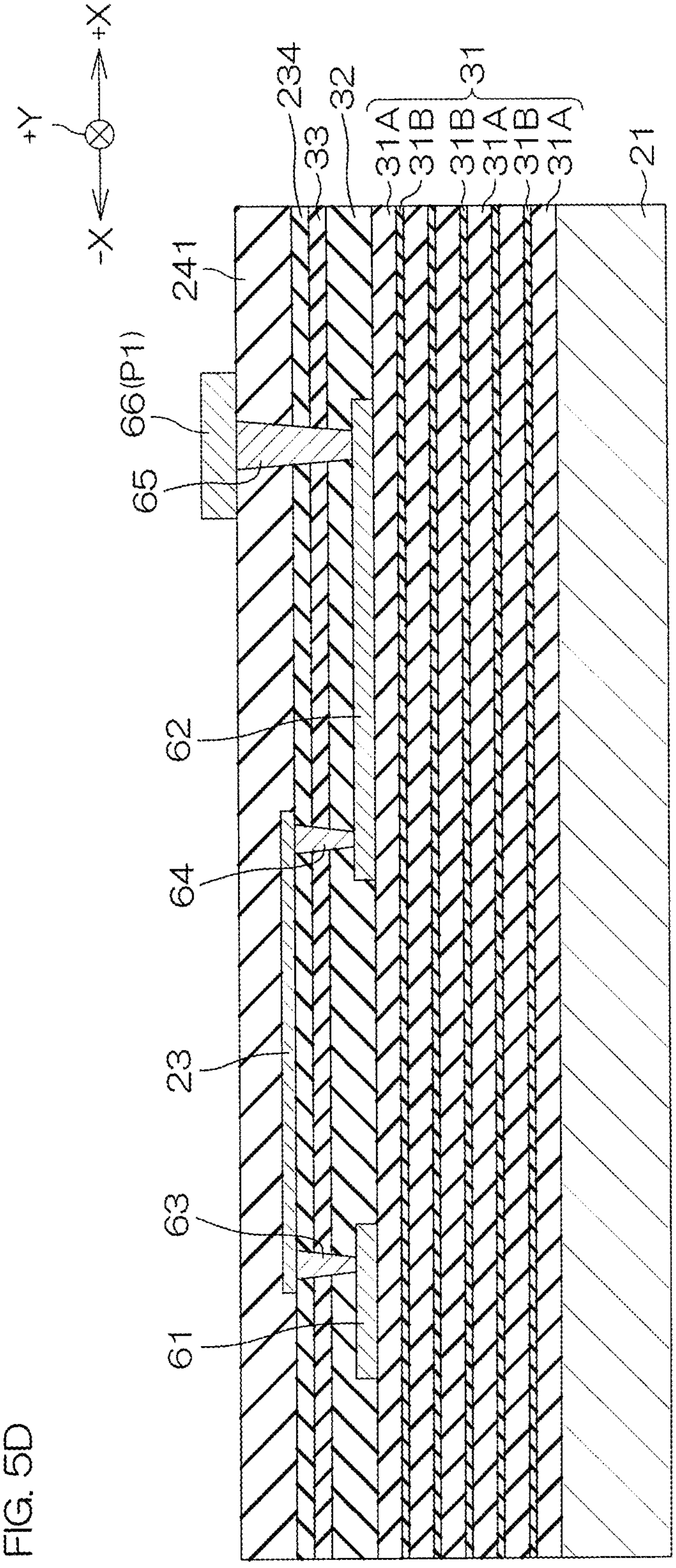
FIG. 5D is a sectional view showing a step subsequent to that of FIG. 5C.

Next, as shown in FIG. 5D, an insulating material film 241 that is a material film of the third SiO-based insulating film 41 is formed on the insulating material film 234 such as to cover the resistor 23. Next, in a laminated film of the second SiO-based insulating film 32, the first nitride film 33, the insulating material film 234, and the insulating material film 241, the third via 65 that penetrates through the laminated film and with which a lower end reaches the second lower metal 62 is formed. Then, after a metal film that is a material film of the upper metal 66 is formed on the insulating material film 241, the metal film (an Al film in this preferred embodiment) is patterned. The upper metal 66 is thereby formed on the insulating material film 241. An upper end of the third via 65 is thereby connected to the upper metal 66.

Figure 5E:
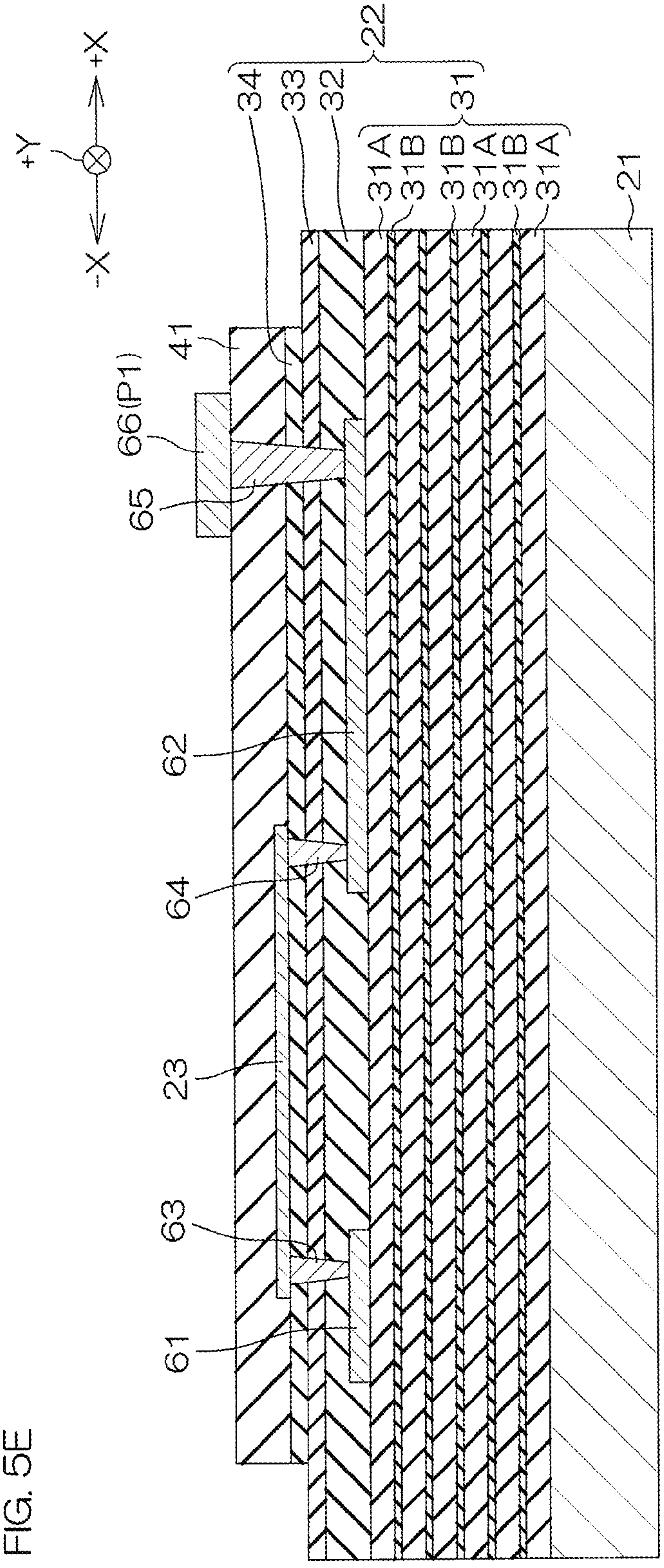
FIG. 5E is a sectional view showing a step subsequent to that of FIG. 5D.

Next, as shown in FIG. 5E, a laminated film of the insulating material film 234 and the insulating material film 241 is patterned to remove a peripheral edge portion of the laminated film. Thereby, the first SiO-based insulating film 34 that is constituted of the insulating material film 234 and the third SiO-based insulating film 41 that is constituted of the insulating material film 241 are obtained. The lower insulating film 22 that is constituted of the insulating film laminated structure 31, the second SiO-based insulating film 32, the first nitride film 33, and the first SiO-based insulating film 34 is thereby obtained.

Thereafter, the second nitride film 42 is formed on the first nitride film 33 such as to cover the exposed surfaces of the upper metal 66, the third SiO-based insulating film 41, the first SiO-based insulating film 34, and the first nitride film 33. The opening 67 that exposes a portion of the upper surface of the upper metal 66 is then formed in the second nitride film 42. The first chip 5 such as shown in FIG. 3 and FIG. 4 is thereby obtained.

Figure 6:
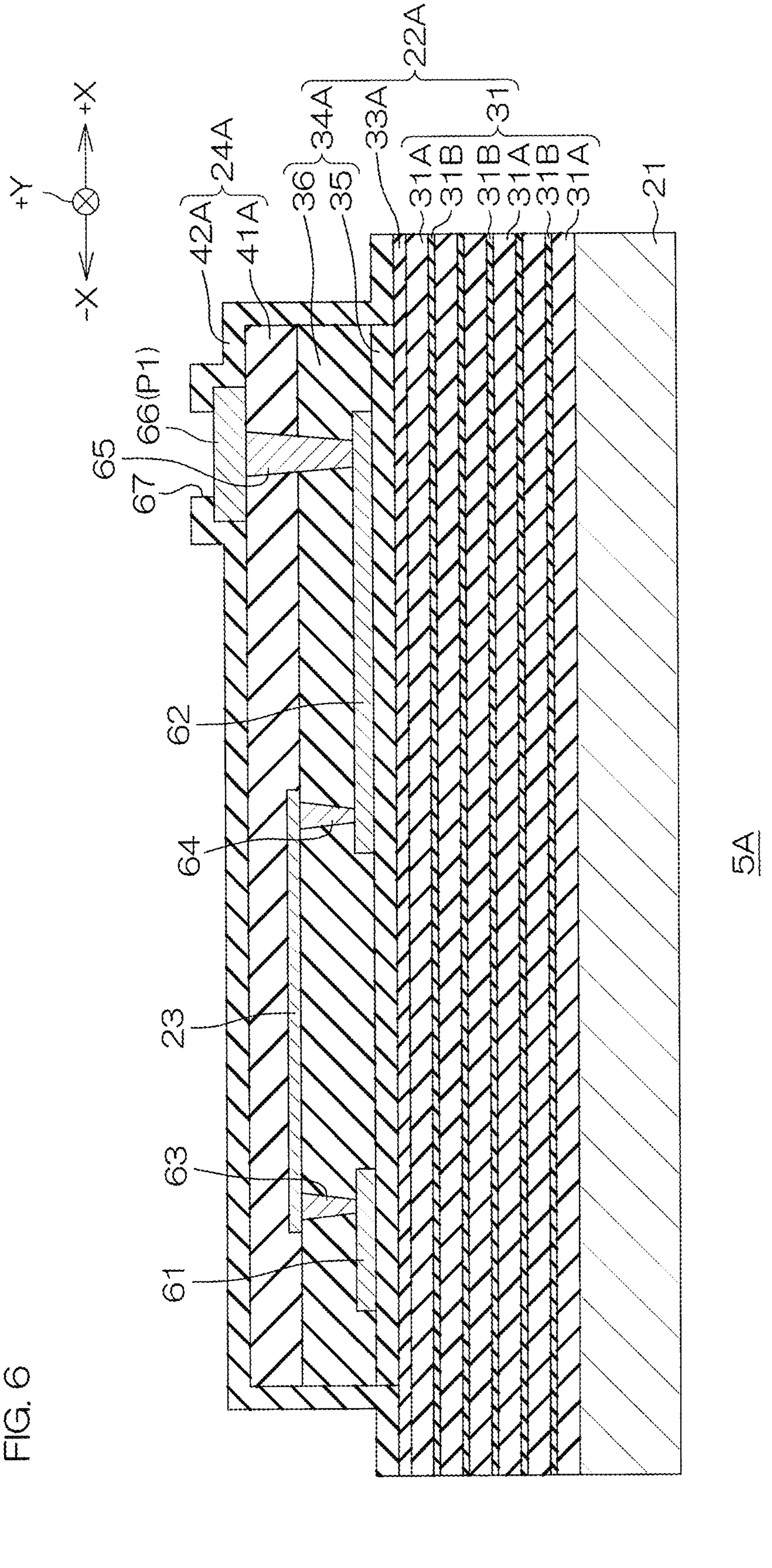
FIG. 6 is an illustrative sectional view for describing a first modification example of the first chip in the first disclosure.

FIG. 6 is a sectional view for describing the first modification example of the first chip and is a sectional view corresponding to FIG. 4. In FIG. 6, portions corresponding to respective portions in FIG. 4 are indicated with the same reference signs attached as in FIG. 4.

A plan view of a first chip 5A of FIG. 6 is the same as FIG. 3. The first chip 5A of FIG. 6 includes the substrate 21, a lower insulating film 22A that is formed on the substrate 21, the resistor 23 that is formed on the lower insulating film 22A and constitutes a resistor r, and an upper insulating film 24A that is formed on the lower insulating film 22A such as to cover the resistor 23.

Further, the first chip 5A includes the first lower metal 61 and the second lower metal 62 that are disposed inside the lower insulating film 22A and the upper metal 66 that is disposed inside the upper insulating film 24A. However, a portion of the upper surface of the upper metal 66 is exposed from the upper insulating film 24A.

The lower insulating film 22A includes the insulating film laminated structure 31 that is formed on the substrate 21, a first nitride film 33A that is formed on the insulating film laminated structure 31, and a first SiO-based insulating film 34A that is formed on the first nitride film 33A. The first SiO-based insulating film 34A is constituted of a fourth SiO-based insulating film 35 that is formed on the first nitride film 33A and a fifth SiO-based insulating film 36 that is formed on the fourth SiO-based insulating film 35.

The first nitride film 33A is formed on substantially an entire area of the insulating film laminated structure 31 upper surface. The fourth SiO-based insulating film 35 is formed in a region excluding a peripheral edge portion of the first nitride film 33A upper surface. A film thickness of the first nitride film 33A is approximately 0.15 μm. A film thickness of the fourth SiO-based insulating film 35 is approximately 0.15 μm.

A plurality of lower metals 61 and 62 are disposed on the fourth SiO-based insulating film 35. In the example of FIG. 6, the lower metals 61 and 62 include the first lower metal 61 that is disposed close to the −X side end and the second lower metal 62 that is disposed at the +X side with respect to the first lower metal 61.

The fifth SiO-based insulating film 36 is formed on the fourth SiO-based insulating film 35 such as to cover the first lower metal 61 and the second lower metal 62. A film thickness of the fifth SiO-based insulating film 36 is approximately 1 μm.

The resistor 23 is formed on the fifth SiO-based insulating film 36. The resistor 23 is of a rectangular shape that is long in the X direction in plan view. The resistor 23 is disposed such as to extend across the first lower metal 61 and the second lower metal 62 in plan view.

The −X side end portion of the lower surface of the resistor 23 is electrically connected to the first lower metal 61 via the first via 63 that penetrates through the fourth SiO-based insulating film 35. The +X side end portion of the lower surface of the resistor 23 is electrically connected to the −X side end portion of the second lower metal 62 via the second via 64 that penetrates through the fourth SiO-based insulating film 35.

The upper insulating film 24A includes a sixth SiO-based insulating film 41A that is formed on the fifth SiO-based insulating film 36 such as to cover the resistor 23 and a second nitride film 42A that is formed on the sixth SiO-based insulating film 41A.

A film thickness of the sixth SiO-based insulating film 41A is approximately 0.4 μm. The upper metal 66 is formed on the sixth SiO-based insulating film 41A.

The upper metal 66 shown in FIG. 6 is disposed such that a portion overlaps with the +X side end portion of the second lower metal 62 in plan view. The upper metal 66 is electrically connected to the +X side end portion of the second lower metal 62 via the third via 65 that penetrates continuously through the sixth SiO-based insulating film 41A and the fifth SiO-based insulating film 36. The upper metal 66 shown in FIG. 6 constitutes the wiring 52 (see FIG. 3) and the terminal P1.

The second nitride film 42A is formed on the first nitride film 33A such as to cover exposed surfaces of the upper metal 66, the sixth SiO-based insulating film 41A, the fifth SiO-based insulating film 36, the fourth SiO-based insulating film 35, and the first nitride film 33A. A peripheral edge portion of a lower surface of the second nitride film 42A is joined to a peripheral edge portion of the upper surface of the first nitride film 33A. A film thickness of the second nitride film 42A is approximately 1.2 μm.

The opening 67 arranged to expose a portion of the upper surface of the upper metal 66 is formed in the second nitride film 42A. A pad portion arranged to connect wirings to the terminals P1 to P6 is formed by the opening.

Even with the first modification example, the same effects as the preferred embodiment described above are obtained.

Here, if an uppermost layer of the insulating film laminated structure 31 is a second insulating film (nitride film) 31B, the second insulating film 31B of the uppermost layer of the insulating film laminated structure 31 may be used as the first nitride film 33A. In this case, the lower insulating film 22A includes the insulating film laminated structure 31 that is formed on the substrate 21 and has the first nitride film 33A (second insulating film 31B) as the uppermost layer and the first SiO-based insulating film 34A that is formed on the insulating film laminated structure 31.

FIG. 7A to FIG. 7D are sectional views showing an example of a manufacturing process of the first chip 5A shown in FIG. 3 and FIG. 6 and are sectional views corresponding to the section plane of FIG. 6.

Figure 7A:
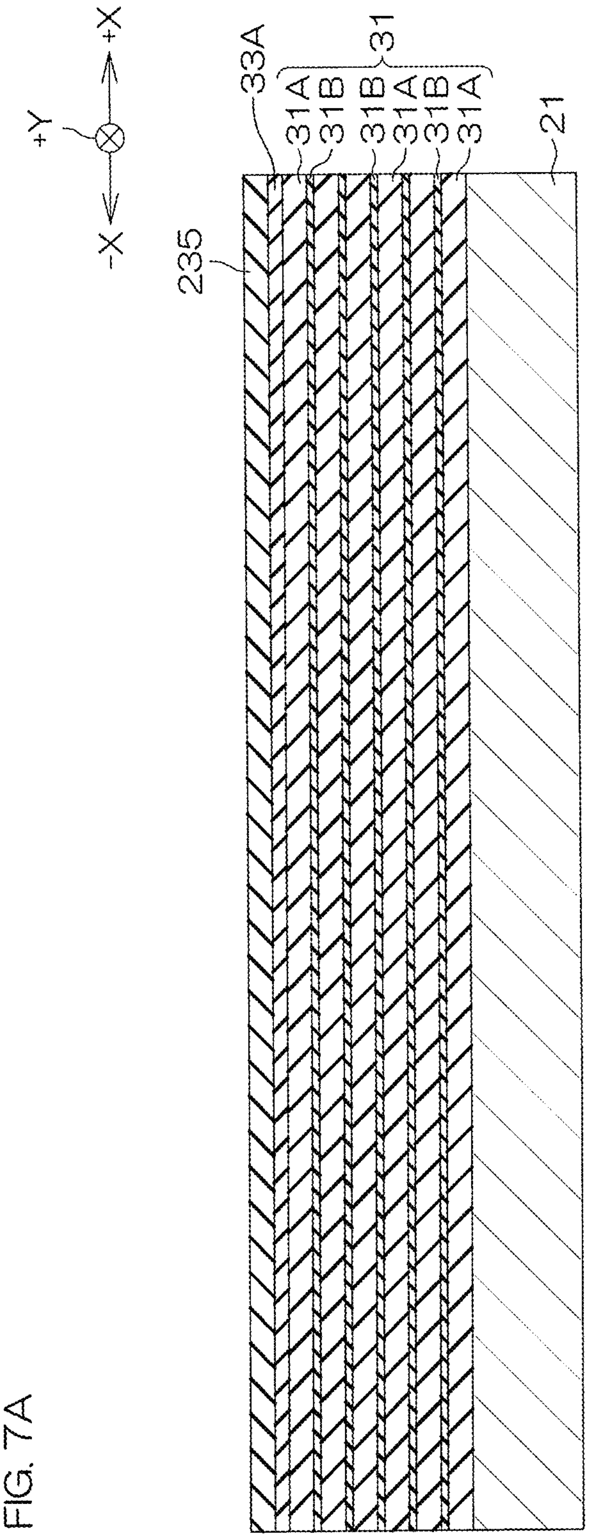
FIG. 7A is a sectional view showing a portion of a manufacturing process of the first chip shown in FIG. 3 and FIG. 6 and is a sectional view corresponding to the section plane of FIG. 6.

First, as shown in FIG. 7A, the insulating film laminated structure 31 is formed by alternately laminating the first insulating film 31A and the second insulating film 31B on the substrate 21. Next, the first nitride film 33A is formed on the insulating film laminated structure 31. Next, an insulating material film 235 that is a material film of the fourth SiO-based insulating film 35 is formed on the first nitride film 33A.

Figure 7B:
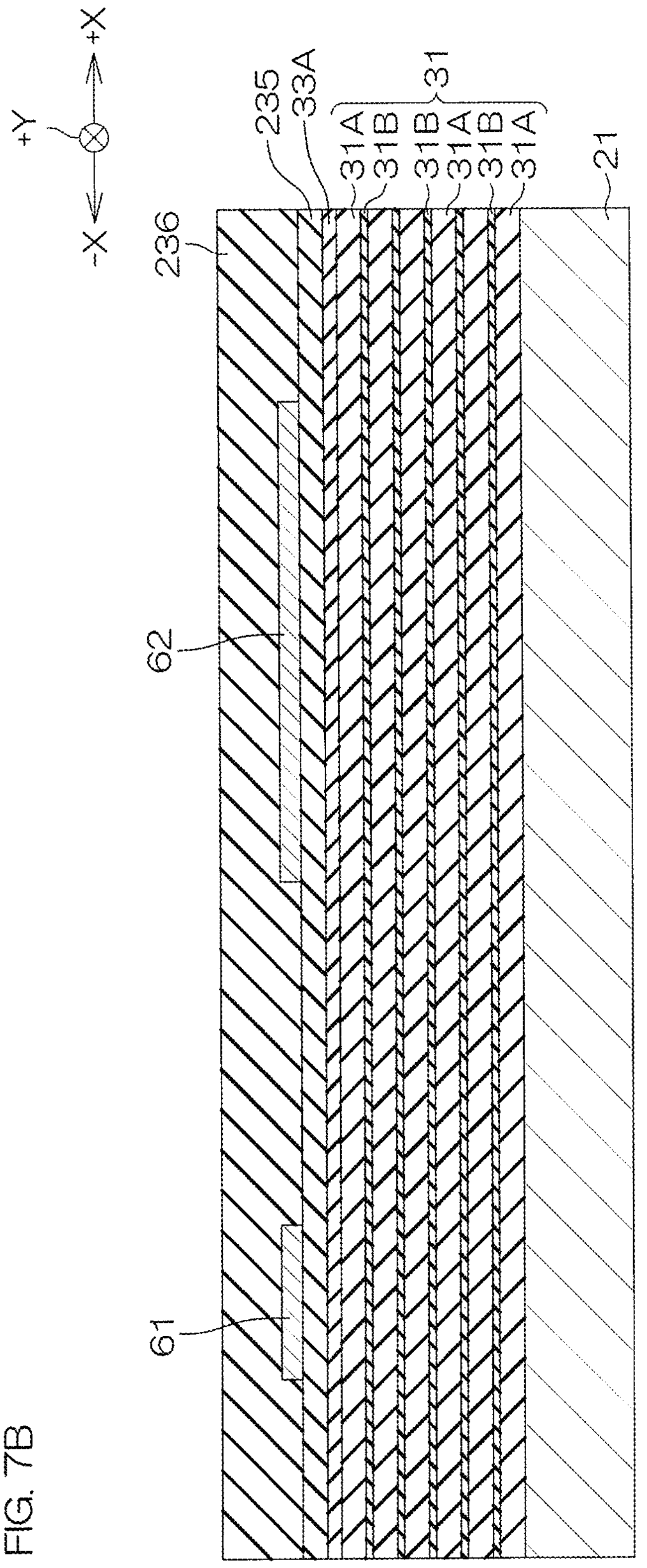
FIG. 7B is a sectional view showing a step subsequent to that of FIG. 7A.

Next, as shown in FIG. 7B, after forming a metal film that is a material film of the first lower metal 61 and the second lower metal 62 on the insulating material film 235, the metal film is patterned. The first lower metal 61 and the second lower metal 62 are thereby formed on the insulating material film 235. An insulating material film 236 that is a material film of the fifth SiO-based insulating film 36 is then formed on the insulating material film 235 such as to cover the first lower metal 61 and the second lower metal 62.

Figure 7C:
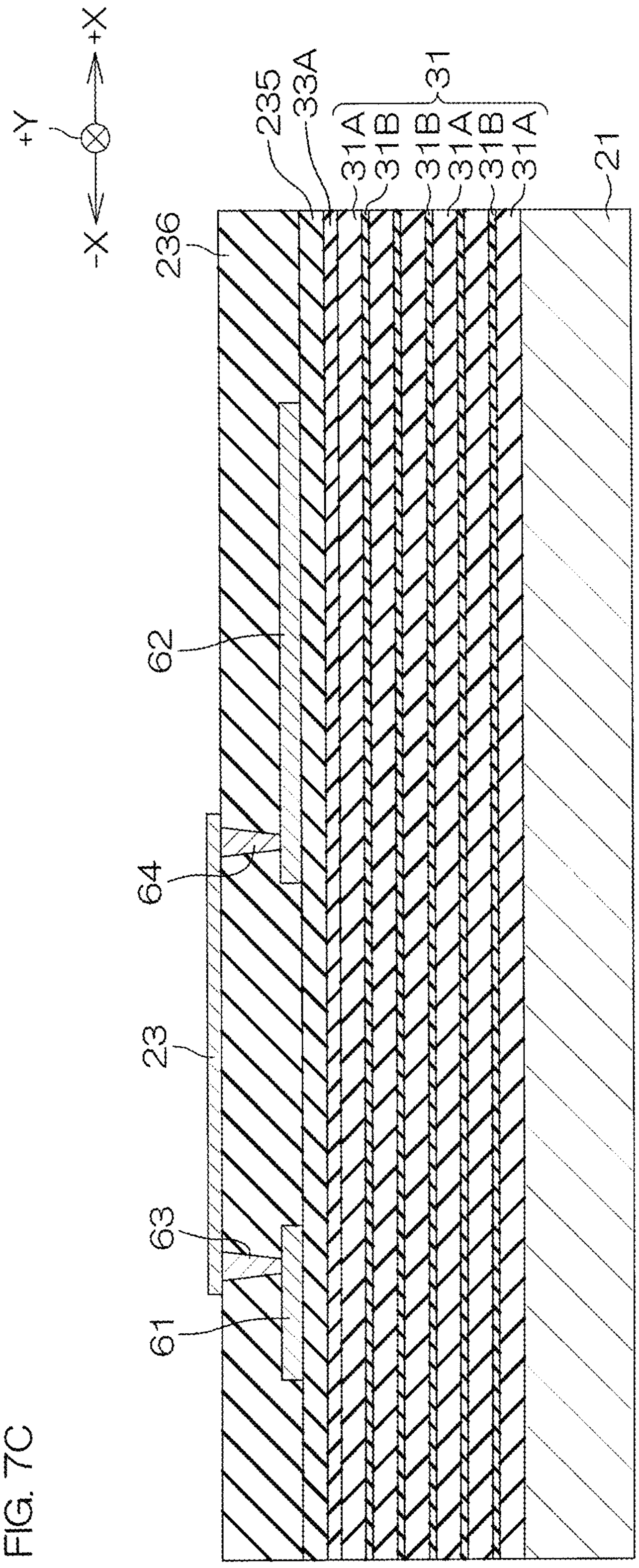
FIG. 7C is a sectional view showing a step subsequent to that of FIG. 7B.

Next, as shown in FIG. 7C, the first via 63 and the second via 64 that penetrate through the insulating material film 236 and with which the lower ends reach the first lower metal 61 and the second lower metal 62, respectively, are formed in the insulating material film 236. Then, after a resistive material film that is a material film of the resistor 23 is formed on the insulating material film 236, the resistive material film is patterned to form the plurality of resistors 23. The upper ends of the first via 63 and the second via 64 are thereby connected to the resistor 23.

Figure 7D:
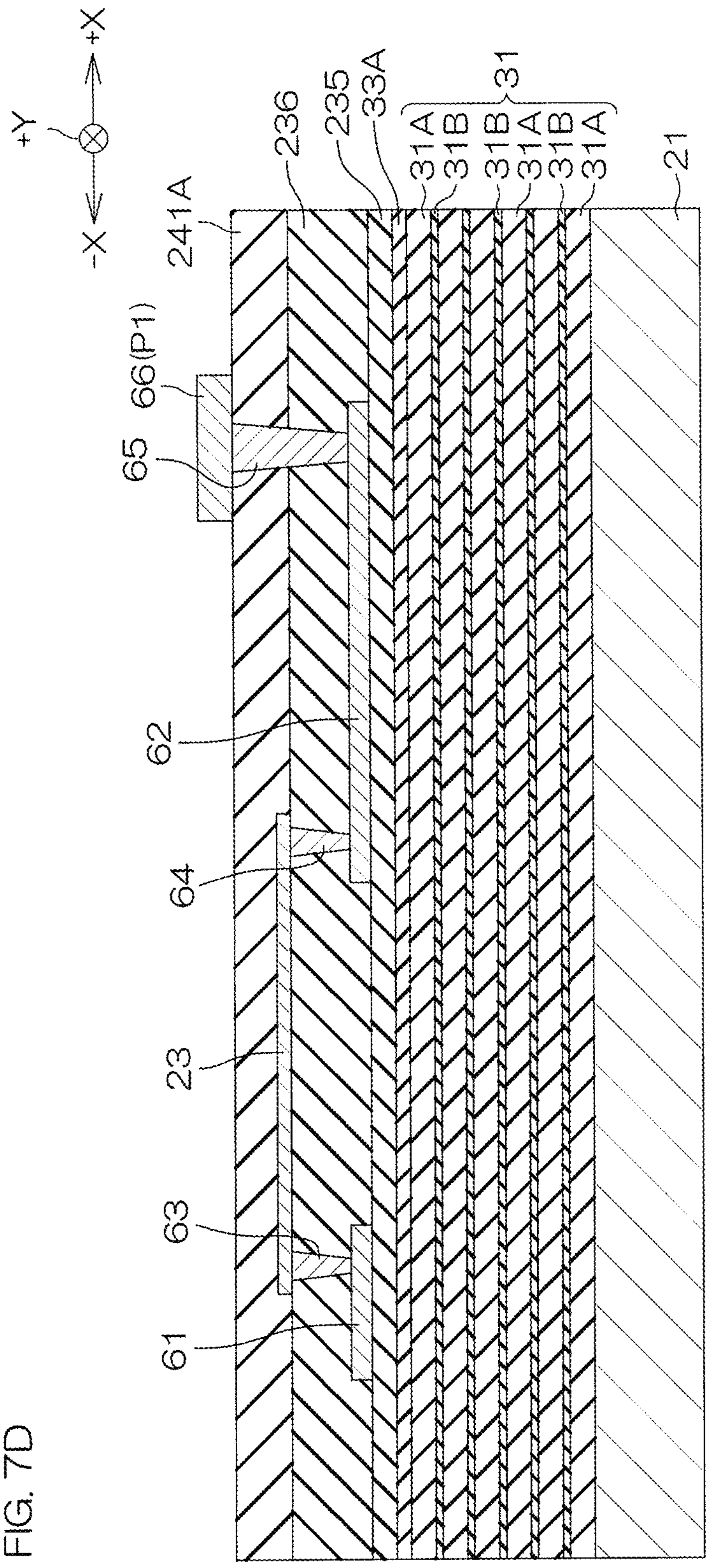
FIG. 7D is a sectional view showing a step subsequent to that of FIG. 7C.

Next, as shown in FIG. 7D, an insulating material film 241A that is a material film of the sixth SiO-based insulating film 41A is formed on the insulating material film 236. Next, in a laminated film of the insulating material film 236 and the insulating material film 241A, the third via 65 that penetrates through the laminated film and with which the lower end reaches the second lower metal 62 is formed. Then, after a metal film that is a material film of the upper metal 66 is formed on the insulating material film 241A, the metal film is patterned. The upper metal 66 is thereby formed on the insulating material film 241A. The third via 65 upper end is thereby connected to the upper metal 66.

Figure 7E:
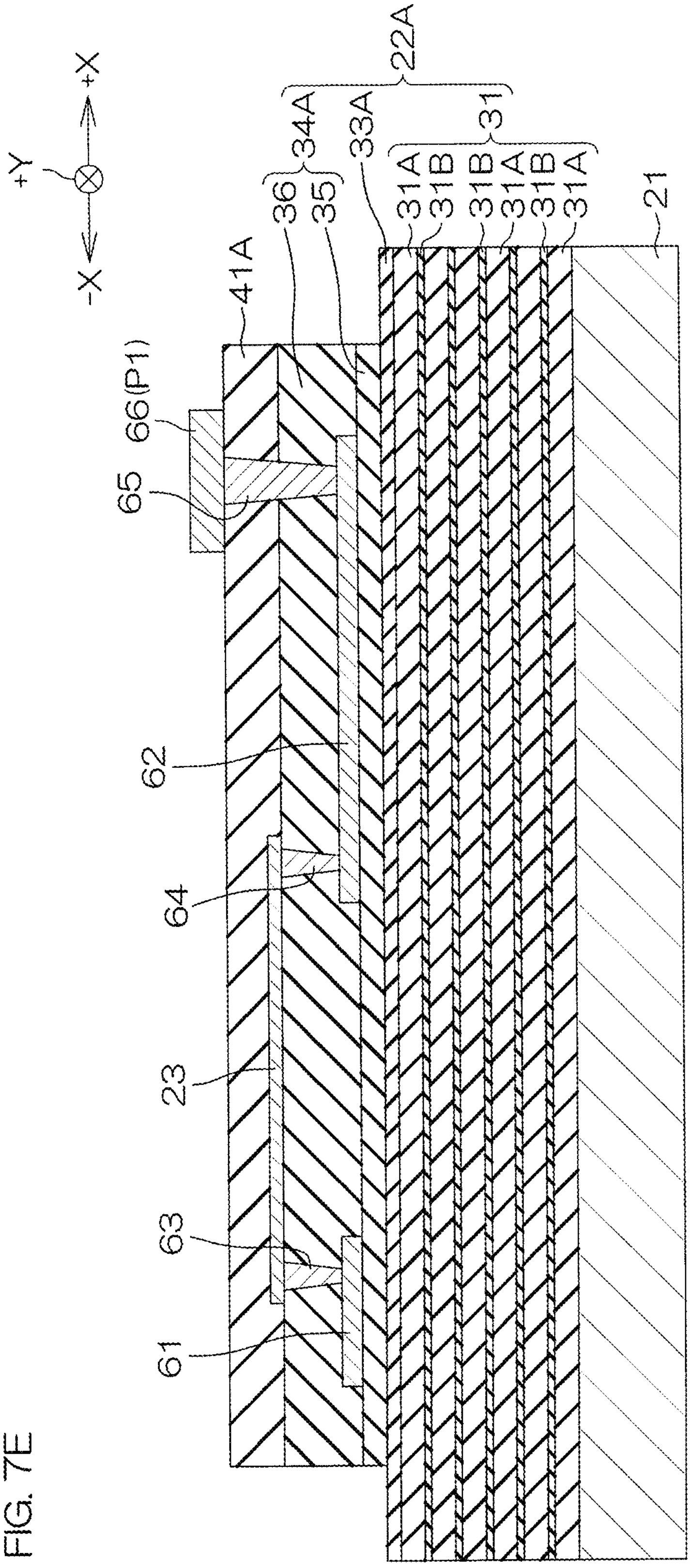
FIG. 7E is a sectional view showing a step subsequent to that of FIG. 7D.

Next, as shown in FIG. 7E, a laminated film of the insulating material film 235, the insulating material film 236, and the insulating material film 241A is patterned to remove a peripheral edge portion of the laminated film. Thereby, the fourth SiO-based insulating film 35 that is constituted of the insulating material film 235, the fifth SiO-based insulating film 36 that is constituted of the insulating material film 236, and the sixth SiO-based insulating film 41A that is constituted of the insulating material film 241A are obtained. The first SiO-based insulating film 34A that is constituted of a laminated film of the fourth SiO-based insulating film 35 and the fifth SiO-based insulating film 36 is thereby obtained. Also, the lower insulating film 22A that is constituted of the insulating film laminated structure 31, the first nitride film 33A, and the first SiO-based insulating film 34A is thereby obtained.

Thereafter, the second nitride film 42A is formed on the first nitride film 33A such as to cover the exposed surfaces of the upper metal 66, the sixth SiO-based insulating film 41A, the fifth SiO-based insulating film 36, the fourth SiO-based insulating film 35, and the first nitride film 33A. The opening 67 that exposes a portion of the upper surface of the upper metal 66 is then formed in the second nitride film 42A. The first chip 5A such as shown in FIG. 3 and FIG. 6 is thereby obtained.

Figure 8:
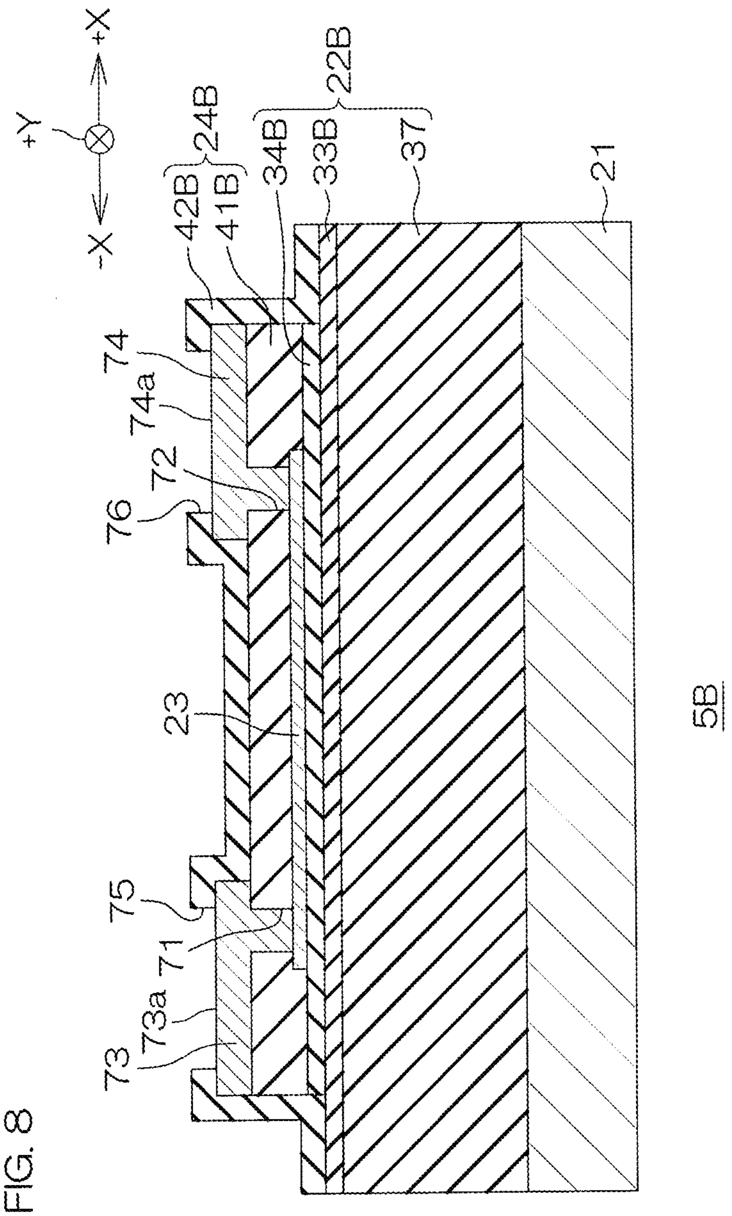
FIG. 8 is an illustrative sectional view for describing a second modification example of the first chip in the first disclosure.

FIG. 8 is a sectional view for describing the second modification example of the first chip and is a sectional view corresponding to FIG. 4. In FIG. 8, portions corresponding to respective portions in FIG. 4 are indicated with the same reference signs attached as in FIG. 4.

A plan view of a first chip 5B of FIG. 8 is the same as FIG. 3. The first chip 5B of FIG. 8 includes the substrate 21, a lower insulating film 22B that is formed on the substrate 21, the resistor 23 that is formed on the lower insulating film 22B and constitutes a resistor r, and an upper insulating film 24B that is formed on the lower insulating film 22B such as to cover the resistor 23.

Further, the first chip 5B includes a first lead-out electrode 73 and a second lead-out electrode 74 that are disposed inside the upper insulating film 24B. However, a portion of an upper surface of the first lead-out electrode 73 and a portion of an upper surface of the second lead-out electrode 74 are exposed from the upper insulating film 24B.

The lower insulating film 22B includes a seventh SiO-based insulating film 37 that is formed on the substrate 21, a first nitride film 33B that is formed on the seventh SiO-based insulating film 37, and a first SiO-based insulating film 34B that is formed on the first nitride film 33B. The first nitride film 33B is preferably formed on substantially an entire area of the seventh SiO-based insulating film 37 upper surface. A film thickness of the seventh SiO-based insulating film 37 is, for example, approximately 6 μm. A film thickness of the first nitride film 33B is, for example, approximately 0.15 μm.

The first SiO-based insulating film 34B is formed in a region excluding a peripheral edge portion of the first nitride film 33B upper surface. A film thickness of the first SiO-based insulating film 34B is, for example, approximately 0.5 μm.

The resistor 23 is formed on the first SiO-based insulating film 34B. The resistor 23 is of a rectangular shape that is long in the X direction in plan view. In this preferred embodiment, the resistor 23 is constituted of CrSi.

The upper insulating film 24B includes an eighth SiO-based insulating film 41B that is formed on the first SiO-based insulating film 34B such as to cover the resistor 23 and a second nitride film 42B that is formed on the first nitride film 33B such as to cover the first SiO-based insulating film 34B, the resistor 23, the eighth SiO-based insulating film 41B, etc.

A film thickness of the eighth SiO-based insulating film 41B is approximately 0.3 μm. A first contact hole 71 arranged to expose a portion of an upper surface of a −X side end portion of the resistor 23 and a second contact hole 72 arranged to expose a portion of an upper surface of a +X side end portion of the resistor 23 are formed in the eighth SiO-based insulating film 41B.

The first lead-out electrode 73 and the second lead-out electrode 74 are formed on the eighth SiO-based insulating film 41B. The first lead-out electrode 73 is formed in a region that includes the −X side end portion of the resistor 23 in plan view. The second lead-out electrode 74 is formed in a region that includes the +X side end portion of the resistor 23 in plan view.

A portion of the first lead-out electrode 73 enters into the first contact hole 71 and is connected to the −X side end portion of the resistor 23 inside the first contact hole 71. A portion of the second lead-out electrode 74 enters into the second contact hole 72 and is connected to the +X side end portion of the resistor 23 inside the second contact hole 72. In this preferred embodiment, the first lead-out electrode 73 and the second lead-out electrode 74 are constituted of A1 (aluminum).

The second nitride film 42B is formed on the first nitride film 33B such as to cover exposed surfaces of the first lead-out electrode 73, the second lead-out electrode 74, the eighth SiO-based insulating film 41B, the first SiO-based insulating film 34B, and the first nitride film 33B. A film thickness of the second nitride film 42B is approximately 1 μm. A peripheral edge portion of a lower surface of the second nitride film 42B is joined to a peripheral edge portion of the upper surface of the first nitride film 33B.

A first opening 75 arranged to expose a portion of the upper surface of the first lead-out electrode 73 and a second opening 76 arranged to expose a portion of the upper surface of the second lead-out electrode 74 are formed in the second nitride film 42B. A first pad portion 73*a* that is exposed from the first opening 75 is thereby formed in the first lead-out electrode 73. Similarly, a second pad portion 74*a* that is exposed from the second opening 76 is formed in the second lead-out electrode 74.

The pad portions 73*a* and 74*a* are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

Even with the second modification example, the same effects as the first chip of FIG. 4 are obtained.

FIG. 9A to FIG. 9D are sectional views showing an example of a manufacturing process of the first chip 5B shown in FIG. 8 and are sectional views corresponding to the section plane of FIG. 8.

Figure 9A:
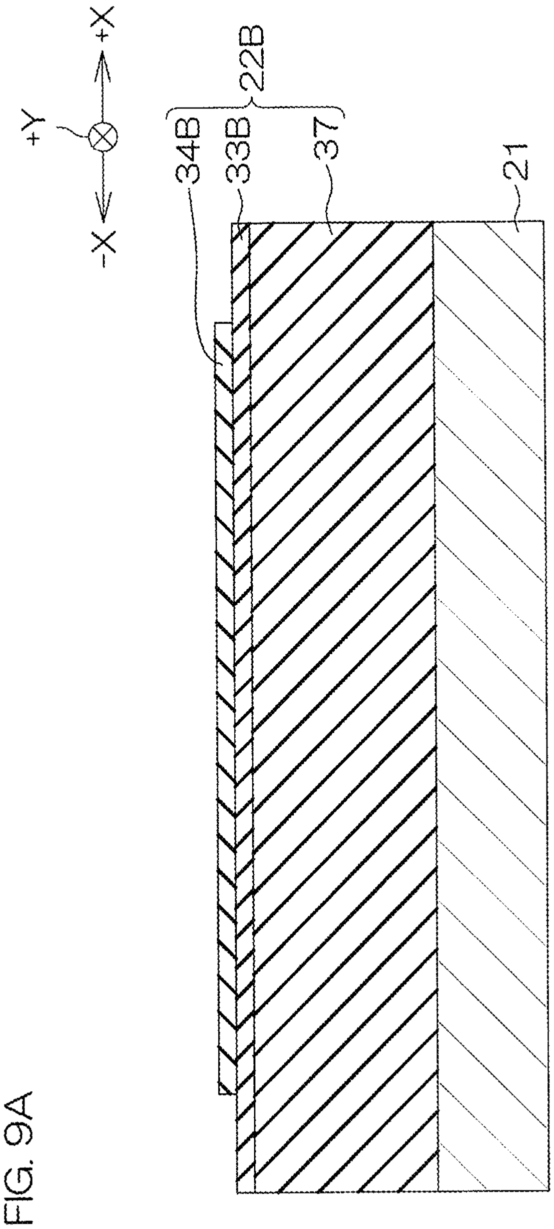
FIG. 9A is a sectional view showing a portion of a manufacturing process of the first chip shown in FIG. 3 and FIG. 8 and is a sectional view corresponding to the section plane of FIG. 8.

First, as shown in FIG. 9A, the seventh SiO-based insulating film 37 is formed on the substrate 21. Next, the first nitride film 33B is formed on the seventh SiO-based insulating film 37. Next, a material film of the first SiO-based insulating film 34B is formed on the first nitride film 33B. Then, by the material film of the first SiO-based insulating film 34B being patterned, a peripheral edge portion of the material film is removed. The lower insulating film 22B that is constituted of the seventh SiO-based insulating film 37, the first nitride film 33B, and the first SiO-based insulating film 34B is thereby obtained.

Figure 9B:
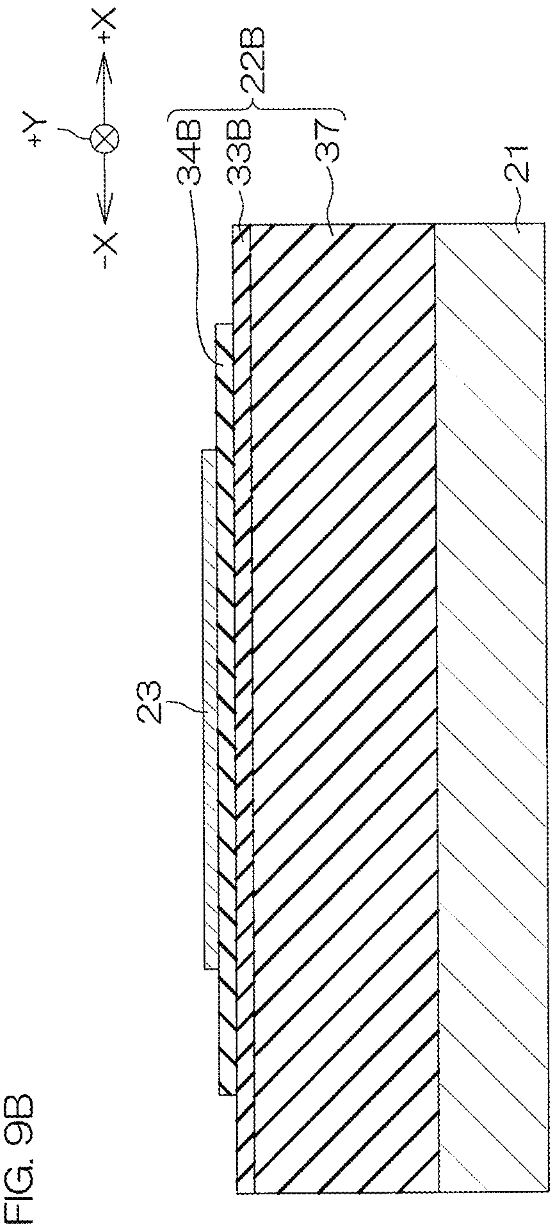
FIG. 9B is a sectional view showing a step subsequent to that of FIG. 9A.

Next, as shown in FIG. 9B, after a resistive material film that is a material film of the resistor 23 is formed on the first SiO-based insulating film 34B, the resistive material film is patterned to form the plurality of resistors 23 (the plurality of real resistors ra and the plurality of dummy resistors rb).

Figure 9C:
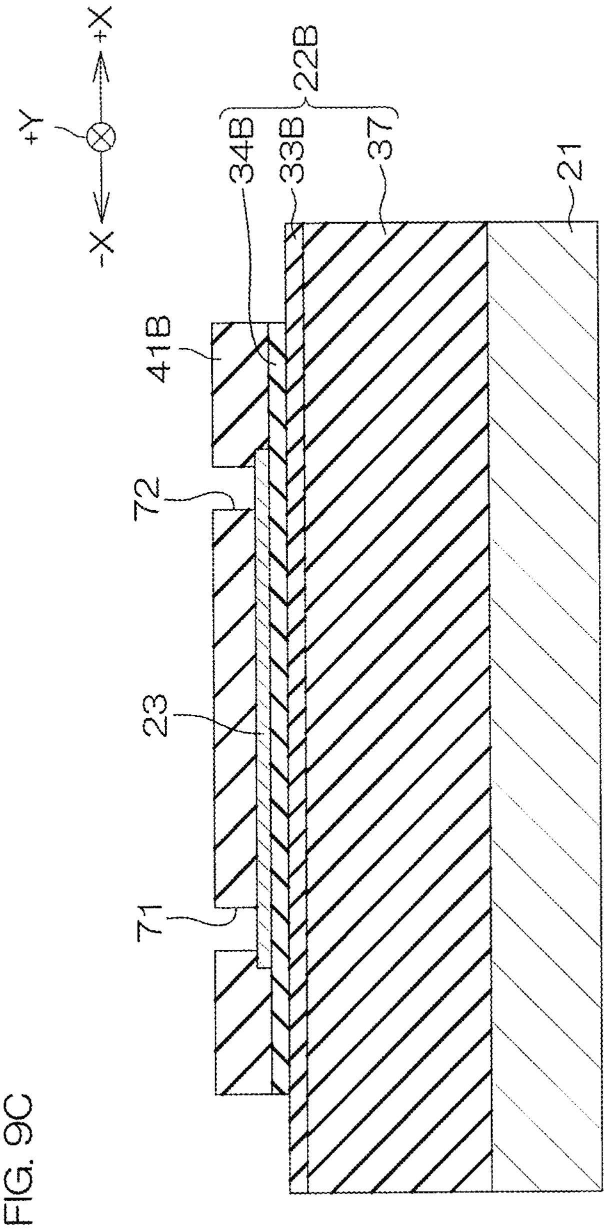
FIG. 9C is a sectional view showing a step subsequent to that of FIG. 9B.

Next, as shown in FIG. 9C, the eighth SiO-based insulating film 41B is formed on the first SiO-based insulating film 34B such as to cover the resistor 23. The first contact hole 71 that penetrates through the eighth SiO-based insulating film 41B and with which a lower end reaches the upper surface of the −X side end portion of the resistor 23 and the second contact hole 72 that penetrates through the eighth SiO-based insulating film 41B and with which a lower end reaches the upper surface of the +X side end portion of the resistor 23 are then formed in the eighth SiO-based insulating film 41B.

Figure 9D:
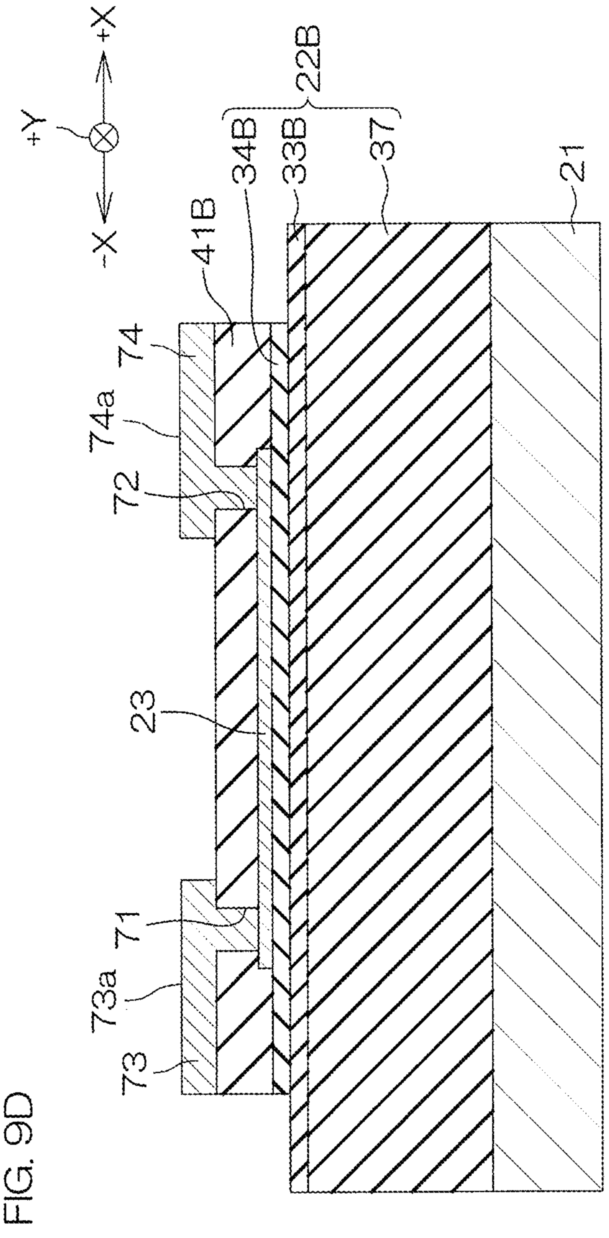
FIG. 9D is a sectional view showing a step subsequent to that of FIG. 9C.

Next, as shown in FIG. 9D, a metal film that is a material film of the first lead-out electrode 73 and the second lead-out electrode 74 is formed on the eighth SiO-based insulating film 41B. In this process, the metal film enters into the first contact hole 71 and the second contact hole 72. Thereafter, the metal film is patterned. The first lead-out electrode 73 and the second lead-out electrode 74 are thereby formed on the eighth SiO-based insulating film 41B.

Thereafter, the second nitride film 42B is formed on the first nitride film 33B such as to cover the exposed surfaces of the first lead-out electrode 73, the second lead-out electrode 74, the eighth SiO-based insulating film 41B, and the first SiO-based insulating film 34B. The first opening 75 that exposes a portion of the upper surface of the first lead-out electrode 73 and the second opening 76 that exposes a portion of the upper surface of the second lead-out electrode 74 are then formed in the second nitride film 42B. The first chip 5B such as shown in FIG. 3 and FIG. 8 is thereby obtained.

Figure 10:
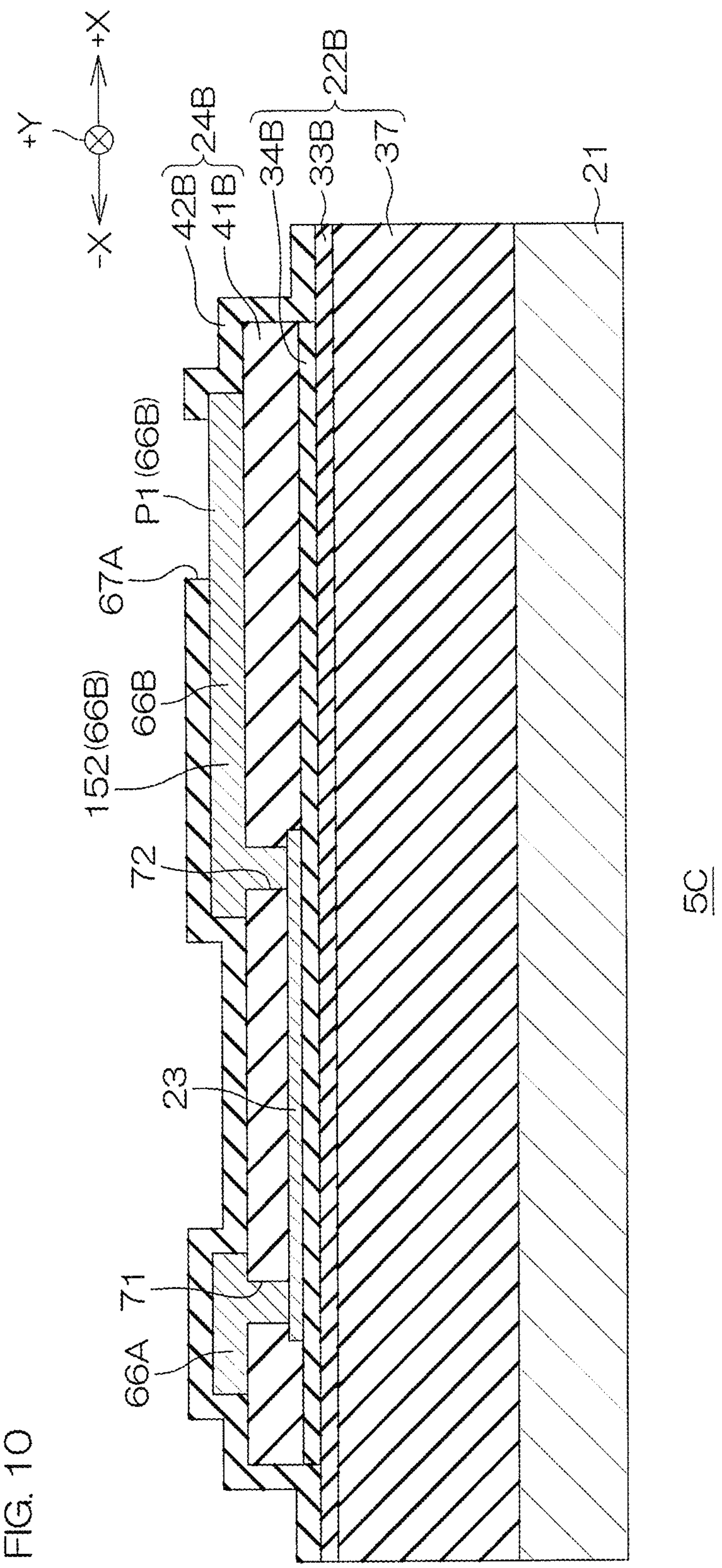
FIG. 10 is an illustrative sectional view for describing a third modification example of the first chip in the first disclosure.

FIG. 10 is a sectional view for describing the third modification example of the first chip and is a sectional view corresponding to FIG. 8. In FIG. 10, portions corresponding to respective portions in FIG. 8 are indicated with the same reference signs attached as in FIG. 8.

A first chip 5C of FIG. 10 has substantially the same arrangement as the first chip 5B of FIG. 8. In comparison to the first chip 5B of FIG. 8, the first chip 5C of FIG. 10 differs in the points that a first upper metal 66A is formed in place of the first lead-out electrode 73 and a second upper metal 66B is formed in place of the second lead-out electrode 74.

The first upper metal 66A and the second upper metal 66B are used to connect the real resistors ra to each other and to connect the real resistors ra to the terminals P1 to P6. Also, the first upper metal 66A and the second upper metal 66B may integrally include a wiring and a terminal. In the example of FIG. 10, the second upper metal 66B integrally includes the terminal P1 and the wiring 152. An opening 67A arranged to expose a portion of an upper surface of a portion of the second upper metal 66B that constitutes the terminal P1 is formed in the second nitride film 42B.

Figure 11:
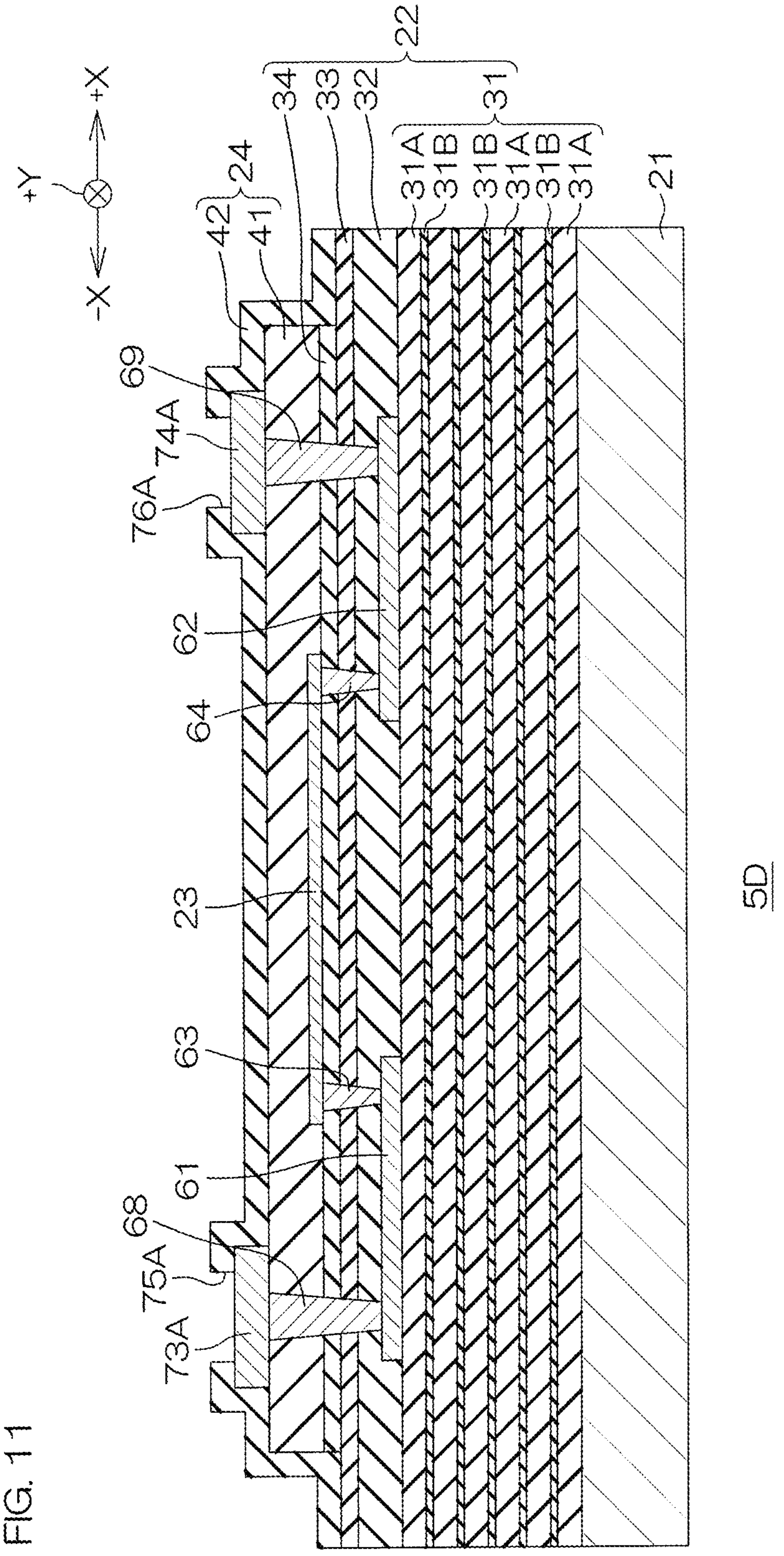
FIG. 11 is an illustrative sectional view for describing a fourth modification example of the first chip in the first disclosure.

FIG. 11 is a sectional view for describing the fourth modification example of the first chip and is a sectional view corresponding to FIG. 4. In FIG. 11, portions corresponding to respective portions in FIG. 4 are indicated with the same reference signs attached as in FIG. 4.

A first chip 5D of FIG. 11 has substantially the same arrangement as the first chip 5 of FIG. 4. In comparison to the first chip 5 of FIG. 4, the first chip 5D of FIG. 11 differs in the point that a first lead-out electrode 73A that is electrically connected to the first lower metal 61 via a fourth via 68 and a second lead-out electrode 74A that is electrically connected to the second lower metal 62 via a fifth via 69 are formed on the third SiO-based insulating film 41. In this case, the third via 65 and the upper metal 66 of FIG. 4 are not formed.

Also, in this case, an opening 75A arranged to expose a portion of an upper surface of the first lead-out electrode 73A and an opening 76A arranged to expose a portion of an upper surface of the second lead-out electrode 74A are formed in the second nitride film 42.

The first lead-out electrode 73A and the second lead-out electrode 74A are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

Figure 12:
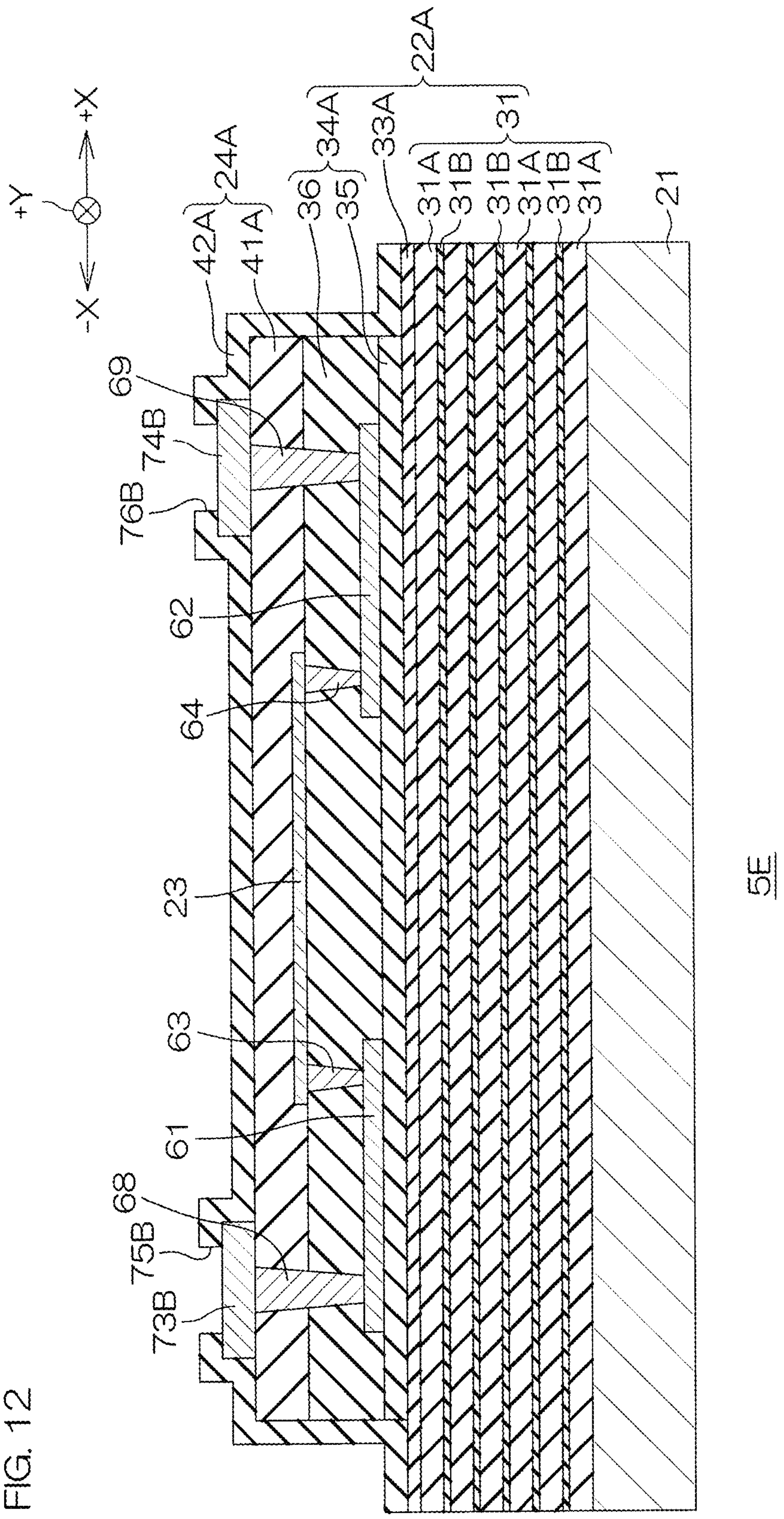
FIG. 12 is an illustrative sectional view for describing a fifth modification example of the first chip in the first disclosure.

FIG. 12 is a sectional view for describing the fifth modification example of the first chip and is a sectional view corresponding to FIG. 6. In FIG. 12, portions corresponding to respective portions in FIG. 6 are indicated with the same reference signs attached as in FIG. 6.

A first chip 5E of FIG. 12 has substantially the same arrangement as the first chip 5A of FIG. 6. In comparison to the first chip 5A of FIG. 6, the first chip 5E of FIG. 12 differs in the point that a first lead-out electrode 73B that is electrically connected to the first lower metal 61 via the fourth via 68 and a second lead-out electrode 74B that is electrically connected to the second lower metal 62 via the fifth via 69 are formed on the third SiO-based insulating film 41. In this case, the third via 65 and the upper metal 66 of FIG. 6 are not formed.

Also, in this case, an opening 75B arranged to expose a portion of an upper surface of the first lead-out electrode 73B and an opening 76B arranged to expose a portion of an upper surface of the second lead-out electrode 74B are formed in the second nitride film 42.

The first lead-out electrode 73B and the second lead-out electrode 74B are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

While the preferred embodiments of the first disclosure and the first to fifth modification examples of the first chip 5 of the first disclosure were described above, the first disclosure can be implemented in yet other preferred embodiments.

For example, although in the preferred embodiments of the first disclosure and the first to fifth modification examples of the first chip 5 of the first disclosure described above, $SiO_2$ films are used as the "SiO-based insulating films," SiON films and other SiO-based insulating films besides $SiO_2$ films may be used instead as the "SiO-based insulating films." Also, although in the preferred embodiments of the first disclosure and the first to fifth modification examples of the first chip 5 of the first disclosure, SiN films are used as the "nitride films," nitride films besides SiN films may be used instead.

Also, although in the first chips 5 and 5A to 5E of the first disclosure described above, the dummy resistors rb (see FIG. 3) are provided, the dummy resistors rb do not have to be provided.

Also, an arrangement pattern of the resistors r shown in FIG. 3 is one example and the arrangement pattern of the resistors r may be an arrangement pattern besides that of FIG. 3.

[2] On the Second Disclosure

A second disclosure shall now be described with reference to FIG. 1 to FIG. 3 and FIG. 13 to FIG. 25. Reference signs indicated in FIG. 13 to FIG. 25 are unrelated to the reference signs indicated in FIG. 4 to FIG. 12.

An object of the second disclosure is to provide a semiconductor device that includes a resistor and is a semiconductor device having a novel arrangement and enabling improvement of moisture resistance and a method for manufacturing the same.

[Arrangement of the Second Disclosure]

[A1] A semiconductor device including
- a substrate,
- a lower insulating film that is formed on the substrate,
- a resistor that is formed on the lower insulating film,
- an intermediate insulating film that is formed on the lower insulating film such as to cover the resistor, and
- an upper insulating film that is formed on the intermediate insulating film and
- where the lower insulating film includes a first nitride film,
- the intermediate insulating film includes a second nitride film,
- the upper insulating film includes a first SiO-based insulating film and a third nitride film that is disposed on the first SiO-based insulating film, and
- the resistor is surrounded by the first nitride film and the second nitride film.

With this arrangement, a semiconductor device that includes a resistor and is a semiconductor device having a novel arrangement and enabling improvement of moisture resistance can be obtained.

[A2] The Semiconductor Device According to [A1] where the lower insulating film includes
- an insulating film laminated structure that is formed on the substrate and in which a nitride film and an SiO-based insulating film are laminated alternately,
- a second SiO-based insulating film that is formed on the insulating film laminated structure, and
- the first nitride film that is formed on the second SiO-based insulating film, and
- the resistor is formed on the first nitride film.

[A3] The Semiconductor Device According to [A2] including a first metal and a second metal that are formed on the insulating film laminated structure, a first via that penetrates through a laminated film of the second SiO-based insulating film and the first nitride film and electrically connects the first metal and one end portion of the resistor, and a second via that penetrates through the laminated film and electrically connects the second metal and another end portion of the resistor.

[A4] The semiconductor device according to [A3] where the intermediate insulating film includes the second nitride film that is formed on the first nitride film such as to cover the resistor.

[A5] The semiconductor device according to [A4] where the upper insulating film includes the first SiO-based insulating film that is formed on the second nitride film and a protective film that is disposed on the first SiO-based insulating film and includes the third nitride film and the semiconductor device includes a third metal that is formed on the first SiO-based insulating film and is a third metal electrically connected to the first metal or the second metal via a third via that penetrates through a laminated film of the second SiO-based insulating film, the first nitride film, the second nitride film, and the first SiO-based insulating film.

[A6] The semiconductor device according to [A5] where an opening that exposes a portion of an upper surface of the third metal is formed in the protective film.

[A7] The semiconductor device according to any one of [A2] to [A6] where a third SiO-based insulating film is interposed between a lower surface of the resistor and an upper surface of the first nitride film.

[A8] The semiconductor device according to any one of [A4] to [A7] where an SiO-based insulating film differing from the first, second, and third SiO-based insulating films is interposed between an upper surface of the resistor and a lower surface of the second nitride film.

[A9] The semiconductor device according to [A1] where the lower insulating film includes an insulating film laminated structure that is formed on the substrate and in which a nitride film and an SiO-based insulating film are laminated alternately, the first nitride film that is formed on the insulating film laminated structure, and a fourth SiO-based insulating film that is interposed between a lower surface of the resistor and an upper surface of the first nitride film.

[A10] The semiconductor device according to [A9] including a first metal and a second metal that are formed on the first nitride film, a first via that penetrates through the fourth SiO-based insulating film and electrically connects the first metal and one end portion of the resistor, and a second via that penetrates through the fourth SiO-based insulating film and electrically connects the second metal and another end portion of the resistor.

[A11] The semiconductor device according to [A10] where the intermediate insulating film includes the second nitride film that is formed on the first nitride film such as to cover exposed surfaces of a laminated body of the fourth SiO-based insulating film and the resistor, the first metal, the second metal, and the first nitride film.

[A12] The semiconductor device according to [A11] where the upper insulating film includes the first SiO-based insulating film that is formed on the second nitride film and a protective film that is disposed on the first SiO-based insulating film and includes the third nitride film and the semiconductor device includes a third metal that is formed on the first SiO-based insulating film and is a third metal electrically connected to the first metal or the second metal via a third via that penetrates through a laminated film of the second nitride film and the first SiO-based insulating film.

[A13] The semiconductor device according to [A12] where an opening that exposes a portion of an upper surface of the third metal is formed in the protective film.

[A14] The semiconductor device according to any one of [A11] to [A13] where an SiO-based insulating film differing from the first, second, third, and fourth SiO-based insulating films is interposed between an upper surface of the resistor and a lower surface of the second nitride film.

[A15] The semiconductor device according to [A1] where the lower insulating film includes a fifth SiO-based insulating film that is formed on the substrate and the first nitride film that is formed on the fifth SiO-based insulating film, and the resistor is formed on the first nitride film.

[A16] The semiconductor device according to [A15] where the intermediate insulating film includes the second nitride film that is formed on the first nitride film such as to cover the resistor.

[A17] The semiconductor device according to [A16] where the upper insulating film includes the first SiO-based insulating film that is formed on the second nitride film and the third nitride film that is formed on the first SiO-based insulating film, the semiconductor device includes a first lead-out electrode that is formed on the first SiO-based insulating film and is electrically connected to one end portion of the resistor and a second lead-out electrode that is formed on the first SiO-based insulating film and is electrically connected to another end portion of the resistor, the third nitride film is formed on the first SiO-based insulating film such as to cover the first lead-out electrode and the second lead-out electrode, and a first opening that exposes a portion of an upper surface of the first lead-out electrode and a second opening that exposes a portion of an upper surface of the second lead-out electrode are formed in the third nitride film.

[A18] The semiconductor device according to [A16] or [A17] where a sixth SiO-based insulating film is interposed between a lower surface of the resistor and an upper surface of the first nitride film.

[A19] A method for manufacturing a semiconductor device including a step of forming a lower insulating film, including a first nitride film, on a substrate, a step of forming a resistor on the lower insulating film, a step of forming an intermediate insulating film, including a second nitride film, on the lower insulating film such as to cover the resistor, and a step of forming an upper insulating film, including a first SiO-based insulating film and a third nitride film formed on the first SiO-based insulating film, on the intermediate insulating film and where, in the step of forming the intermediate insulating film, the resistor is surrounded by the first nitride film and the second nitride film.

With this manufacturing method, a semiconductor device that includes a resistor and is a semiconductor device having a novel arrangement and enabling improvement of moisture resistance can be manufactured.

Detailed Description of Preferred Embodiments of the Second Disclosure

In the following, preferred embodiments of the second disclosure shall be described in detail based on FIG. 1 to FIG. 3 and FIG. 13 to FIG. 25.

FIG. 1 is an illustrative plan view showing a semiconductor device according to a preferred embodiment of the present invention. FIG. 2 is a schematic view mainly showing the general electrical arrangement of a first chip and the general electrical arrangement of a second chip. FIG. 3 is an illustrative plan view of the first chip.

Since FIG. 1 to FIG. 3 are the same as FIG. 1 to FIG. 3 of the first disclosure, description thereof shall be omitted.

Figure 13:
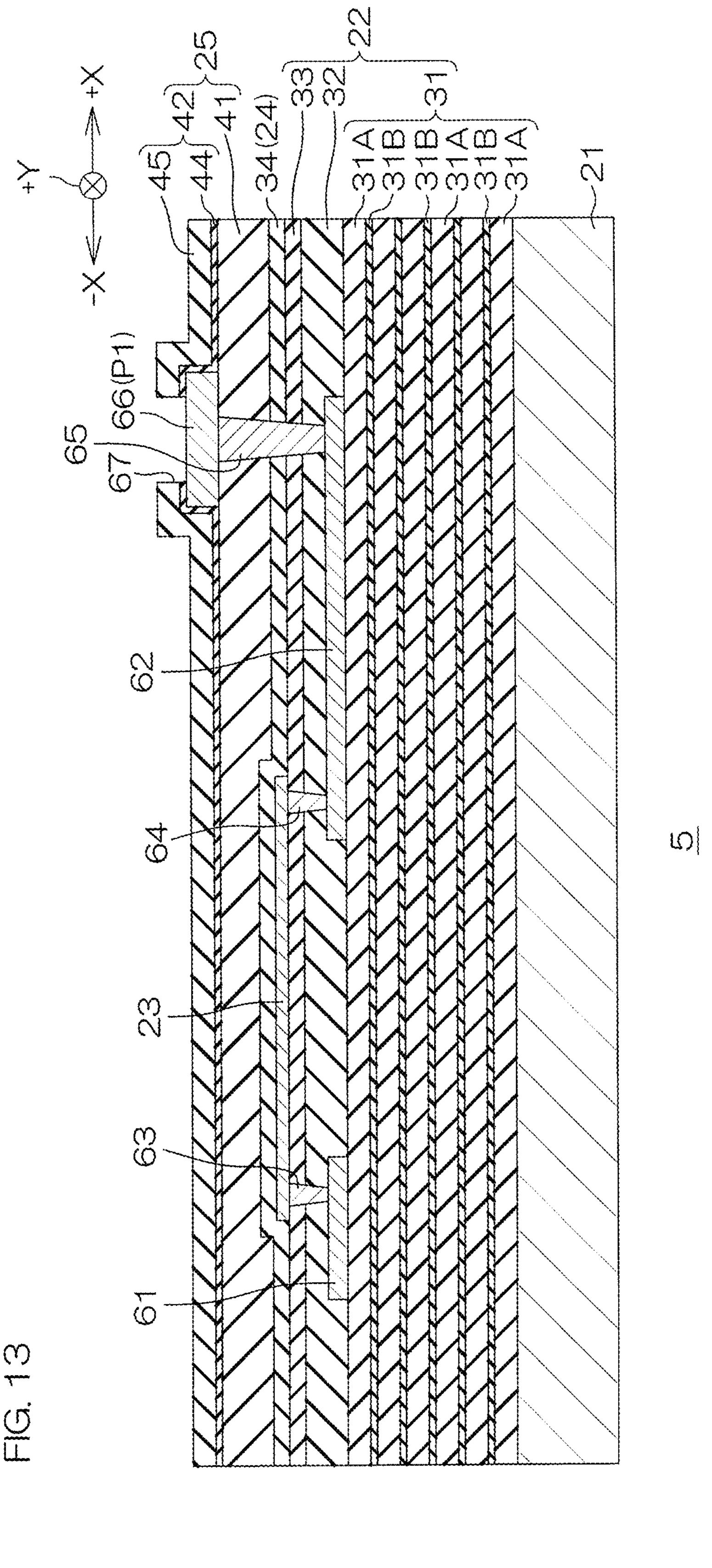
FIG. 13 is a sectional view taken along line A-A of FIG. 3 in the second disclosure.

FIG. 13 is a sectional view taken along line A-A of FIG. 3.

A sectional structure of the first chip 5 shall be described.

The first chip 5 includes a substrate 21, a lower insulating film 22 that is formed on the substrate 21, a resistor 23 that is formed on the lower insulating film 22 and constitutes a resistor r, an intermediate insulating film 24 that is formed on the lower insulating film 22 such as to cover the resistor 23, and an upper insulating film 25 that is formed on the intermediate insulating film 24.

Further, the first chip 5 includes a first lower metal 61 and a second lower metal 62 that are disposed inside the lower insulating film 22 and an upper metal 66 that is disposed inside the upper insulating film 25. However, a portion of an upper surface of the upper metal 66 is exposed from the upper insulating film 25.

The substrate 21 is constituted, for example, of an Si substrate. A film thickness of the substrate 21 is, for example, approximately 300 μm.

The lower insulating film 22 includes an insulating film laminated structure 31 that is formed on the substrate 21, a second SiO-based insulating film 32 that is formed on the insulating film laminated structure 31, and a first nitride film 33 that is formed on the second SiO-based insulating film 32.

In this preferred embodiment and in modification examples 5A to 5H of the first chip 5 to be described below, $SiO_2$ is used as the "SiO-based insulating film." Also, in this preferred embodiment and in the modification examples 5A to 5H of the first chip 5 to be described below, an SiN film is used as the "nitride film."

The insulating film laminated structure 31 has a structure in which a first insulating film 31A constituted of an SiO-based insulating film and a second insulating film 31B constituted of a nitride film having tensile stress are laminated alternately. The number of laminated layers of the first insulating film 31A and the second insulating film 31B may be any number and may differ from the number of laminated layers shown in FIG. 13. The two types of insulating films 31A and 31B are laminated to control warping of the substrate 21, caused by film-forming of the first insulating film 31A, by film-forming of the second insulating film 31B and film-form the insulating film thickly.

A film thickness of the first insulating film 31A is, for example, approximately 2 μm and a film thickness of the second insulating film 31B is, for example, approximately 0.3 μm. A thickness of the insulating film laminated structure 31 is, for example, approximately 13.5 μm.

A plurality of lower metals 61 and 62 are disposed on the insulating film laminated structure 31. In the example of FIG. 13, the lower metals 61 and 62 include the first lower metal 61 that is disposed close to a −X side end and the second lower metal 62 that is disposed at a +X side with respect to the first lower metal 61. In this preferred embodiment, the lower metals 61 and 62 are constituted of Al (aluminum). The lower metals 61 and 62 are used to electrically connect the real resistors ra to each other and to connect the real resistors ra to the terminals P1 to P6.

The second SiO-based insulating film 32 is formed on the insulating film laminated structure 31 such as to cover the lower metals 61 and 62. Also, the first nitride film 33 is formed on the second SiO-based insulating film 32. The first nitride film 33 is preferably formed on substantially an entire area of the second SiO-based insulating film 32 upper surface. A film thickness of the second SiO-based insulating film 32 is approximately 0.8 μm. A film thickness of the first nitride film 33 is approximately 0.15 μm.

The resistor 23 is formed on the first nitride film 33. The resistor 23 is of a rectangular shape that is long in the X direction in plan view. The resistor 23 is disposed such as to extend across the first lower metal 61 and the second lower metal 61 in plan view. In this preferred embodiment, the resistor 23 is constituted of Crsi.

A −X side end portion of a lower surface of the resistor 23 is electrically connected to the first lower metal 61 via a first via 63 that penetrates continuously through the first nitride film 33 and the second SiO-based insulating film 32. A +X side end portion of the lower surface of the resistor 23 is electrically connected to a −X side end portion of the second lower metal 62 via a second via 64 that penetrates continuously through the first nitride film 33 and the second SiO-based insulating film 32. In this preferred embodiment, the first via 63 and the second via 64 are constituted of W (tungsten).

The intermediate insulating film 24 is constituted of a second nitride film 34 that is formed on the first nitride film 33 such as to cover the resistor 23. The second nitride film 34 covers exposed surfaces of the resistor 23 and an exposed surface of an upper surface of the first nitride film 33. A lower surface of the second nitride film 34 is thus joined to an upper surface of the first nitride film 33 except at a portion covering the resistor 23. A film thickness of the second nitride film 34 is approximately 0.15 μm.

The upper insulating film 25 includes a first SiO-based insulating film 41 that is formed on the second nitride film 34 and a protective film 42 that is formed on the first SiO-based insulating film 41.

A film thickness of the first SiO-based insulating film 41 is approximately 0.4 μm. The upper metal 66 is formed on the first SiO-based insulating film 41. In this preferred embodiment and in the first and second modification examples 5A and 5B (see FIG. 15 and FIG. 17) of the first chip 5 to be described below, each upper metal 66 includes any of the terminals P1 to P6 (see FIG. 3). There are cases where the upper metal 66 includes just a terminal and cases where it integrally includes a terminal and a wiring. The upper metal 66 appearing in FIG. 13 includes just the terminal P1. In other words, the upper metal 66 appearing in FIG. 13 constitutes the terminal P1.

In addition, although not appearing in FIG. 13, there are also portions where an upper metal is connected to the first lower metal 61 via an unillustrated via. As such an upper metal, there is an upper metal that constitutes the wiring 154 and the terminal P4 in FIG. 3 and an upper metal that constitutes the wiring 159 and the terminal P5 in FIG. 3.

The upper metal 66 shown in FIG. 13 is disposed such that a portion overlaps with a +X side end portion of the second lower metal 62 in plan view. The upper metal 66 is electrically connected to the +X side end portion of the second lower metal 62 via a third via 65 that penetrates continuously through the first SiO-based insulating film 41, the second nitride film 34, the first nitride film 33, and the second SiO-based insulating film 32. In this preferred embodiment, the third via 65 is constituted of W (tungsten). The second lower metal 62 and the third via 65 shown in FIG. 13 constitute the wiring 152 (see FIG. 3).

The protective film 42 is formed on the first SiO-based insulating film 41 such as to cover the upper metal 66. The protective film 42 is constituted of a laminated film of a protective SiO-based insulating film 44 that is a lower layer and a third nitride film 45 that is an upper layer. A film thickness of the protective SiO-based insulating film 44 is approximately 1 μm. A film thickness of the third nitride film 45 is approximately 1.2 μm. Also, the protective film 42 may be constituted of just the third nitride film 45.

An opening 67 arranged to expose a portion of the upper surface of the upper metal 66 is formed in the protective film 42. A pad portion arranged to connect wirings to the terminals P1 to P6 is formed by the opening.

With this preferred embodiment, improvement of moisture resistance is enabled because all resistors 23 are surrounded according to each resistor 23 by the first nitride film 33 and the second nitride film 34.

With this preferred embodiment, there is a possibility that resistance characteristics of the resistors r will vary due to process variation when the first chip 5 is manufactured. The process variation tends to occur in a stepwise manner along one direction, for example, the −Y direction or the +Y direction.

With this preferred embodiment, a real resistor set that constitutes the second resistor circuit 122 is disposed between two real resistors ra adjacent in the Y direction among a real resistor set that constitutes the first resistor circuit 121. Thereby, a difference is made unlikely to arise between an average value of resistance values of the real resistors ra inside the first resistor circuit 121 and an average value of resistance values of the real resistors ra inside the second resistor circuit 122. Consequently, an error is made unlikely to arise in the ratio (R2/R1) of the resistance value R2 of the second resistor circuit 122 with respect to the resistance value R1 of the first resistor circuit 121.

Similarly, with this preferred embodiment, a real resistor set that constitutes the third resistor circuit 123 is disposed between two real resistors ra adjacent in the Y direction among a real resistor set that constitutes the fourth resistor circuit 124. Thereby, a difference is made unlikely to arise between an average value of resistance values of the real resistors ra inside the fourth resistor circuit 124 and an average value of resistance values of the real resistors ra inside the third resistor circuit 123. Consequently, an error is made unlikely to arise in the ratio (R3/R4) of the resistance value R3 of the third resistor circuit 123 with respect to the resistance value R4 of the fourth resistor circuit 124.

As mentioned above, when the second resistor circuit 122 is disposed as in the preferred embodiment, a high voltage difference is generated between the second resistor circuit 122 and the real resistors ra adjacent thereto of the first resistor circuit 121. Also, when the third resistor circuit 123 is disposed as in the preferred embodiment, a high voltage difference is generated between the third resistor circuit 123 and the real resistors ra adjacent thereto of the fourth resistor circuit 124. However, in the preferred embodiment, the dummy resistors rb are disposed at the locations at which the high voltage differences are generated and therefore, the electric fields at the locations at which the high voltage differences are generated can be relaxed.

In addition, in FIG. 13, an SiO-based insulating film may be formed between an upper surface of the resistor 23 and the second nitride film 34.

FIG. 14A to FIG. 14E are sectional views showing an example of a manufacturing process of the first chip 5 shown in FIG. 3 and FIG. 13 and are sectional views corresponding to the section plane of FIG. 13.

Figure 14A:
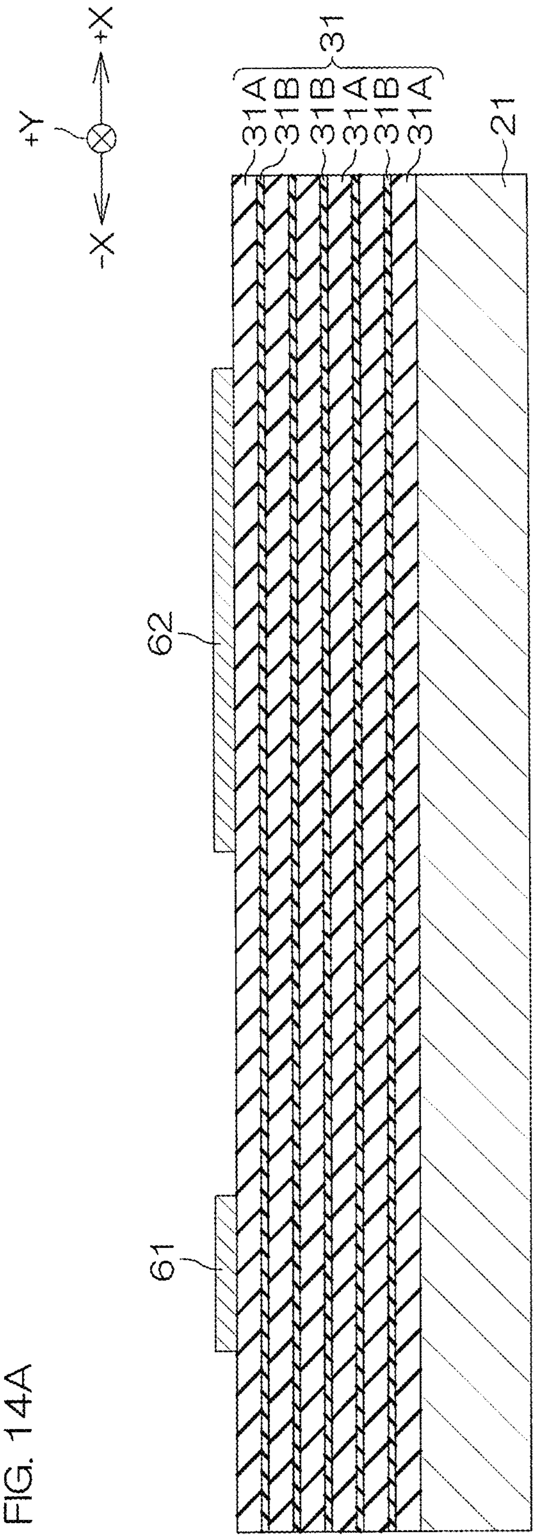
FIG. 14A is a sectional view showing a portion of a manufacturing process of the first chip in the second disclosure shown in FIG. 3 and FIG. 13 and is a sectional view corresponding to the section plane of FIG. 13.

First, as shown in FIG. 14A, the insulating film laminated structure 31 is formed by alternately laminating the first insulating film 31A and the second insulating film 31B on the substrate 21. Then, after forming a metal film (an Al film in this preferred embodiment) that is a material film of the first lower metal 61 and the second lower metal 62 on the insulating film laminated structure 31, the metal film is patterned. The first lower metal 61 and the second lower metal 62 are thereby formed on the insulating film laminated structure 31.

Figure 14B:
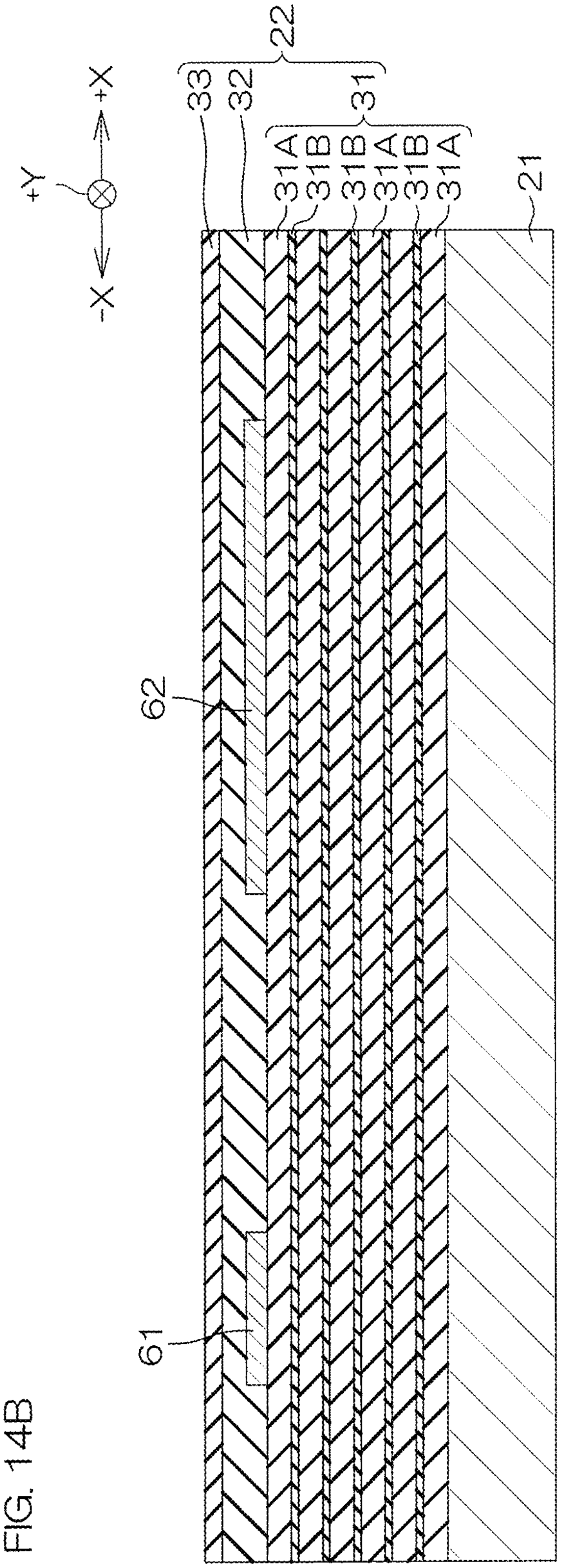
FIG. 14B is a sectional view showing a step subsequent to that of FIG. 14A.

Next, as shown in FIG. 14B, the second SiO-based insulating film 32 is formed on the insulating film laminated structure 31 such as to cover the first lower metal 61 and the second lower metal 62. The first nitride film 33 is then formed on the second SiO-based insulating film 32. The lower insulating film 22 that is constituted of the insulating film laminated structure 31, the second SiO-based insulating film 32, and the first nitride film 33 is thereby obtained.

Figure 14C:
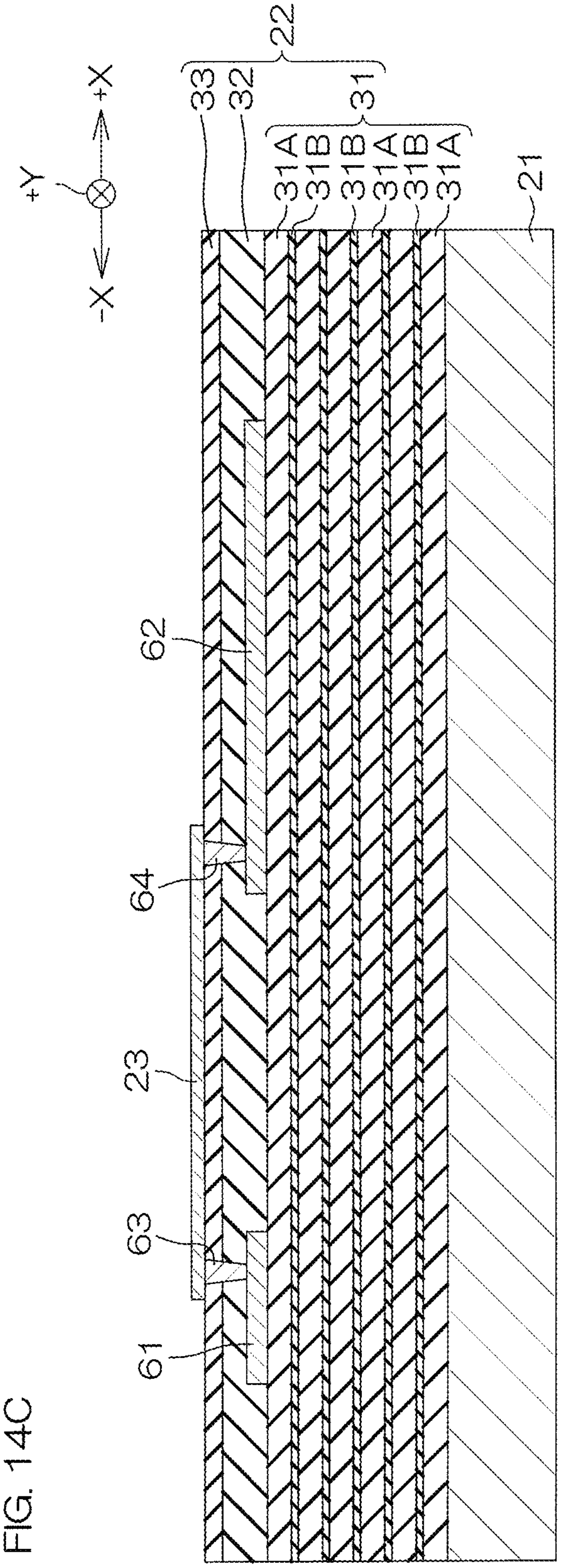
FIG. 14C is a sectional view showing a step subsequent to that of FIG. 14B.

Next, in a laminated film of the second SiO-based insulating film 32 and the first nitride film 33, the first via 63 and the second via 64 that penetrate through the laminated film and with which lower ends reach the first lower metal 61 and the second lower metal 62 are formed as shown in FIG. 14C. Then, after a resistive material film that is a material film of the resistor 23 is formed on the first nitride film 33, the resistive material film is patterned to form a plurality of resistors 23 (the plurality of real resistors ra and the plurality of dummy resistors rb). Upper ends of the first via 63 and the second via 64 are thereby connected to the resistor 23.

Figure 14D:
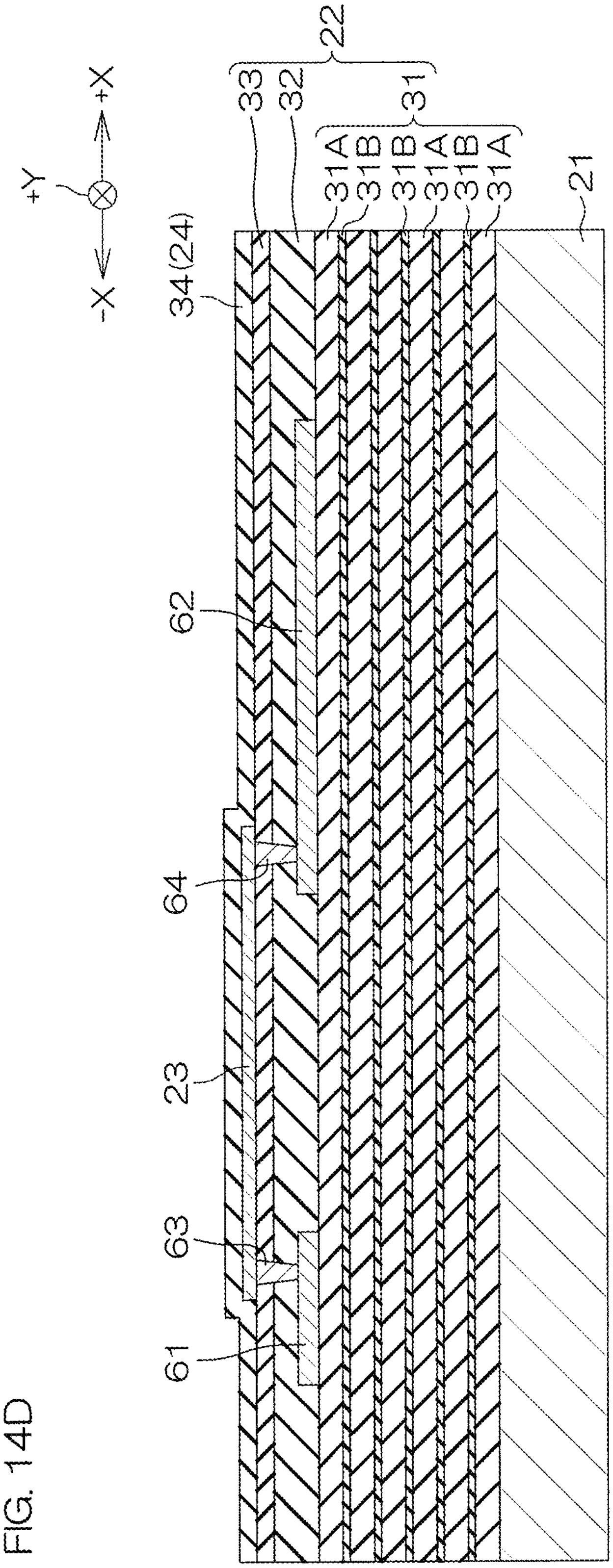
FIG. 14D is a sectional view showing a step subsequent to that of FIG. 14C.

Next, as shown in FIG. 14D, the second nitride film 34 (intermediate insulating film 24) is formed on the first nitride film 33 such as to cover the resistor 23.

Figure 14E:
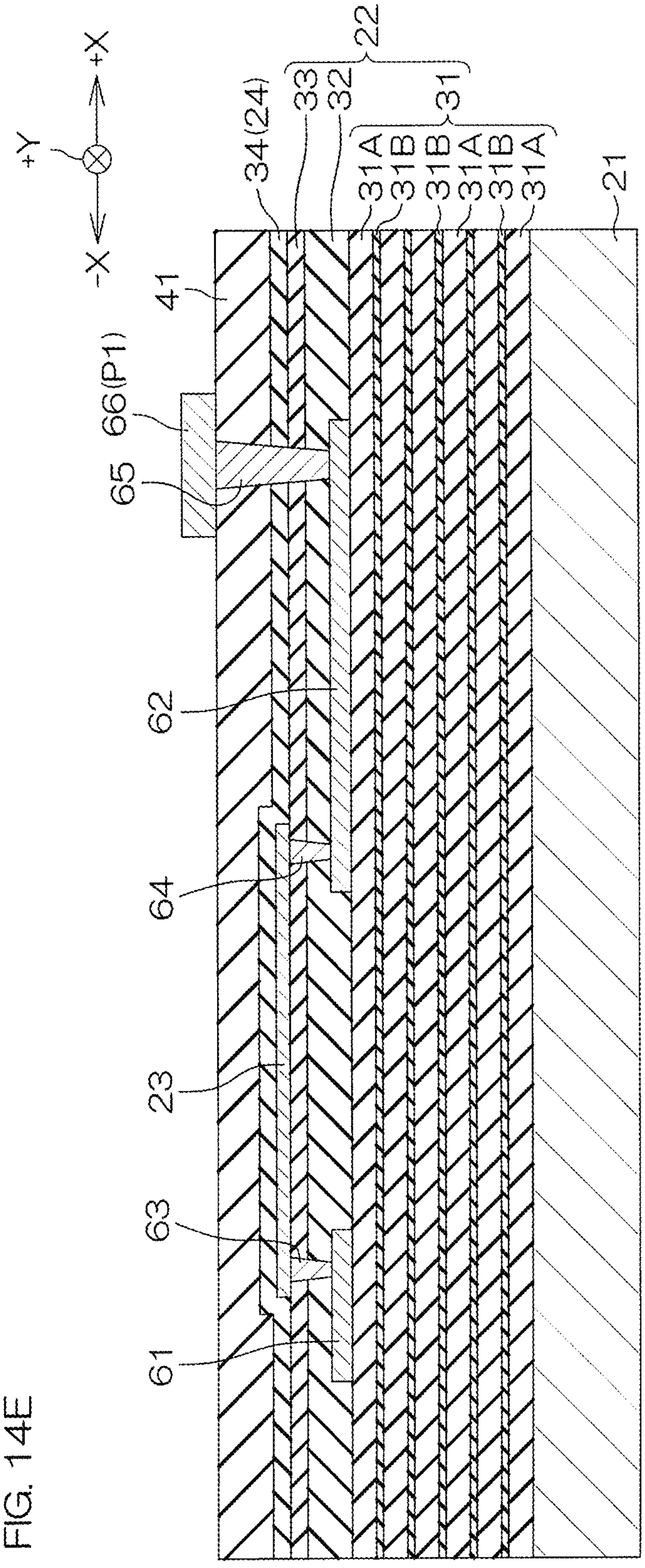
FIG. 14E is a sectional view showing a step subsequent to that of FIG. 14D.

Next, as shown in FIG. 14E, the first SiO-based insulating film 41 is formed on the second nitride film 34. Then, in a laminated film of the second SiO-based insulating film 32, the first nitride film 33, the second nitride film 34, and the first SiO-based insulating film 41, the third via 65 that penetrates through the laminated film and with which a lower end reaches the second lower metal 62 is formed. Then, after a metal film that is a material film of the upper metal 66 is formed on the first SiO-based insulating film 41, the metal film (an Al film in this preferred embodiment) is patterned. The upper metal 66 is thereby formed on the first SiO-based insulating film 41. An upper end of the third via 65 is thereby connected to the upper metal 66.

Thereafter, the protective film 42 is formed on the first SiO-based insulating film 41 such as to cover the upper metal 66. The opening 67 that exposes a portion of the upper surface of the upper metal 66 is then formed in the protective film 42. The first chip 5 such as shown in FIG. 3 and FIG. 13 is thereby obtained.

Figure 15:
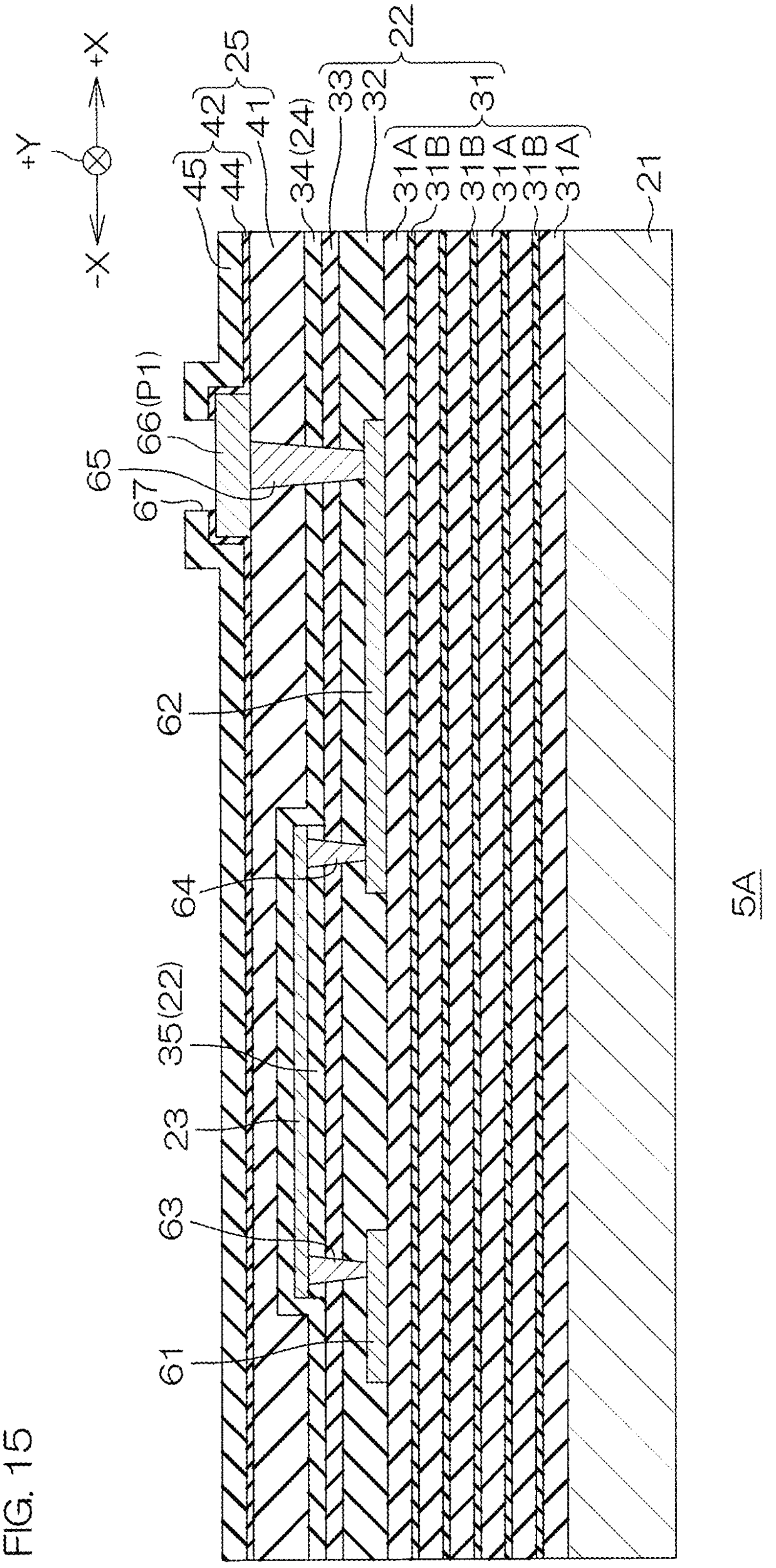
FIG. 15 is an illustrative sectional view for describing a first modification example of the first chip in the second disclosure.

FIG. 15 is a sectional view for describing the first modification example of the first chip and is a sectional view corresponding to FIG. 13. In FIG. 15, portions corresponding to respective portions in FIG. 13 are indicated with the same reference signs attached as in FIG. 13.

A plan view of a first chip 5A of FIG. 15 is the same as FIG. 3. With the first chip 5A of FIG. 15, a third SiO-based insulating film 35 is interposed between the lower surface of the resistor 23 and the first nitride film 33. A film thickness of the third SiO-based insulating film 35 is approximately 0.15 μm.

With the first chip 5A of FIG. 15, the lower insulating film 22 is constituted of the insulating film laminated structure 31, the second SiO-based insulating film 32 that is formed on the insulating film laminated structure 31, the first nitride film 33 that is formed on the second SiO-based insulating film 32, and the third SiO-based insulating film 35 that is formed selectively on the first nitride film 33.

With the first chip 5A of FIG. 15, the first via 63 and the second via 64 penetrate through a laminated film of the second SiO-based insulating film 32, the first nitride film 33, and the third SiO-based insulating film 35.

Even with the first modification example, the same effects as the preferred embodiment described above are obtained.

In FIG. 15, the protective film 42 may be constituted of just the third SiO-based insulating film 45. Also, in FIG. 15, an SiO-based insulating film may be formed between an upper surface of the resistor 23 and the second nitride film 34.

FIG. 16A to FIG. 16D are sectional views showing an example of a manufacturing process of the first chip 5A shown in FIG. 3 and FIG. 15 and are sectional views corresponding to the section plane of FIG. 15.

To manufacture the first chip 5A, the same step as the step of FIG. 14A is performed.

Figure 16A:
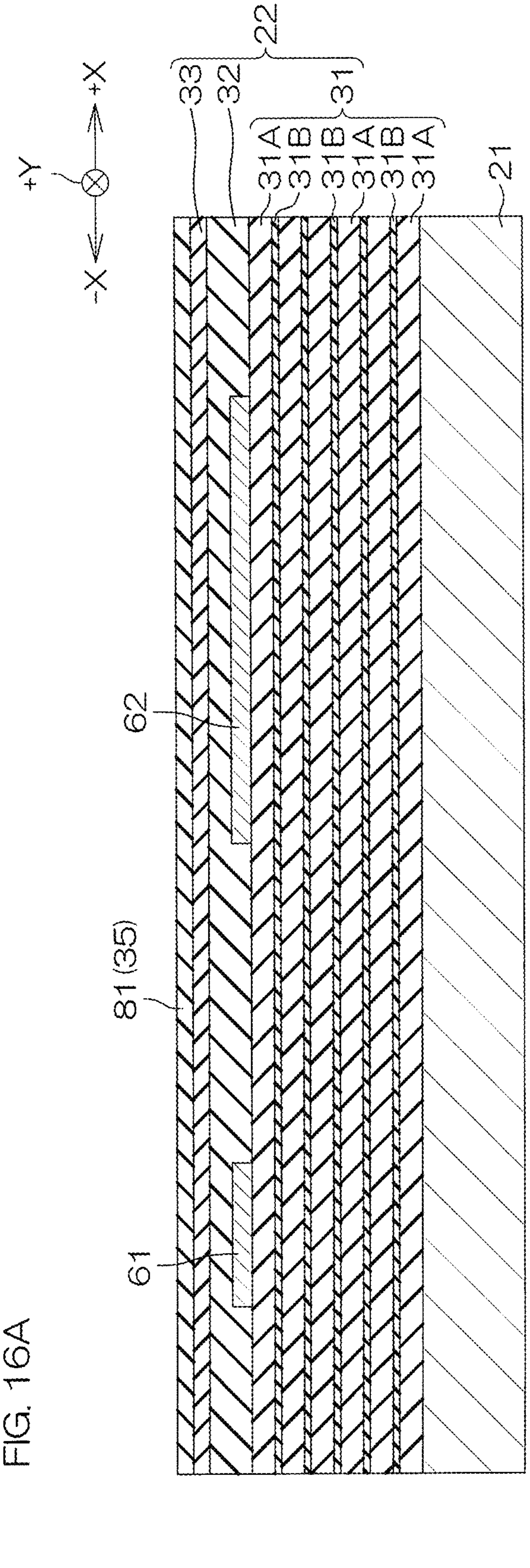
FIG. 16A is a sectional view showing a portion of a manufacturing process of the first chip shown in FIG. 3 and FIG. 15 and is a sectional view corresponding to the section plane of FIG. 15.

Next, as shown in FIG. 16A, the second SiO-based insulating film 32 is formed on the insulating film laminated structure 31 such as to cover the first lower metal 61 and the second lower metal 62. The first nitride film 33 is then formed on the second SiO-based insulating film 32. Also, an SiO-based material film 81 that is a material film of the third SiO-based insulating film 35 is formed on an entire area of the first nitride film 33 upper surface.

Figure 16B:
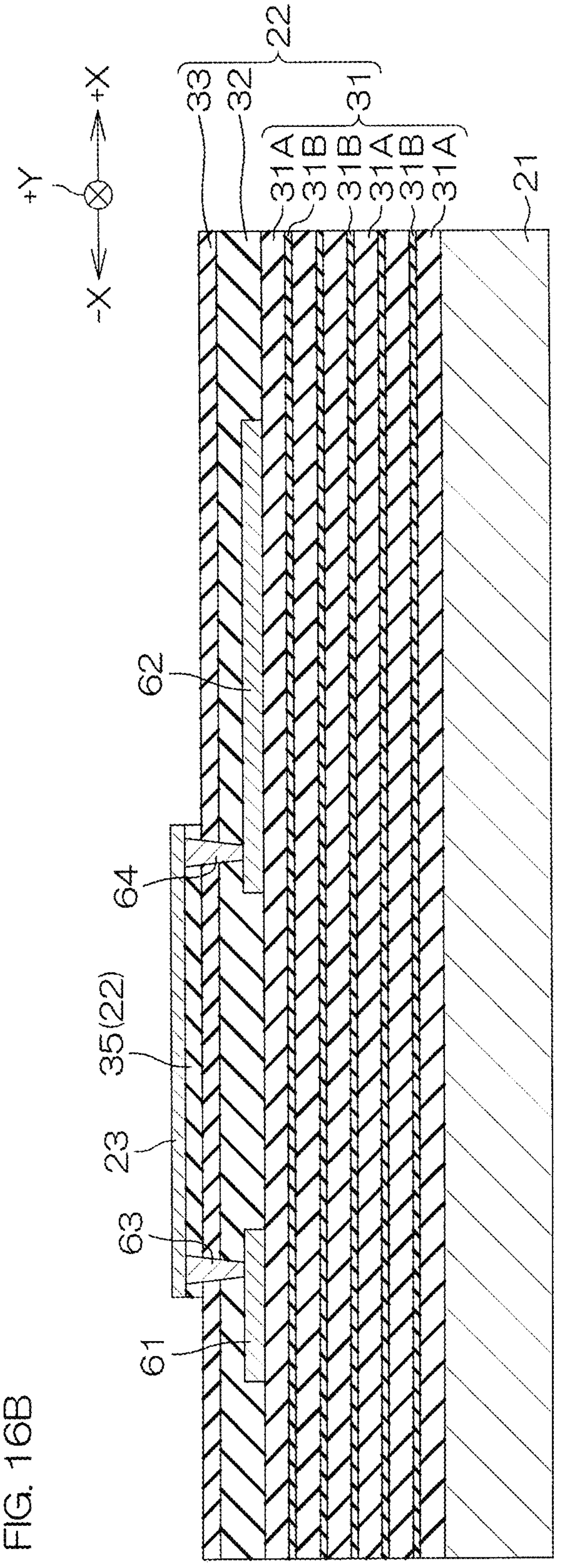
FIG. 16B is a sectional view showing a step subsequent to that of FIG. 16A.

Next, in a laminated film of the second SiO-based insulating film 32, the first nitride film 33, and the SiO-based material film 81, the first via 63 and the second via 64 that penetrate through the laminated film and with which the lower ends reach the first lower metal 61 and the second lower metal 62, respectively, are formed as shown in FIG. 16B. A resistive material film that is a material film of the resistor 23 is then formed on the SiO-based material film 81.

Thereafter, by patterning of the resistive material film and the SiO-based material film 81, a plurality of laminated bodies constituted of the third SiO-based insulating film 35 and resistors 23 formed thereon are formed. The upper ends of the first via 63 and the second via 64 are thereby connected to the resistor 23. The lower insulating film 22 that is constituted of the insulating film laminated structure 31, the second SiO-based insulating film 32, the first nitride film 33, and the third SiO-based insulating film 35 is thereby obtained.

Figure 16C:
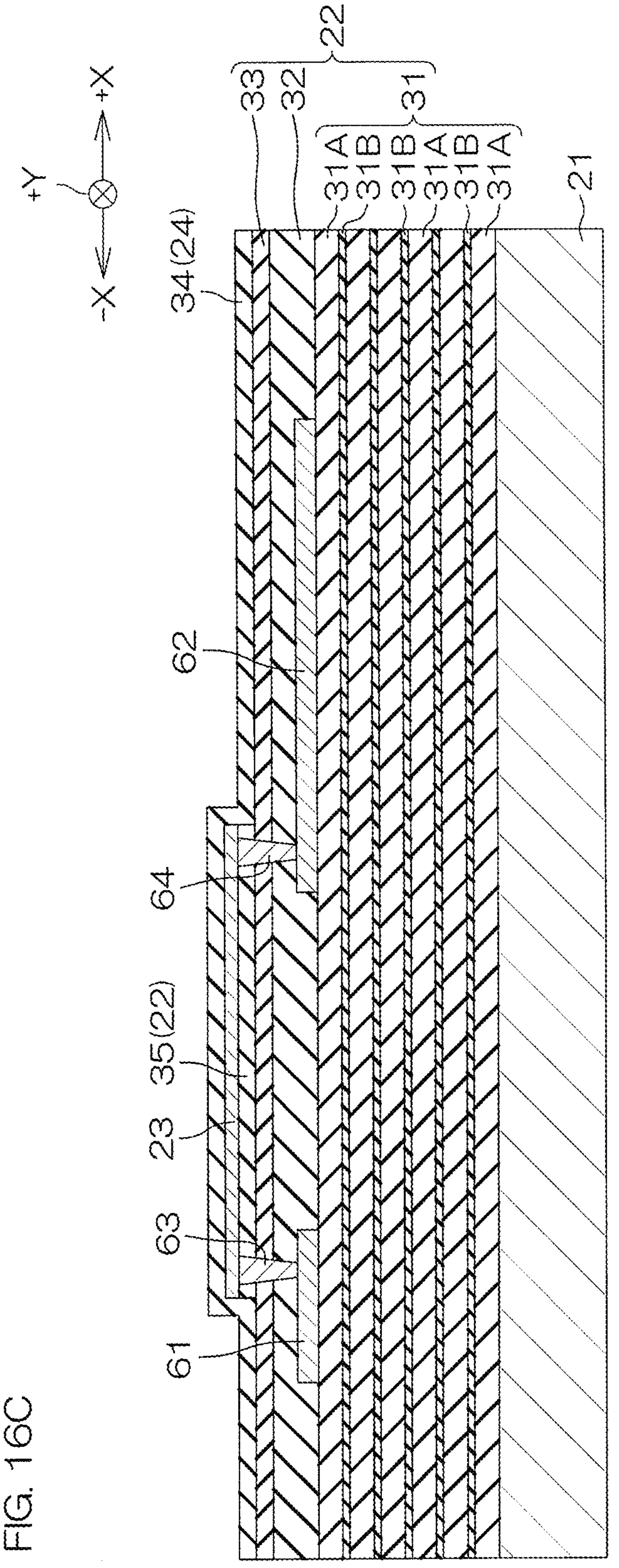
FIG. 16C is a sectional view showing a step subsequent to that of FIG. 16B.

Next, as shown in FIG. 16C, the second nitride film 34 (intermediate insulating film 24) is formed on the first nitride film 33 such as to cover the laminated body of the third SiO-based insulating film 35 and the resistor 23.

Figure 16D:
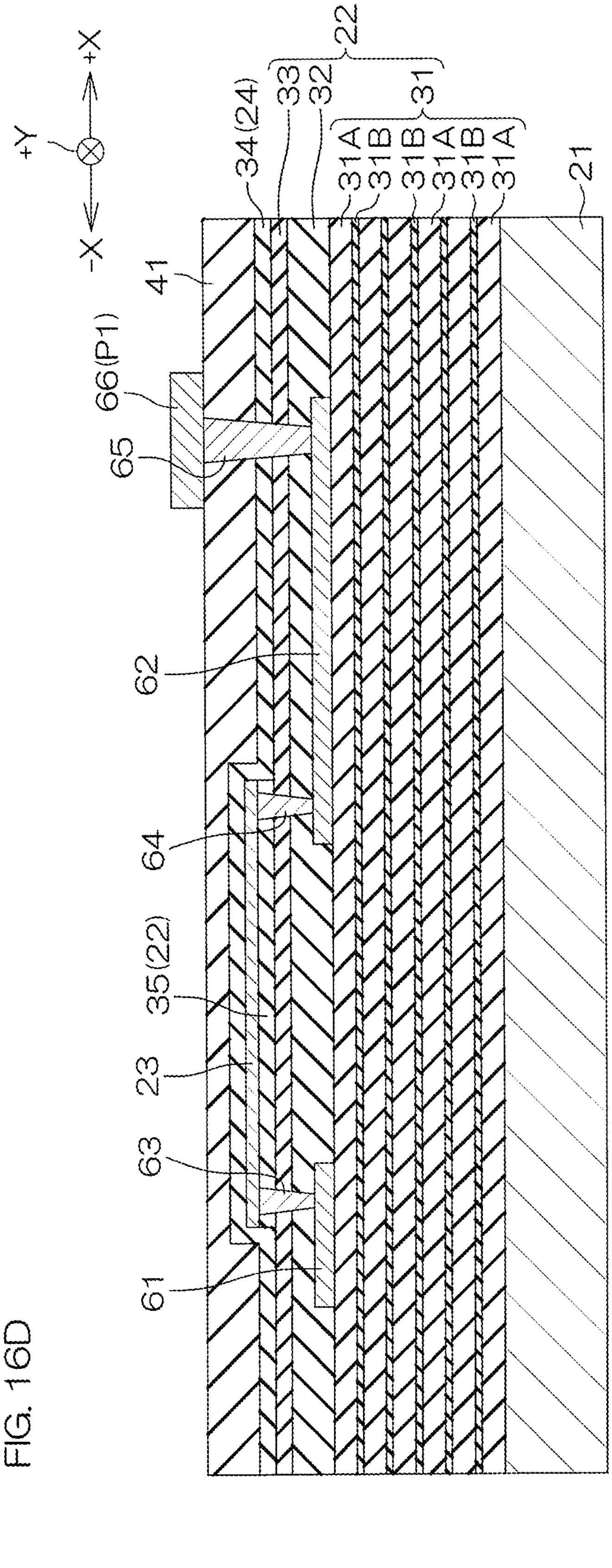
FIG. 16D is a sectional view showing a step subsequent to that of FIG. 16C.

Next, as shown in FIG. 16D, the first SiO-based insulating film 41 is formed on the second nitride film 34. Then, in a laminated film of the second SiO-based insulating film 32, the first nitride film 33, the second nitride film 34, and the first SiO-based insulating film 41, the third via 65 that penetrates through the laminated film and with which the lower end reaches the second lower metal 62 is formed. Then, after a metal film that is a material film of the upper metal 66 is formed on the first SiO-based insulating film 41, the metal film is patterned. The upper metal 66 is thereby formed on the first SiO-based insulating film 41. The third via 65 upper end is thereby connected to the upper metal 66.

Thereafter, the protective film 42 is formed on the first SiO-based insulating film 41 such as to cover the upper metal 66. The opening 67 that exposes a portion of the upper surface of the upper metal 66 is then formed in the protective film 42. The first chip 5A such as shown in FIG. 3 and FIG. 15 is thereby obtained.

Figure 17:
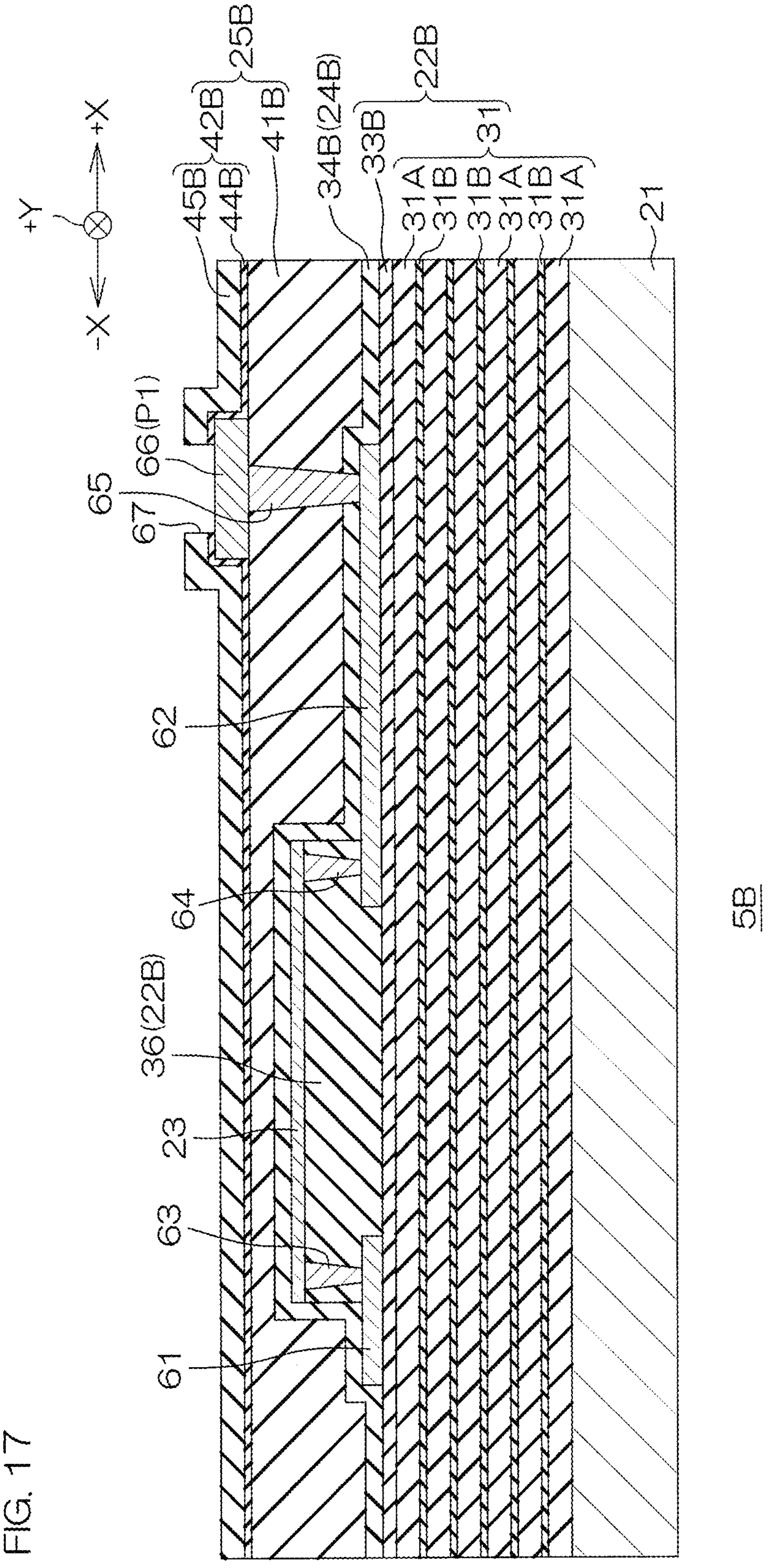
FIG. 17 is an illustrative sectional view for describing a second modification example of the first chip in the second disclosure.

FIG. 17 is a sectional view for describing the second modification example of the first chip and is a sectional view corresponding to FIG. 13. In FIG. 17, portions corresponding to respective portions in FIG. 13 are indicated with the same reference signs attached as in FIG. 13.

A plan view of a first chip 5B of FIG. 17 is the same as FIG. 3. The first chip 5B of FIG. 17 includes the substrate 21, a lower insulating film 22B that is formed on the substrate 21, the resistor 23 that is formed on the lower insulating film 22B and constitutes a resistor r, an intermediate insulating film 24B that is formed on the lower insulating film 22B such as to cover the resistor 23, and an upper insulating film 25B that is formed on the intermediate insulating film 24B.

Further, the first chip 5B includes the first lower metal 61 and the second lower metal 62 that are disposed inside the lower insulating film 22B and the upper metal 66 that is disposed inside the upper insulating film 25B. However, a portion of the upper surface of the upper metal 66 is exposed from the upper insulating film 25B.

The lower insulating film 22B includes the insulating film laminated structure 31 that is formed on the substrate 21, a first nitride film 33B that is formed on the insulating film laminated structure 31, and a plurality of fourth SiO-based insulating films 36 that are selectively formed on the first nitride film 33B.

The first nitride film 33B is formed on the insulating film laminated structure 31 upper surface. The first nitride film 33B is preferably formed on substantially an entire area of the insulating film laminated structure 31 upper surface. A film thickness of the first nitride film 33B is approximately 0.15 μm.

A plurality of lower metals 61 and 62 are disposed on the first nitride film 33B. In the example of FIG. 17, the lower metals 61 and 62 include the first lower metal 61 that is disposed close to the −X side end and the second lower metal 62 that is disposed at the +X side with respect to the first lower metal 61.

The plurality of fourth SiO-based insulating films 36 are formed such as to be disposed at positions directly below respective resistors 23 in plan view. A film thickness of the fourth SiO-based insulating films 36 is approximately 1 μm.

The resistor 23 is formed on each fourth SiO-based insulating film 36. The resistor 23 is of a rectangular shape that is long in the X direction in plan view. The resistor 23 is disposed such as to extend across the first lower metal 61 and the second lower metal 61 in plan view.

The −X side end portion of the lower surface of the resistor 23 is electrically connected to the first lower metal 61 via the first via 63 that penetrates through the fourth SiO-based insulating film 36. The +X side end portion of the lower surface of the resistor 23 is electrically connected to the −X side end portion of the second lower metal 62 via the second via 64 that penetrates through the fourth SiO-based insulating film 36.

The intermediate insulating film 24B is constituted of a second nitride film 34B that is formed on the first nitride film 33B such as to cover the laminated body of the fourth SiO-based insulating film 36 and the resistor 23. The second nitride film 34B covers exposed surfaces of the laminated body of the fourth SiO-based insulating film 36 and the resistor 23 and an exposed surface of an upper surface of the first nitride film 33B. A lower surface of the second nitride film 34B is thus joined to an upper surface of the first nitride film 33B except at a portion covering the laminated body of the fourth SiO-based insulating film 36 and the resistor 23. A film thickness of the second nitride film 34B is approximately 0.15 μm.

The upper insulating film 25B includes a first SiO-based insulating film 41B that is formed on the second nitride film 34B and a protective film 42B that is formed on the first SiO-based insulating film 41B.

A film thickness of the first SiO-based insulating film 41B is approximately 1 μm. The upper metal 66 is formed on the first SiO-based insulating film 41B.

The upper metal 66 shown in FIG. 17 is disposed such that a portion overlaps with the +X side end portion of the second lower metal 62 in plan view. The upper metal 66 is electrically connected to the +X side end portion of the second lower metal 62 via the third via 65 that penetrates continuously through the first SiO-based insulating film 41B and the second nitride film 34B. The upper metal 66 shown in FIG. 17 constitutes the terminal P1.

The protective film 42B is formed on the first SiO-based insulating film 41B such as to cover the upper metal 66. The protective film 42B is constituted of a laminated film of a protective SiO-based insulating film 44B that is a lower layer and a third nitride film 45B that is an upper layer. A film thickness of the protective SiO-based insulating film 44B is approximately 1 μm. A film thickness of the third nitride film 45B is approximately 1.2 μm. Also, the protective film 42B may be constituted of just the third nitride film 45B.

The opening 67 arranged to expose a portion of the upper surface of the upper metal 66 is formed in the protective film 42B. A pad portion arranged to connect wirings to the terminals P1 to P6 is formed by the opening. Even with the second modification example, the same effects as the preferred embodiment described above are obtained.

In addition, in FIG. 17, an SiO-based insulating film may be formed between the upper surface of the resistor 23 and the second nitride film 34B.

Here, if an uppermost layer of the insulating film laminated structure 31 is a second insulating film (nitride film) 31B, the second insulating film 31B of the uppermost layer of the insulating film laminated structure 31 may be used as the first nitride film 33B. In this case, the lower insulating film 22B includes the insulating film laminated structure 31 that is formed on the substrate 21 and has the first nitride film 33B (second insulating film 31B) as the uppermost layer and the plurality of fourth SiO-based insulating films 36 that are formed selectively on the insulating film laminated structure 31.

FIG. 18A to FIG. 18E are sectional views showing an example of a manufacturing process of the first chip 5B shown in FIG. 3 and FIG. 17 and are sectional views corresponding to the section plane of FIG. 17.

Figure 18A:
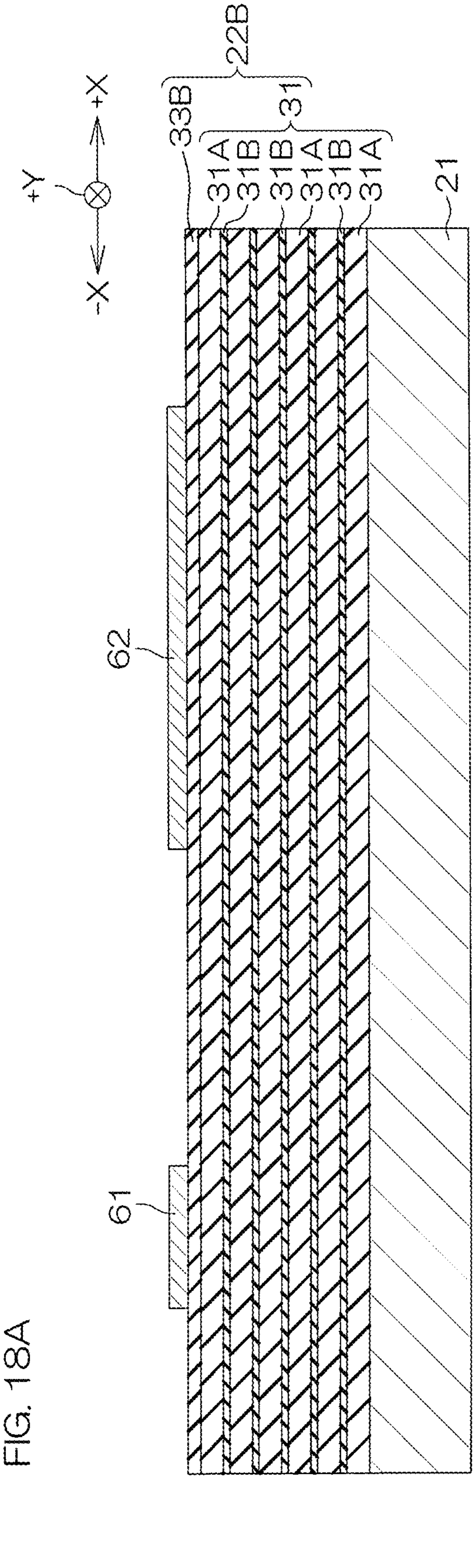
FIG. 18A is a sectional view showing a portion of a manufacturing process of the first chip shown in FIG. 3 and FIG. 17 and is a sectional view corresponding to the section plane of FIG. 17.

First, as shown in FIG. 18A, the insulating film laminated structure 31 is formed by alternately laminating the first insulating film 31A and the second insulating film 31B on the substrate 21. The first nitride film 33B is then formed on the insulating film laminated structure 31. Then, after forming a metal film that is a material film of the first lower metal 61 and the second lower metal 62 on the first nitride film 33B, the metal film is patterned. The first lower metal 61 and the second lower metal 62 are thereby formed on the first nitride film 33B.

Figure 18B:
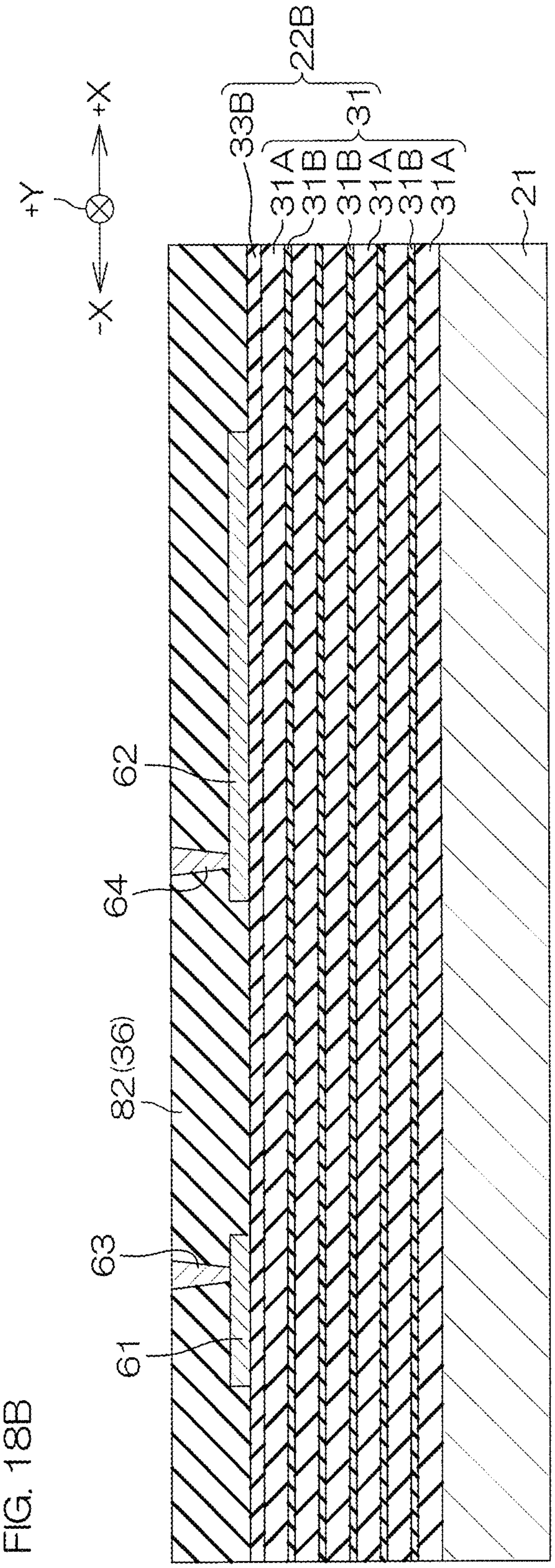
FIG. 18B is a sectional view showing a step subsequent to that of FIG. 18A.

Next, as shown in FIG. 18B, an SiO-based material film 82 that is a material film of the fourth SiO-based insulating film 36 is formed on the first nitride film 33B such as to cover the first lower metal 61 and the second lower metal 62. The first via 63 and the second via 64 that penetrate through the SiO-based material film 82 and with which the lower ends reach the first lower metal 61 and the second lower metal 62 are then formed in the SiO-based material film 82.

Figure 18C:
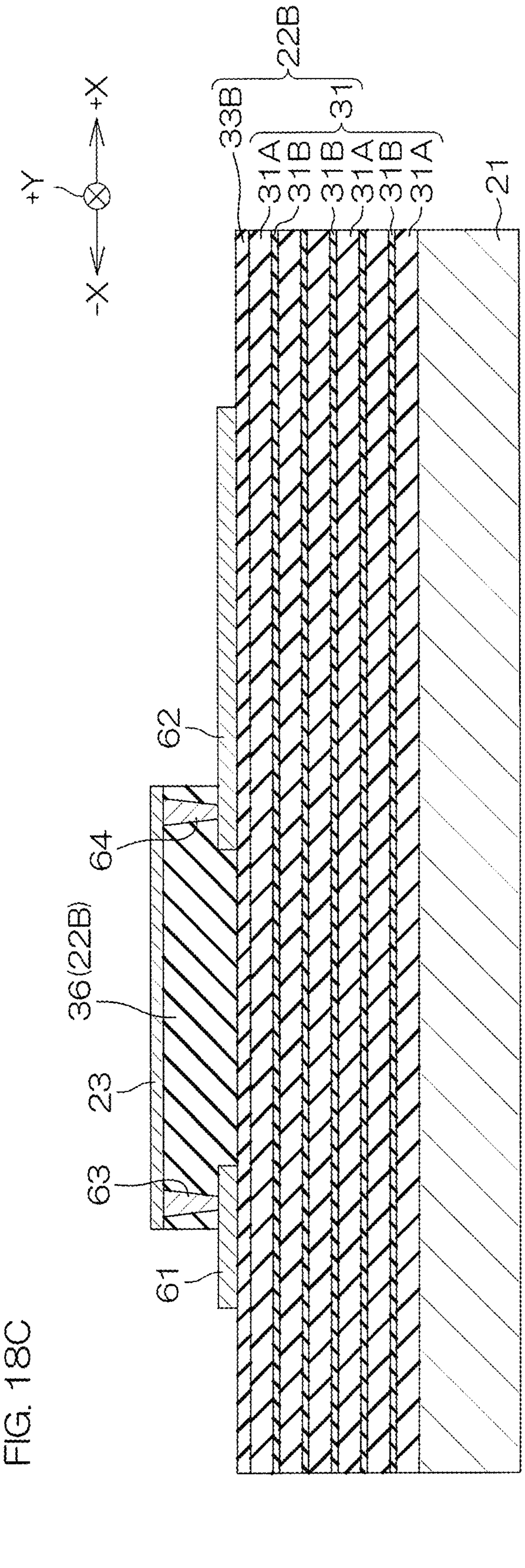
FIG. 18C is a sectional view showing a step subsequent to that of FIG. 18B.

Next, as shown in FIG. 18C, a resistive material film that is a material film of the resistor 23 is formed on the SiO-based material film 82. Thereafter, by patterning of the resistive material film and the SiO-based material film 82, a plurality of laminated bodies each constituted of the fourth SiO-based insulating film 36 and the resistor 23 formed thereon are formed. The upper ends of the first via 63 and the second via 64 are thereby connected to the resistor 23. The lower insulating film 22B that is constituted of the insulating film laminated structure 31, the first nitride film 33B, and the fourth SiO-based insulating film 36 is thereby obtained.

Figure 18D:
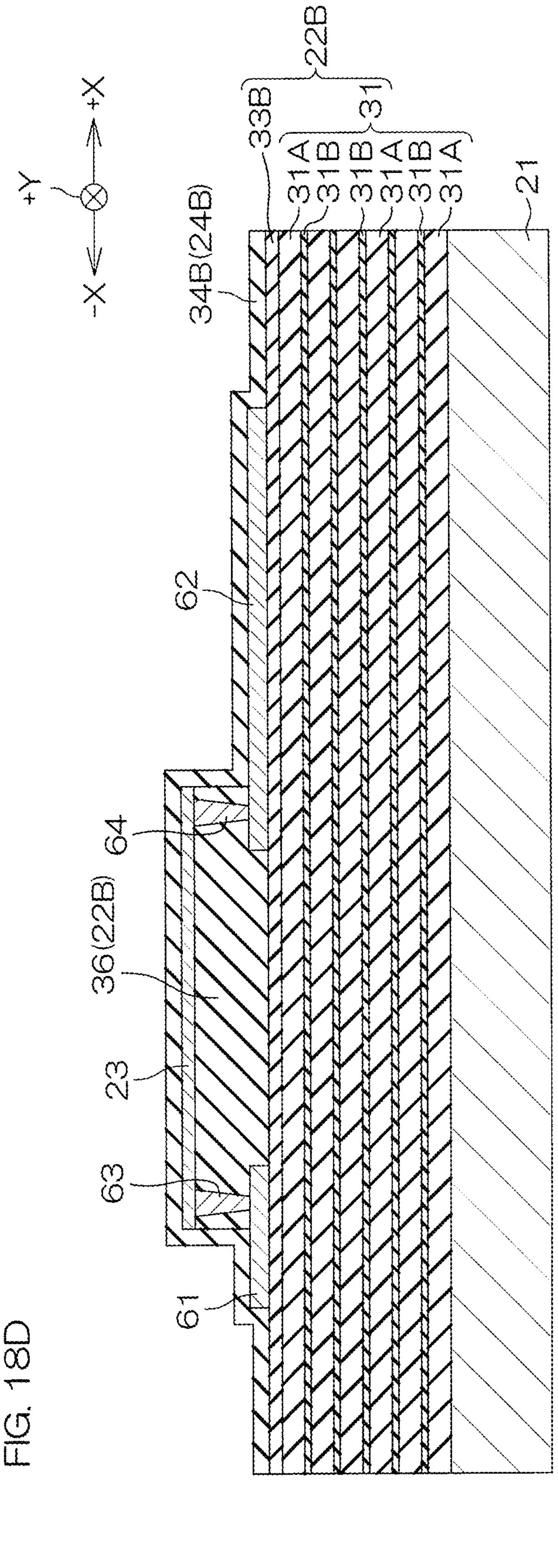
FIG. 18D is a sectional view showing a step subsequent to that of FIG. 18C.

Next, as shown in FIG. 18D, the second nitride film 34B (intermediate insulating film 24B) is formed on the first nitride film 33B such as to cover exposed surfaces of the laminated body of the fourth SiO-based insulating film 36 and the resistor 23, exposed surfaces of the first and second lower metals 61 and 62, and an exposed surface of the first nitride film 33B upper surface.

Figure 18E:
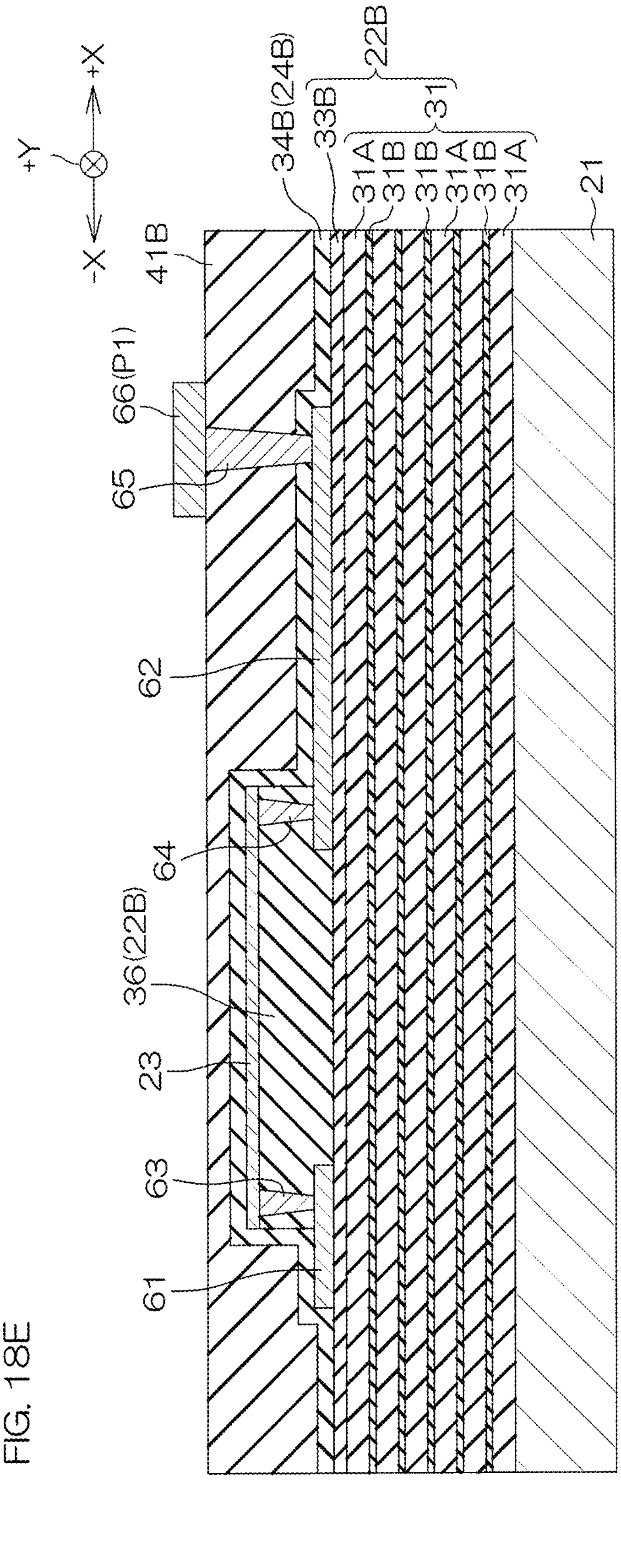
FIG. 18E is a sectional view showing a step subsequent to that of FIG. 18D.

Next, as shown in FIG. 18E, the first SiO-based insulating film 41B is formed on the second nitride film 34B. Then, in a laminated film of the second nitride film 34B and the first SiO-based insulating film 41B, the third via 65 that penetrates through the laminated film and with which the lower end reaches the second lower metal 62 is formed. Then, after a metal film that is a material film of the upper metal 66 is formed on the first SiO-based insulating film 41B, the metal film is patterned. The upper metal 66 is thereby formed on the first SiO-based insulating film 41B. The third via 65 upper end is thereby connected to the upper metal 66.

Thereafter, the protective film 42B is formed on the first SiO-based insulating film 41B such as to cover the upper metal 66. The opening 67 that exposes a portion of the upper surface of the upper metal 66 is then formed in the protective film 42B. The first chip 5B such as shown in FIG. 3 and FIG. 17 is thereby obtained.

Figure 19:
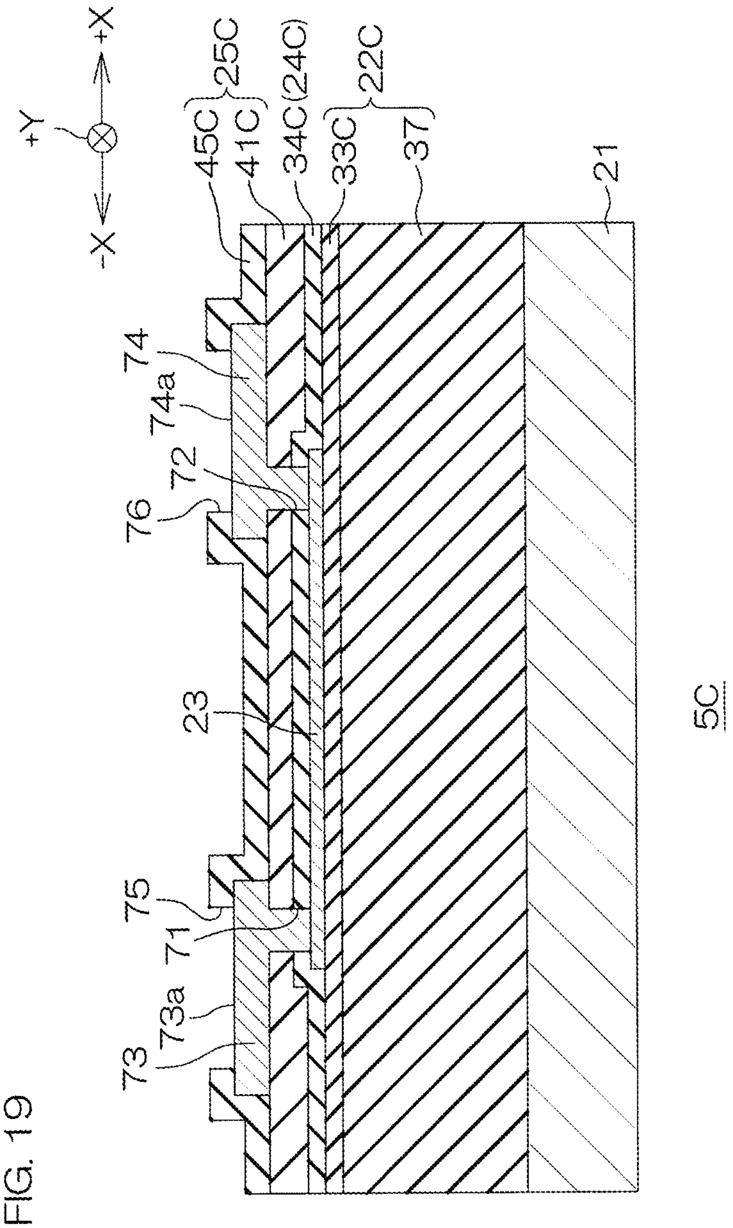
FIG. 19 is an illustrative sectional view for describing a third modification example of the first chip in the second disclosure.

FIG. 19 is a sectional view for describing the third modification example of the first chip and is a sectional view corresponding to FIG. 13. In FIG. 19, portions corresponding to respective portions in FIG. 13 are indicated with the same reference signs attached as in FIG. 13.

A plan view of a first chip 5C of FIG. 19 is the same as FIG. 3. The first chip 5C of FIG. 19 includes the substrate 21, a lower insulating film 22C that is formed on the substrate 21, the resistor 23 that is formed on the lower insulating film 22C and constitutes a resistor r, an intermediate insulating film 24C that is formed on the lower insulating film 22C such as to cover the resistor 23, and an upper insulating film 25C that is formed on the intermediate insulating film 24C.

Further, the first chip 5C includes a first lead-out electrode 73 and a second lead-out electrode 74 that are disposed inside a laminated film of the intermediate insulating film 24C and the upper insulating film 25C. However, a portion of an upper surface of the first lead-out electrode 73 and a portion of an upper surface of the second lead-out electrode 74 are exposed from the upper insulating film 25C.

The lower insulating film 22C includes a fifth SiO-based insulating film 37 that is formed on the substrate 21 and a first nitride film 33C that is formed on the fifth SiO-based insulating film 37. The first nitride film 33C is preferably formed on substantially an entire area of the fifth SiO-based insulating film 37 upper surface. A film thickness of the fifth SiO-based insulating film 37 is, for example, approximately 6 μm. A film thickness of the first nitride film 33C is, for example, approximately 0.15 μm.

The resistor 23 is formed on the first nitride film 33C. The resistor 23 is of a rectangular shape that is long in the X direction in plan view. In this preferred embodiment, the resistor 23 is constituted of CrSi.

The intermediate insulating film 24C is constituted of a second nitride film 34C that is formed on the first nitride film 33C such as to cover the resistor 23. A film thickness of the second nitride film 34C is approximately 0.15 μm. The second nitride film 34C covers exposed surfaces of the resistor 23 and an exposed surface of an upper surface of the first nitride film 33C. A lower surface of the second nitride film 34C is thus joined to an upper surface of the first nitride film 33C except at a portion covering the resistor 23.

The upper insulating film 25C includes a first SiO-based insulating film 41C that is formed on the second nitride film 34C and a third nitride film 45C that is formed on the first SiO-based insulating film 41C.

A first contact hole 71 arranged to expose a portion of an upper surface of a −X side end portion of the resistor 23 and a second contact hole 72 arranged to expose a portion of an upper surface of a +X side end portion of the resistor 23 are formed in a laminated film of the second nitride film 34C and the first SiO-based insulating film 41C.

The first lead-out electrode 73 and the second lead-out electrode 74 are formed on the first SiO-based insulating film 41C. The first lead-out electrode 73 is formed in a region that includes the −X side end portion of the resistor 23 in plan view. The second lead-out electrode 74 is formed in a region that includes the +X side end portion of the resistor 23 in plan view.

A portion of the first lead-out electrode 73 enters into the first contact hole 71 and is connected to the −X side end portion of the resistor 23 inside the first contact hole 71. A portion of the second lead-out electrode 74 enters into the second contact hole 72 and is connected to the +X side end portion of the resistor 23 inside the second contact hole 72. In this preferred embodiment, the first lead-out electrode 73 and the second lead-out electrode 74 are constituted of Al (aluminum).

The third nitride film 45C is formed on the first SiO-based insulating film 41C such as to cover the first lead-out electrode 73 and the second lead-out electrode 74. A film thickness of the third nitride film 45C is approximately 1 μm.

A first opening 75 arranged to expose a portion of the upper surface of the first lead-out electrode 73 and a second opening 76 arranged to expose a portion of the upper surface of the second lead-out electrode 74 are formed in the third nitride film 45C. A first pad portion 73*a* that is exposed from the first opening 75 is thereby formed in the first lead-out electrode 73. Similarly, a second pad portion 74*a* that is exposed from the second opening 76 is formed in the second lead-out electrode 74.

The pad portions 73*a* and 74*a* are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

Even with the third modification example, the same effects as the first chip 5 of FIG. 13 are obtained.

FIG. 20A to FIG. 20D are sectional views showing an example of a manufacturing process of the first chip 5C shown in FIG. 19 and are sectional views corresponding to the section plane of FIG. 19.

Figure 20A:
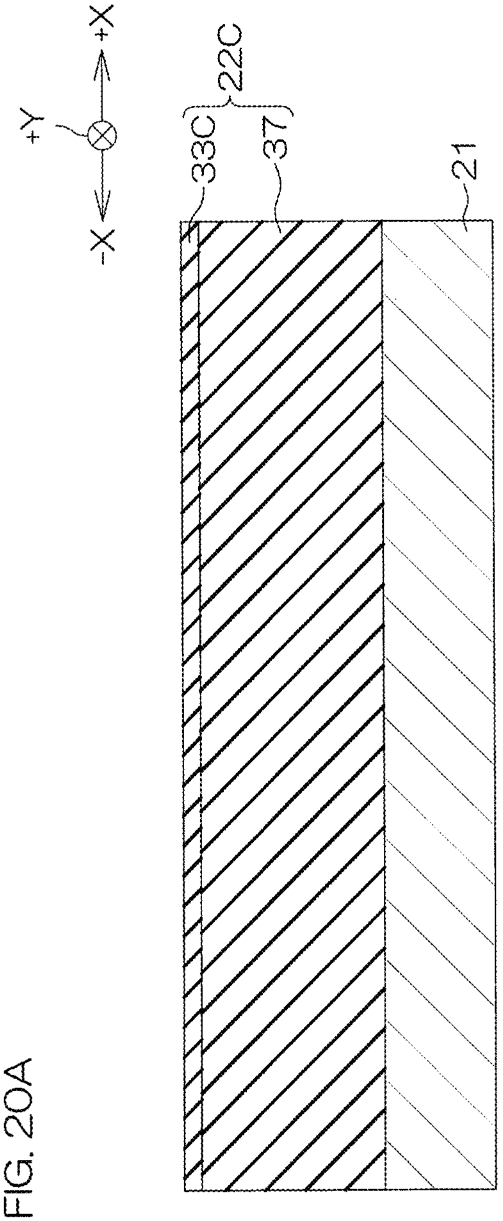
FIG. 20A is a sectional view showing a portion of a manufacturing process of the first chip shown in FIG. 3 and FIG. 19 and is a sectional view corresponding to the section plane of FIG. 19.

First, as shown in FIG. 20A, the fifth SiO-based insulating film 37 is formed on the substrate 21. The first nitride film 33C C is then formed on the fifth SiO-based insulating film 37. The lower insulating film 22C that is constituted of the fifth SiO-based insulating film 37 and the first nitride film 33C is thereby obtained.

Figure 20B:
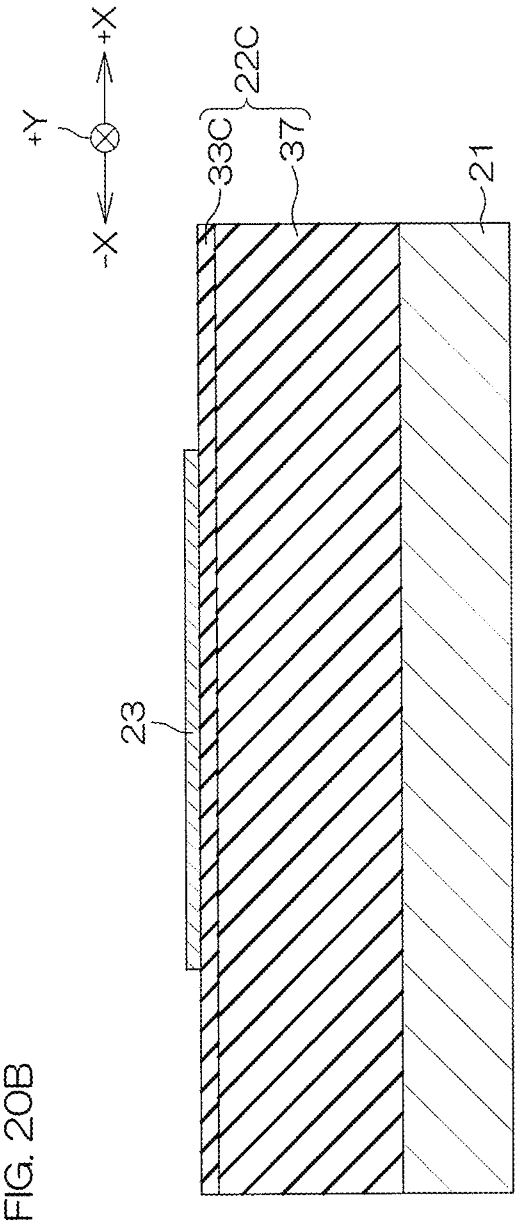
FIG. 20B is a sectional view showing a step subsequent to that of FIG. 20A.

Next, as shown in FIG. 20B, after a resistive material film that is a material film of the resistor 23 is formed on the first nitride film 33C, the resistive material film is patterned to form the plurality of resistors 23 (the plurality of real resistors ra and the plurality of dummy resistors rb).

Figure 20C:
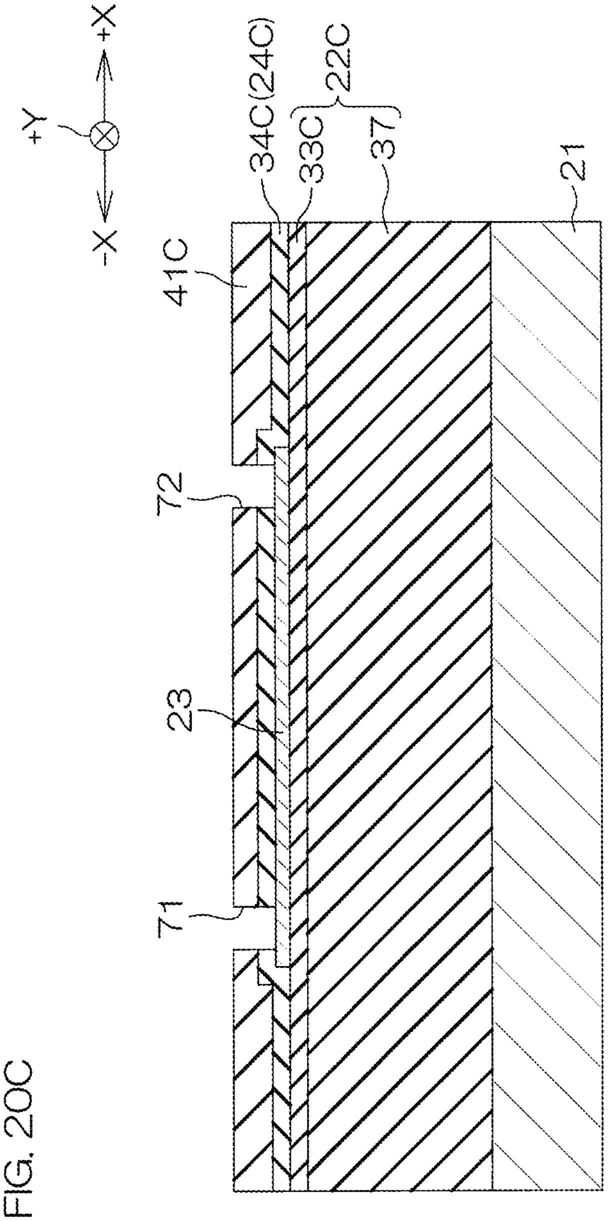
FIG. 20C is a sectional view showing a step subsequent to that of FIG. 20B.

Next, as shown in FIG. 20C, the second nitride film 34C (intermediate insulating film 24C) is formed on the first nitride film 33C such as to cover the resistor 23. Next, the first SiO-based insulating film 41C is formed on the second nitride film 34C. Then, in a laminated film of the second nitride film 34C and the first SiO-based insulating film 41C, the first contact hole 71 that penetrates through the laminated film and with which a lower end reaches the upper surface of the −X side end portion of the resistor 23 and the second contact hole 72 that penetrates through the laminated film and with which a lower end reaches the upper surface of the +X side end portion of the resistor 23 are formed.

Figure 20D:
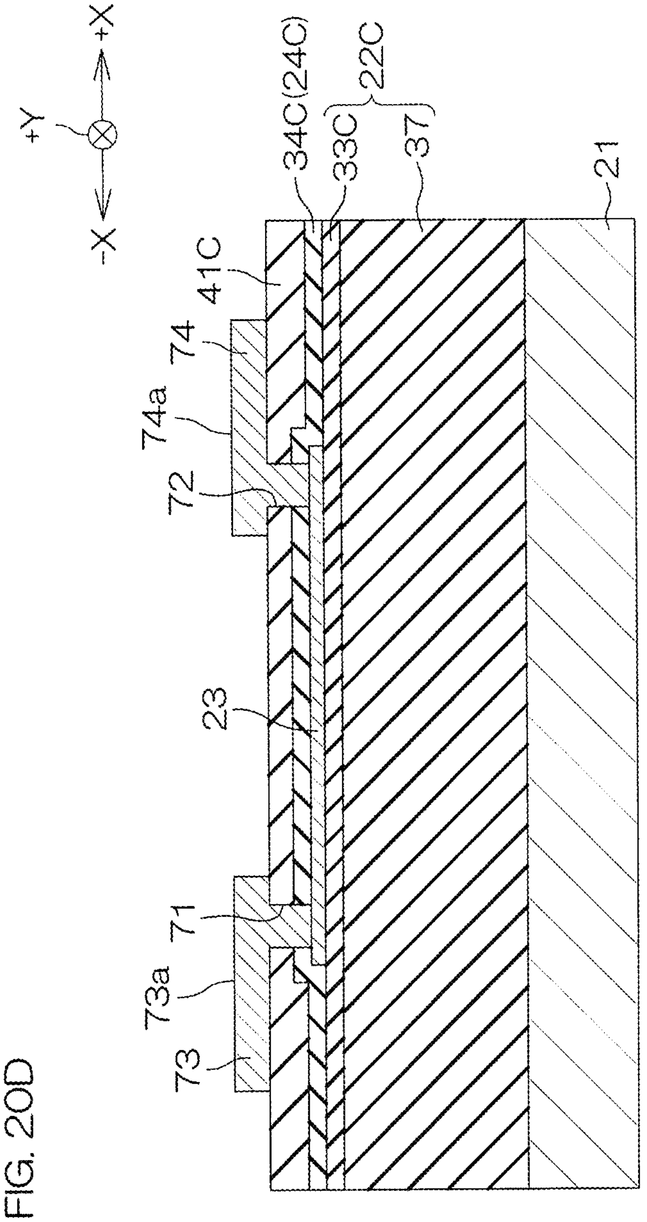
FIG. 20D is a sectional view showing a step subsequent to that of FIG. 20C.

Next, as shown in FIG. 20D, a metal film that is a material film of the first lead-out electrode 73 and the second lead-out electrode 74 is formed on the first SiO-based insulating film 41C. In this process, the metal film enters into the first contact hole 71 and the second contact hole 72. Thereafter, the metal film is patterned. The first lead-out electrode 73 and the second lead-out electrode 74 are thereby formed on the first SiO-based insulating film 41C.

Thereafter, the third nitride film 45C is formed on the first SiO-based insulating film 41C such as to cover the first lead-out electrode 73 and the second lead-out electrode 74. The first opening 75 that exposes a portion of the upper surface of the first lead-out electrode 73 and the second opening 76 that exposes a portion of the upper surface of the second lead-out electrode 74 are then formed in the third nitride film 45C. The first chip 5C such as shown in FIG. 3 and FIG. 19 is thereby obtained.

Figure 21:
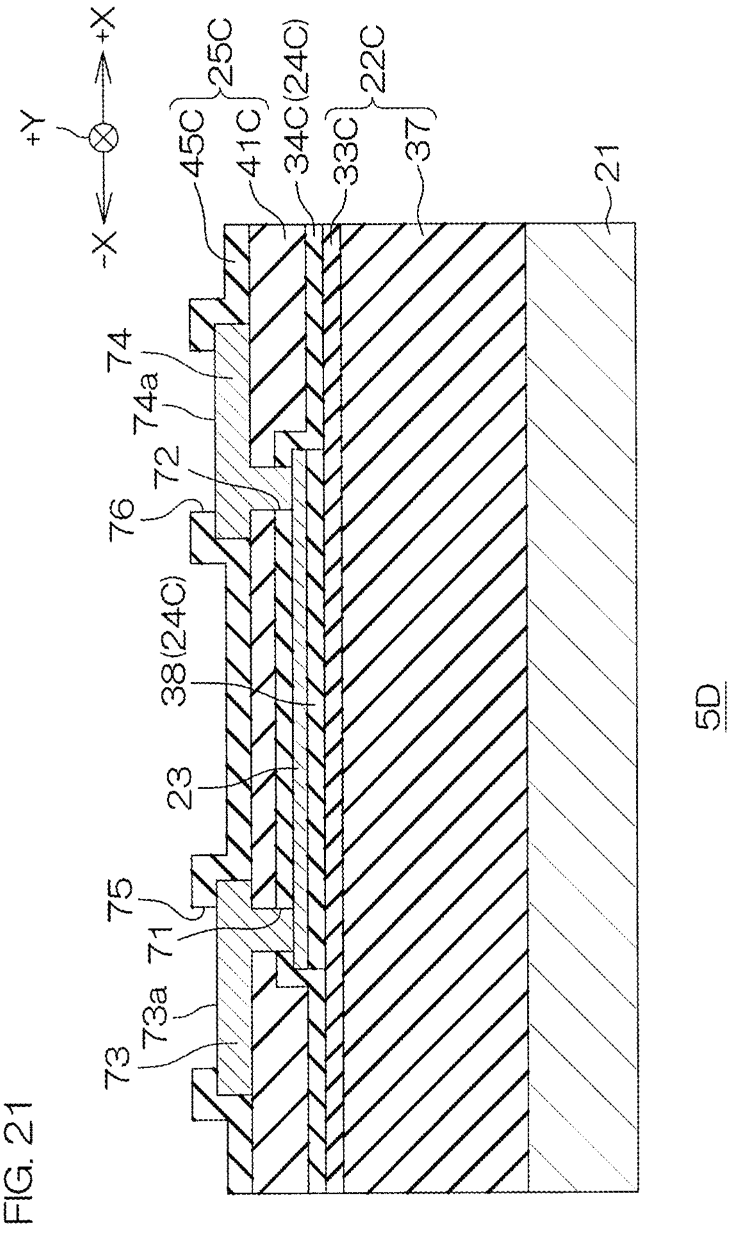
FIG. 21 is an illustrative sectional view for describing a fourth modification example of the first chip in the second disclosure.

FIG. 21 is a sectional view for describing the fourth modification example of the first chip and is a sectional view corresponding to FIG. 19. In FIG. 21, portions corresponding to respective portions in FIG. 19 are indicated with the same reference signs attached as in FIG. 19.

A plan view of a first chip 5D of FIG. 21 is the same as FIG. 3. With the first chip 5D of FIG. 21, a sixth SiO-based insulating film 38 is interposed between the lower surface of the resistor 23 and the first nitride film 33C. A film thickness of the sixth SiO-based insulating film 38 is approximately 0.5 μm.

With the first chip 5D of FIG. 21, the lower insulating film 22C is constituted of the fifth SiO-based insulating film 37 that is formed on the substrate 21, the first nitride film 33C that is formed on the fifth SiO-based insulating film 37, and the sixth SiO-based insulating film 38 that is formed selectively on the first nitride film 33C.

Even with the fourth modification example, the same effects as the preferred embodiment described above are obtained.

A method for manufacturing the first chip 5D according to the fourth modification example is the same as the method for manufacturing the first chip 5C according to the third modification example with the exception of the following point. That is, in the method for manufacturing the first chip 5D according to the fourth modification example, in the step of FIG. 20B described above, after forming a material film of the sixth SiO-based insulating film 38 and a material film of the resistor 23 on the first nitride film 33C, the material films are patterned to form a plurality of laminated bodies constituted of the sixth SiO-based insulating film 38 and resistors 23 formed thereon.

Figure 22:
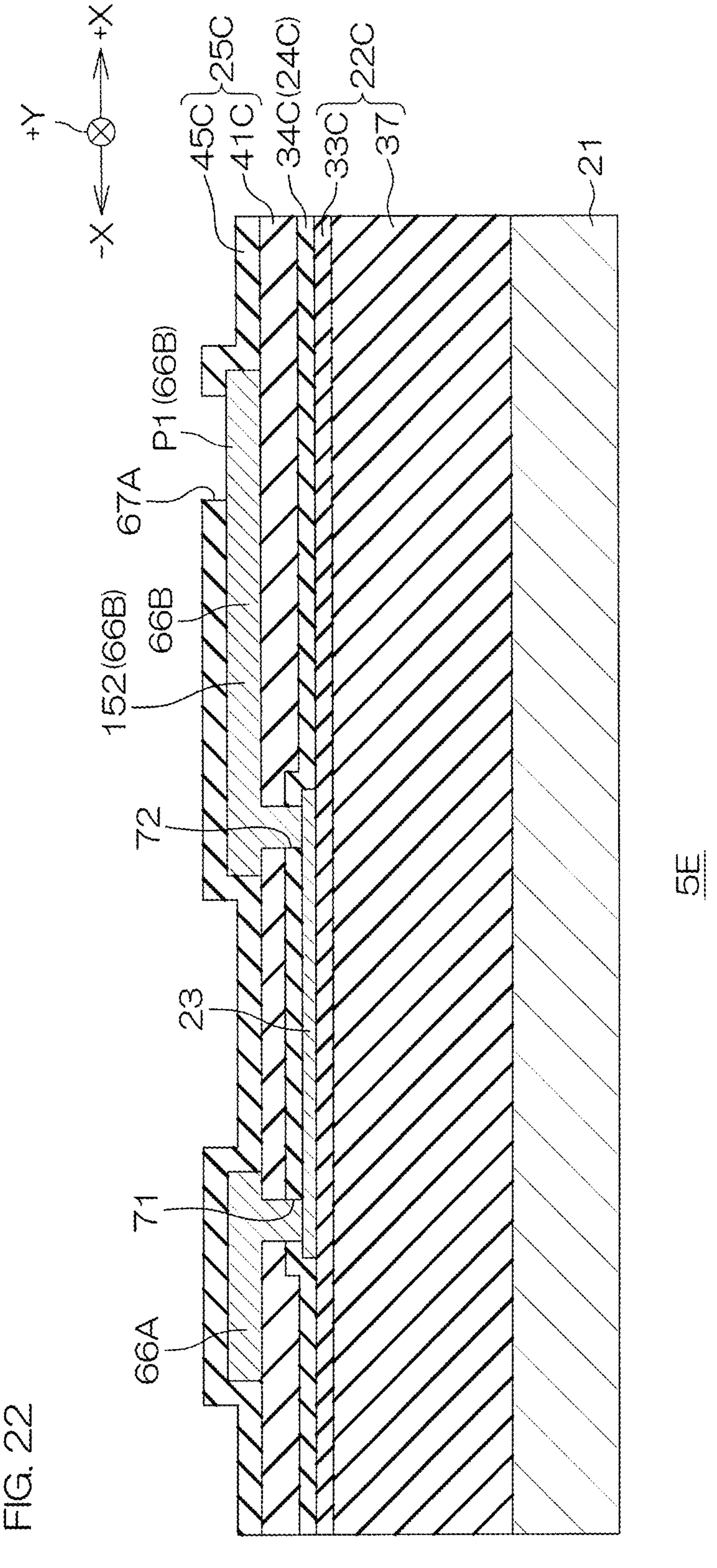
FIG. 22 is an illustrative sectional view for describing a fifth modification example of the first chip in the second disclosure.

FIG. 22 is a sectional view for describing the fifth modification example of the first chip and is a sectional view corresponding to FIG. 19. In FIG. 22, portions corresponding to respective portions in FIG. 19 are indicated with the same reference signs attached as in FIG. 19.

A first chip 5E of FIG. 22 has substantially the same arrangement as the first chip 5C of FIG. 19. In comparison to the first chip 5C of FIG. 19, the first chip 5E of FIG. 22 differs in the points that a first upper metal 66A is formed in place of the first lead-out electrode 73 and a second upper metal 66B is formed in place of the second lead-out electrode 74.

The first upper metal 66A and the second upper metal 66B are used to connect the real resistors ra to each other and to connect the real resistors ra to the terminals P1 to P6. Also, the first upper metal 66A and the second upper metal 66B may integrally include a wiring and a terminal. In the example of FIG. 22, the second upper metal 66B integrally includes the terminal P1 and the wiring 152. An opening 67A arranged to expose a portion of an upper surface of a portion of the second upper metal 66B that constitutes the terminal P1 is formed in the third nitride film 45C.

Figure 23:
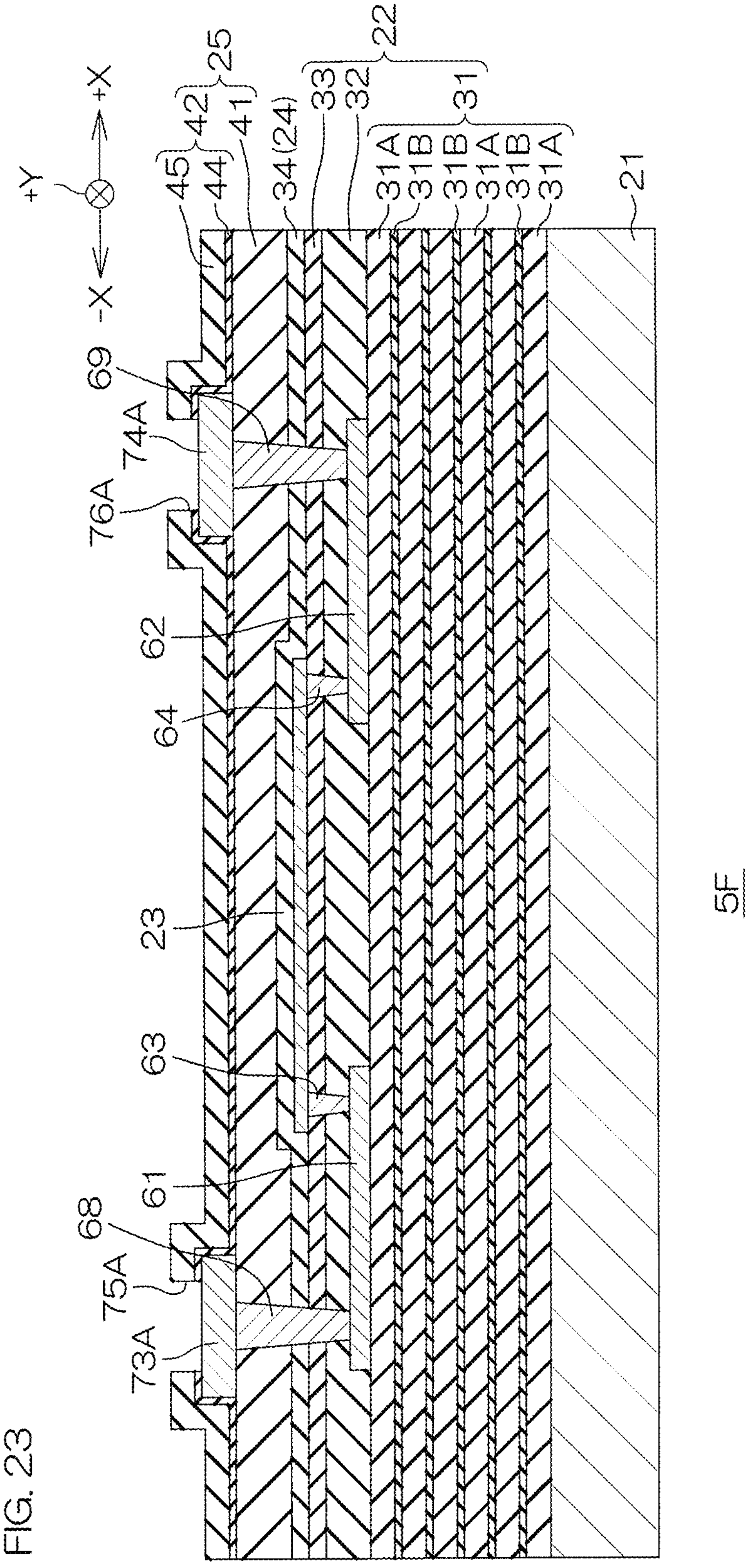
FIG. 23 is an illustrative sectional view for describing a sixth modification example of the first chip in the second disclosure.

FIG. 23 is a sectional view for describing the sixth modification example of the first chip and is a sectional view corresponding to FIG. 13. In FIG. 23, portions corresponding to respective portions in FIG. 13 are indicated with the same reference signs attached as in FIG. 13.

A first chip 5F of FIG. 23 has substantially the same arrangement as the first chip 5 of FIG. 13. In comparison to the first chip 5 of FIG. 13, the first chip 5F of FIG. 23 differs in the point that a first lead-out electrode 73A that is electrically connected to the first lower metal 61 via a fourth via 68 and a second lead-out electrode 74A that is electrically connected to the second lower metal 62 via a fifth via 69 are formed on the first SiO-based insulating film 41. In this case, the third via 65 and the upper metal 66 of FIG. 13 are not formed.

Also, in this case, an opening 75A arranged to expose a portion of an upper surface of the first lead-out electrode 73A and an opening 76A arranged to expose a portion of an upper surface of the second lead-out electrode 74A are formed in the protective film 42.

The first lead-out electrode 73A and the second lead-out electrode 74A are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

Figure 24:
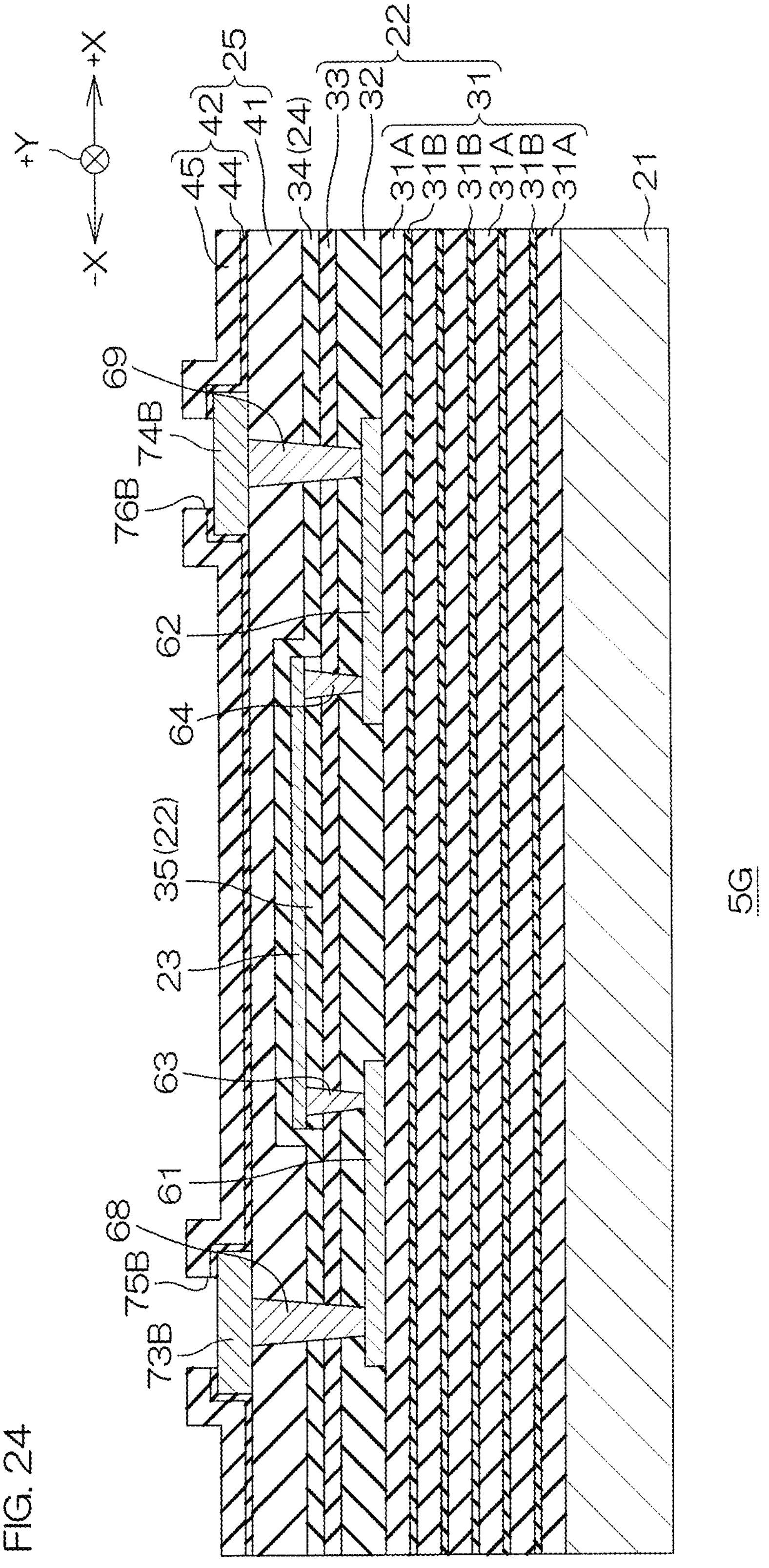
FIG. 24 is an illustrative sectional view for describing a seventh modification example of the first chip in the second disclosure.

FIG. 24 is a sectional view for describing the seventh modification example of the first chip and is a sectional view corresponding to FIG. 15. In FIG. 24, portions corresponding to respective portions in FIG. 15 are indicated with the same reference signs attached as in FIG. 15.

A first chip 5G of FIG. 24 has substantially the same arrangement as the first chip 5A of FIG. 15. In comparison to the first chip 5A of FIG. 15, the first chip 5G of FIG. 24 differs in the point that a first lead-out electrode 73B that is electrically connected to the first lower metal 61 via the fourth via 68 and a second lead-out electrode 74B that is electrically connected to the second lower metal 62 via the fifth via 69 are formed on the first SiO-based insulating film 41. In this case, the third via 65 and the upper metal 66 of FIG. 15 are not formed.

Also, in this case, an opening 75B arranged to expose a portion of an upper surface of the first lead-out electrode 73B and an opening 76B arranged to expose a portion of an upper surface of the second lead-out electrode 74B are formed in the protective film 42.

The first lead-out electrode 73B and the second lead-out electrode 74B are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

Figure 25:
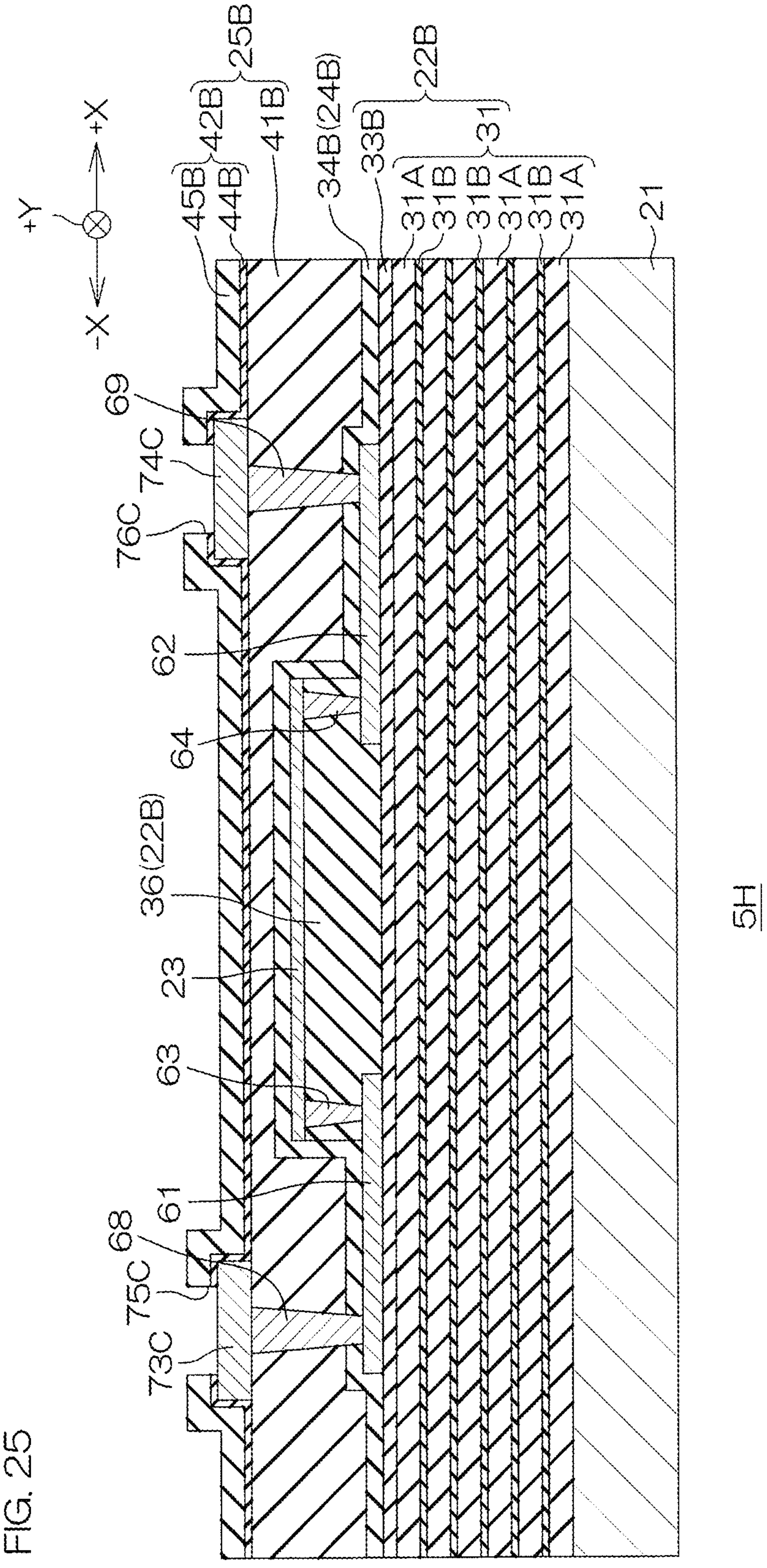
FIG. 25 is an illustrative sectional view for describing an eighth modification example of the first chip in the second disclosure.

FIG. 25 is a sectional view for describing the eighth modification example of the first chip and is a sectional view corresponding to FIG. 17. In FIG. 25, portions corresponding to respective portions in FIG. 17 are indicated with the same reference signs attached as in FIG. 17.

A first chip 5H of FIG. 25 has substantially the same arrangement as the first chip 5B of FIG. 17. In comparison to the first chip 5B of FIG. 17, the first chip 5H of FIG. 25 differs in the point that a first lead-out electrode 73C that is electrically connected to the first lower metal 61 via the fourth via 68 and a second lead-out electrode 74C that is electrically connected to the second lower metal 62 via the fifth via 69 are formed on the first SiO-based insulating film 41B. In this case, the third via 65 and the upper metal 66 of FIG. 17 are not formed.

Also, in this case, an opening 75C arranged to expose a portion of an upper surface of the first lead-out electrode 73C and an opening 76C arranged to expose a portion of an upper surface of the second lead-out electrode 74C are formed in the protective film 42B.

The first lead-out electrode 73C and the second lead-out electrode 74C are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

While the preferred embodiments of the second disclosure and the first to eighth modification examples of the first chip 5 of the second disclosure were described above, the second disclosure can be implemented in yet other preferred embodiments.

For example, although in the preferred embodiments of the second disclosure and the first to eighth modification examples of the first chip 5 of the second disclosure described above, $SiO_2$ films are used as the "SiO-based insulating films," SiON films and other SiO-based insulating films besides $SiO_2$ films may be used instead as the "SiO-based insulating films." Also, although in the preferred embodiments of the second disclosure and the first to fourth modification examples of the first chip 5 of the second disclosure, SiN films are used as the "nitride films," nitride films besides SiN films may be used instead.

In the first chips 5, 5A, and 5B of FIG. 13, FIG. 15, and FIG. 17, the protective films 42 and 42B may be constituted of just the third nitride film 45.

Also, although in the first chips 5 and 5A to 5H of the second disclosure described above, the dummy resistors rb (see FIG. 3) are provided, the dummy resistors rb do not have to be provided.

Also, an arrangement pattern of the resistors r shown in FIG. 3 is one example and the arrangement pattern of the resistors r may be an arrangement pattern besides that of FIG. 3.

[3] On the Third Disclosure

A third disclosure shall now be described with reference to FIG. 1 to FIG. 3 and FIG. 26 to FIG. 60. Reference signs indicated in FIG. 26 to FIG. 60 are unrelated to the reference signs indicated in FIG. 4 to FIG. 12 and FIG. 13 to FIG. 25.

An object of the third disclosure is to provide a semiconductor device that includes a resistor and is a semiconductor device having a novel arrangement and enabling improvement of moisture resistance and a method for manufacturing the same.

[Arrangement of the Third Disclosure]

[B1] A semiconductor device including a substrate, a lower insulating film that is formed on the substrate, a resistor that is formed on the lower insulating film, an upper insulating film that is formed on the lower insulating film such as to cover the resistor, and a seal ring made of metal that is disposed such as to surround the resistor in plan view and where the lower insulating film includes a first nitride film, the upper insulating film includes a first SiO-based insulating film that is formed on the lower insulating film such as to cover the resistor and a protective film that is disposed on the first SiO-based insulating film and includes a second nitride film, and the seal ring includes at least a main ring portion that is disposed in a region between the first nitride film and the second nitride film.

With this arrangement, a semiconductor device that includes a resistor and is a semiconductor device having a novel arrangement and enabling improvement of moisture resistance can be obtained.

[B2] The semiconductor device according to [B1] where the lower insulating film includes an insulating film laminated structure that is formed on the substrate and in which a nitride film and an SiO-based insulating film are laminated alternately, a second SiO-based insulating film that is formed on the insulating film laminated structure, and the first nitride film that is formed on the second SiO-based insulating film, and the resistor is formed on the first nitride film.

[B3] The semiconductor device according to [B2] including a first metal and a second metal that are formed on the insulating film laminated structure and are covered by the second SiO-based insulating film, a first via that penetrates through a laminated film of the second SiO-based insulating film and the first nitride film and electrically connects the first metal and one end portion of the resistor, and a second via that penetrates through the laminated film and electrically connects the second metal and another end portion of the resistor.

[B4] The semiconductor device according to [B3] where the upper insulating film includes the first SiO-based insulating film that is formed on the first nitride film such as to cover the resistor, and the protective film that is formed on the first SiO-based insulating film.

[B5] The semiconductor device according to [B4] including a third metal that is formed on the first SiO-based insulating film and is a third metal electrically connected to the first metal or the second metal via a third via that penetrates through a laminated film of the second SiO-based insulating film, the first nitride film, and the first SiO-based insulating film and where the protective film is formed on the first SiO-based insulating film such as to cover the third metal.

[B6] The semiconductor device according to [B5] including a third SiO-based insulating film that is formed on the first nitride film and where the resistor is formed on the third SiO-based insulating film, the first SiO-based insulating film is formed on the third SiO-based insulating film such as to cover the resistor, the first via and the second via penetrate through a laminated film of the second SiO-based insulating film, the first nitride film, and the third SiO-based insulating film, and the third via penetrates through a laminated film of the second SiO-based insulating film, the first nitride film, the third SiO-based insulating film, and the first SiO-based insulating film.

[B7] The semiconductor device according to [B5] or [B6] where the seal ring includes a lower ring portion that is formed on the insulating film laminated structure and is covered by the second SiO-based insulating film, an upper ring portion that is formed on the first SiO-based insulating film, and a ring main body portion that couples the lower ring portion and the upper ring portion and the upper ring portion is covered by the protective film.

[B8] The semiconductor device according to [B5] or [B6] where the seal ring is constituted of a lower ring portion that is formed on the insulating film laminated structure and is covered by the second SiO-based insulating film and a ring main body portion that is disposed in a region between the protective film and the lower ring portion and with which a lower surface is joined to an upper surface of the lower ring portion.

[B9] The semiconductor device according to [B5] or [B6] where the seal ring is constituted of a ring main body portion that is disposed in a region between an upper surface of the first SiO-based insulating film and the first nitride film and with which a lower surface is in contact with the first nitride film and an upper ring portion that is formed on the first SiO-based insulating film and with which a lower surface is joined to an upper surface of the ring main body portion, and the upper ring portion is covered by the protective film.

[B10] The semiconductor device according to [B5] or [B6] where the seal ring is constituted of a ring member that is disposed in a region between an upper surface of the first SiO-based insulating film and the first nitride film and with which a lower surface is in contact with the first nitride film.

[B11] The semiconductor device according to [B1] where the lower insulating film includes an insulating film laminated structure that is formed on the substrate and in which a nitride film and an SiO-based insulating film are laminated alternately, the first nitride film that is formed on the insulating film laminated structure, a fourth SiO-based insulating film that is formed on the first nitride film, and a fifth SiO-based insulating film that is formed on the fourth SiO-based insulating film, the resistor is formed on the fifth SiO-based insulating film, a first metal and a second metal that are formed on the fourth SiO-based insulating film and are covered by the fifth SiO-based insulating film, a first via that penetrates through the fifth SiO-based insulating film and electrically connects the first metal and one end portion of the resistor, and a second via that penetrates through the fifth SiO-based insulating film and electrically connects the second metal and another end portion of the resistor are included, and the upper insulating film includes the first SiO-based insulating film that is formed on the first nitride film such as to cover the resistor and the protective film that is formed on the first SiO-based insulating film.

[B12] The semiconductor device according to [B11] including a third metal that is formed on the first SiO-based insulating film and is a third metal electrically connected to the first metal or the second metal via a third via that penetrates through a laminated film of the fifth SiO-based insulating film and the first SiO-based insulating film and where the protective film is formed on the first SiO-based insulating film such as to cover the third metal.

[B13] The semiconductor device according to [B12] where the seal ring includes a lower ring portion that is formed on the fourth SiO-based insulating film and is covered by the fifth SiO-based insulating film, an upper ring portion that is formed on the first SiO-based insulating film, a ring main body portion that couples the lower ring portion and the upper ring portion, and a lower end ring portion that is disposed inside the fourth SiO-based insulating film and with which an upper surface is joined to a lower surface of the lower ring portion and a lower surface is in contact with the first nitride film and where the upper ring portion is covered by the protective film.

[B14] The semiconductor device according to [B12] where the seal ring is constituted of a lower ring portion that is formed on the fourth SiO-based insulating film and is covered by the fifth SiO-based insulating film, a ring main body portion that is disposed in a region between the protective film and the lower ring portion and with which a lower surface is joined to an upper surface of the lower ring portion, and a lower end ring portion that is disposed inside the fourth SiO-based insulating film and with which an upper surface is joined to a lower surface of the lower ring portion and a lower surface is in contact with the first nitride film.

[B15] The semiconductor device according to [B1] where the lower insulating film includes a sixth SiO-based insulating film that is formed on the substrate and the first nitride film that is formed on the sixth SiO-based insulating film, the resistor is formed on the first nitride film, and the upper insulating film includes the first SiO-based insulating film that is formed on the first nitride film such as to cover the resistor and the protective film that is formed on the first SiO-based insulating film.

[B16] The semiconductor device according to [B15] including a first lead-out electrode that is formed on the first SiO-based insulating film and is electrically connected to one end portion of the resistor and a second lead-out electrode that is formed on the first SiO-based insulating film and is electrically connected to another end portion of the resistor, the protective film is formed on the first SiO-based insulating film such as to cover the first lead-out electrode and the second lead-out electrode, and a first opening that exposes a portion of an upper surface of the first lead-out electrode and a second opening that exposes a portion of an upper surface of the second lead-out electrode are formed in the protective film.

[B17] The semiconductor device according to [B15] including a seventh SiO-based insulating film that is formed on the first nitride film and the resistor is formed on the seventh SiO-based insulating film.

[B18] The semiconductor device according to [B16] or [B17] where the seal ring is constituted of a ring main body portion that is disposed in a region between an upper surface of the first SiO-based insulating film and the first nitride film and with which a lower surface is in contact with the first nitride film and an upper ring portion that is formed on the first SiO-based insulating film and with which a lower surface is joined to an upper surface of the ring main body portion, and the upper ring portion is covered by the protective film.

[B19] The semiconductor device according to [B16] or [B17] where the seal ring is constituted of a ring member that is disposed in a region between an upper surface of the first SiO-based insulating film and the first nitride film and with which a lower surface is in contact with the first nitride film.

[B20] A method for manufacturing a semiconductor device including a step of forming a lower insulating film, including a first nitride film, on a substrate, a step of forming a resistor on the lower insulating film, a step of forming an upper insulating film on the lower insulating film such as to cover the resistor, and a step of forming a seal ring made of metal such as to surround the resistor in plan view and where the upper insulating film includes a first SiO-based insulating film that is formed on the lower insulating film such as to cover the resistor and a protective film that is disposed on the first SiO-based insulating film and includes a second nitride film, and the seal ring includes at least a main ring portion that is formed in a region between the first nitride film and the second nitride film.

With this manufacturing method, a semiconductor device that includes a resistor and is a semiconductor device having a novel arrangement and enabling improvement of moisture resistance can be manufactured.

Detailed Description of Preferred Embodiments of the Third Disclosure

In the following, preferred embodiments of the third disclosure shall be described in detail based on FIG. 1 to FIG. 3 and FIG. 26 to FIG. 60.

FIG. 1 is an illustrative plan view showing a semiconductor device according to a preferred embodiment of the present invention. FIG. 2 is a schematic view mainly showing the general electrical arrangement of a first chip and the general electrical arrangement of a second chip. FIG. 3 is an illustrative plan view of the first chip.

Since FIG. 1 to FIG. 3 are the same as FIG. 1 to FIG. 3 of the first disclosure, description thereof shall be omitted.

Figure 26:
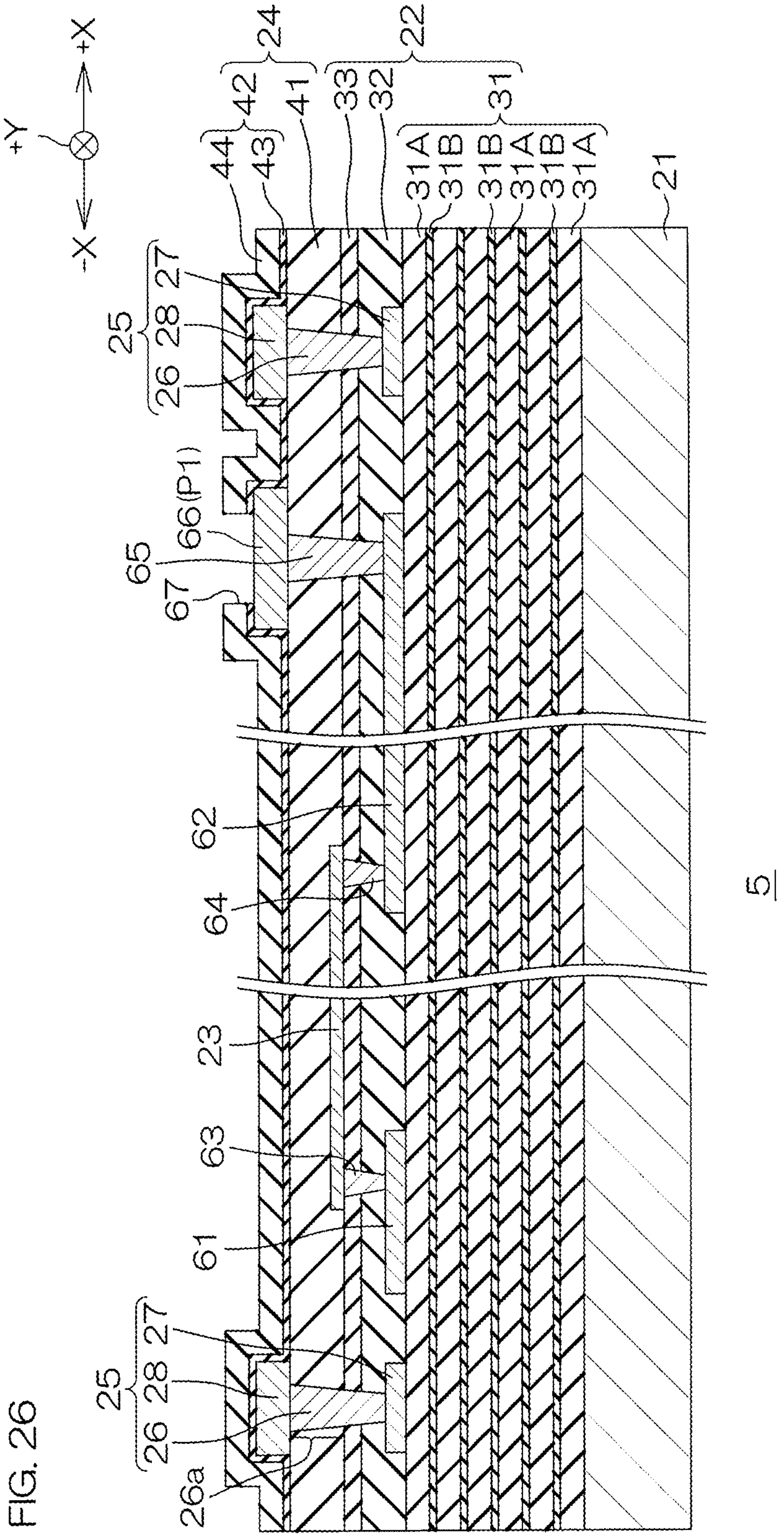
FIG. 26 is a sectional view taken along line A-A of FIG. 3 in the third disclosure.

FIG. 26 is a sectional view taken along line A-A of FIG. 3.

A sectional structure of the first chip 5 shall be described.

The first chip 5 includes a substrate 21, a lower insulating film 22 that is formed on the substrate 21, a resistor 23 that is formed on the lower insulating film 22 and constitutes a resistor r, an upper insulating film 24 that is formed on the lower insulating film 22 such as to cover the resistor 23, and a seal ring 25 made of metal that is disposed such as to surround all resistors 23 in plan view.

The seal ring 25 is constituted of a ring main body portion 26 of rectangular annular shape in plan view, a lower ring portion 27 that is formed along an entire length of a lower surface of the ring main body portion 26, and an upper ring portion 28 that is formed along an entire length of an upper surface of the ring main body portion 26. The lower ring portion 27 projects inward and outward with respect to the ring main body portion 26 in vertical sectional view. The upper ring portion 28 projects inward and outward with respect to the ring main body portion 26 in vertical sectional view.

Further, the first chip 5 includes a first lower metal 61 and a second lower metal 62 that are disposed inside the lower insulating film 22 and an upper metal 66 that is disposed inside the upper insulating film 24. However, a portion of an upper surface of the upper metal 66 is exposed from the upper insulating film 24.

The substrate 21 is constituted, for example, of an Si substrate. A film thickness of the substrate 21 is, for example, approximately 300 μm.

The lower insulating film 22 includes an insulating film laminated structure 31 that is formed on the substrate 21, a second SiO-based insulating film 32 that is formed on the insulating film laminated structure 31, and a first nitride film 33 that is formed on the second SiO-based insulating film 32.

In this preferred embodiment and in the first to thirty-first modification examples 5A to 5Z6 of the first chip 5 to be described below, $SiO_2$ is used as the "SiO-based insulating film." Also, in this preferred embodiment and in the first to thirty-first modification examples 5A to 5Z6 of the first chip 5 to be described below, an SiN film is used as the "nitride film."

The insulating film laminated structure 31 has a structure in which a first insulating film 31A constituted of an SiO-based insulating film and a second insulating film 31B constituted of a nitride film having tensile stress are laminated alternately. The number of laminated layers of the first insulating film 31A and the second insulating film 31B may be any number and may differ from the number of laminated layers shown in FIG. 26. The two types of insulating films 31A and 31B are laminated to control warping of the substrate 21, caused by film-forming of the first insulating film 31A, by film-forming of the second insulating film 31B and film-form the insulating film thickly.

A film thickness of the first insulating film 31A is, for example, approximately 2 μm and a film thickness of the second insulating film 31B is, for example, approximately 0.3 μm. A thickness of the insulating film laminated structure 31 is, for example, approximately 13.5 μm.

A plurality of lower metals 61 and 62 and the lower ring portion 27 are disposed on the insulating film laminated structure 31. In the example of FIG. 26, the lower metals 61 and 62 include, in a region surrounded by the lower ring portion 27, the first lower metal 61 that is disposed close to a −X side end and the second lower metal 62 that is disposed at a +X side with respect to the first lower metal 61. In this preferred embodiment, the lower metals 61 and 62 and the lower ring portion 27 are constituted, for example, of Al (aluminum). The lower metals 61 and 62 are used to electrically connect the real resistors ra to each other and to connect the real resistors ra to the terminals P1 to P6.

The lower ring portion 27 is of a rectangular annular shape in plan view. The lower ring portion 27 is disposed such as to surround all of the resistors 23 and lower metals 61 and 62 in plan view.

The second SiO-based insulating film 32 is formed on the insulating film laminated structure 31 such as to cover the lower metals 61 and 62 and the lower ring portion 27. Also, the first nitride film 33 is formed on the second SiO-based insulating film 32. The first nitride film 33 is preferably formed on substantially an entire area of the second SiO-based insulating film 32 upper surface. A film thickness of the second SiO-based insulating film 32 is approximately 0.8 μm. A film thickness of the first nitride film 33 is approximately 0.15 μm.

The resistor 23 is formed on the first nitride film 33. The resistor 23 is of a rectangular shape that is long in the X direction in plan view. The resistor 23 is disposed such as to extend across the first lower metal 61 and the second lower metal 62 in plan view. In this preferred embodiment, the resistor 23 is constituted of CrSi.

A −X side end portion of a lower surface of the resistor 23 is electrically connected to the first lower metal 61 via a first via 63 that penetrates continuously through the first nitride film 33 and the second SiO-based insulating film 32. A +X side end portion of the lower surface of the resistor 23 is electrically connected to a −X side end portion of the second lower metal 62 via a second via 64 that penetrates continuously through the first nitride film 33 and the second SiO-based insulating film 32. In this preferred embodiment, the first via 63 and the second via 64 are constituted, for example, of W (tungsten).

The upper insulating film 24 includes a first SiO-based insulating film 41 that is formed on the first nitride film 33 such as to cover the resistor 23 and a protective film 42 that is formed on the first SiO-based insulating film 41. A film thickness of the first SiO-based insulating film 41 is approximately 0.4 μm.

The upper metal 66 and the upper ring portion 28 are formed on the first SiO-based insulating film 41. In this preferred embodiment, the upper metal 66 and the upper ring portion 28 are constituted of Al (aluminum).

In this preferred embodiment and in the first to ninth modification examples 5A to 5I (see FIG. 28 and FIG. 30) of the first chip 5 to be described below, each upper metal 66 includes any of the terminals P1 to P6 (see FIG. 3). There are cases where the upper metal 66 includes just a terminal and cases where it integrally includes a terminal and a wiring. The upper metal 66 appearing in FIG. 26 includes just the terminal P1. In other words, the upper metal 66 appearing in FIG. 26 constitutes the terminal P1.

In addition, although not appearing in FIG. 26, there are also portions where an upper metal is connected to the first lower metal 61 via an unillustrated via. As such an upper metal, there is an upper metal that constitutes the wiring 154 and the terminal P4 in FIG. 3 and an upper metal that constitutes the wiring 159 and the terminal P5 in FIG. 3.

The upper metal 66 shown in FIG. 26 is disposed such that a portion overlaps with a +X side end portion of the second lower metal 62 in plan view. The upper metal 66 is electrically connected to the +X side end portion of the second lower metal 62 via a third via 65 that penetrates continuously through the first SiO-based insulating film 41, the first nitride film 33, and the second SiO-based insulating film 32. In this preferred embodiment, the third via 65 is constituted of W (tungsten). The second lower metal 62 and the third via 65 shown in FIG. 26 constitute the wiring 152 (see FIG. 3).

The upper ring portion 28 is disposed directly above the lower ring portion 27 in plan view. The upper ring portion 28 is disposed inside a laminated film of the second SiO-based insulating film 32, the first nitride film 33, and the first SiO-based insulating film 41 and is coupled to the lower ring portion 27 via the ring main body portion 26 that penetrates through the laminated film. In this preferred embodiment, the ring main body portion 26 is constituted of W (tungsten).

The protective film 42 includes a protective SiO-based insulating film 43 that is formed on the first SiO-based insulating film 41 such as to cover the upper metal 66 and the upper ring portion 28 and a second nitride film 44 that is formed on the protective SiO-based insulating film 43. A film thickness of the first protective SiO-based insulating film 41 is approximately 0.4 μm. A film thickness of the second nitride film 44 is approximately 1.2 μm.

An opening 67 arranged to expose a portion of the upper surface of the upper metal 66 is formed in the protective film 42. A pad portion arranged to connect wirings to the terminals P1 to P6 is formed by the opening 67.

The seal ring 25 has a main ring portion (corresponding to a main ring portion of the present disclosure) that is formed between the protective film 42 and the first nitride film 33. With this preferred embodiment, the main ring portion is constituted of a portion 26*a* of the ring main body portion 26 that is disposed inside the first SiO-based insulating film 41 and the upper ring portion 28.

With this preferred embodiment, improvement of moisture resistance is enabled because all resistors 23 are surrounded by the first nitride film 33, the protective film 42 that includes the second nitride film 44, and the seal ring 25. Also, the protective film 42 may be constituted of just the second nitride film 44.

With this preferred embodiment, there is a possibility that resistance characteristics of the resistors r will vary due to process variation when the first chip 5 is manufactured. The process variation tends to occur in a stepwise manner along one direction, for example, the −Y direction or the +Y direction.

With this preferred embodiment, a real resistor set that constitutes the second resistor circuit 122 is disposed between two real resistors ra adjacent in the Y direction among a real resistor set that constitutes the first resistor circuit 121. Thereby, a difference is made unlikely to arise between an average value of resistance values of the real resistors ra inside the first resistor circuit 121 and an average value of resistance values of the real resistors ra inside the second resistor circuit 122. Consequently, an error is made unlikely to arise in the ratio (R2/R1) of the resistance value R2 of the second resistor circuit 122 with respect to the resistance value R1 of the first resistor circuit 121.

Similarly, with this preferred embodiment, a real resistor set that constitutes the third resistor circuit 123 is disposed between two real resistors ra adjacent in the Y direction among a real resistor set that constitutes the fourth resistor circuit 124. Thereby, a difference is made unlikely to arise between an average value of resistance values of the real resistors ra inside the fourth resistor circuit 124 and an average value of resistance values of the real resistors ra inside the third resistor circuit 123. Consequently, an error is made unlikely to arise in the ratio (R3/R4) of the resistance value R3 of the third resistor circuit 123 with respect to the resistance value R4 of the fourth resistor circuit 124.

As mentioned above, when the second resistor circuit 122 is disposed as in the preferred embodiment, a high voltage difference is generated between the second resistor circuit 122 and the real resistors ra adjacent thereto of the first resistor circuit 121. Also, when the third resistor circuit 123 is disposed as in the preferred embodiment, a high voltage difference is generated between the third resistor circuit 123 and the real resistors ra adjacent thereto of the fourth resistor circuit 124. However, in the preferred embodiment, the dummy resistors rb are disposed at the locations at which the high voltage differences are generated and therefore, the electric fields at the locations at which the high voltage differences are generated can be relaxed.

FIG. 27A to FIG. 27D are sectional views showing an example of a manufacturing process of the first chip 5 shown in FIG. 3 and FIG. 26 and are sectional views corresponding to the section plane of FIG. 26.

Figure 27A:
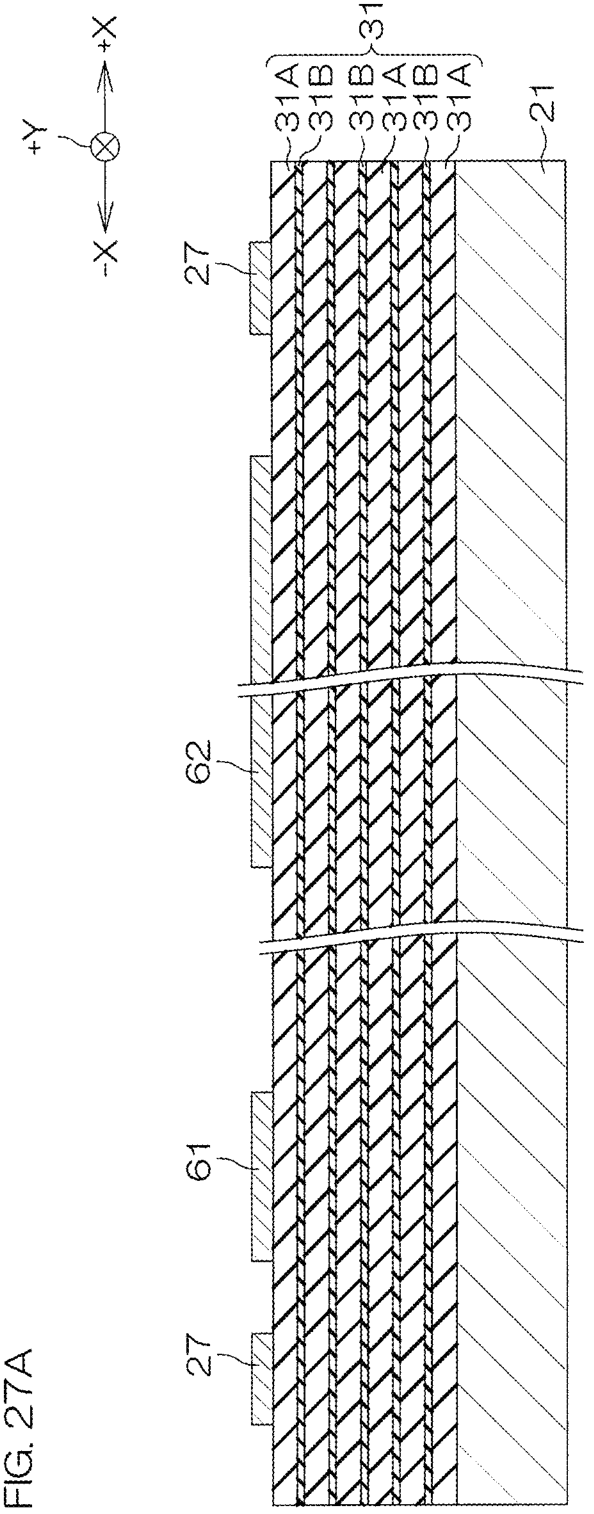
FIG. 27A is a sectional view showing a portion of a manufacturing process of the first chip in the third disclosure shown in FIG. 3 and FIG. 26 and is a sectional view corresponding to the section plane of FIG. 26.

First, as shown in FIG. 27A, the insulating film laminated structure 31 is formed by alternately laminating the first insulating film 31A and the second insulating film 31B on the substrate 21. Then, after forming a metal film (an Al film in this preferred embodiment) that is a material film of the first lower metal 61, the second lower metal 62, and the lower ring portion 27 on the insulating film laminated structure 31, the metal film is patterned. The first lower metal 61, the second lower metal 62, and the lower ring portion 27 are thereby formed on the insulating film laminated structure 31.

Figure 27B:
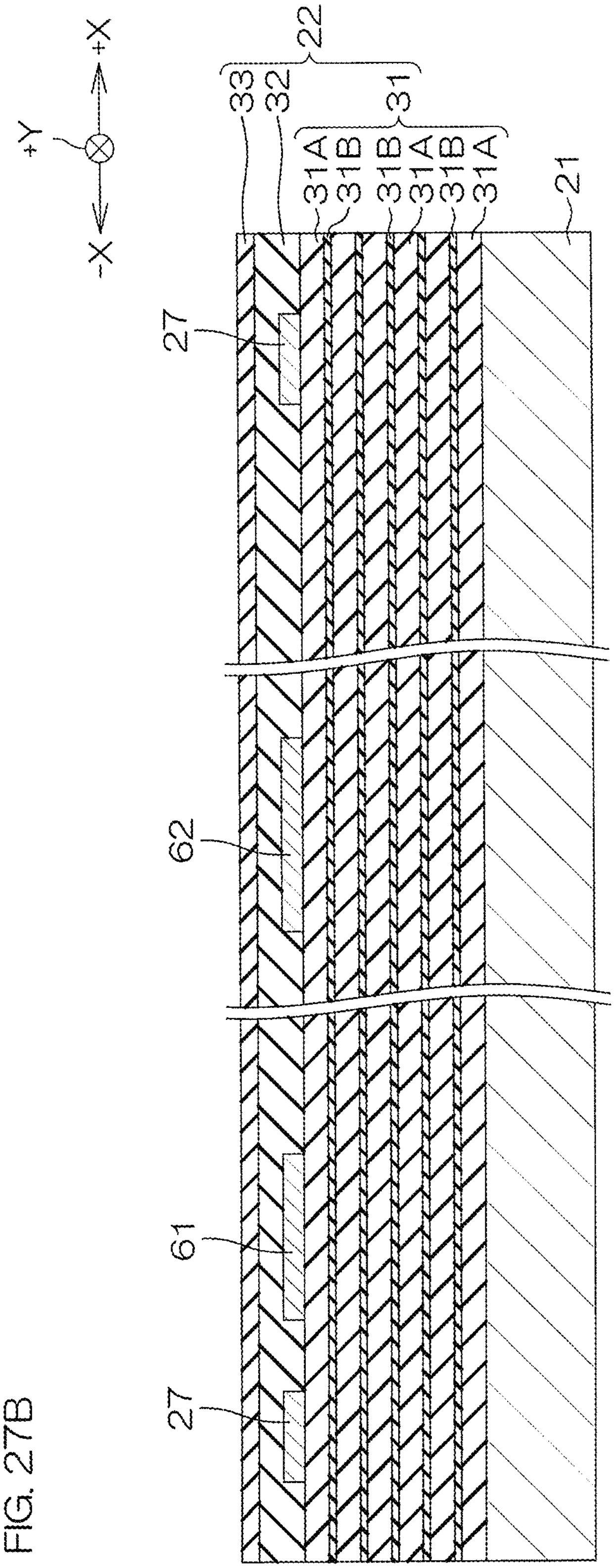
FIG. 27B is a sectional view showing a step subsequent to that of FIG. 27A.

Next, as shown in FIG. 27B, the second SiO-based insulating film 32 is formed on the insulating film laminated structure 31 such as to cover the first lower metal 61, the second lower metal 62, and the lower ring portion 27. The first nitride film 33 is then formed on the second SiO-based insulating film 32. The lower insulating film 22 that is constituted of the insulating film laminated structure 31, the second SiO-based insulating film 32, and the first nitride film 33 is thereby obtained.

Figure 27C:
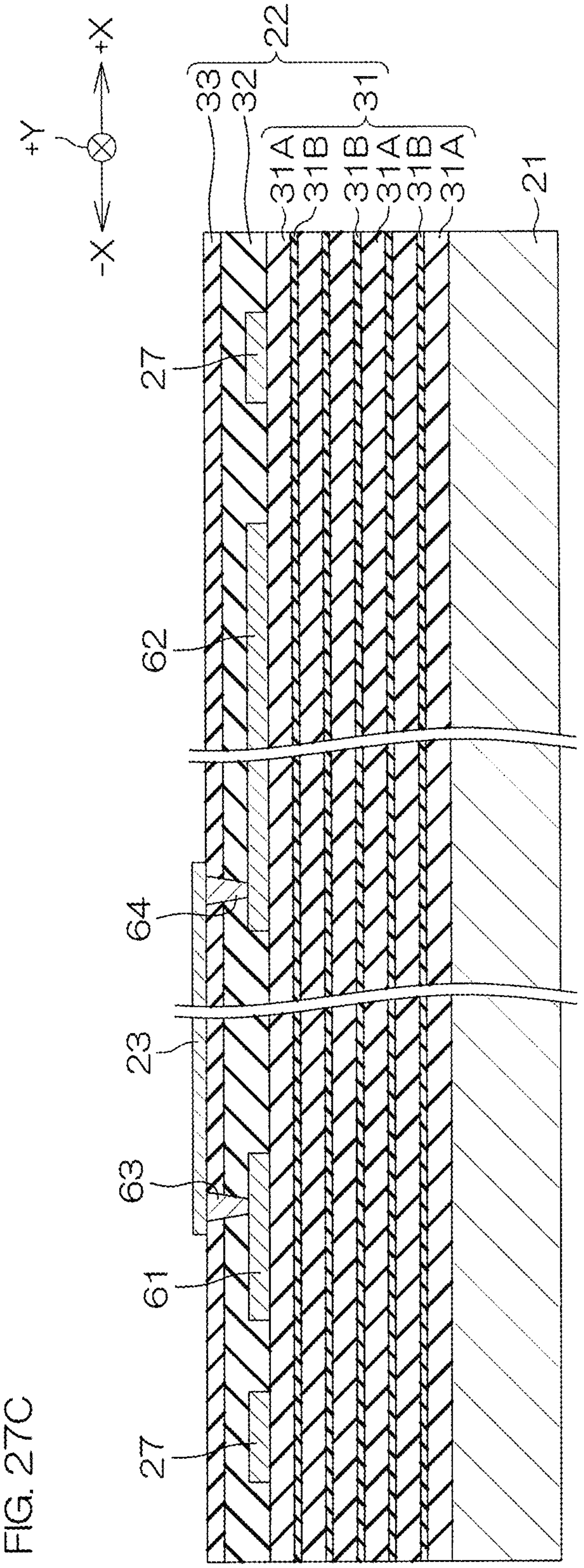
FIG. 27C is a sectional view showing a step subsequent to that of FIG. 27B.

Next, in a laminated film of the second SiO-based insulating film 32 and the first nitride film 33, the first via 63 and the second via 64 that penetrate through the laminated film and with which lower ends reach the first lower metal 61 and the second lower metal 62, respectively, are formed as shown in FIG. 27C. Then, after a resistive material film that is a material film of the resistor 23 is formed on the first nitride film 33, the resistive material film is patterned to form a plurality of resistors 23 (the plurality of real resistors ra and the plurality of dummy resistors rb). Upper ends of the first via 63 and the second via 64 are thereby connected to the resistor 23.

Figure 27D:
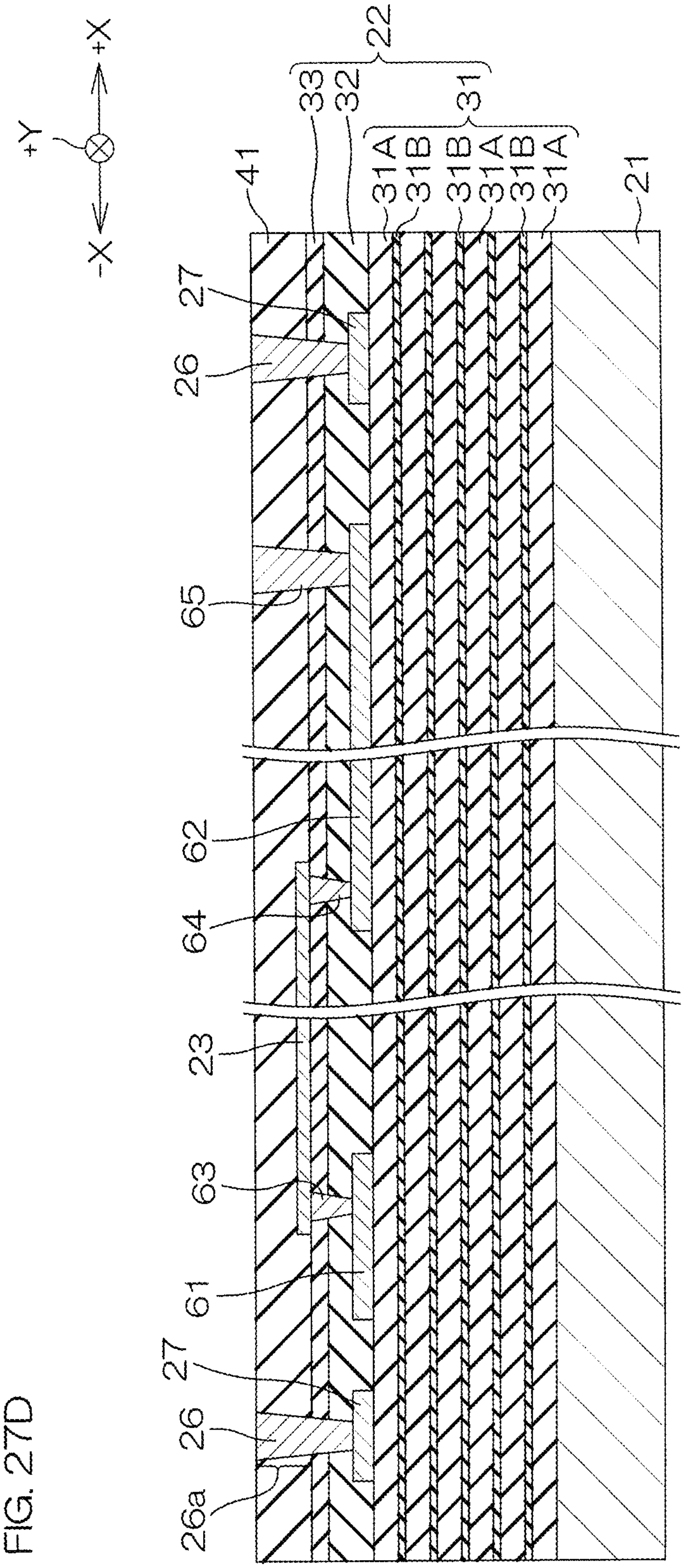
FIG. 27D is a sectional view showing a step subsequent to that of FIG. 27C.

Next, as shown in FIG. 27D, the first SiO-based insulating film 41 is formed on the first nitride film 33 such as to cover the resistor 23. Next, in a laminated film of the second SiO-based insulating film 32, the first nitride film 33, and the first SiO-based insulating film 41, the third via 65 that penetrates through the laminated film and with which a lower end reaches the second lower metal 62 and the ring main body portion 26 that penetrates through the laminated film and with which a lower end is joined to the lower ring portion 27 are formed. In this preferred embodiment, the third via 65 and the ring main body portion 26 are constituted of W (tungsten).

Figure 27E:
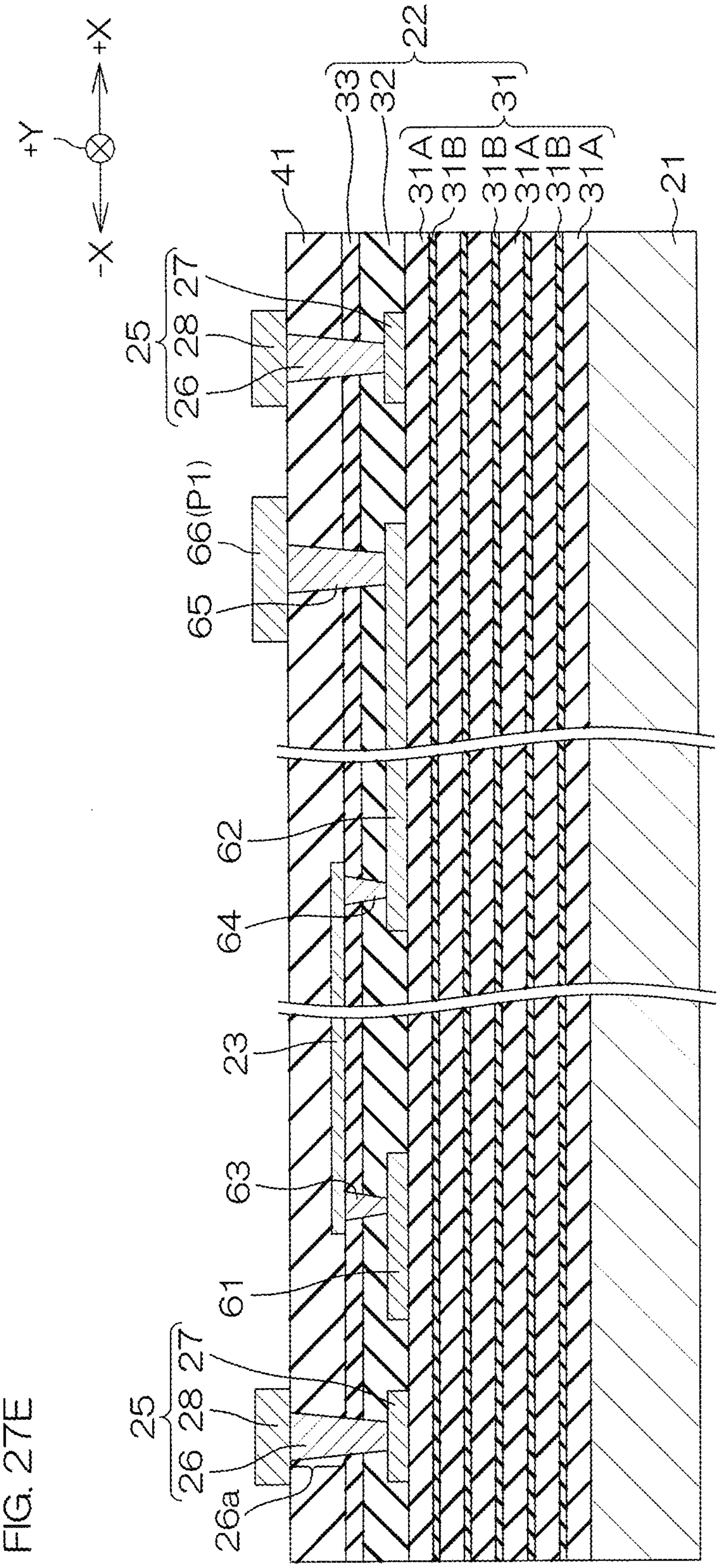
FIG. 27E is a sectional view showing a step subsequent to that of FIG. 27D.

Next, as shown in FIG. 27E, after a metal film (an Al film in this preferred embodiment) that is a material film of the upper metal 66 and the upper ring portion 28 is formed on the first SiO-based insulating film 41, the metal film is patterned. The upper metal 66 and the upper ring portion 28 are thereby formed on the first SiO-based insulating film 41. An upper end of the third via 65 is thereby connected to the upper metal 66. Also, the upper surface of the ring main body portion 26 is joined to a lower surface of the upper ring portion 28.

Thereafter, the protective SiO-based insulating film 43 and the second nitride film 44 are formed in that order on the first nitride film 33 such as to cover the upper metal 66 and the ring main body portion 26. The protective film 42 that is a laminated film of the protective SiO-based insulating film 43 and the second nitride film 44 is thereby obtained. The opening 67 that exposes a portion of the upper surface of the upper metal 66 is then formed in the protective film 42. The first chip 5 such as shown in FIG. 3 and FIG. 26 is thereby obtained.

Figure 28:
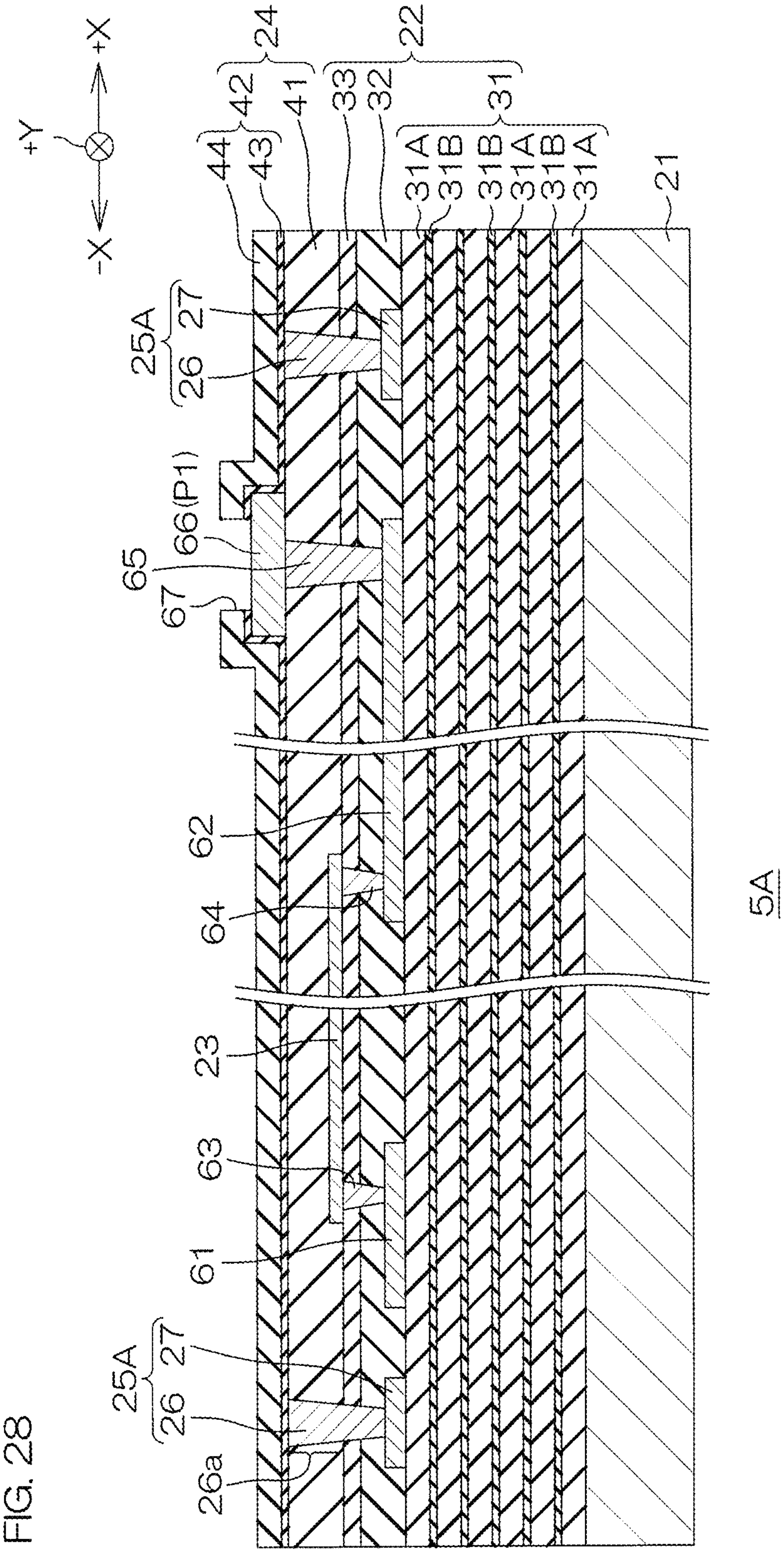
FIG. 28 is an illustrative sectional view for describing a first modification example of the first chip in the third disclosure.

FIG. 28 is a sectional view for describing the first modification example of the first chip and is a sectional view corresponding to FIG. 26. In FIG. 28, portions corresponding to respective portions in FIG. 26 are indicated with the same reference signs attached as in FIG. 26.

A plan view of a first chip 5A of FIG. 28 is the same as FIG. 3. The first chip 5A of FIG. 28 differs in the arrangement of a seal ring 25A from the seal ring 25 of the first chip 5 of FIG. 26. Specifically, the seal ring 25A does not include the upper ring portion 28 in the seal ring 25 illustrated in FIG. 26. That is, the seal ring 25A is constituted of the ring main body portion 26 and the lower ring portion 27 of the seal ring 25 illustrated in FIG. 26.

With the first chip 5A of FIG. 28, the main ring portion of the present disclosure is constituted of a portion 26*a* of the ring main body portion 26 that is disposed inside the first SiO-based insulating film 41.

With the first modification example, improvement of moisture resistance is enabled because all resistors 23 are surrounded by the first nitride film 33, the protective film 42 that includes the second nitride film 44, and the seal ring 25A. Also, the protective film 42 may be constituted of just the second nitride film 44.

In comparison to the method for manufacturing the first chip 5 of FIG. 26, a method for manufacturing the first chip 5A of FIG. 28 differs just in the point that the upper ring portion 28 is not formed on the first SiO-based insulating film 41 and therefore, a description thereof shall be omitted.

Figure 29:
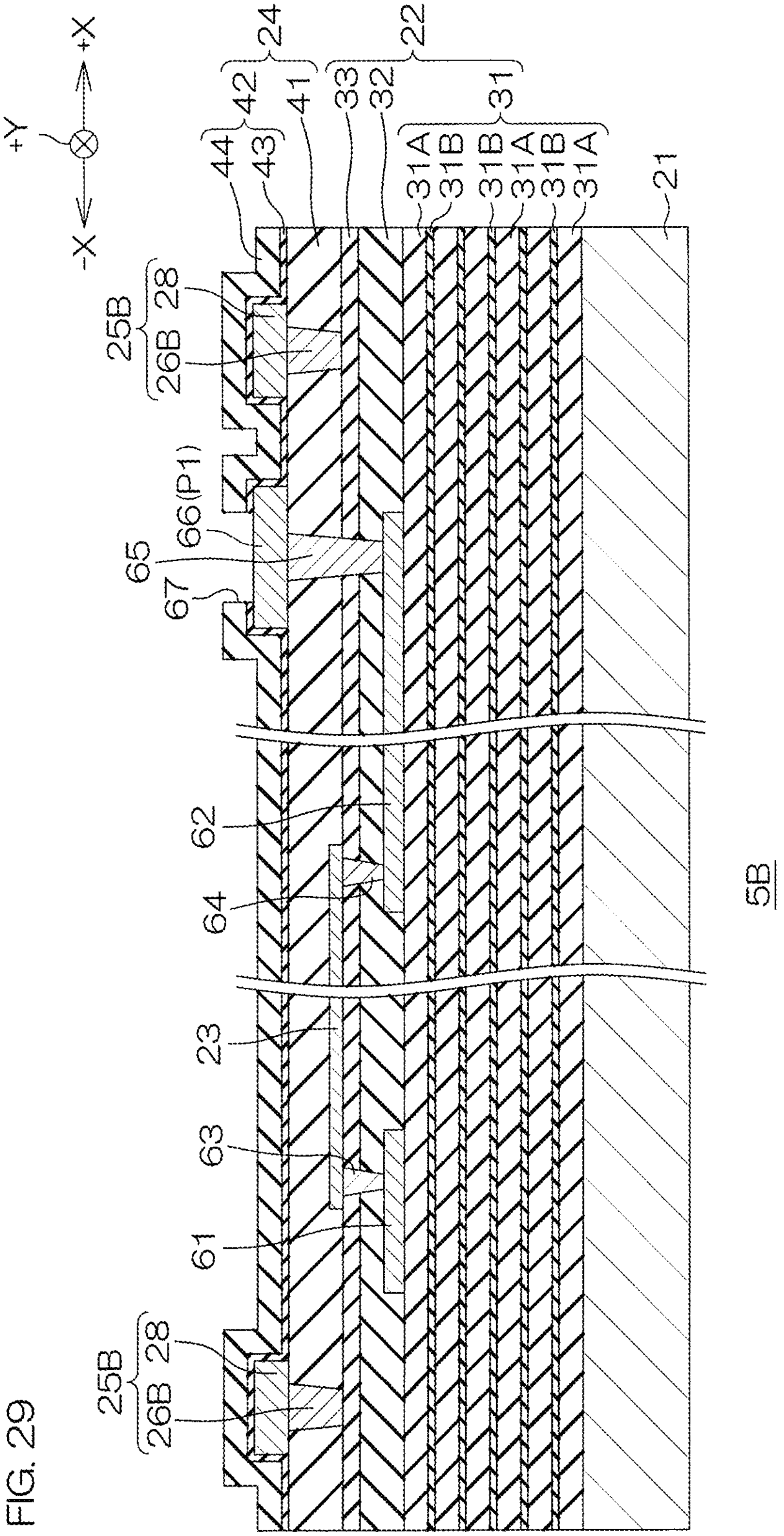
FIG. 29 is an illustrative sectional view for describing a second modification example of the first chip in the third disclosure.

FIG. 29 is a sectional view for describing the second modification example of the first chip and is a sectional view corresponding to FIG. 26. In FIG. 29, portions corresponding to respective portions in FIG. 26 are indicated with the same reference signs attached as in FIG. 26.

A plan view of a first chip 5B of FIG. 29 is the same as FIG. 3. The first chip 5B of FIG. 29 differs in the arrangement of a seal ring 25B from the seal ring 25 of the first chip 5 of FIG. 26. Specifically, the seal ring 25B is constituted of a ring main body portion 26B that is disposed inside the first SiO-based insulating film 41 and the upper ring portion 28 that is disposed on the first SiO-based insulating film 41. That is, the seal ring 25B does not include the lower ring portion 27 of the seal ring 25 illustrated in FIG. 26 and a portion lower than the first SiO-based insulating film 41 of the ring main body portion 26 of the seal ring 25 illustrated in FIG. 26.

A lower surface of the ring main body portion 26B is in contact with an upper surface of the first nitride film 33. An upper surface of the ring main body portion 26B is joined to the lower surface of the upper ring portion 28.

With the first chip 5B of FIG. 29, the main ring portion of the present disclosure is constituted of the ring main body portion 26B and the upper ring portion 28.

With the second modification example, improvement of moisture resistance is enabled because all resistors 23 are surrounded by the first nitride film 33, the protective film 42 that includes the second nitride film 44, and the seal ring 25B. Also, the protective film 42 may be constituted of just the second nitride film 44.

In comparison to the method for manufacturing the first chip 5 of FIG. 26, a method for manufacturing the first chip 5B of FIG. 29 differs just in the point that the lower ring portion 27 and the portion lower than the first SiO-based insulating film 41 of the ring main body portion 26 are not formed and therefore, a description thereof shall be omitted.

Figure 30:
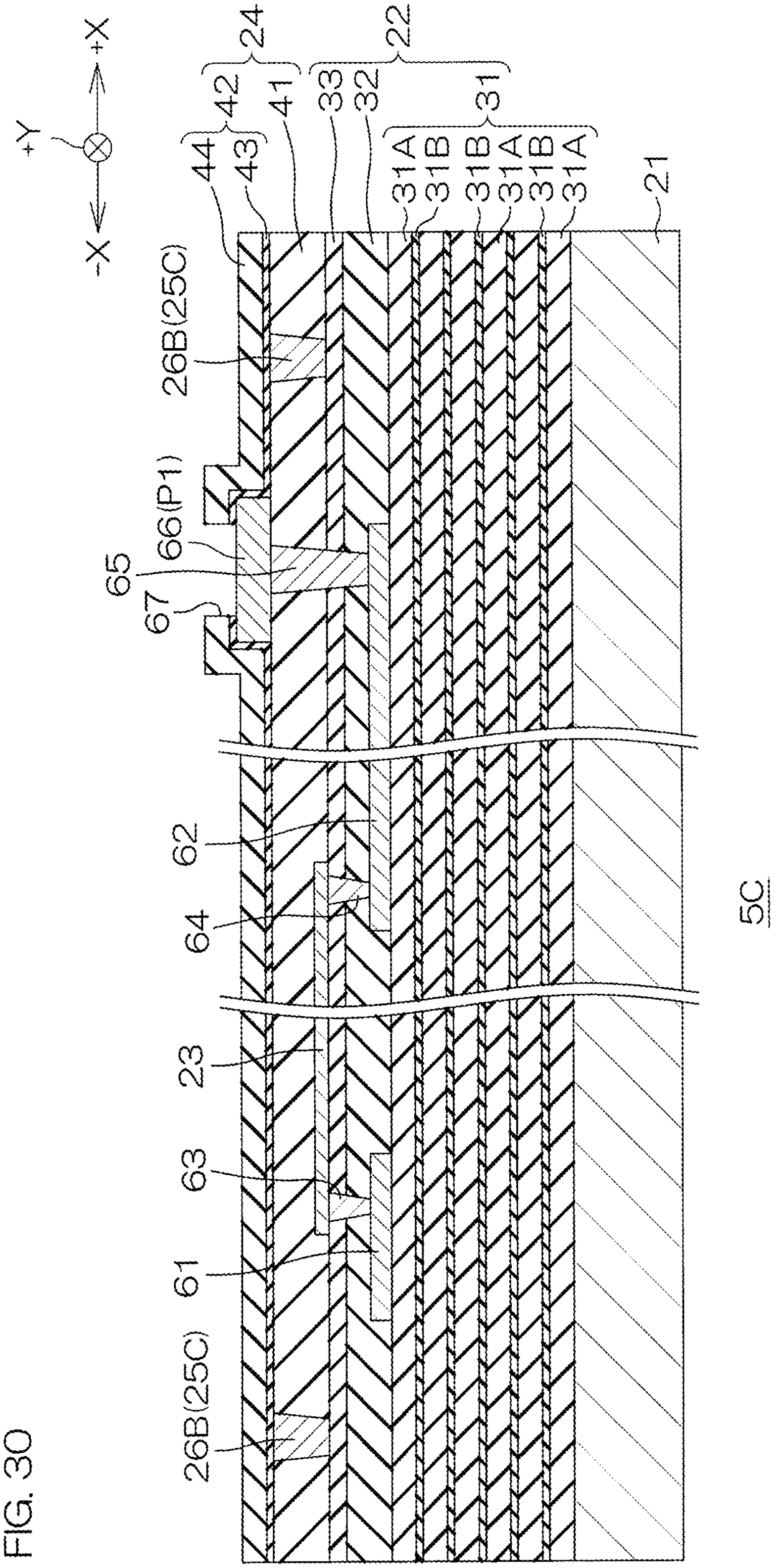
FIG. 30 is an illustrative sectional view for describing a third modification example of the first chip in the third disclosure.

FIG. 30 is a sectional view for describing the third modification example of the first chip and is a sectional view corresponding to FIG. 26. In FIG. 30, portions corresponding to respective portions in FIG. 26 are indicated with the same reference signs attached as in FIG. 26.

A plan view of a first chip 5C of FIG. 30 is the same as FIG. 3. The first chip 5C of FIG. 30 differs in the arrangement of a seal ring 25C from the seal ring 25 of the first chip 5 of FIG. 26. Specifically, the seal ring 25C is constituted of just the ring main body portion 26B in FIG. 29 described above. That is, the seal ring 25C is constituted of a ring member that is disposed inside the first SiO-based insulating film 41. In other words, the seal ring 25C does not include the lower ring portion 27 of the seal ring 25 illustrated in FIG. 26, the portion lower than the first SiO-based insulating film 41 of the ring main body portion 26 of the seal ring 25 illustrated in FIG. 26, and the upper ring portion 28.

With the first chip 5C of FIG. 30, an entirety of the seal ring 25C corresponds to being the main ring portion of the present disclosure.

With the third modification example, improvement of moisture resistance is enabled because all resistors 23 are surrounded by the first nitride film 33, the protective film 42 that includes the second nitride film 44, and the seal ring 25C. Also, the protective film 42 may be constituted of just the second nitride film 44.

In comparison to the method for manufacturing the first chip 5 of FIG. 26, a method for manufacturing the first chip 5C of FIG. 30 differs just in the point that the lower ring portion 27, the portion lower than the first SiO-based insulating film 41 of the ring main body portion 26, and the upper ring portion 28 are not formed and therefore, a description thereof shall be omitted.

Figure 31:
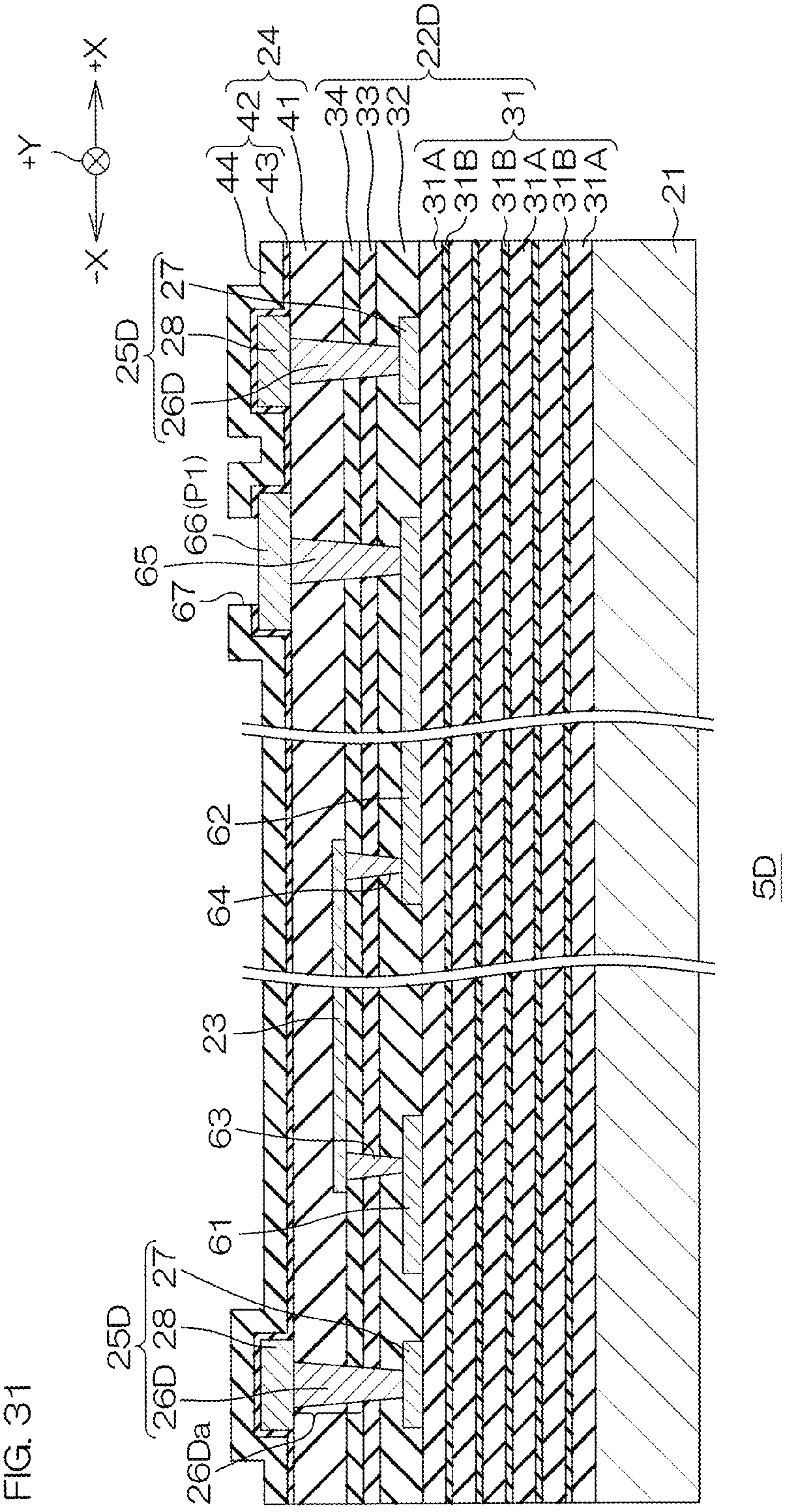
FIG. 31 is an illustrative sectional view for describing a fourth modification example of the first chip in the third disclosure.

FIG. 31 is a sectional view for describing the fourth modification example of the first chip and is a sectional view corresponding to FIG. 26. In FIG. 31, portions corresponding to respective portions in FIG. 26 are indicated with the same reference signs attached as in FIG. 26.

A plan view of a first chip 5D of FIG. 31 is the same as FIG. 3. The first chip 5D of FIG. 31 differs from the first chip 5 of FIG. 26 in the points that a third SiO-based insulating film 34 is formed on the first nitride film 33 and the resistor 23 is formed on the third SiO-based insulating film 34. The arrangement of a seal ring 25D thereby differs from the seal ring 25 of the first chip 5 of FIG. 26.

With the first chip 5D of FIG. 31, a lower insulating film 22D is constituted of the insulating film laminated structure 31 that is formed on the substrate 21, the second SiO-based insulating film 32 that is formed on the insulating film laminated structure 31, the first nitride film 33 that is formed on the second SiO-based insulating film 32, and the third SiO-based insulating film 34 that is formed on the first nitride film 33.

The first via 63 and the second via 64 penetrate through a laminated film of the second SiO-based insulating film 32, the first nitride film 33, and the third SiO-based insulating film 34. The third via 65 penetrates through a laminated film of the second SiO-based insulating film 32, the first nitride film 33, the third SiO-based insulating film 34, and the first SiO-based insulating film 41.

The seal ring 25D differs in a ring main body portion 26D from the seal ring 25 of the first chip 5 of FIG. 26. Specifically, the ring main body portion 26D penetrates through the laminated film of the second SiO-based insulating film 32, the first nitride film 33, the third SiO-based insulating film 34, and the first SiO-based insulating film 41.

With the first chip 5D of FIG. 31, the main ring portion of the present disclosure is constituted of a portion 26Da of the ring main body portion 26D that is disposed inside a laminated film of the third SiO-based insulating film 34 and the first SiO-based insulating film 41 and the upper ring portion 28.

With the fourth modification example, improvement of moisture resistance is enabled because all resistors 23 are surrounded by the first nitride film 33, the protective film 42 that includes the second nitride film 44, and the seal ring 25D. Also, the protective film 42 may be constituted of just the second nitride film 44.

In comparison to the method for manufacturing the first chip 5 of FIG. 26, a method for manufacturing the first chip 5D of FIG. 31 differs just in the point that the third SiO-based insulating film 34 is formed on the first nitride film 33 and the point that the ring main body portion 26D, the first via 63, the second via 64, and the third via 65 are accordingly formed to penetrate through the third SiO-based insulating film 34 and therefore, a description thereof shall be omitted.

Figure 32:
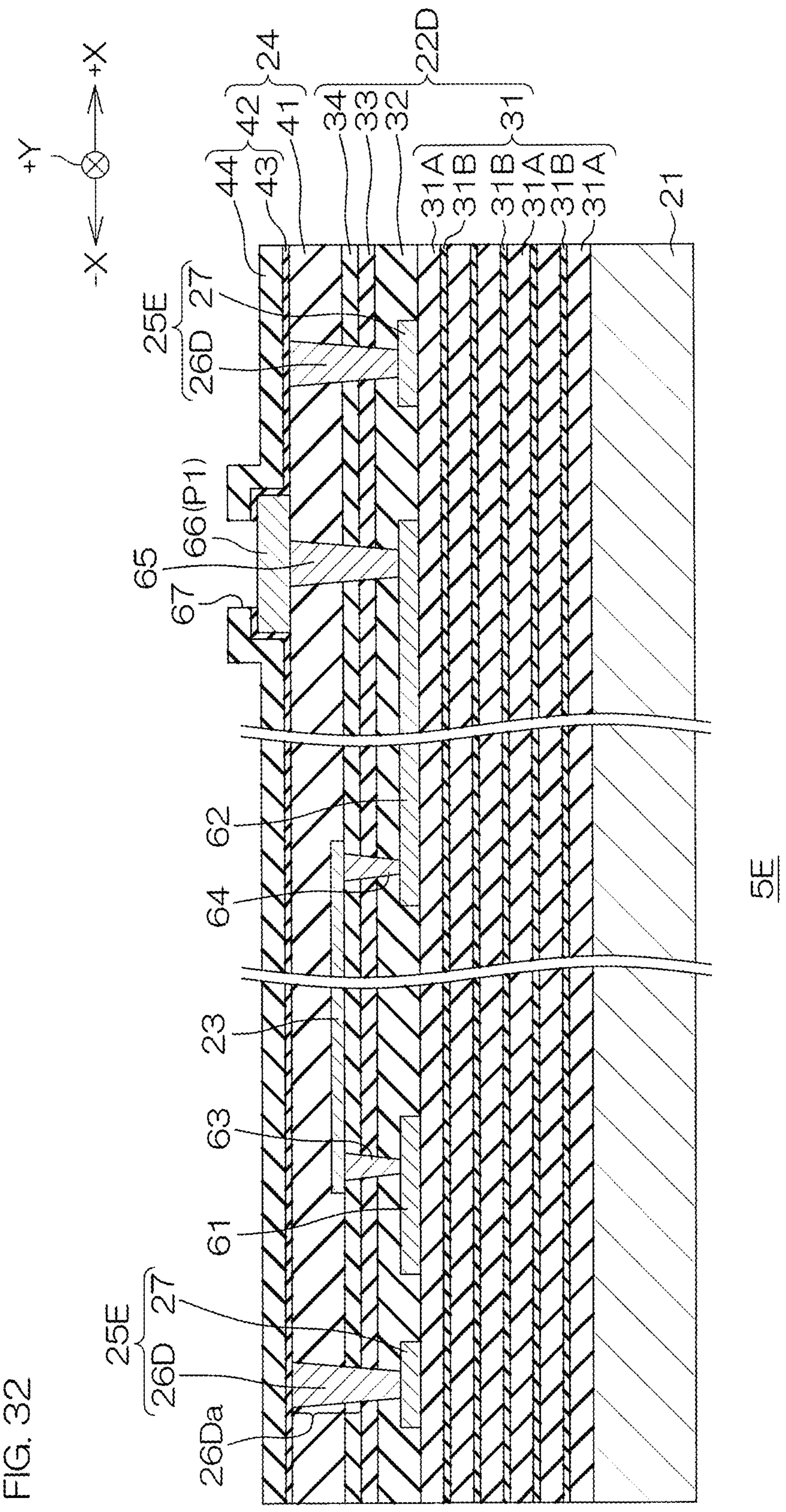
FIG. 32 is an illustrative sectional view for describing a fifth modification example of the first chip in the third disclosure.

FIG. 32 is a sectional view for describing the fifth modification example of the first chip. The sectional structure of a first chip 5E of FIG. 32 is similar to the sectional structure of the first chip 5D of FIG. 31. In FIG. 32, portions corresponding to respective portions in FIG. 31 are indicated with the same reference signs attached as in FIG. 31.

A plan view of the first chip 5E of FIG. 32 is the same as FIG. 3. The first chip 5E of FIG. 32 differs in the arrangement of a seal ring 25E from the seal ring 25D of the first chip 5D of FIG. 31. Specifically, the seal ring 25E does not include the upper ring portion 28 of the seal ring 25D illustrated in FIG. 31. That is, the seal ring 25E is constituted of the ring main body portion 26D and the lower ring portion 27 of the seal ring 25D illustrated in FIG. 31.

With the first chip 5E of FIG. 32, the main ring portion of the present disclosure is constituted of the portion 26Da of the ring main body portion 26D that is disposed inside the laminated film of the third SiO-based insulating film 34 and the first SiO-based insulating film 41.

With the fifth modification example, improvement of moisture resistance is enabled because all resistors 23 are surrounded by the first nitride film 33, the protective film 42 that includes the second nitride film 44, and the seal ring 25E. Also, the protective film 42 may be constituted of just the second nitride film 44.

In comparison to the method for manufacturing the first chip 5D of FIG. 31, a method for manufacturing the first chip 5E of FIG. 32 differs just in the point that the upper ring portion 28 is not formed on the first SiO-based insulating film 41 and therefore, a description thereof shall be omitted.

Figure 33:
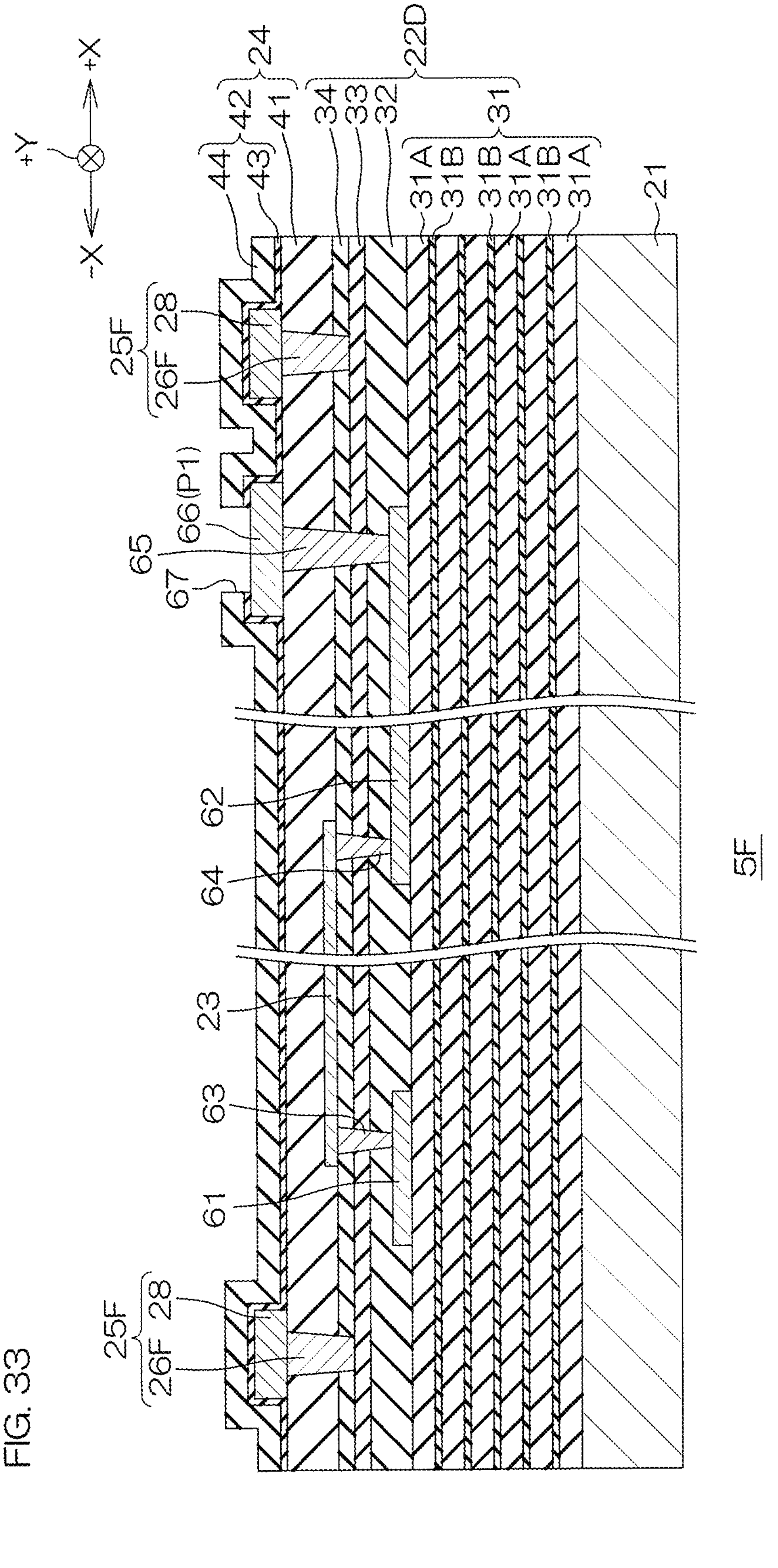
FIG. 33 is an illustrative sectional view for describing a sixth modification example of the first chip in the third disclosure.

FIG. 33 is a sectional view for describing the sixth modification example of the first chip. The sectional structure of a first chip 5F of FIG. 33 is similar to the sectional structure of the first chip 5D of FIG. 31. In FIG. 33, portions corresponding to respective portions in FIG. 31 are indicated with the same reference signs attached as in FIG. 31.

A plan view of the first chip 5F of FIG. 33 is the same as FIG. 3. The first chip 5F of FIG. 33 differs in the arrangement of a seal ring 25F from the seal ring 25D of the first chip 5D of FIG. 31. Specifically, the seal ring 25F is constituted of a ring main body portion 26F that is disposed inside the laminated film of the third SiO-based insulating film 34 and the first SiO-based insulating film 41 and the upper ring portion 28 that is disposed on the first SiO-based insulating film 41. That is, the seal ring 25F does not include the lower ring portion 27 of the seal ring 25D illustrated in FIG. 31 and a portion lower than the third SiO-based insulating film 34 of the ring main body portion 26D of the seal ring 25D illustrated in FIG. 31.

A lower surface of the ring main body portion 26F is in contact with the upper surface of the first nitride film 33. An upper surface of the ring main body portion 26F is joined to the lower surface of the upper ring portion 28.

With the first chip 5F of FIG. 33, the main ring portion of the present disclosure is constituted of the ring main body portion 26F and the upper ring portion 28.

With the sixth modification example, improvement of moisture resistance is enabled because all resistors 23 are surrounded by the first nitride film 33, the protective film 42 that includes the second nitride film 44, and the seal ring 25F. Also, the protective film 42 may be constituted of just the second nitride film 44.

In comparison to the method for manufacturing the first chip 5D of FIG. 31, a method for manufacturing the first chip 5F of FIG. 33 differs just in the point that the lower ring portion 27 and the portion lower than the third SiO-based insulating film 34 of the ring main body portion 26D are not formed and therefore, a description thereof shall be omitted.

Figure 34:
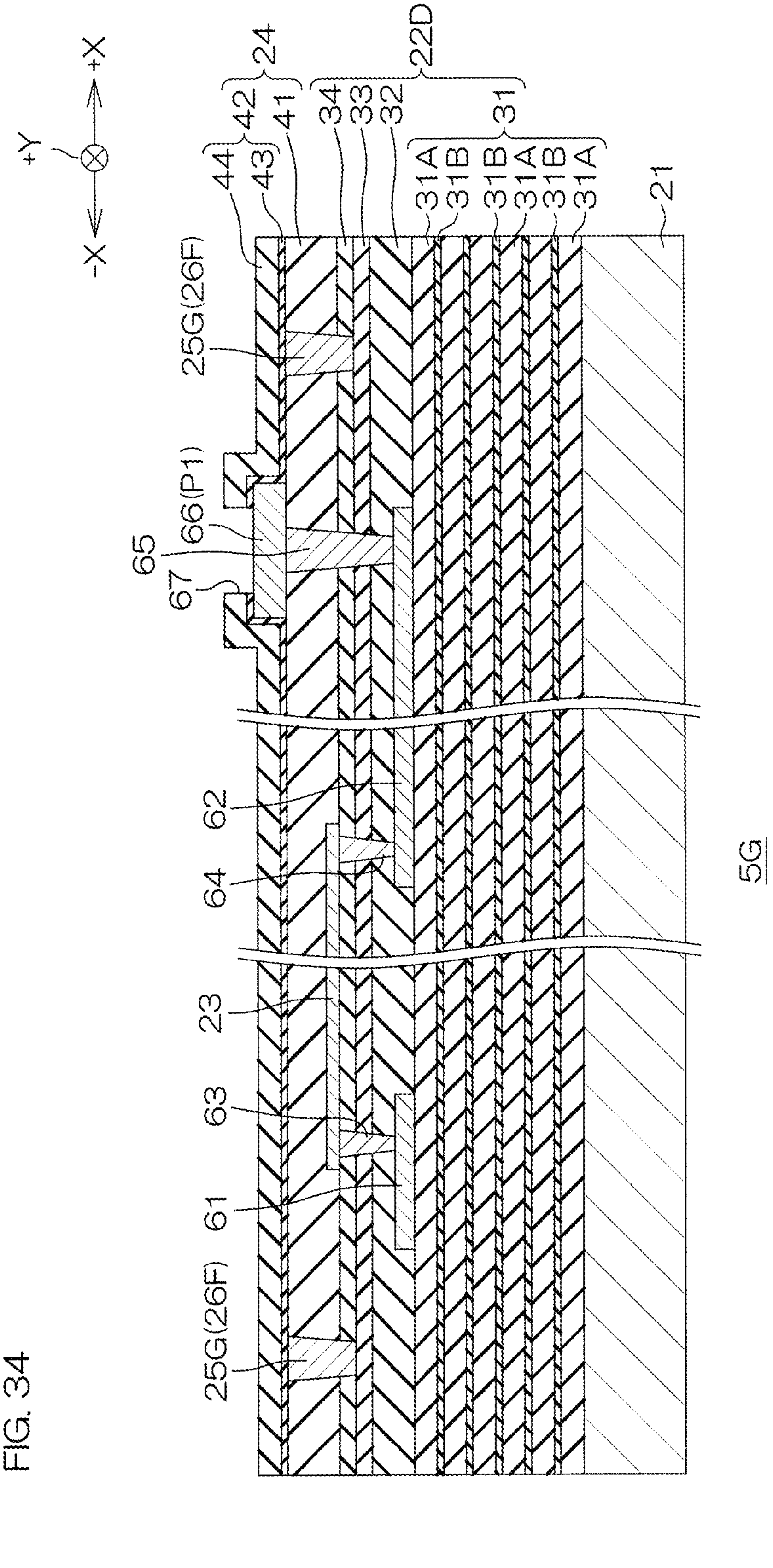
FIG. 34 is an illustrative sectional view for describing a seventh modification example of the first chip in the third disclosure.

FIG. 34 is a sectional view for describing the seventh modification example of the first chip. The sectional structure of a first chip 5G of FIG. 34 is similar to the sectional structure of the first chip 5D of FIG. 31. In FIG. 34, portions corresponding to respective portions in FIG. 31 are indicated with the same reference signs attached as in FIG. 31.

A plan view of the first chip 5G of FIG. 34 is the same as FIG. 3. The first chip 5G of FIG. 34 differs in the arrangement of a seal ring 25G from the seal ring 25D of the first chip 5D of FIG. 31. Specifically, the seal ring 25G is constituted of just the ring main body portion 26F in FIG. 33 described above. That is, the seal ring 25G is disposed inside the laminated film of the third SiO-based insulating film 34 and the first SiO-based insulating film 41. In other words, the seal ring 25G does not include the lower ring portion 27 of the seal ring 25D illustrated in FIG. 31, the portion lower than the third SiO-based insulating film 34 of the ring main body portion 26D of the seal ring 25D illustrated in FIG. 31, and the upper ring portion 28.

With the first chip 5G of FIG. 34, an entirety of the seal ring 25G corresponds to being the main ring portion of the present disclosure.

With the seventh modification example, improvement of moisture resistance is enabled because all resistors 23 are surrounded by the first nitride film 33, the protective film 42 that includes the second nitride film 44, and the seal ring 25G. Also, the protective film 42 may be constituted of just the second nitride film 44.

In comparison to the method for manufacturing the first chip 5D of FIG. 31, a method for manufacturing the first chip 5G of FIG. 34 differs just in the point that the lower ring portion 27, the portion lower than the third SiO-based insulating film 34 of the ring main body portion 26D, and the upper ring portion 28 are not formed and therefore, a description thereof shall be omitted.

Figure 35:
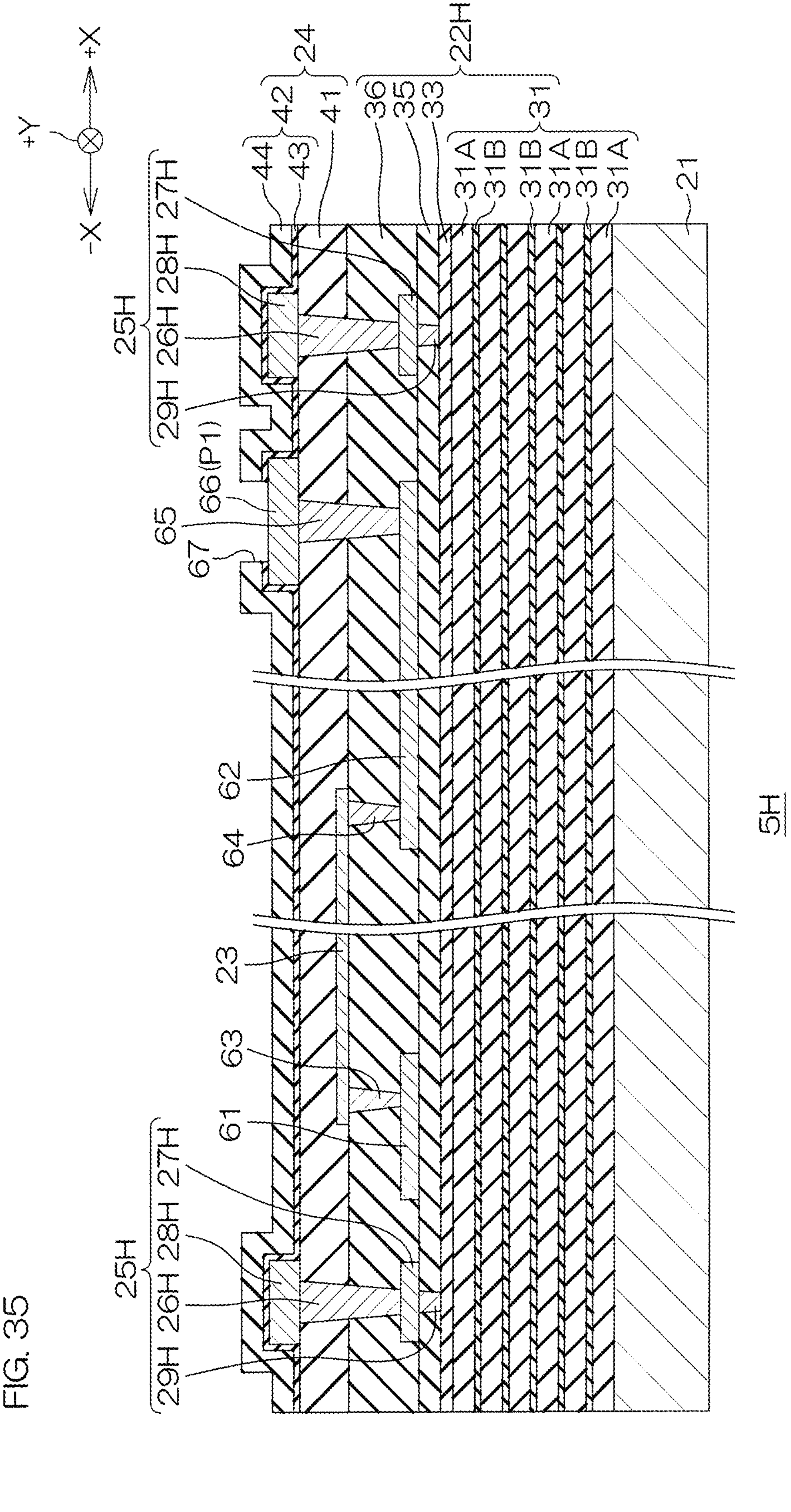
FIG. 35 is an illustrative sectional view for describing an eighth modification example of the first chip in the third disclosure.

FIG. 35 is a sectional view for describing the eighth modification example of the first chip. In FIG. 35, portions corresponding to respective portions in FIG. 26 are indicated with the same reference signs attached as in FIG. 26.

A plan view of a first chip 5H of FIG. 35 is the same as FIG. 3. The first chip 5H of FIG. 35 includes the substrate 21, a lower insulating film 22H that is formed on the substrate 21, the resistor 23 that is formed on the lower insulating film 22H and constitutes a resistor r, the upper insulating film 24 that is formed on the lower insulating film 22H such as to cover the resistor 23, and a seal ring 25H made of metal that is disposed such as to surround all resistors 23 in plan view.

The seal ring 25H is constituted of a ring main body portion 26H of rectangular annular shape in plan view, a lower ring portion 27H that is formed along an entire length of a lower surface of the ring main body portion 26H, an upper ring portion 28H that is formed along an entire length of an upper surface of the ring main body portion 26H, and a lower end ring portion 29H that is formed along an entire length of a lower surface of the lower ring 27H.

The lower ring portion 27H projects inward and outward with respect to the ring main body portion 26H in vertical sectional view. In vertical sectional view, the lower end ring portion 29H is formed at a width central portion of the lower surface of the lower ring portion 27H and projects downward from the lower surface of the lower ring portion 27H. The upper ring portion 28H projects inward and outward with respect to the ring main body portion 26H in vertical sectional view.

Further, the first chip 5H includes the first lower metal 61 and the second lower metal 62 that are disposed inside the lower insulating film 22H and the upper metal 66 that is disposed inside the upper insulating film 24. However, a portion of the upper surface of the upper metal 66 is exposed from the upper insulating film 24.

The lower insulating 22H includes the insulating film laminated structure 31 that is formed on the substrate 21, the first nitride film 33 that is formed on the insulating film laminated structure 31, a fourth SiO-based insulating film 35 that is formed on the first nitride film 33, and a fifth SiO-based insulating film 36 that is formed on the fourth SiO-based insulating film 35.

A film thickness of the first nitride film 33 is approximately 0.15 μm. A film thickness of the fourth SiO-based insulating film 35 is approximately 0.5 μm. A film thickness of the fifth SiO-based insulating film 36 is approximately 0.8 μm.

The lower end ring portion 29H is disposed inside the fourth SiO-based insulating film 35. The lower end ring portion 29H is of a rectangular annular shape in plan view. The lower end ring portion 29H is formed such as to surround a region that includes the lower metals 61 and 62, the resistor 23, and the upper metal 66 in plan view. The lower end ring portion 29H penetrates through the fourth SiO-based insulating film 35 and a lower end thereof is in contact with the first nitride film 33. In this preferred embodiment, the lower end ring portion 29H is constituted of W (tungsten).

A plurality of lower metals 61 and 62 and the lower ring portion 27H are disposed on the fourth SiO-based insulating film 35. The lower ring portion 27H is disposed directly above the lower end ring portion 29H. An upper surface of the lower end ring portion 29H is joined to the width central portion of the lower surface of the lower ring portion 27H. In this preferred embodiment, the lower metals 61 and 62 and the lower ring portion 27H are constituted of Al (aluminum).

The fifth SiO-based insulating film 36 is formed on the fourth SiO-based insulating film 35 such as to cover the lower metals 61 and 62 and the lower ring portion 27H.

The resistor 23 is formed on the fifth SiO-based insulating film 36. The −X side end portion of the lower surface of the resistor 23 is electrically connected to a +X side end portion of the first lower metal 61 via the first via 63 that penetrates through the fifth SiO-based insulating film 36. The +X side end portion of the lower surface of the resistor 23 is electrically connected to the second lower metal 62 via the second via 64 that penetrates through the fifth SiO-based insulating film 36. In this preferred embodiment, the first via 63 and the second via 64 are constituted, for example, of W (tungsten).

The upper insulating film 24 includes the first SiO-based insulating film 41 that is formed on the fifth SiO-based insulating film 36 such as to cover the resistor 23 and the protective film 42 that is formed on the first SiO-based insulating film 41.

The upper metal 66 and the upper ring portion 28H are formed on the first SiO-based insulating film 41. In this preferred embodiment, the upper metal 66 and the upper ring portion 28H are constituted of Al (aluminum).

The upper metal 66 is electrically connected to the +X side end portion of the second lower metal 62 via the third via 65 that penetrates continuously through the first SiO-based insulating film 41 and the fifth SiO-based insulating film 36. In this preferred embodiment, the third via 65 is constituted of W (tungsten).

The upper ring portion 28H is disposed directly above the lower ring portion 27H in plan view. The upper ring portion 28H is coupled to the lower ring portion 27H via the ring main body portion 26H that is disposed inside a laminated film of the fifth SiO-based insulating film 36 and the first SiO-based insulating film 41. In this preferred embodiment, the ring main body portion 26H is constituted of W (tungsten).

The protective film 42 includes the protective SiO-based insulating film 43 that is formed on the first SiO-based insulating film 41 such as to cover the upper metal 66 and the upper ring portion 28H and the second nitride film 44 that is formed on the protective SiO-based insulating film 43.

The opening 67 arranged to expose a portion of the upper surface of the upper metal 66 is formed in the protective film 42. A pad portion arranged to connect wirings to the terminals P1 to P6 is formed by the opening 67.

With this preferred embodiment, an entirety of the seal ring 25H corresponds to being the main ring portion of the present disclosure.

With the eighth modification example, improvement of moisture resistance is enabled because all resistors 23 are surrounded by the first nitride film 33, the protective film 42 that includes the second nitride film 44, and the seal ring 25H. Also, the protective film 42 may be constituted of just the second nitride film 44.

Here, if an uppermost layer of the insulating film laminated structure 31 is a second insulating film (nitride film)

31B, the second insulating film 31B of the uppermost layer of the insulating film laminated structure 31 may be used as the first nitride film 33. In this case, the lower insulating film 22H includes the insulating film laminated structure 31 that is formed on the substrate 21 and has the first nitride film 33A (second insulating film 31B) as the uppermost layer, the fourth SiO-based insulating film 35 that is formed on the insulating film laminated structure 31, and the fifth SiO-based insulating film 36 that is formed on the fourth SiO-based insulating film 35.

FIG. 36A to FIG. 36F are sectional views showing an example of a manufacturing process of the first chip 5H shown in FIG. 3 and FIG. 35 and are sectional views corresponding to the section plane of FIG. 35.

Figure 36A:
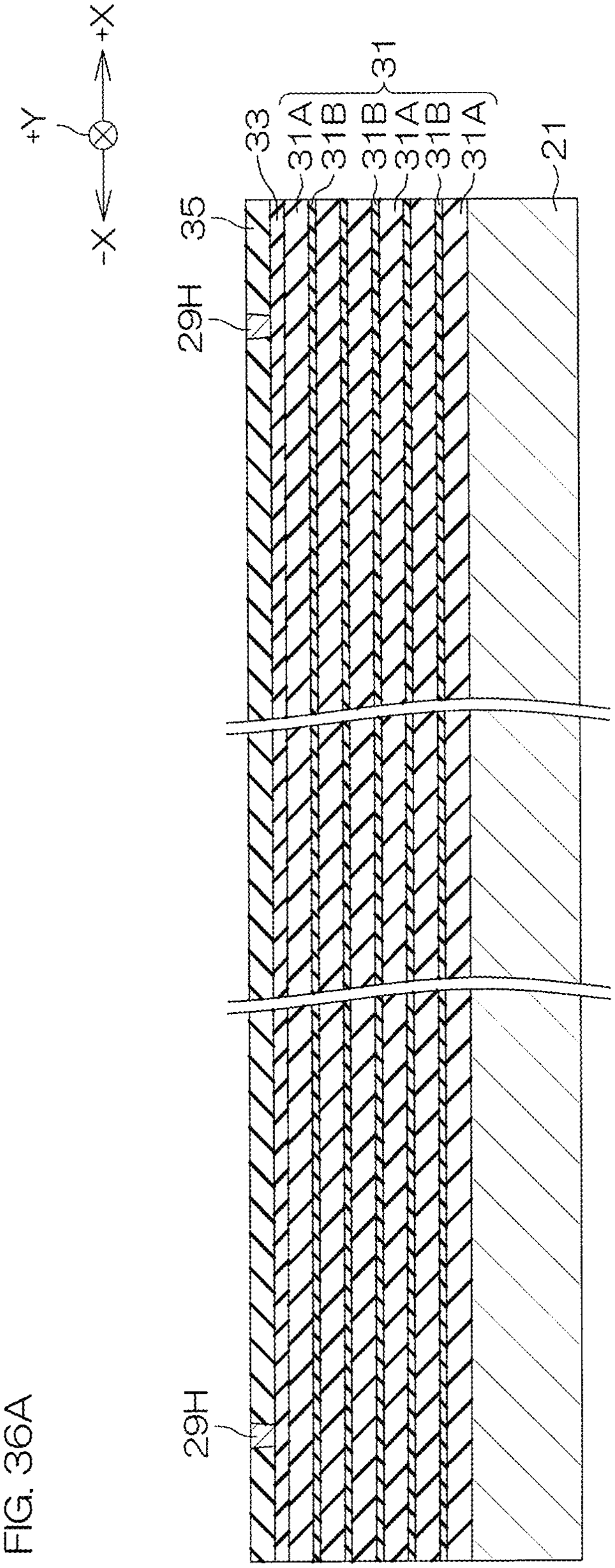
FIG. 36A is a sectional view showing a portion of a manufacturing process of the first chip shown in FIG. 3 and FIG. 35 and is a sectional view corresponding to the section plane of FIG. 35.

First, as shown in FIG. 36A, the insulating film laminated structure 31 is formed by alternately laminating the first insulating film 31A and the second insulating film 31B on the substrate 21. The first nitride film 33 and the fourth SiO-based insulating film 35 are then formed in that order on the insulating film laminated structure 31. The lower end ring portion 29H that penetrates through the fourth SiO-based insulating film 35 and reaches the first nitride film 33 is then formed in the fourth SiO-based insulating film 35.

Figure 36B:
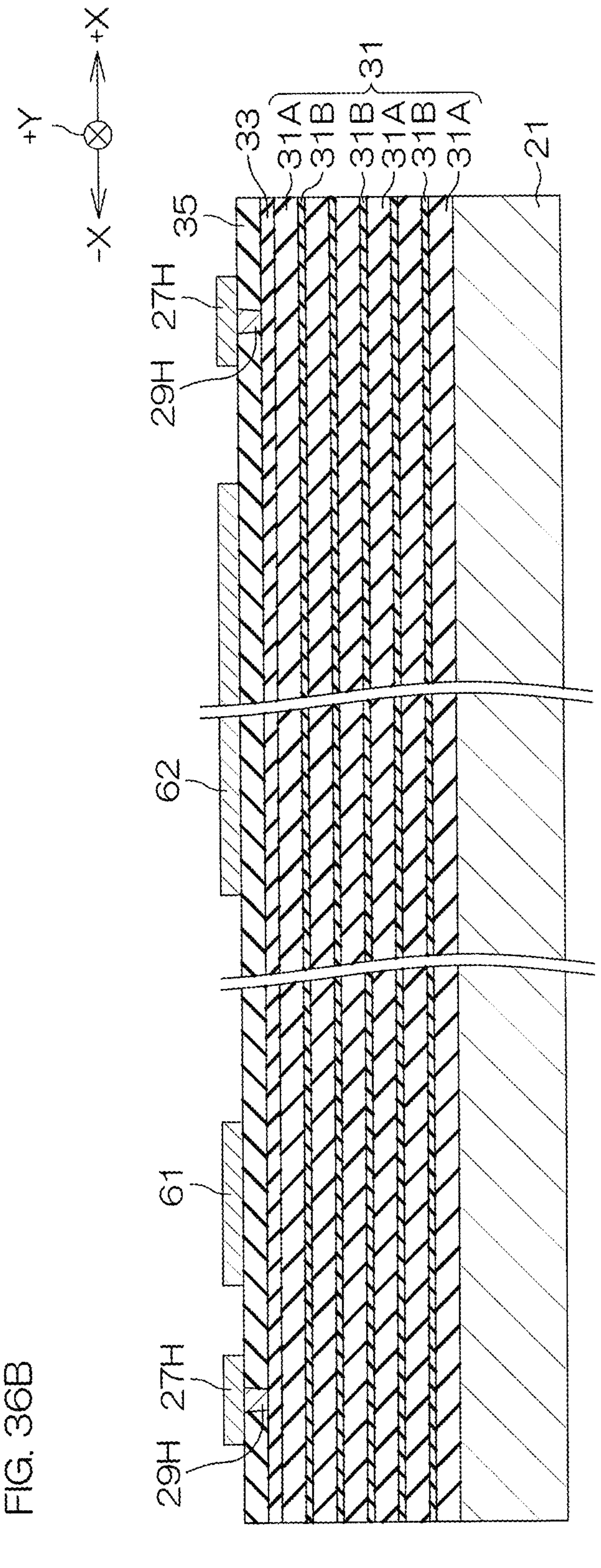
FIG. 36B is a sectional view showing a step subsequent to that of FIG. 36A.

Next, as shown in FIG. 36B, after forming a metal film (an Al film in this preferred embodiment) that is a material film of the first lower metal 61, the second lower metal 62, and the lower ring portion 27H on the fourth SiO-based insulating film 35, the metal film is patterned. The first lower metal 61, the second lower metal 62, and the lower ring portion 27H are thereby formed on the fourth SiO-based insulating film 35. The width central portion of the upper surface of the lower end ring portion 29H is thereby joined to the lower ring portion 27H.

Figure 36C:
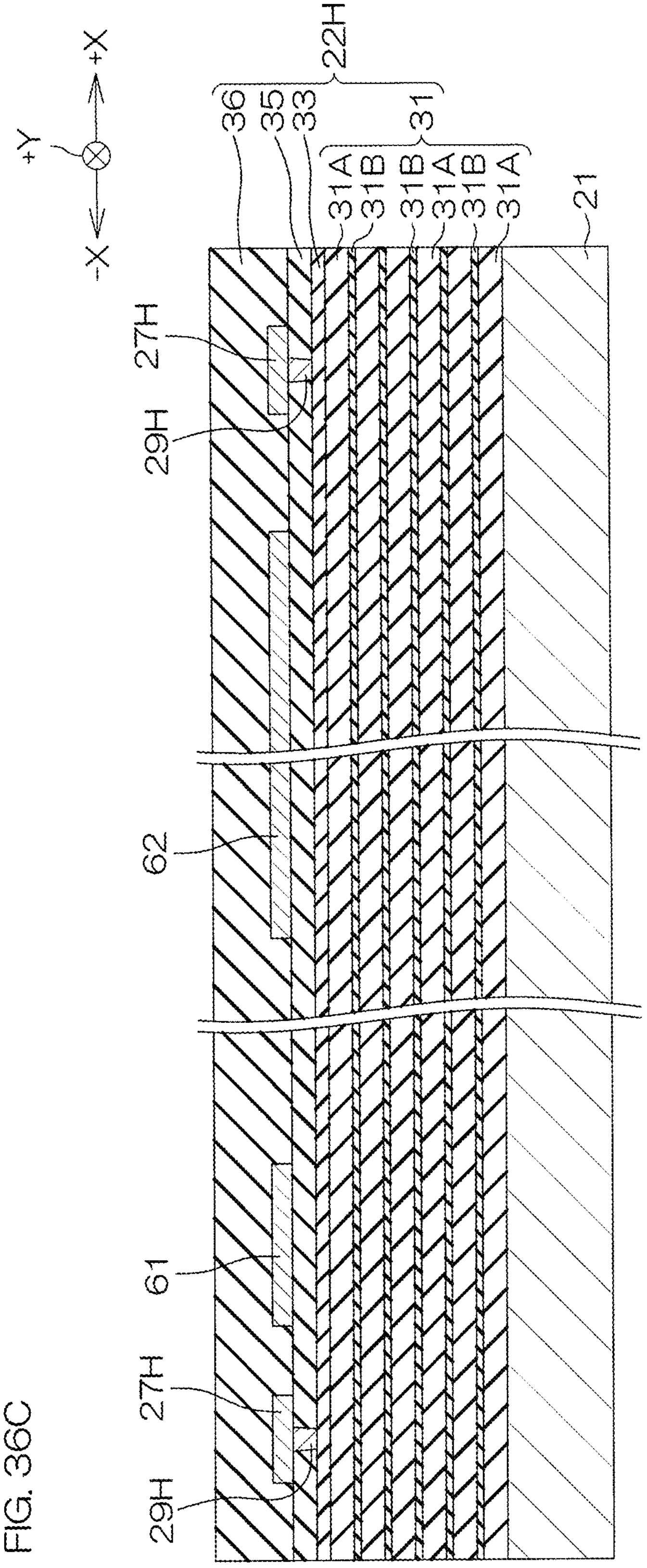
FIG. 36C is a sectional view showing a step subsequent to that of FIG. 36B.

Next, as shown in FIG. 36C, the fifth SiO-based insulating film 36 is formed on the fourth SiO-based insulating film 35 such as to cover the first lower metal 61, the second lower metal 62, and the lower ring portion 27H. The lower insulating film 22H that is constituted of the insulating film laminated structure 31, the first nitride film 33, the fourth SiO-based insulating film 35, SiO-based insulating film 36 is thereby and the fifth obtained.

Figure 36D:
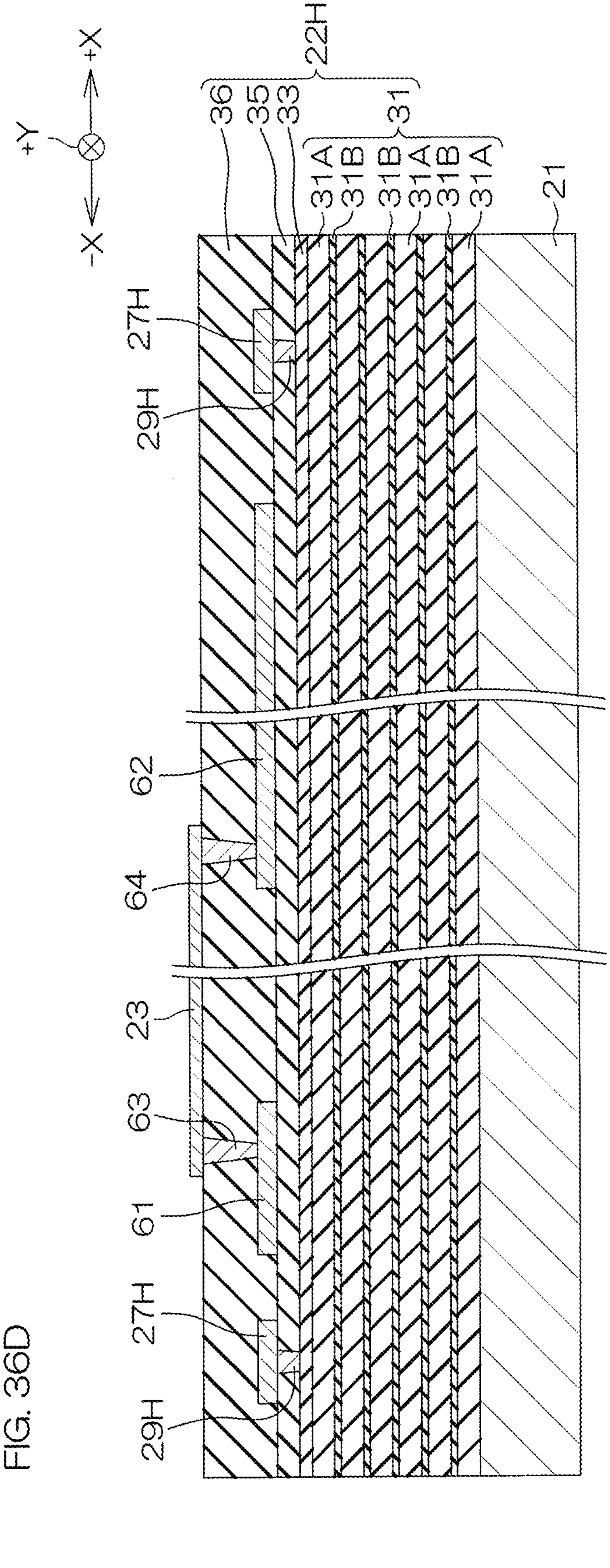
FIG. 36D is a sectional view showing a step subsequent to that of FIG. 36C.

Next, in the fifth SiO-based insulating film 36, the first via 63 and the second via 64 that penetrate through the fifth SiO-based insulating film 36 and with which lower ends reach the first lower metal 61 and the second lower metal 62 are formed as shown in FIG. 36D. Then, after a resistive material film that is a material film of the resistor 23 is formed on the fifth SiO-based insulating film 36, the resistive material film is patterned to form the plurality of resistors 23 (the plurality of real resistors ra and the plurality of dummy resistors rb). Upper ends of the first via 63 and the second via 64 are thereby connected to the resistor 23.

Figure 36E:
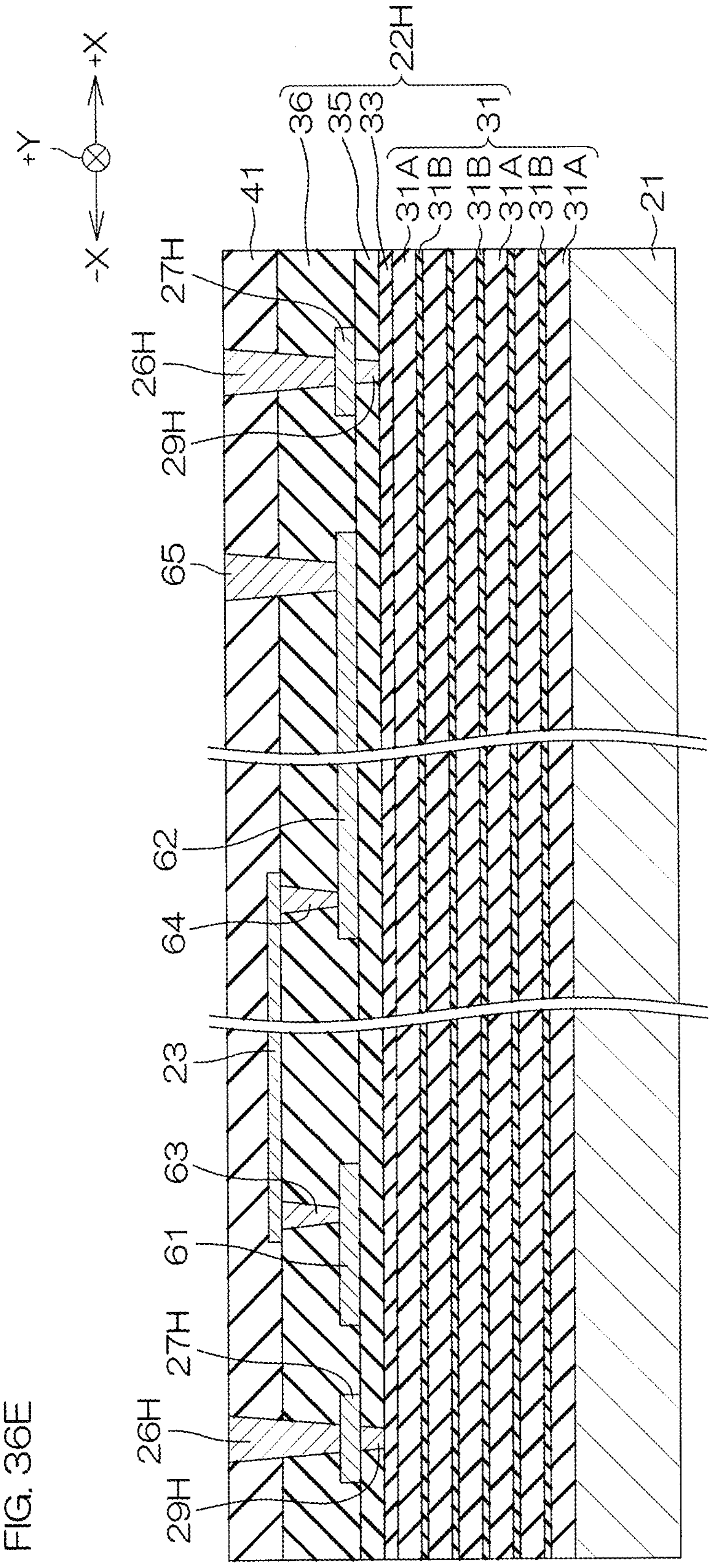
FIG. 36E is a sectional view showing a step subsequent to that of FIG. 36D.

Next, as shown in FIG. 36E, the first SiO-based insulating film 41 is formed on the fifth SiO-based insulating film 36 such as to cover the resistor 23. Next, in a laminated film of the fifth SiO-based insulating film 36 and the first SiO-based insulating film 41, the third via 65 that penetrates through the laminated film and with which the lower end reaches the second lower metal 62 and the ring main body portion 26H that penetrates through the laminated film and with which a lower surface is joined to the lower ring portion 27H are formed.

Figure 36F:
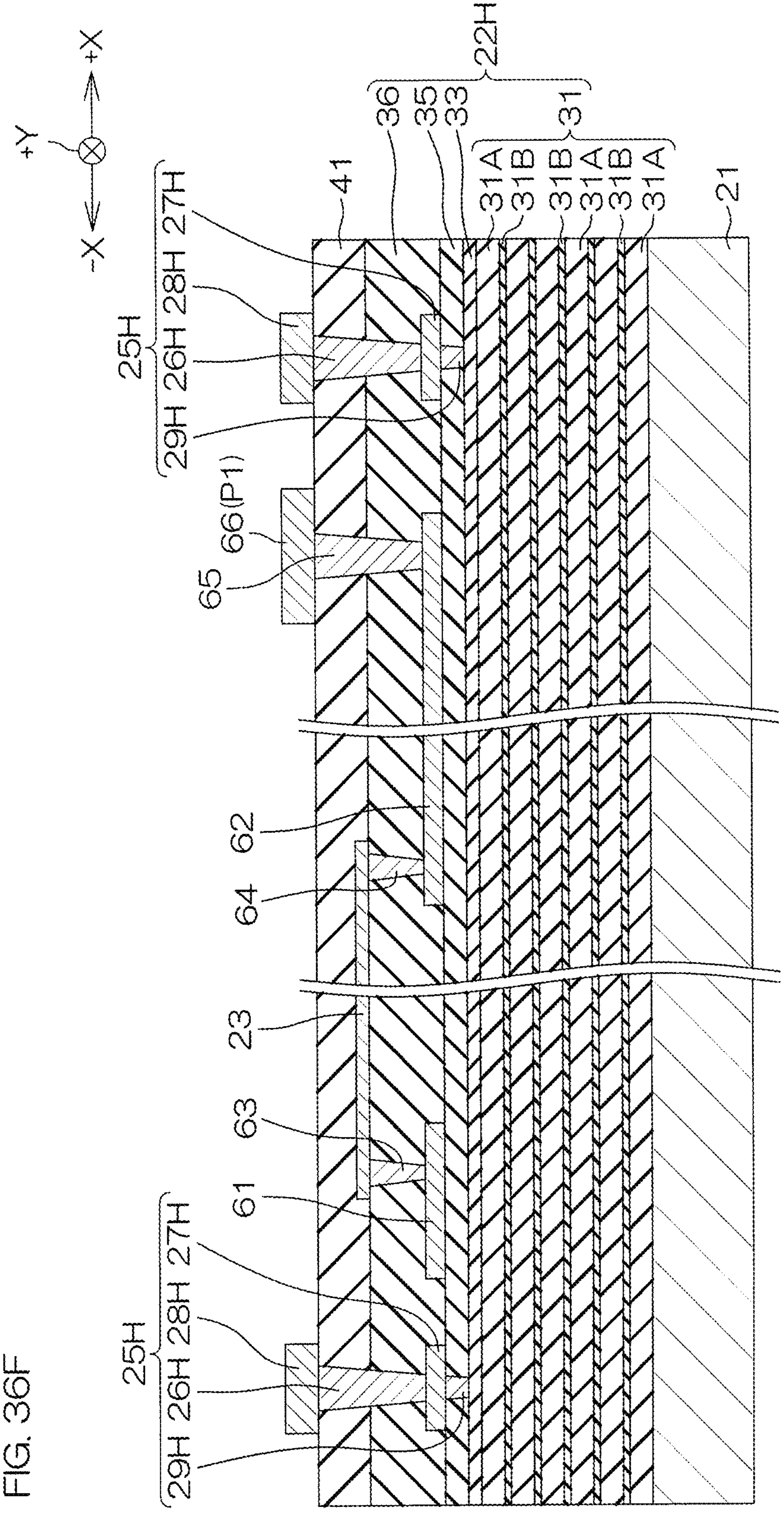
FIG. 36F is a sectional view showing a step subsequent to that of FIG. 36E.

Next, as shown in FIG. 36F, after a metal film (an Al film in this preferred embodiment) that is a material film of the upper metal 66 and the upper ring portion 28H is formed on the first SiO-based insulating film 41, the metal film is patterned. The upper metal 66 and the upper ring portion 28H are thereby formed on the first SiO-based insulating film 41. The upper end of the third via 65 is thereby connected to the upper metal 66. Also, the upper surface of the ring main body portion 26H is joined to the lower surface of the upper ring portion 28H.

Figure 37:
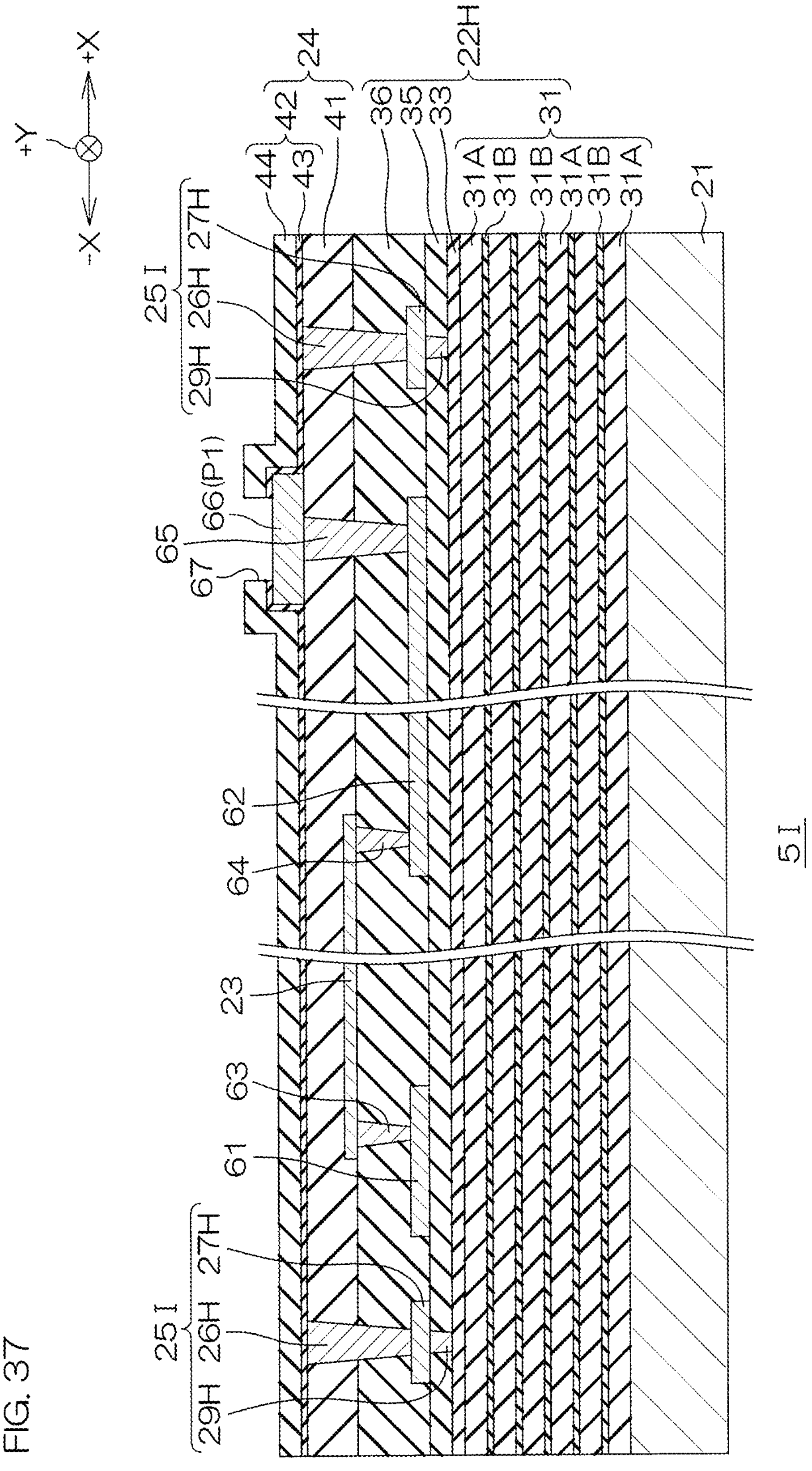
FIG. 37 is an illustrative sectional view for describing a ninth modification example of the first chip in the third disclosure.

Thereafter, the protective SiO-based insulating film 43 and the second nitride film 44 are formed in that order on the first SiO-based insulating film 41 such as to cover the upper metal 66 and the ring main body portion 26H. The protective film 42 that is the laminated film of the protective SiO-based insulating film 43 and the second nitride film 44 is thereby obtained. The opening 67 that exposes a portion of the upper surface of the upper metal 66 is then formed in the protective film 42. The first chip 5 such as shown in FIG. 3 and FIG. 35 is thereby obtained. FIG. 37 is a sectional view for describing the ninth modification example of the first chip. The sectional structure of a first chip 5I of FIG. 37 is similar to the sectional structure of the first chip 5H of FIG. 35. In FIG. 37, portions corresponding to respective portions in FIG. 35 are indicated with the same reference signs attached as in FIG. 35.

A plan view of the first chip 5I of FIG. 37 is the same as FIG. 3. The first chip 5I of FIG. 37 differs in the arrangement of a seal ring 25I from the seal ring 25H of the first chip 5H of FIG. 35. Specifically, the seal ring 25I does not include the upper ring portion 28H of the seal ring 25H illustrated in FIG. 35. That is, the seal ring 25I is constituted of the ring main body portion 26H, the lower ring portion 27H, and the lower end ring portion 29H of the seal ring 25H illustrated in FIG. 35.

With the first chip 5I of FIG. 37, an entirety of the seal ring 25I corresponds to being the main ring portion of the present disclosure.

With the ninth modification example, improvement of moisture resistance is enabled because all resistors 23 are surrounded by the first nitride film 33, the protective film 42 that includes the second nitride film 44, and the seal ring 25I. Also, the protective film 42 may be constituted of just the second nitride film 44.

In comparison to the method for manufacturing the first chip 5H of FIG. 35, a method for manufacturing the first chip 5I of FIG. 37 differs just in the point that the upper ring portion 28H is not formed on the first SiO-based insulating film 41 and therefore, a description thereof shall be omitted.

Figure 38:
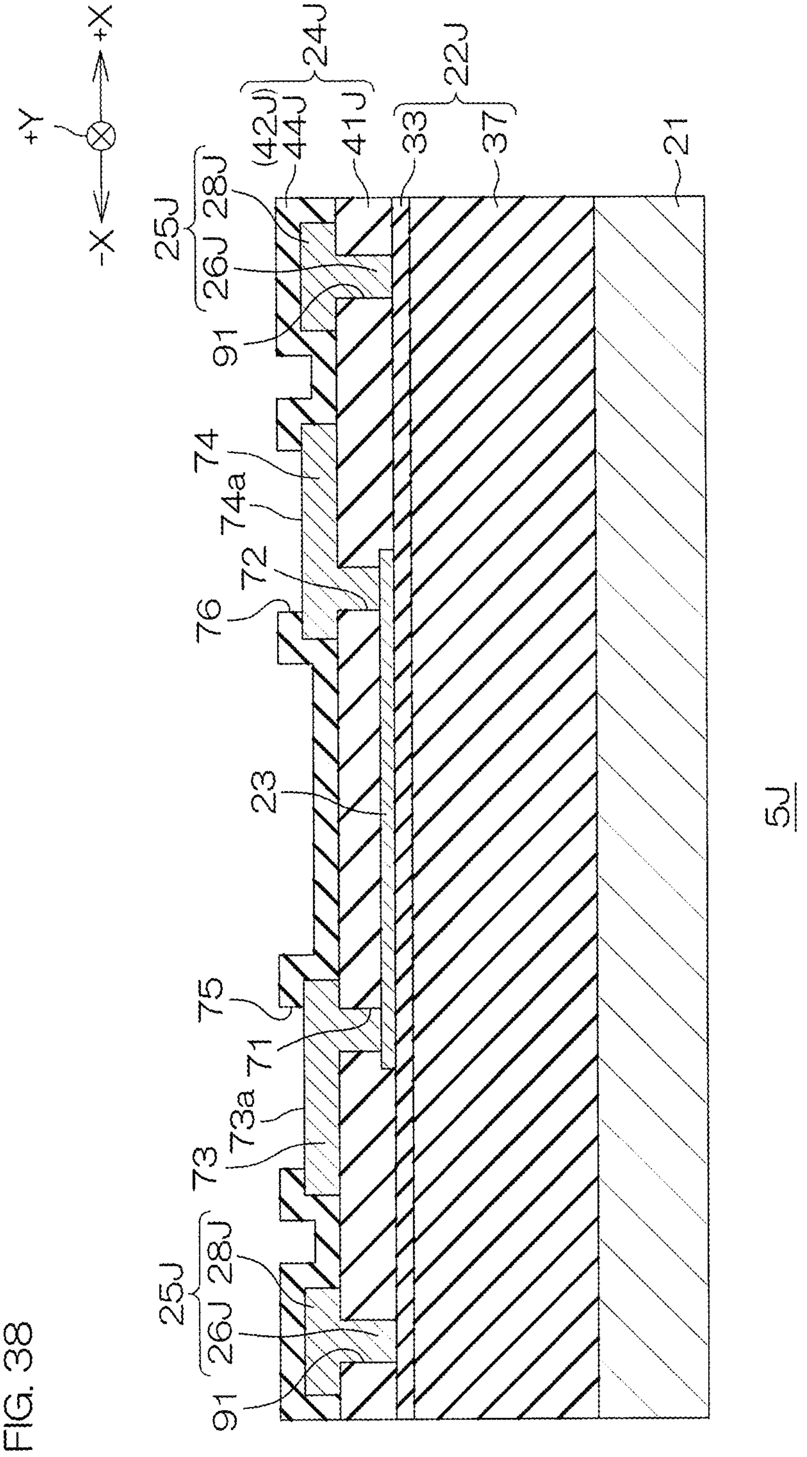
FIG. 38 is an illustrative sectional view for describing a tenth modification example of the first chip in the third disclosure.

FIG. 38 is a sectional view for describing the tenth modification example of the first chip. In FIG. 38, portions corresponding to respective portions in FIG. 26 are indicated with the same reference signs attached as in FIG. 26.

A plan view of a first chip 5J of FIG. 38 is the same as FIG. 3. The first chip 5J of FIG. 38 includes the substrate 21, a lower insulating film 22J that is formed on the substrate 21, the resistor 23 that is formed on the lower insulating film 22J and constitutes a resistor r, an upper insulating film 24J that is formed on the lower insulating film 22J such as to cover the resistor 23, and the seal ring 25J made of metal that is disposed such as to surround all resistors 23 in plan view.

Further, the first chip 5J includes a first lead-out electrode 73 and a second lead-out electrode 74 that are disposed inside the upper insulating film 24J. However, a portion of an upper surface of the first lead-out electrode 73 and a portion of an upper surface of the second lead-out electrode 74 are exposed from the upper insulating film 24J.

The seal ring 25J is constituted of a ring main body portion 26J of rectangular annular shape in plan view and an upper ring portion 28J that is formed along an entire length of an upper surface of the ring main body portion 26J. The upper ring portion 28J projects inward and outward with respect to the ring main body portion 26J in vertical sectional view. In this preferred embodiment, the ring main body portion 26J and the upper ring portion 28J are formed integrally. The ring main body portion 26J and the upper ring portion 28J are constituted of Al (aluminum).

The lower insulating film 22J includes a sixth SiO-based insulating film 37 that is formed on the substrate 21 and the first nitride film 33 that is formed on the sixth SiO-based insulating film 37. A film thickness of the sixth SiO-based insulating film 37 is, for example, approximately 6 μm. A film thickness of the first nitride film 33 is approximately 0.15 μm.

The resistor 23 is formed on the first nitride film 33. The resistor 23 is of a rectangular shape that is long in the X direction in plan view. In this preferred embodiment, the resistor 23 is, for example, constituted of CrSi.

The upper insulating film 24J includes a first SiO-based insulating film 41J that is formed on the first nitride film 33 such as to cover the resistor 23 and a protective film 42J that is formed on the first SiO-based insulating film 41J. The protective film 42J is constituted of a second nitride film 44J that is formed on the first SiO-based insulating film 41J. A film thickness of the first SiO-based insulating film 41J is approximately 0.3 μm. A film thickness of the second nitride film 44J is approximately 1 μm.

A first contact hole 71 arranged to expose a portion of an upper surface of a −X side end portion of the resistor 23 and a second contact hole 72 arranged to expose a portion of an upper surface of a +X side end portion of the resistor 23 are formed in the first SiO-based insulating film 41J. Further, an annular hole 91 of rectangular annular shape in plan view is formed in the first SiO-based insulating film 41J such as to surround all resistors 23. The annular hole 91 penetrates through the first SiO-based insulating film 41J and reaches the first nitride film 33.

The first lead-out electrode 73, the second lead-out electrode 74, and the seal ring 25J are formed on the first SiO-based insulating film 41J.

The first lead-out electrode 73 is formed in a region that includes the −X side end portion of the resistor 23 in plan view. The second lead-out electrode 74 is formed in a region that includes the +X side end portion of the resistor 23 in plan view. A portion of the first lead-out electrode 73 enters into the first contact hole 71 and is connected to the −X side end portion of the resistor 23 inside the first contact hole 71. A portion of the second lead-out electrode 74 enters into the second contact hole 72 and is connected to the +X side end portion of the resistor 23 inside the second contact hole 72. In this preferred embodiment, the first lead-out electrode 73 and the second lead-out electrode 74 are constituted of Al (aluminum).

The seal ring 25J is of rectangular annular shape in plan view and is disposed such as to cover the annular hole 91. A portion of the seal ring 25J enters into the annular hole 91 and is joined to the first nitride film 33 inside the annular hole 91. The seal ring 25J is thereby constituted of the ring main body portion 26J that is disposed inside the annular hole 91 and the upper ring portion 28J that is connected to the ring main body portion 26J and is disposed on the first SiO-based insulating film 41J. The ring main body portion 26J and the upper ring portion 28J are formed integrally. In this preferred embodiment, the seal ring 25J is constituted of Al (aluminum).

The second nitride film 44J (protective film 42J) is formed on the first SiO-based insulating film 41J such as to cover the first lead-out electrode 73, the second lead-out electrode 74, and the seal ring 25J.

A first opening 75 arranged to expose a portion of the upper surface of the first lead-out electrode 73 and a second opening 76 arranged to expose a portion of the upper surface of the second lead-out electrode 74 are formed in the second nitride film 44J (protective film 42J). A first pad portion 73*a* that is exposed from the first opening 75 is thereby formed in the first lead-out electrode 73. Similarly, a second pad portion 74*a* that is exposed from the second opening 76 is formed in the second lead-out electrode 74.

The pad portions 73*a* and 74*a* are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

With the first chip 5J of FIG. 38, an entirety of the seal ring 25J corresponds to being the main ring portion of the present disclosure.

With the tenth modification example, improvement of moisture resistance is enabled because all resistors 23 are surrounded by the first nitride film 33, the protective film 42 that is constituted of the second nitride film 44J, and the seal ring 25J.

Figure 39A:
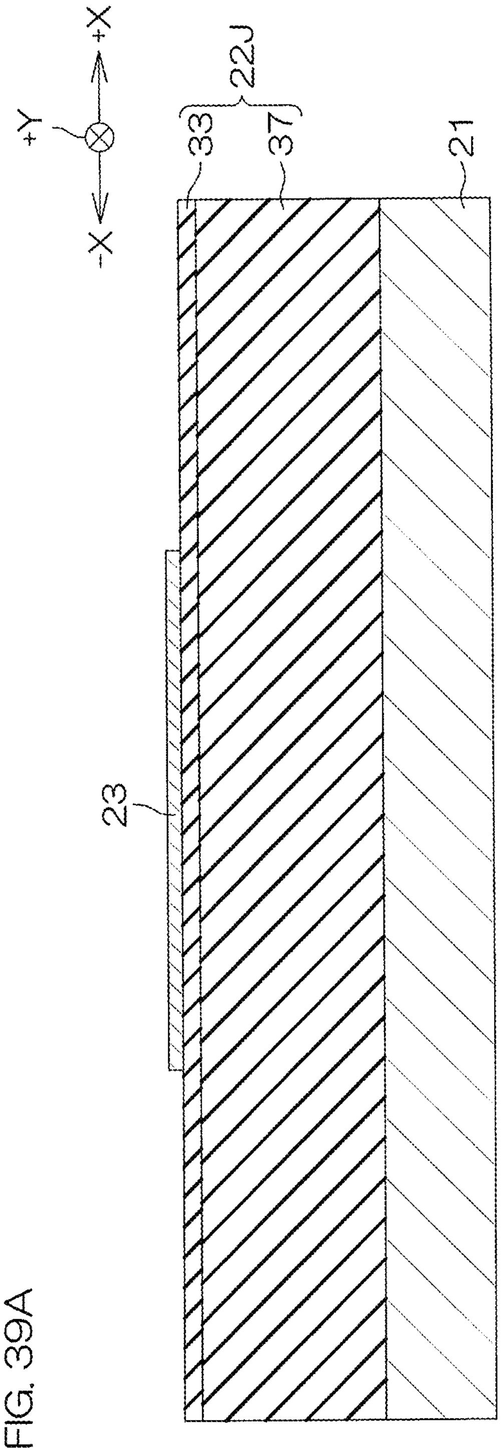
FIG. 39A is a sectional view showing a portion of a manufacturing process of the first chip shown in FIG. 3 and FIG. 38 and is a sectional view corresponding to the section plane of FIG. 38.
Figure 39B:
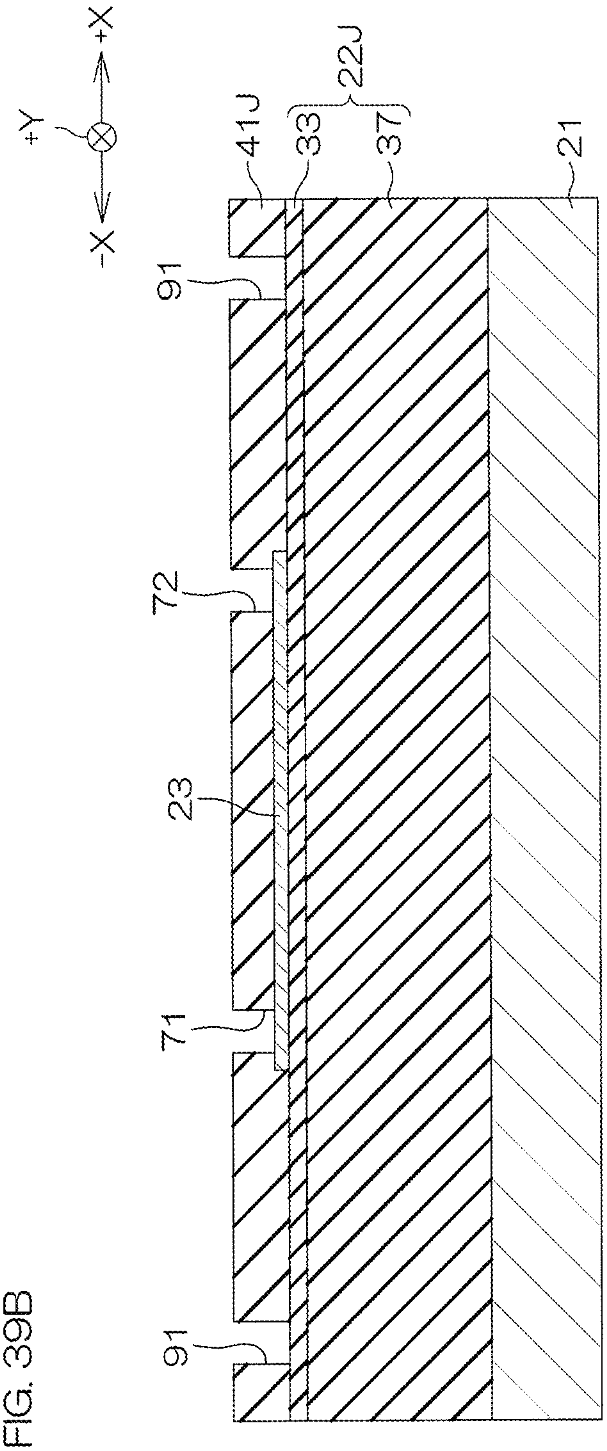
FIG. 39B is a sectional view showing a step subsequent to that of FIG. 39A.
Figure 39C:
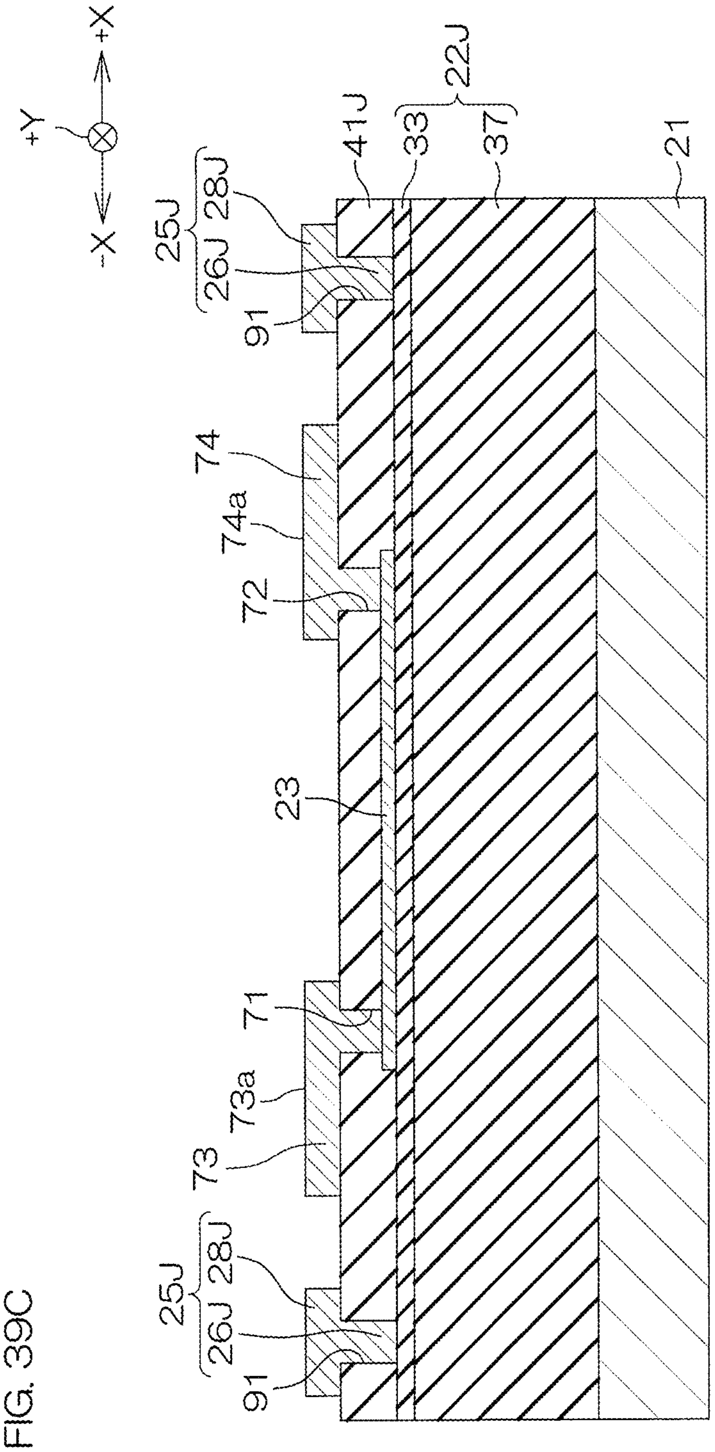
FIG. 39C is a sectional view showing a step subsequent to that of FIG. 39B.

FIG. 39A to FIG. 39C are sectional views showing an example of a manufacturing process of the first chip 5J shown in FIG. 3 and FIG. 38 and are sectional views corresponding to the section plane of FIG. 38.

First, as shown in FIG. 39A, the sixth SiO-based insulating film 37 is formed on the substrate 21. The first nitride film 33 is then formed on the sixth SiO-based insulating film 37. The lower insulating film 22J that is constituted of the sixth SiO-based insulating film 37 and the first nitride film 33 is thereby obtained. After a resistive material film that is a material film of the resistor 23 is thereafter formed on the first nitride film 33, the resistive material film is patterned to form the plurality of resistors 23 (the plurality of real resistors ra and the plurality of dummy resistors rb).

Next, as shown in FIG. 39B, the first SiO-based insulating film 41J is formed on the first nitride film 33 such as to cover the resistor 23. Then, in the first SiO-based insulating film 41J, the first contact hole 71 that penetrates through the first SiO-based insulating film 41J and with which a lower end reaches the upper surface of the −X side end portion of the resistor 23 and the second contact hole 72 that penetrates through the first SiO-based insulating film 41J and with which a lower end reaches the upper surface of the +X side end portion of the resistor 23 are formed. Also, the annular hole 91 of rectangular annular shape in plan view that penetrates through the first SiO-based insulating film 41J is formed in the first SiO-based insulating film 41J.

Next, as shown in FIG. 39C, a metal film (an Al film in this preferred embodiment) that is a material film of the first lead-out electrode 73, the second lead-out electrode 74, and the seal ring 25J is formed on the first SiO-based insulating film 41J. In this process, the metal film enters into the first contact hole 71, the second contact hole 72, and the annular hole 91. Thereafter, the metal film is patterned. The first lead-out electrode 73 and the second lead-out electrode 74 are thereby obtained. Also, the seal ring 25J that is constituted of the ring main body portion 26J and the upper ring portion 28J is obtained.

Thereafter, the second nitride film 44J (protective film 42J) is formed on the first SiO-based insulating film 41J such as to cover the first lead-out electrode 73, the second lead-out electrode 74, and the seal ring 25J. The first opening 75 that exposes a portion of the upper surface of the first lead-out electrode 73 and the second opening 76 that exposes a portion of the upper surface of the second lead-out electrode 74 are then formed in the second nitride film 44J. The first chip 5J such as shown in FIG. 38 is thereby obtained.

Figure 40:
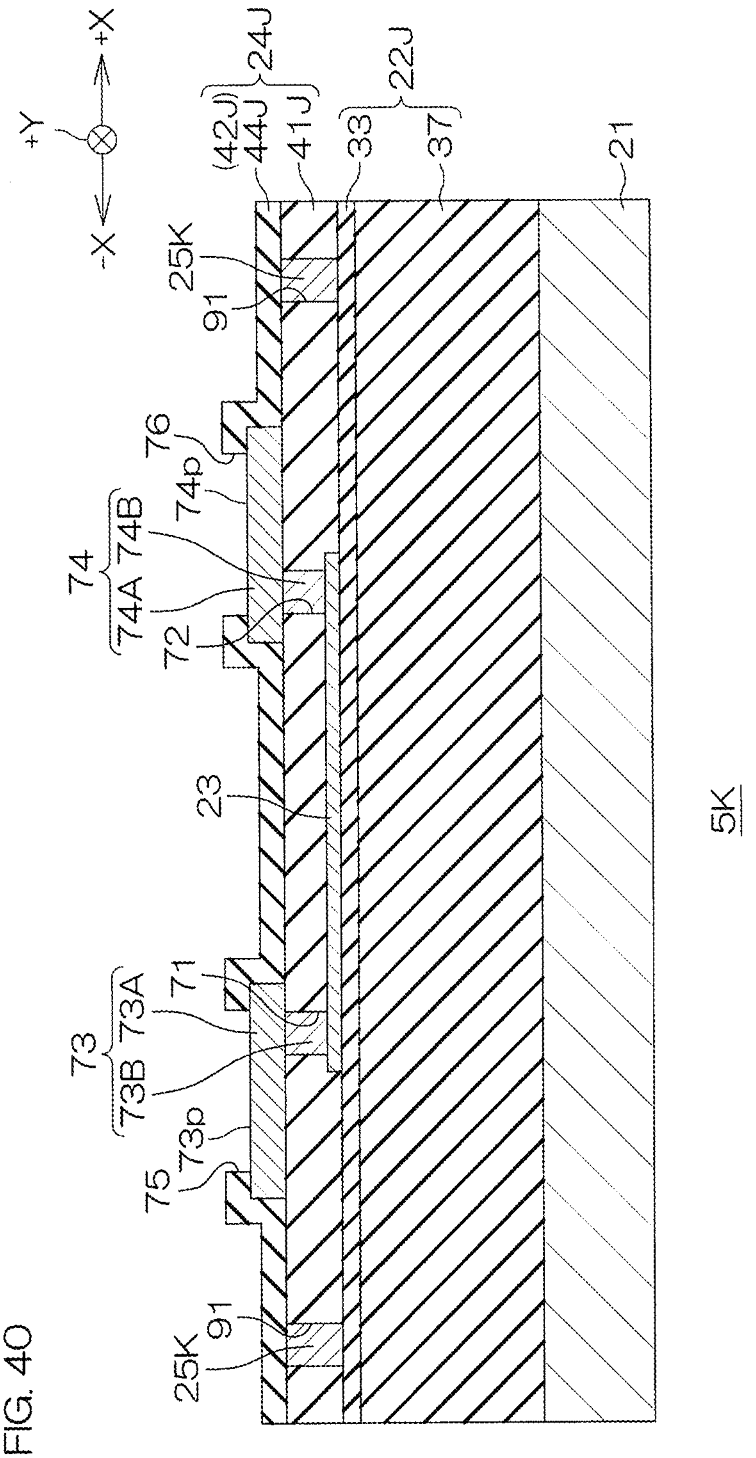
FIG. 40 is an illustrative sectional view for describing an eleventh modification example of the first chip in the third disclosure.

FIG. 40 is a sectional view for describing the eleventh modification example of the first chip and is a sectional view corresponding to the section plane of FIG. 26. A first chip 5K of FIG. 40 is similar to the first chip 5J of FIG. 38. In FIG. 40, portions corresponding to respective portions in FIG. 38 are indicated with the same reference signs attached as in FIG. 38.

A plan view of the first chip 5K of FIG. 40 is the same as FIG. 3. The first chip 5K of FIG. 40 differs in the arrangement of a seal ring 25K from the seal ring 25J of the first chip 5J of FIG. 38. Specifically, the seal ring 25K is constituted of just a portion that is embedded in the annular hole 91.

Also, with the first chip 5K of FIG. 40, the first lead-out electrode 73 is constituted of a main electrode portion 73A that is formed on the first SiO-based insulating film 41J and a connection portion 73B that is embedded in the first contact hole 71 and connects the main electrode portion 73A to the resistor 23. Similarly, the second lead-out electrode 74 is constituted of a main electrode portion 74A that is formed on the first SiO-based insulating film 41J and a connection portion 74B that is embedded in the second contact hole 72 and connects the main electrode portion 74A to the resistor 23.

With this modification example, the seal ring 25K and the connection portions 73B and 74B are constituted of W (tungsten). The main electrode portions 73A and 74A are constituted of Al (aluminum).

With the first chip 5K of FIG. 40, an entirety of the seal ring 25K corresponds to being the main ring portion of the present disclosure.

With the eleventh modification example, improvement of moisture resistance is enabled because all resistors 23 are surrounded by the first nitride film 33, the protective film 42 that is constituted of the second nitride film 44J, and the seal ring 25K.

In comparison to the method for manufacturing the first chip 5J of FIG. 38, a method for manufacturing the first chip 5K of FIG. 40 differs in the following points. That is, after the first contact hole 71, the second contact hole 72, and the annular hole 91 are formed in the first SiO-based insulating film 41J by the step of FIG. 39B, the material (W) of the seal ring 25K and the connection portions 73B and 74B are embedded inside the holes 71, 72, and 91. The seal ring 25K and the connection portions 73B and 74B are thereby obtained. After a material film (Al film) of the main electrode portions 73A and 74A are thereafter formed on the first SiO-based insulating film 41J, the material film is patterned to form the main electrode portions 73A and 74A.

Figure 41:
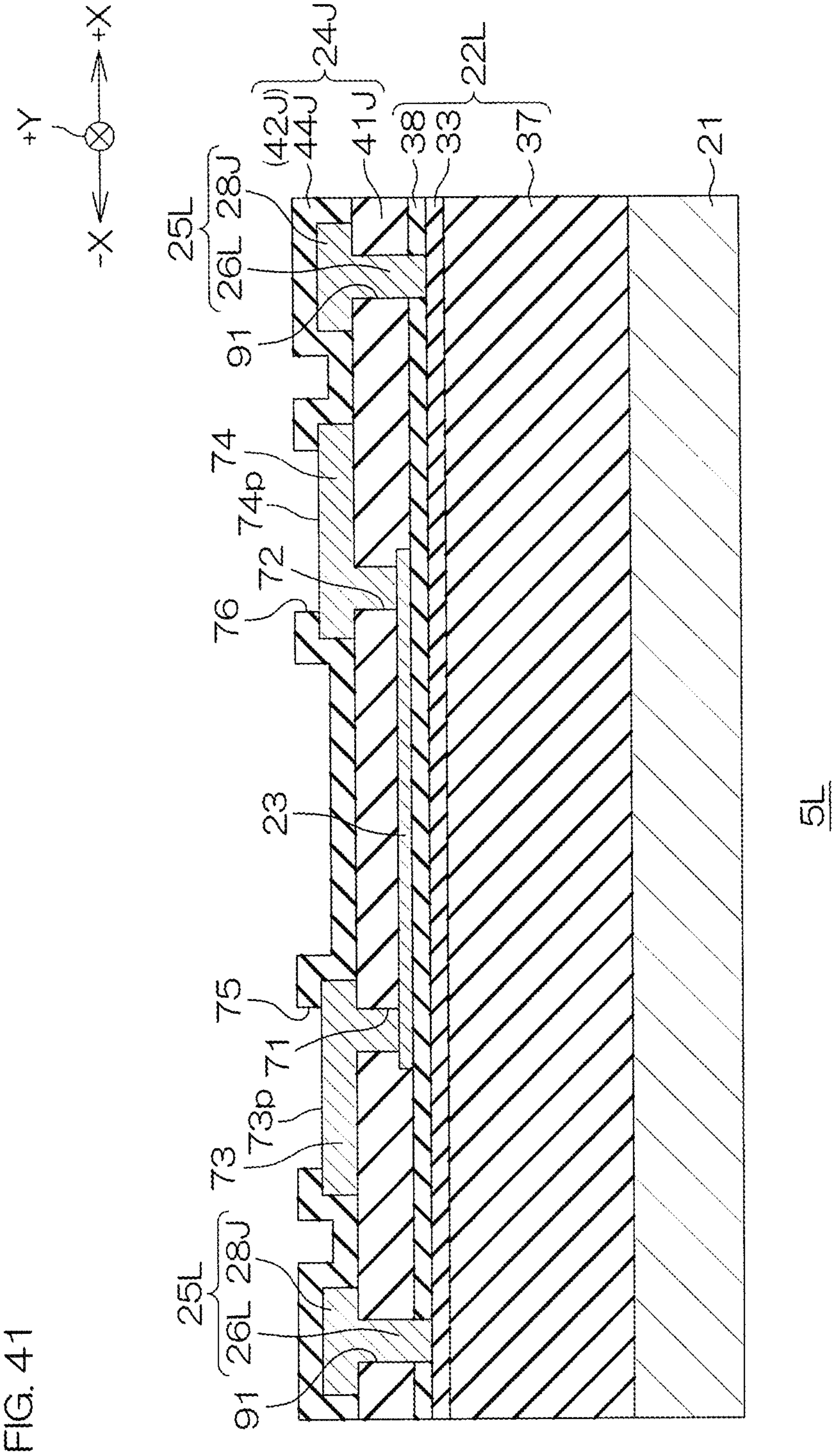
FIG. 41 is an illustrative sectional view for describing a twelfth modification example of the first chip in the third disclosure.

FIG. 41 is a sectional view for describing the twelfth modification example of the first chip and is a sectional view corresponding to the section plane of FIG. 26. A first chip 5L of FIG. 41 is similar to the first chip 5J of FIG. 38. In FIG. 41, portions corresponding to respective portions in FIG. 38 are indicated with the same reference signs attached as in FIG. 38.

A plan view of the first chip 5L of FIG. 41 is the same as FIG. 3. The first chip 5L of FIG. 41 differs from the first chip 5J of FIG. 38 in the point that a seventh SiO-based insulating film 38 is formed on the first nitride film 33 and the resistor 23 is formed on the seventh SiO-based insulating film 38. Thereby, the annular hole 91 differs from the annular hole 91 of the first chip 5J of FIG. 38 and a seal ring 25L differs in arrangement from the seal ring 25J of the first chip 5J of FIG. 38.

With the first chip 5L of FIG. 41, a lower insulating film 22L is constituted of the sixth SiO-based insulating film 37 that is formed on the substrate 21, the first nitride film 33 that is formed on the sixth SiO-based insulating film 37, and the seventh SiO-based insulating film 38 that is formed on the first nitride film 33.

The annular hole 91 penetrates through a laminated film of the seventh SiO-based insulating film 38 and the first SiO-based insulating film 41J. The seal ring 25L is constituted of a ring main body portion 26L and the upper ring portion 28J and the ring main body portion 26L differs from the ring main body portion 26J of FIG. 38. Specifically, the ring main body portion 26L is embedded in the annular hole 91. That is, the ring main body portion 26L is disposed inside the laminated film of the seventh SiO-based insulating film 38 and the first SiO-based insulating film 41J and penetrates through the laminated film.

With the first chip 5L of FIG. 41, an entirety of the seal ring 25L corresponds to being the main ring portion of the present disclosure.

With the twelfth modification example, improvement of moisture resistance is enabled because all resistors 23 are surrounded by the first nitride film 33, the protective film 42 that is constituted of the second nitride film 44J, and the seal ring 25L.

In comparison to the method for manufacturing the first chip 5J of FIG. 38, a method for manufacturing the first chip 5L of FIG. 41 differs in the following points. That is, the resistor 23 is formed after forming the seventh SiO-based insulating film 38 on the first nitride film 33. Also, in the step of forming the first contact hole 71, the second contact hole 72, and the annular hole 91, the annular hole 91 is formed such as to penetrate through the laminated film of the seventh SiO-based insulating film 38 and the first SiO-based insulating film 41J and the first contact hole 71 and the second contact hole 72 are formed such as to penetrate through the first SiO-based insulating film 41J.

Figure 42:
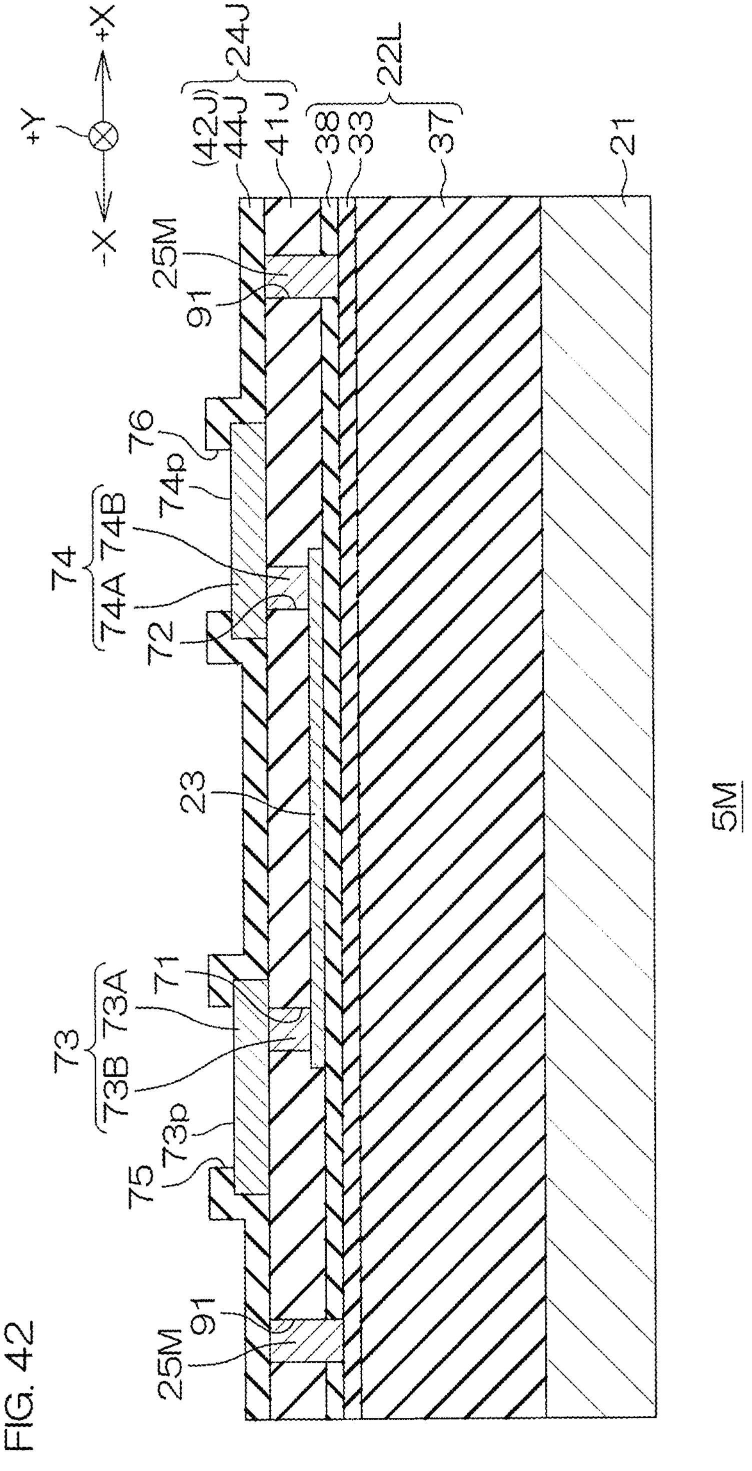
FIG. 42 is an illustrative sectional view for describing a thirteenth modification example of the first chip in the third disclosure.

FIG. 42 is a sectional view for describing the thirteenth modification example of the first chip and is a sectional view corresponding to the section plane of FIG. 26. The sectional structure of a first chip 5M of FIG. 42 is similar to the sectional structure of the first chip 5L of FIG. 41. In FIG. 42, portions corresponding to respective portions in FIG. 41 are indicated with the same reference signs attached as in FIG. 41.

A plan view of the first chip 5M of FIG. 42 is the same as FIG. 3. With the first chip 5M of FIG. 42, a seal ring 25M differs in arrangement from the seal ring 25L of the first chip 5L of FIG. 41.

Specifically, with the first chip 5M of FIG. 42, the seal ring 25M is constituted of just a portion that is embedded in the annular hole 91.

Also, with the first chip 5M of FIG. 42, the first lead-out electrode 73 is constituted of the main electrode portion 73A that is formed on the first SiO-based insulating film 41 and the connection portion 73B that is embedded in the first contact hole 71 and connects the main electrode portion 73A to the resistor 23. Similarly, the second lead-out electrode 74 is constituted of the main electrode portion 74A that is formed on the first SiO-based insulating film 41 and the connection portion 74B that is embedded in the second contact hole 72 and connects the main electrode portion 74A to the resistor 23.

With this modification example, the seal ring 25M and the connection portions 73B and 74B are constituted of W (tungsten). The main electrode portions 73A and 74A are constituted of Al (aluminum).

With the first chip 5M of FIG. 42, an entirety of the seal ring 25M corresponds to being the main ring portion of the present disclosure.

With the thirteenth modification example, improvement of moisture resistance is enabled because all resistors 23 are surrounded by the first nitride film 33, the protective film 42 that is constituted of the second nitride film 44J, and the seal ring 25M.

In comparison to the method for manufacturing the first chip 5L of FIG. 41, a method for manufacturing the first chip 5M of FIG. 42 differs in the following points. That is, after the first contact hole 71, the second contact hole 72, and the annular hole 91 are formed, the material (W) of the seal ring 25M and the connection portions 73B and 74B are embedded inside the holes 71, 72, and 91. The seal ring 25M and the connection portions 73B and 74B are thereby obtained. After a material film (Al film) of the main electrode portions 73A and 74A are thereafter formed on the first SiO-based insulating film 41, the material film is patterned to form the main electrode portions 73A and 74A.

Figure 43:
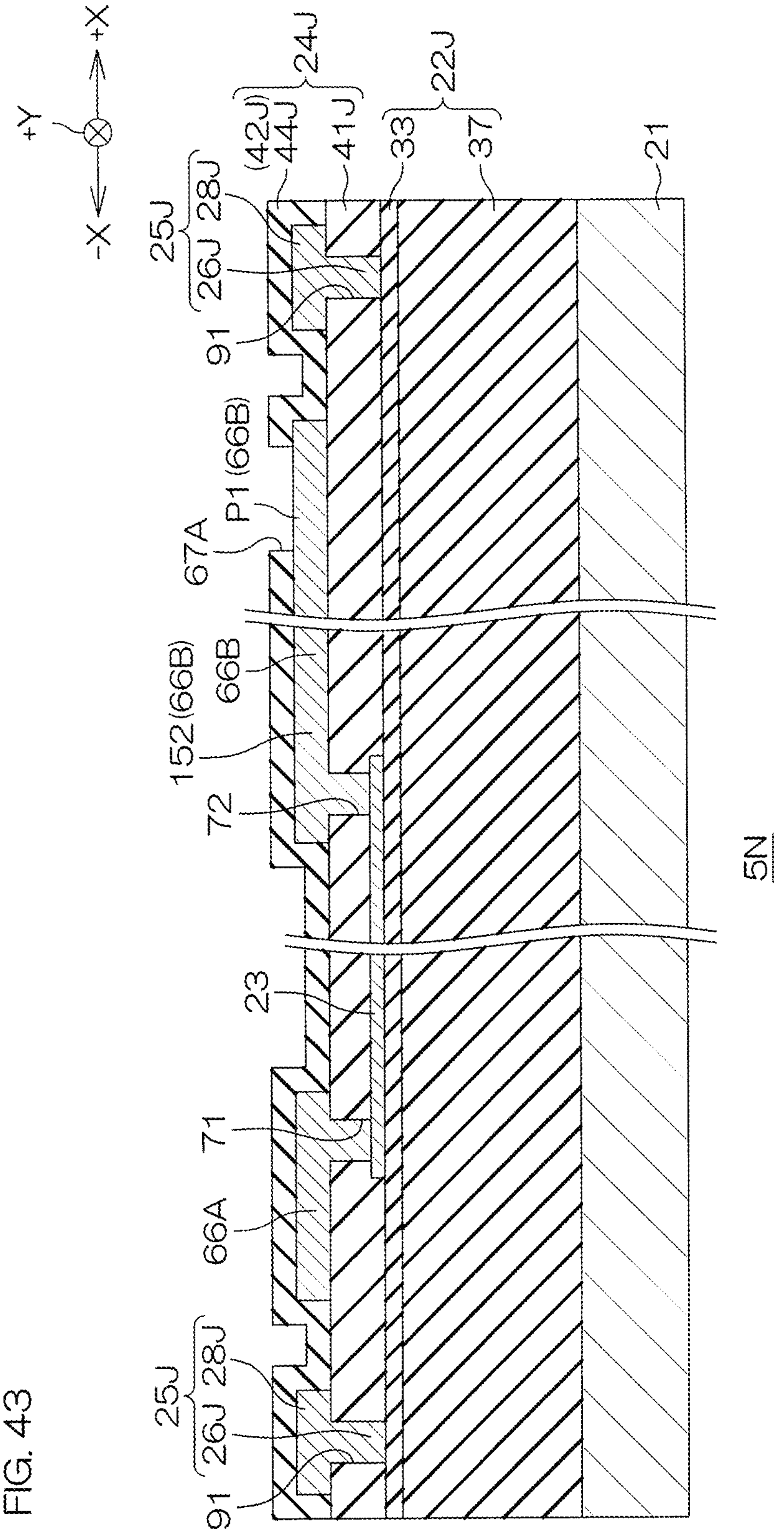
FIG. 43 is an illustrative sectional view for describing a fourteenth modification example of the first chip in the third disclosure.
Figure 44:
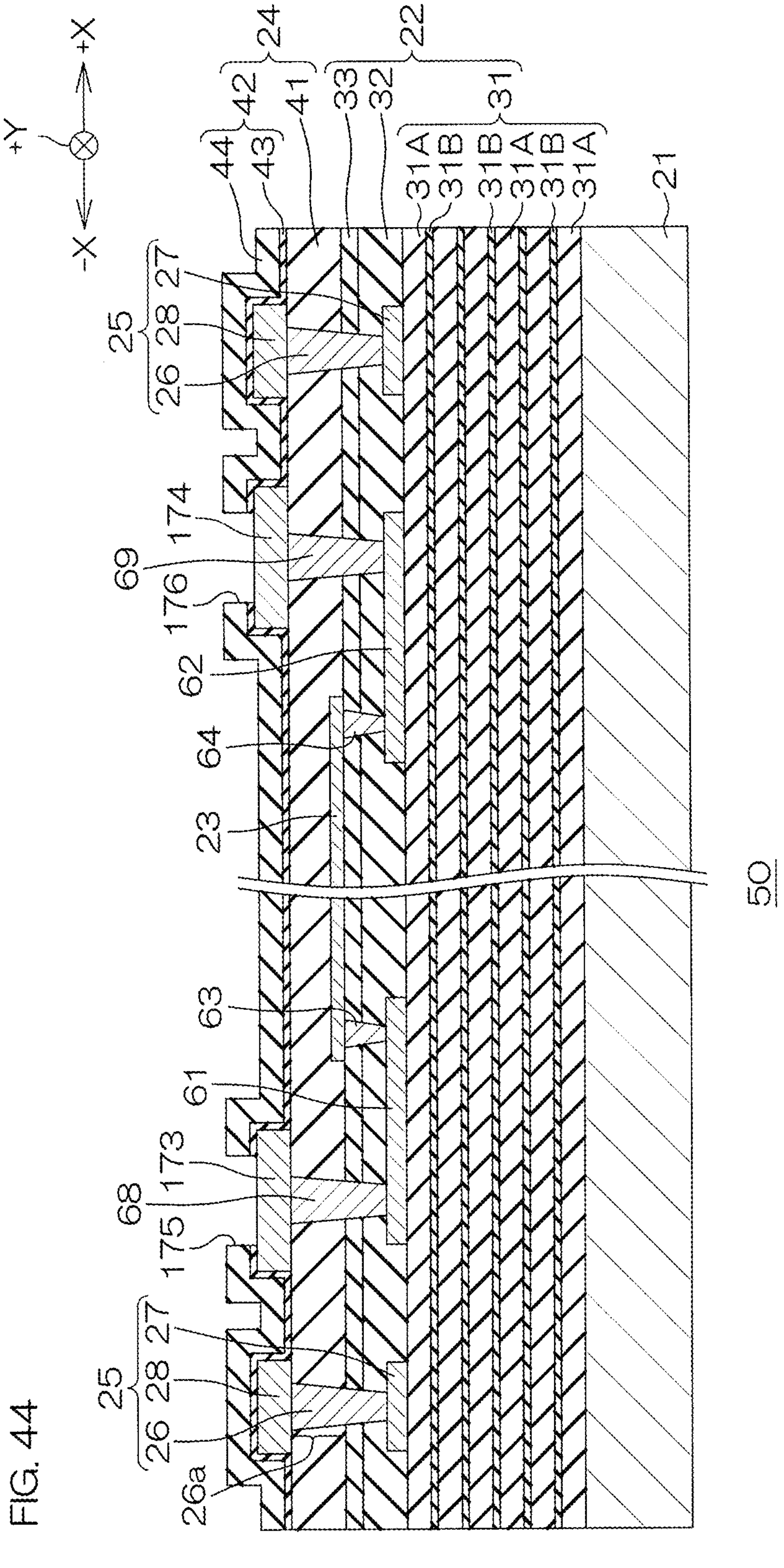
FIG. 44 is an illustrative sectional view for describing a fifteenth modification example of the first chip in the third disclosure.
Figure 45:
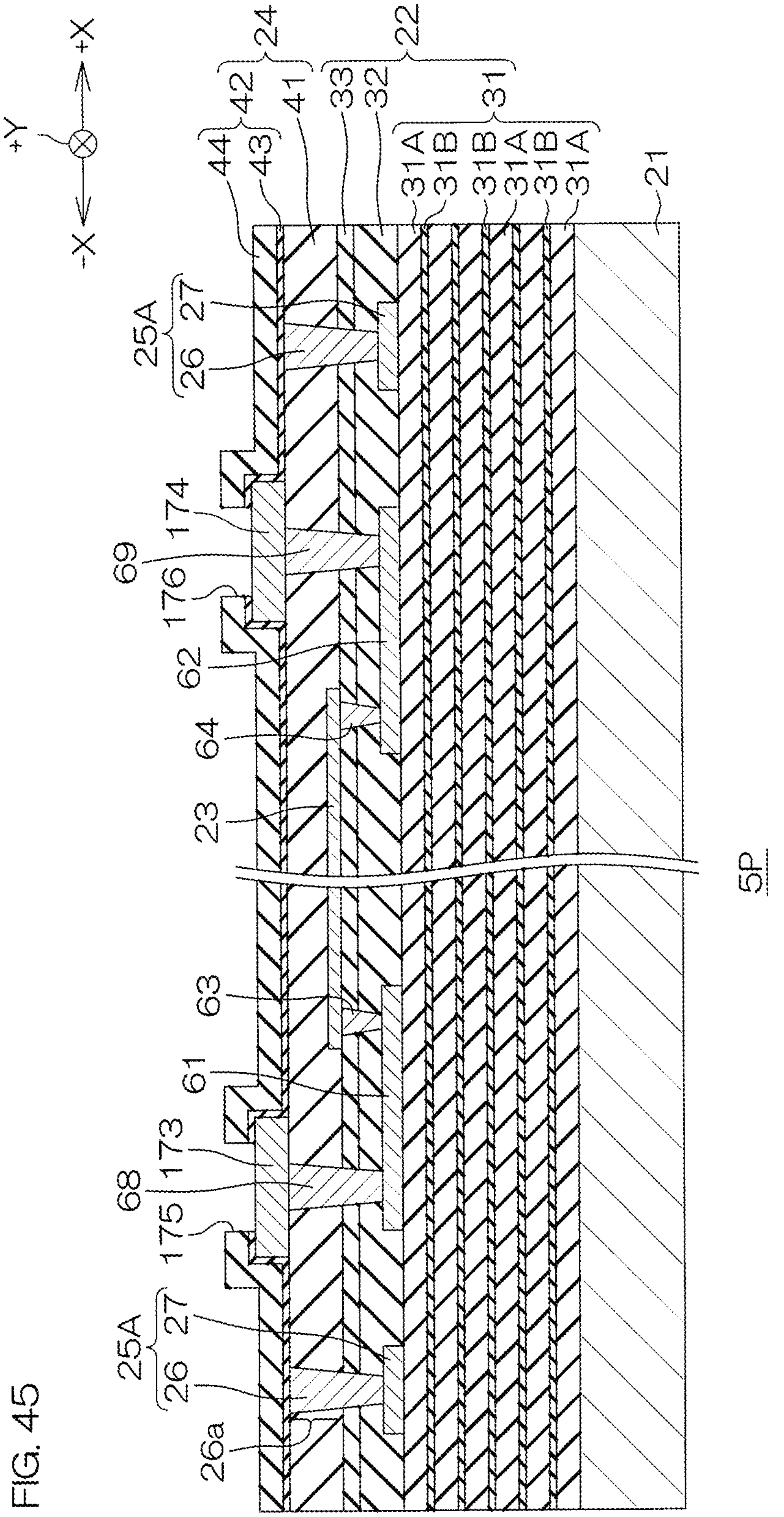
FIG. 45 is an illustrative sectional view for describing a sixteenth modification example of the first chip in the third disclosure.
Figure 46:
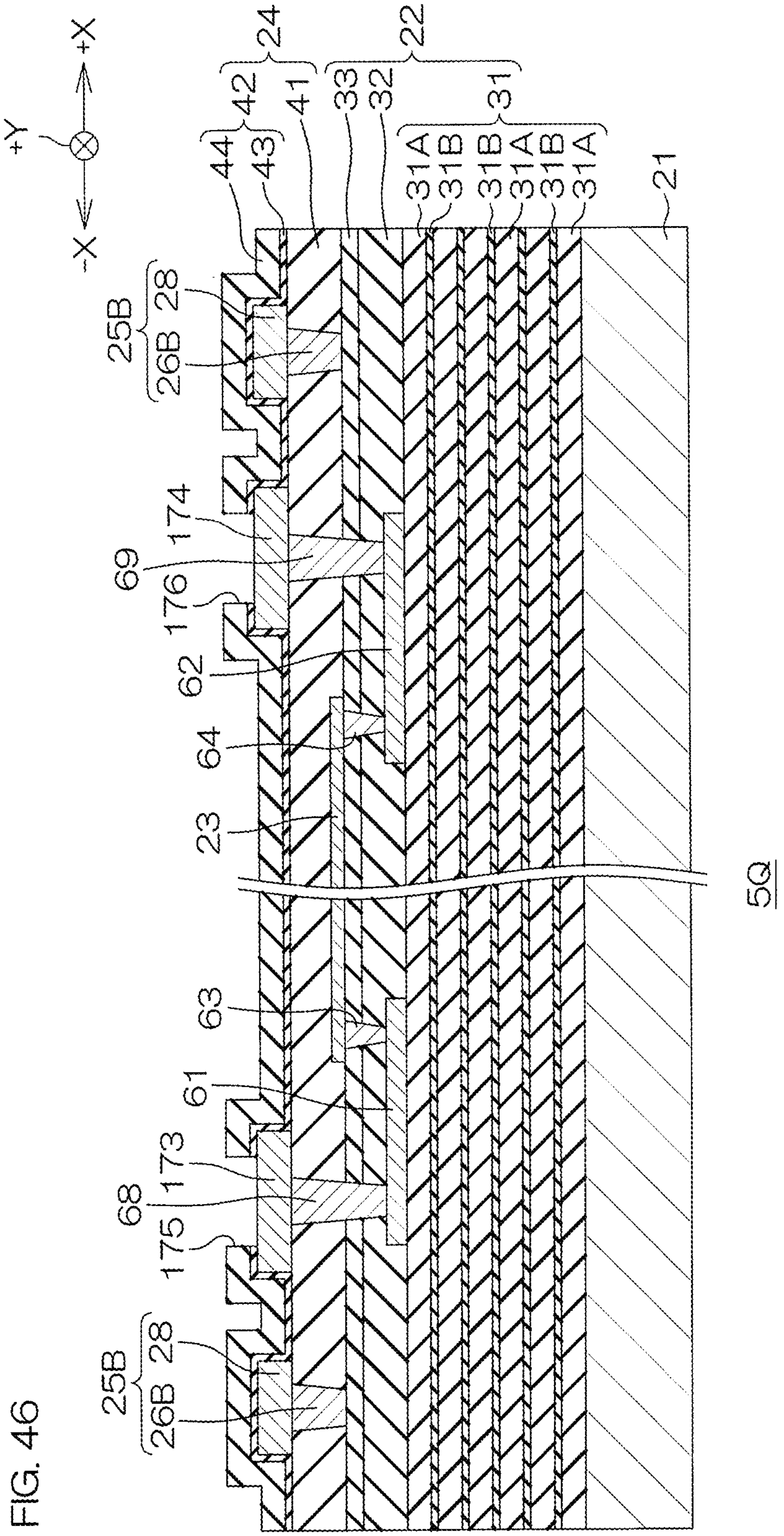
FIG. 46 is an illustrative sectional view for describing a seventeenth modification example of the first chip in the third disclosure.
Figure 47:
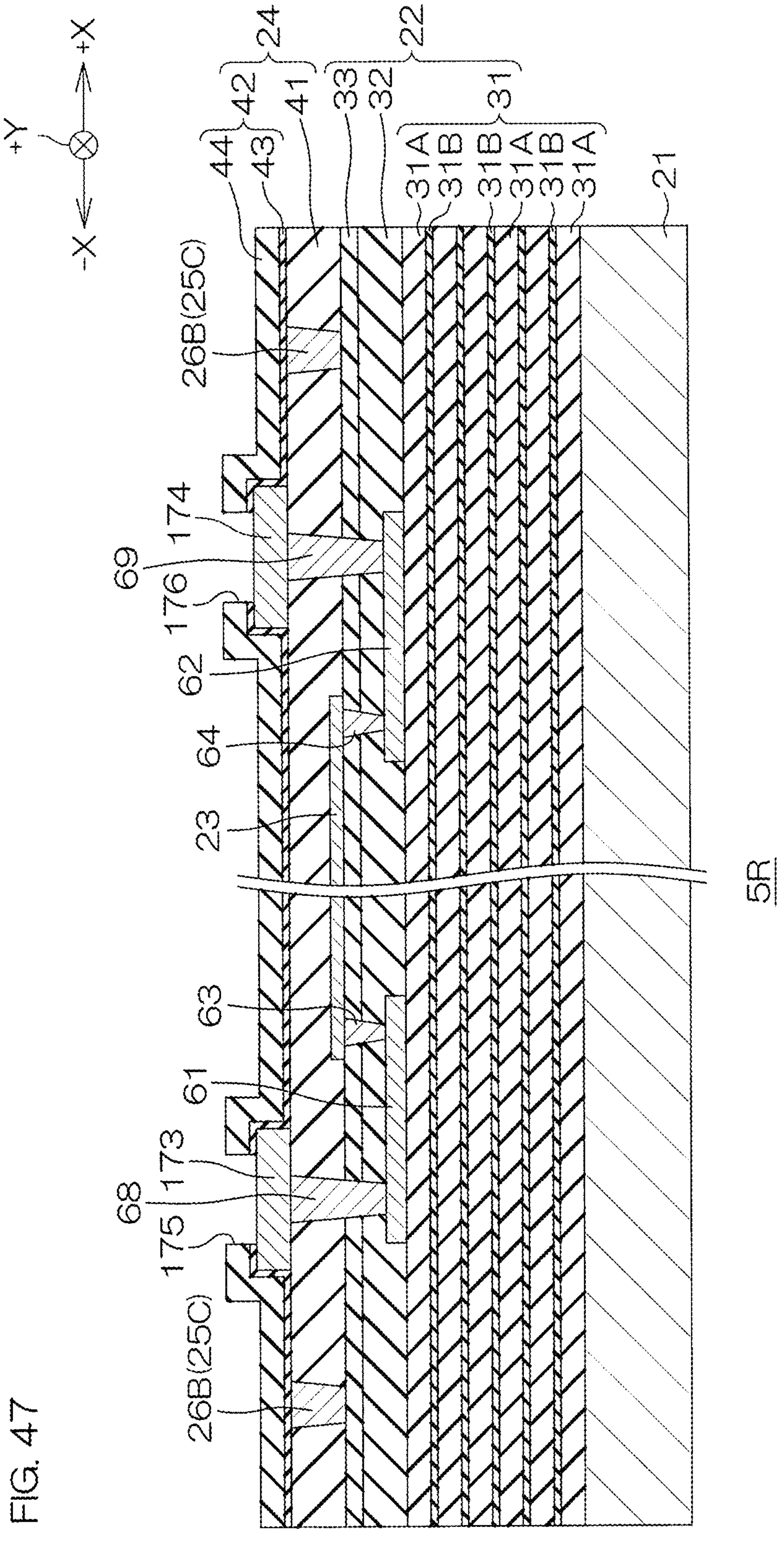
FIG. 47 is an illustrative sectional view for describing an eighteenth modification example of the first chip in the third disclosure.
Figure 48:
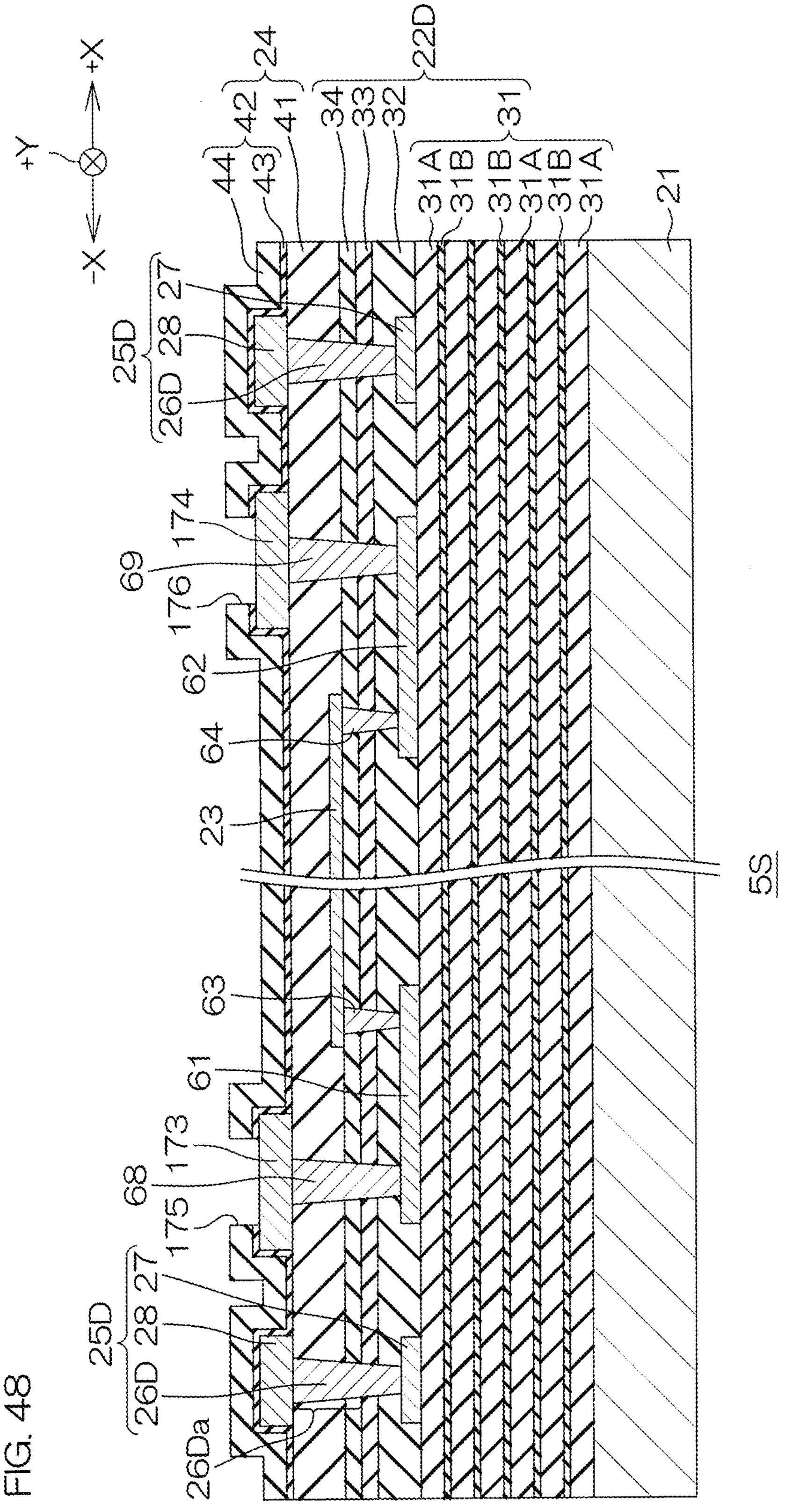
FIG. 48 is an illustrative sectional view for describing a nineteenth modification example of the first chip in the third disclosure.
Figure 49:
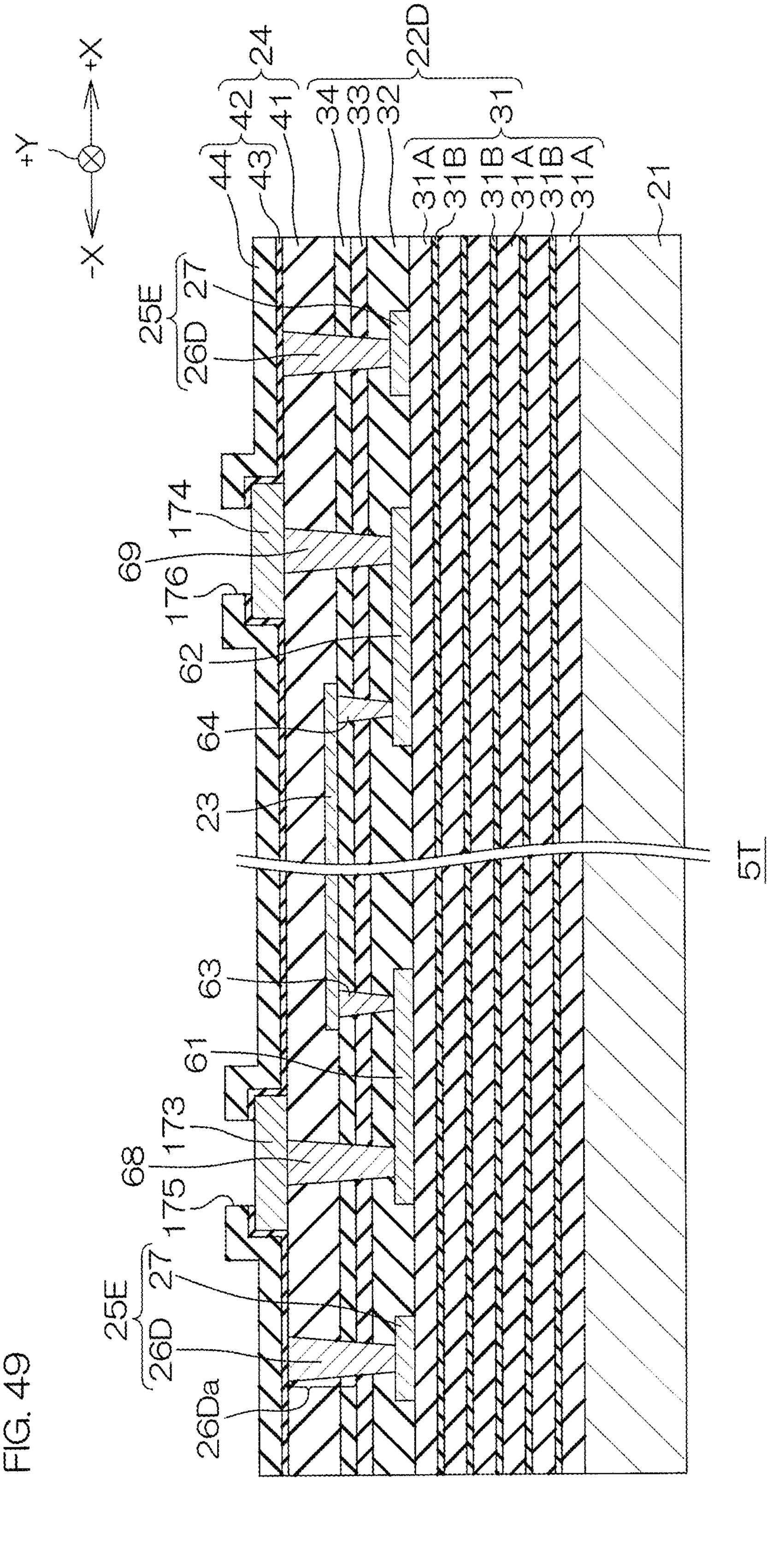
FIG. 49 is an illustrative sectional view for describing a twentieth modification example of the first chip in the third disclosure.
Figure 50:
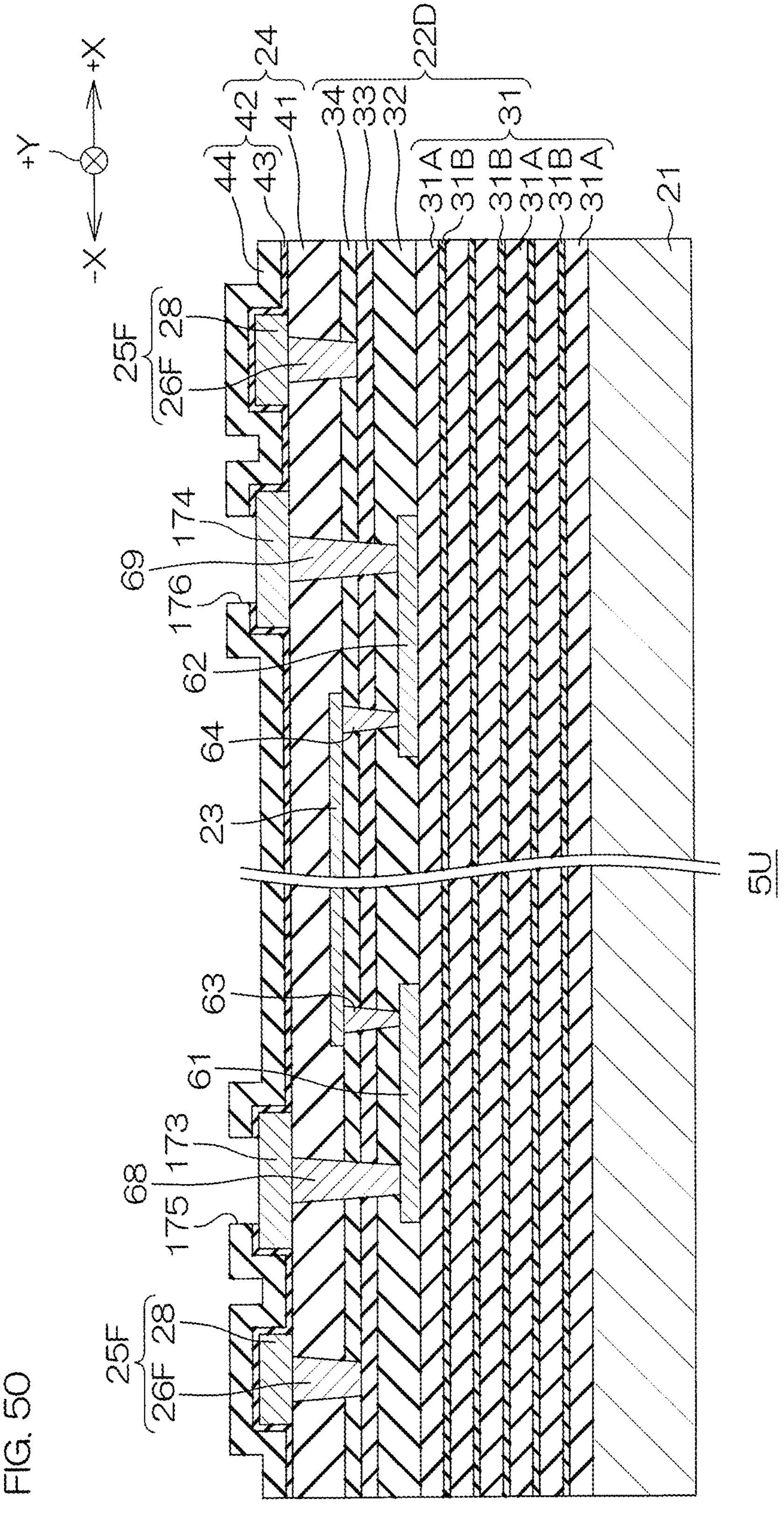
FIG. 50 is an illustrative sectional view for describing a twenty-first modification example of the first chip in the third disclosure.
Figure 51:
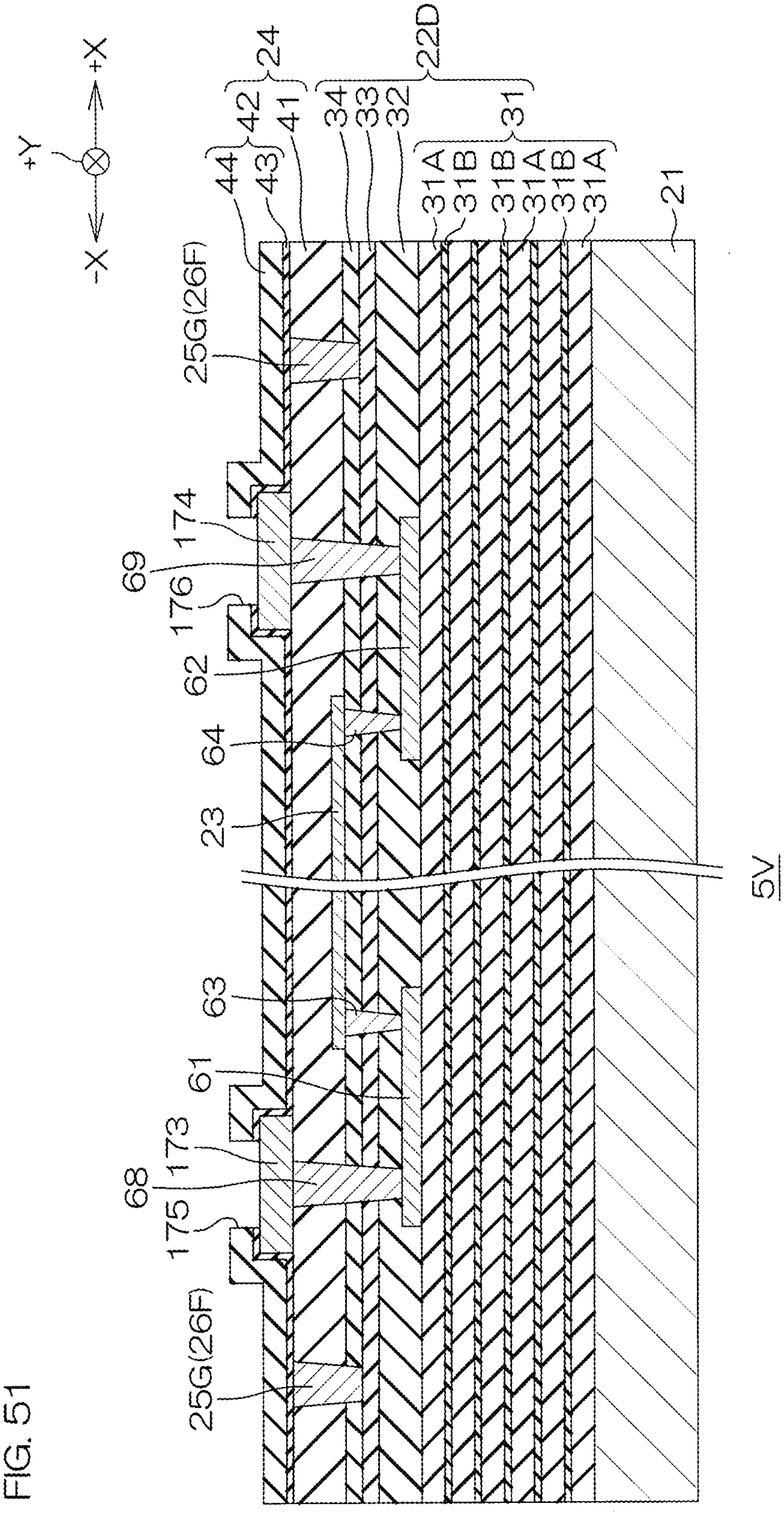
FIG. 51 is an illustrative sectional view for describing a twenty-second modification example of the first chip in the third disclosure.
Figure 52:
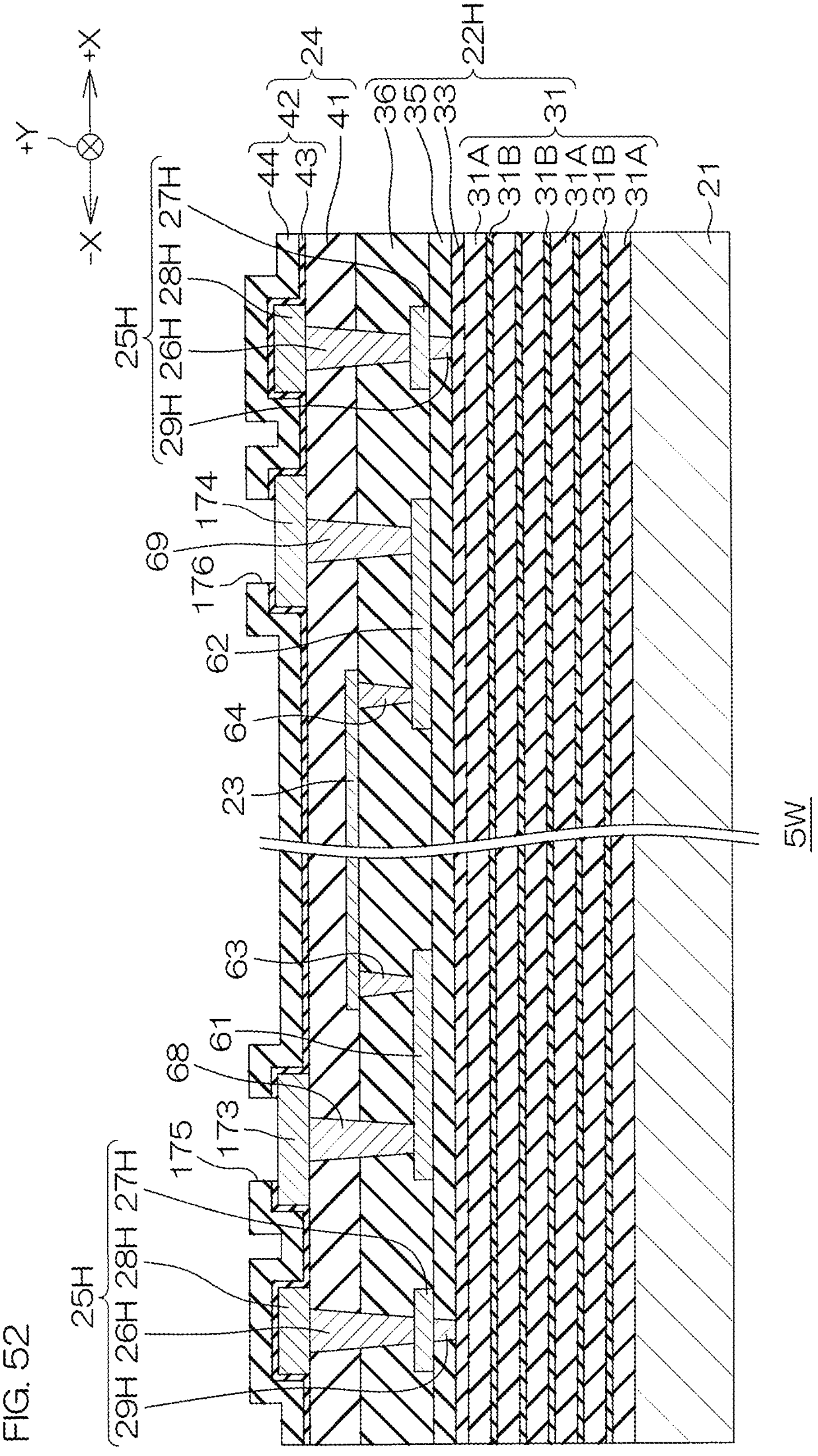
FIG. 52 is an illustrative sectional view for describing a twenty-third modification example of the first chip in the third disclosure.
Figure 53:
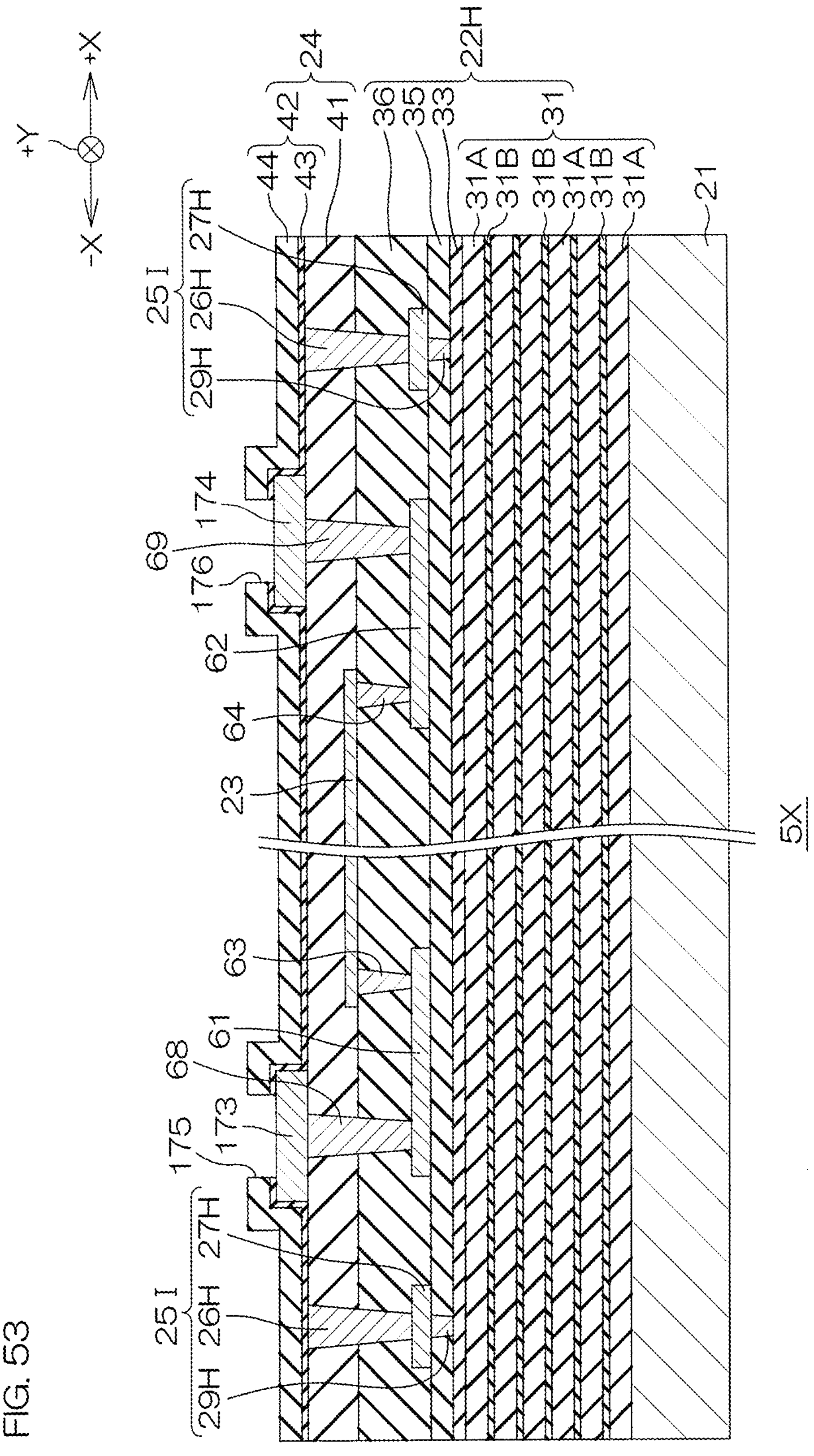
FIG. 53 is an illustrative sectional view for describing a twenty-fourth modification example of the first chip in the third disclosure.
Figure 54:
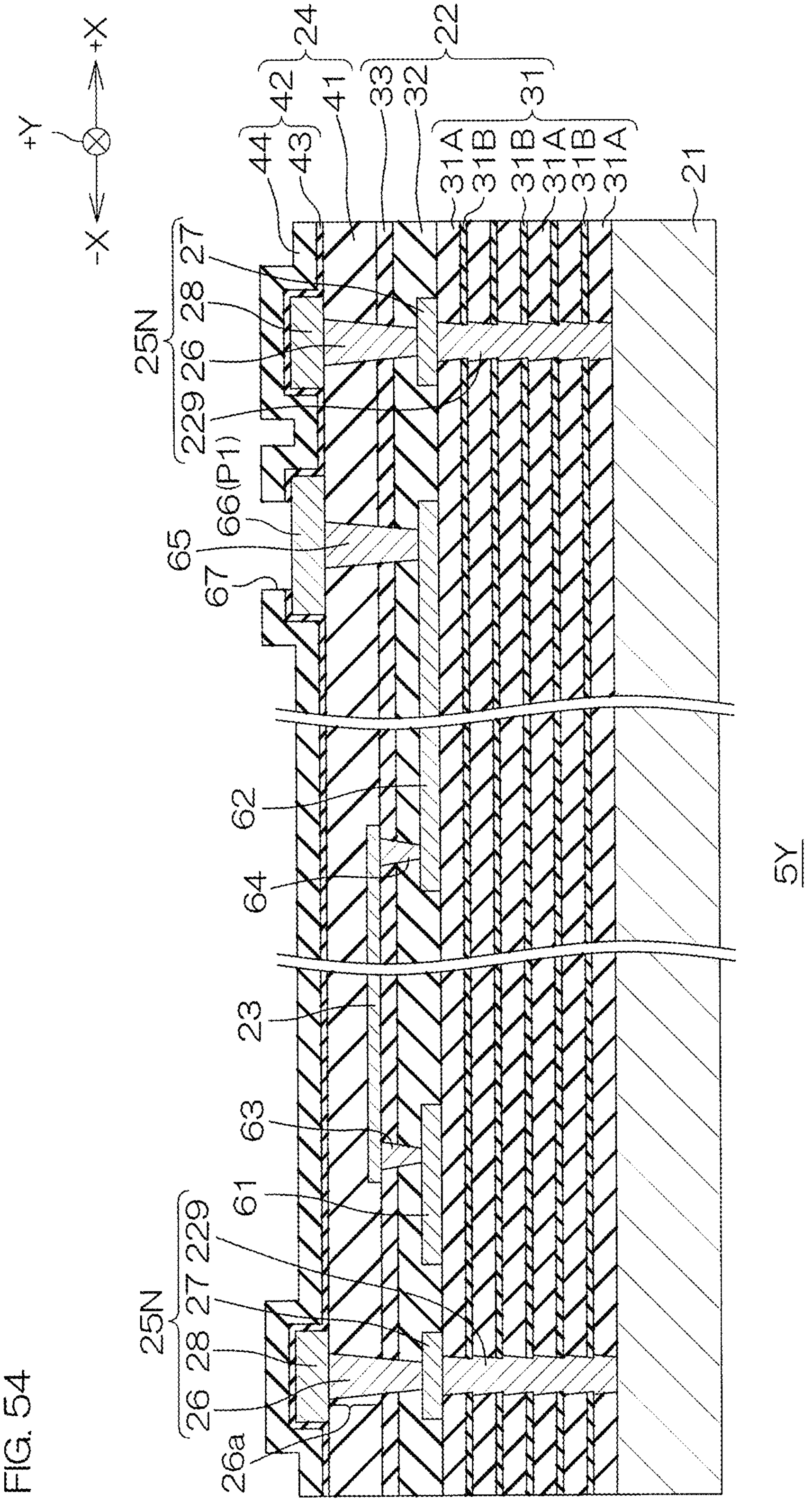
FIG. 54 is an illustrative sectional view for describing a twenty-fifth modification example of the first chip in the third disclosure.
Figure 55:
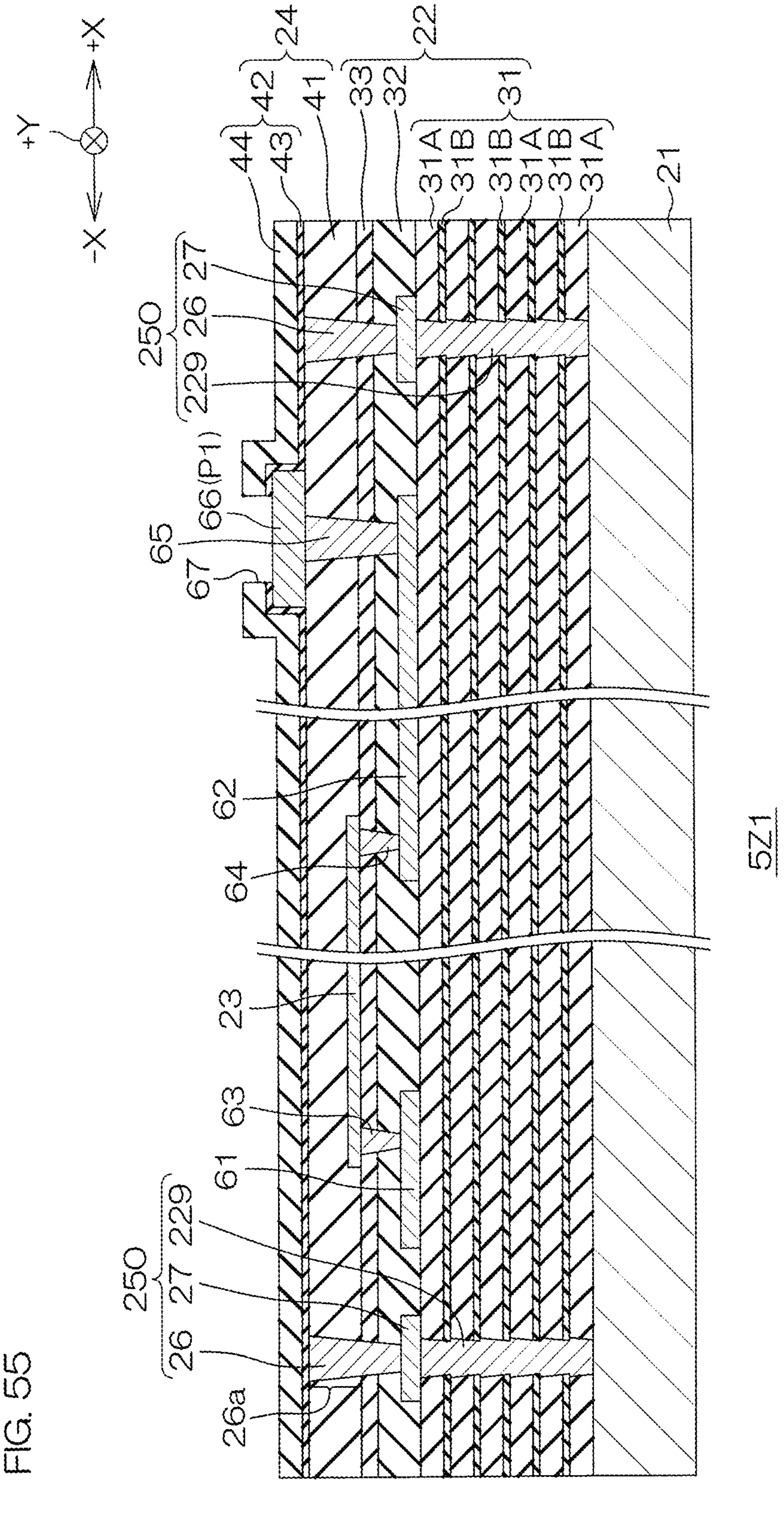
FIG. 55 is an illustrative sectional view for describing a twenty-sixth modification example of the first chip in the third disclosure.
Figure 56:
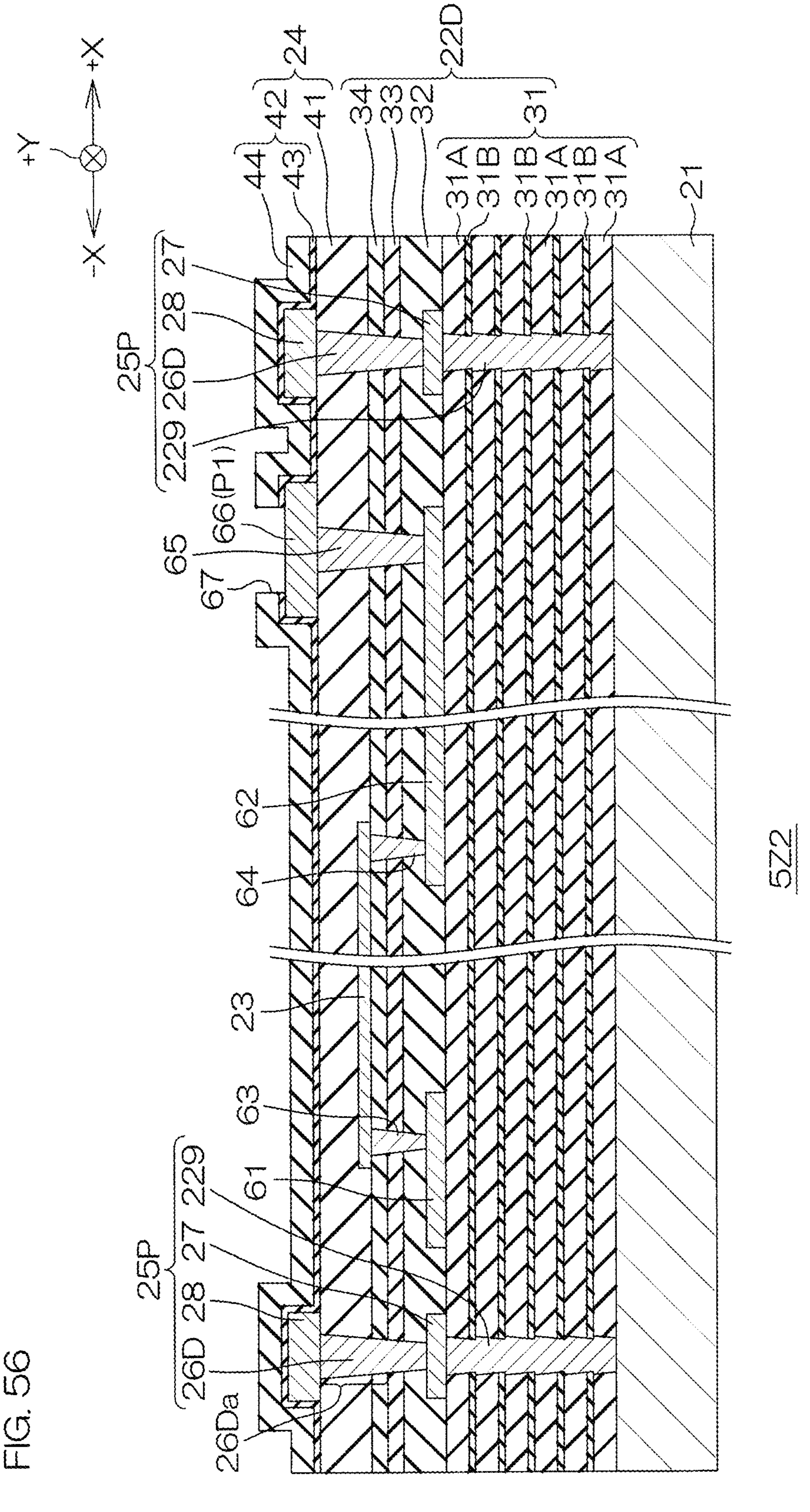
FIG. 56 is an illustrative sectional view for describing a twenty-seventh modification example of the first chip in the third disclosure.
Figure 57:
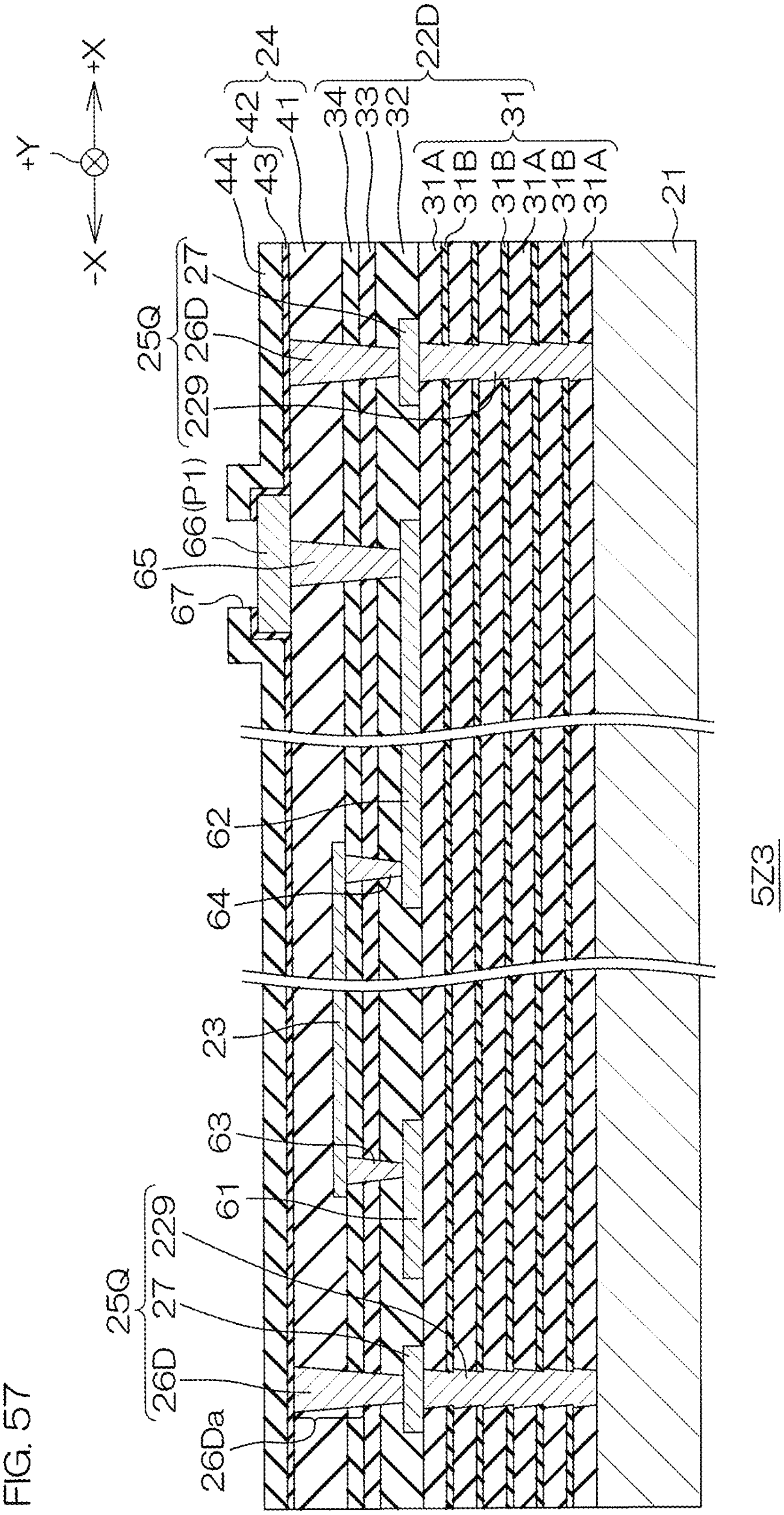
FIG. 57 is an illustrative sectional view for describing a twenty-eighth modification example of the first chip in the third disclosure.

FIG. 43 is a sectional view for describing the fourteenth modification example of the first chip and is a sectional view corresponding to the section plane of FIG. 38. In FIG. 43, portions corresponding to respective portions in FIG. 38 are indicated with the same reference signs attached as in FIG. 38.

A first chip 5N of FIG. 43 has substantially the same arrangement as the first chip 5J of FIG. 38. In comparison to the first chip 5J of FIG. 38, the first chip 5N of FIG. 43 differs in the points that a first upper metal 66A is formed in place of the first lead-out electrode 73 and a second upper metal 66B is formed in place of the second lead-out electrode 74.

The first upper metal 66A and the second upper metal 66B are used to connect the real resistors ra to each other and to connect the real resistors ra to the terminals P1 to P6. Also, the first upper metal 66A and the second upper metal 66B may integrally include a wiring and a terminal. In the example of FIG. 43, the second upper metal 66B integrally includes the terminal P1 and the wiring 152. An opening 67A arranged to expose a portion of an upper surface of a portion of the second upper metal 66B that constitutes the terminal P1 is formed in the protective film 42J.

FIG. 44 to FIG. 53 are sectional views for respectively describing the fifteenth to twenty-fourth modification examples of the first chip.

First chips 5O, 5P, 5Q, 5R, 5S, 5T, 5U, 5V, 5W, and 5X of FIG. 44, FIG. 45, FIG. 46, FIG. 47, FIG. 48, FIG. 49, FIG. 50, FIG. 51, FIG. 52, and FIG. 53 respectively have substantially the same arrangements as the first chips 5, 5A, 5B, 5C, 5D, 5E, 5F, 5G, 5H, and 5I of FIG. 26, FIG. 28, FIG. 29, FIG. 30, FIG. 31, FIG. 32, FIG. 33, FIG. 34, FIG. 35, and FIG. 37.

In FIG. 44, FIG. 45, FIG. 46, FIG. 47, FIG. 48, FIG. 49, FIG. 50, FIG. 51, FIG. 52, and FIG. 53, respectively, portions corresponding to respective portions in FIG. 26, FIG. 28, FIG. 29, FIG. 30, FIG. 31, FIG. 32, FIG. 33, FIG. 34, FIG. 35, and FIG. 37 are indicated with the same reference signs attached as in FIG. 26, FIG. 28, FIG. 29, FIG. 30, FIG. 31, FIG. 32, FIG. 33, FIG. 34, FIG. 35, and FIG. 37.

The first chips 5O to 5X of FIG. 44 to FIG. 53 differ in comparison to the first chips 5 to 5I having similar structures thereto, respectively, in the point that a first lead-out electrode 173 that is electrically connected to the first lower metal 61 via a fourth via 68 and a second lead-out electrode 174 that is electrically connected to the second lower metal 62 via a fifth via 69 are formed on the first SiO-based insulating film 41. In this case, the third via 65 and the upper metal 66 of the first chips 5 to 5I are not formed.

Also, in this case, in the protective film 42, an opening 175 arranged to expose a portion of an upper surface of the first lead-out electrode 173 is formed and an opening 176 arranged to expose a portion of an upper surface of the second lead-out electrode 174 is formed.

The first lead-out electrode 173 and the second lead-out electrode 174 are used to connect wirings (including the wirings 151 and 156 of FIG. 3) arranged to connect the real resistors ra to each other and wirings (including the wirings 152 to 155 and 157 to 160 of FIG. 3) arranged to connect the real resistors ra to the terminals P1 to P6.

FIG. 54 to FIG. 57 are sectional views for respectively describing the twenty-fifth to twenty-eighth modification examples of the first chip.

First chips 5Y, 5Z1, 5Z2, and 5Z3 of FIG. 54, FIG. 55, FIGS. 56, and 57 respectively have FIG. substantially the same arrangements as the first chips 5, 5A, 5D, and 5E of FIG. 26, FIG. 28, FIG. 31, and FIG. 32.

In FIG. 54, FIG. 55, FIG. 56, and FIG. 57, respectively, portions corresponding to respective portions in FIG. 26, FIG. 28, FIG. 31, and FIG. 32 are indicated with the same reference signs attached as in FIG. 26, FIG. 28, FIG. 31, and FIG. 32.

The first chips 5Y, 5Z1, 5Z2, and 5Z3 of FIG. 54 to FIG. 57 differ in comparison to the first chips 5, 5A, 5D, and 5E having similar structures thereto, respectively, in the point that seal rings 25N, 25O, 25P, and 25Q each have a lower end ring portion 229.

The lower end ring portion 229 penetrates through the insulating film laminated structure 31 and an upper surface thereof is joined to the width central portion of the lower surface of the lower ring 27.

Figure 58:
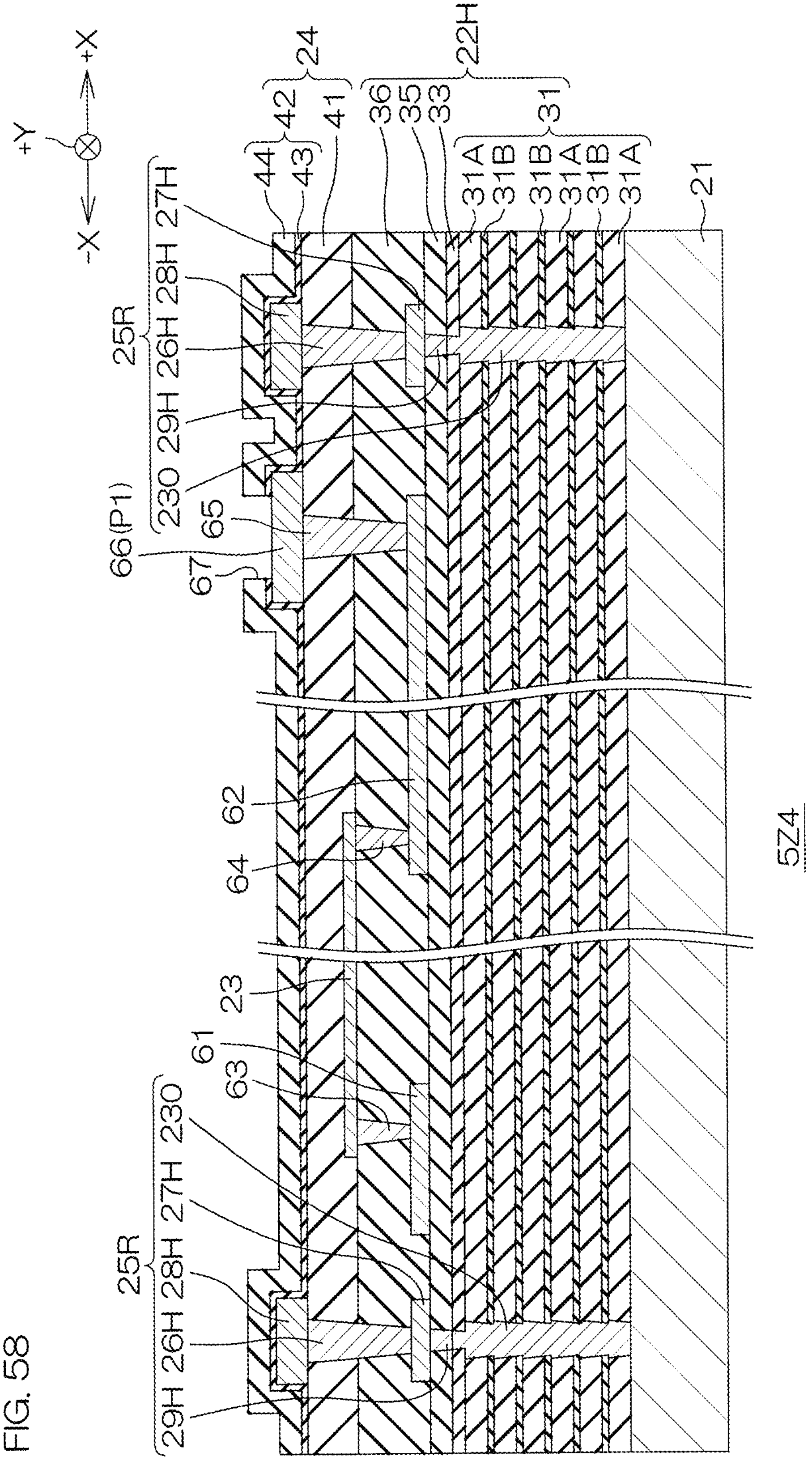
FIG. 58 is an illustrative sectional view for describing a twenty-ninth modification example of the first chip in the third disclosure.
Figure 59:
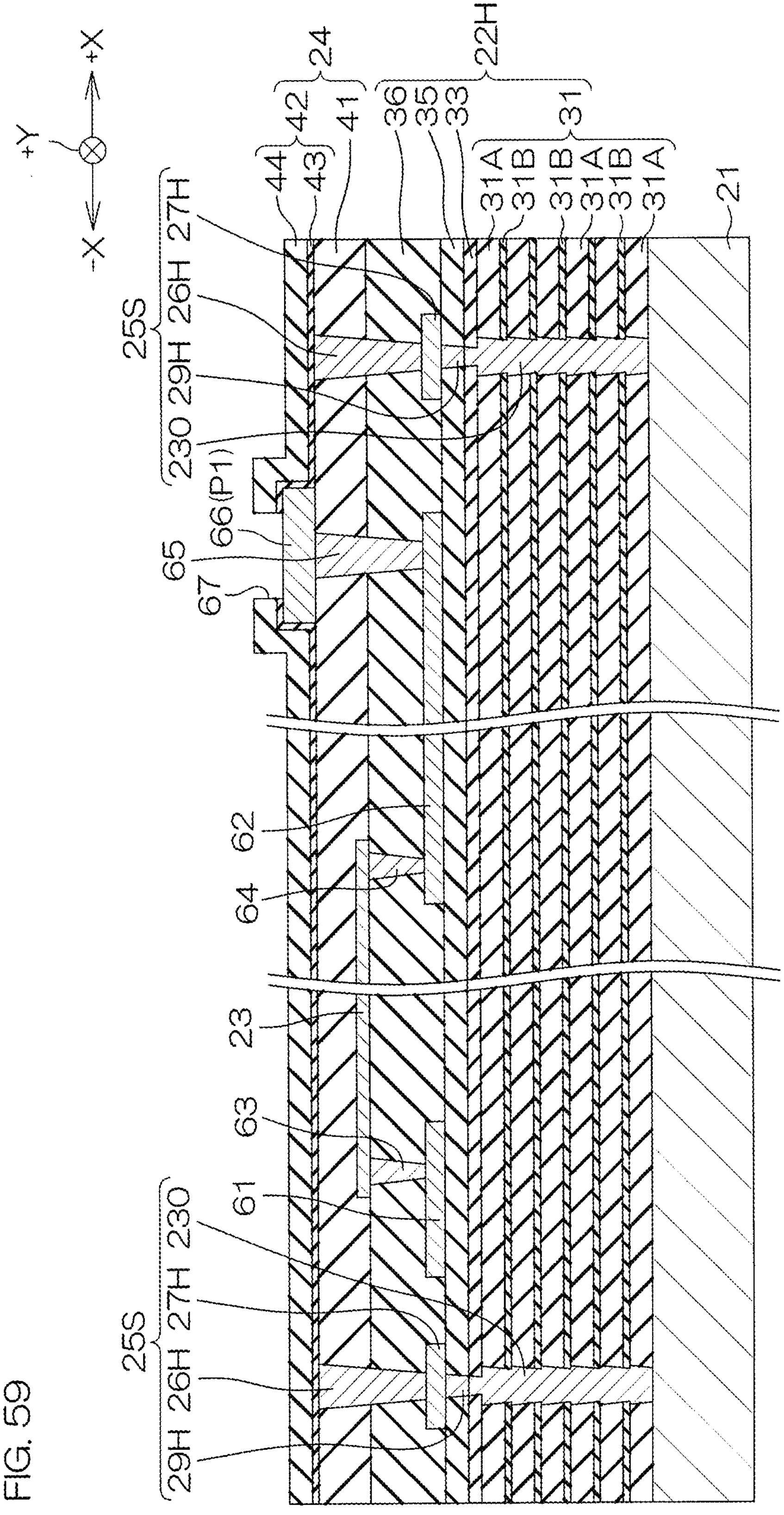
FIG. 59 is an illustrative sectional view for describing a thirtieth modification example of the first chip in the third disclosure.

FIG. 58 and FIG. 59 are sectional views for respectively describing the twenty-ninth and thirtieth modification examples of the first chip.

First chips 524 and 525 of FIG. 58 and FIG. 59 respectively have substantially the same arrangements as the first chips 5H and 5I of FIG. 35 and FIG. 37. In FIG. 58 and FIG. 59, respectively, portions corresponding to respective portions in FIG. 35 and FIG. 37 are indicated with the same reference signs attached as in FIG. 35 and FIG. 37.

The first chips 524 and 525 of FIG. 58 and FIG. 59 differ in comparison to the first chips 5H and 5I having similar structures thereto, respectively, in the point that a seal ring 25R and 25S each have a lower extension ring portion 230.

The lower extension ring portion 230 penetrates through a laminated film of the insulating film laminated structure 31 and the first nitride film 33 and an upper surface thereof is joined to a lower surface of the lower end ring portion 29H. Here, a portion of the lower extension ring portion 230 that penetrates through the first nitride film 33 may be formed in a step of forming the lower end ring portion 29H.

Figure 60:
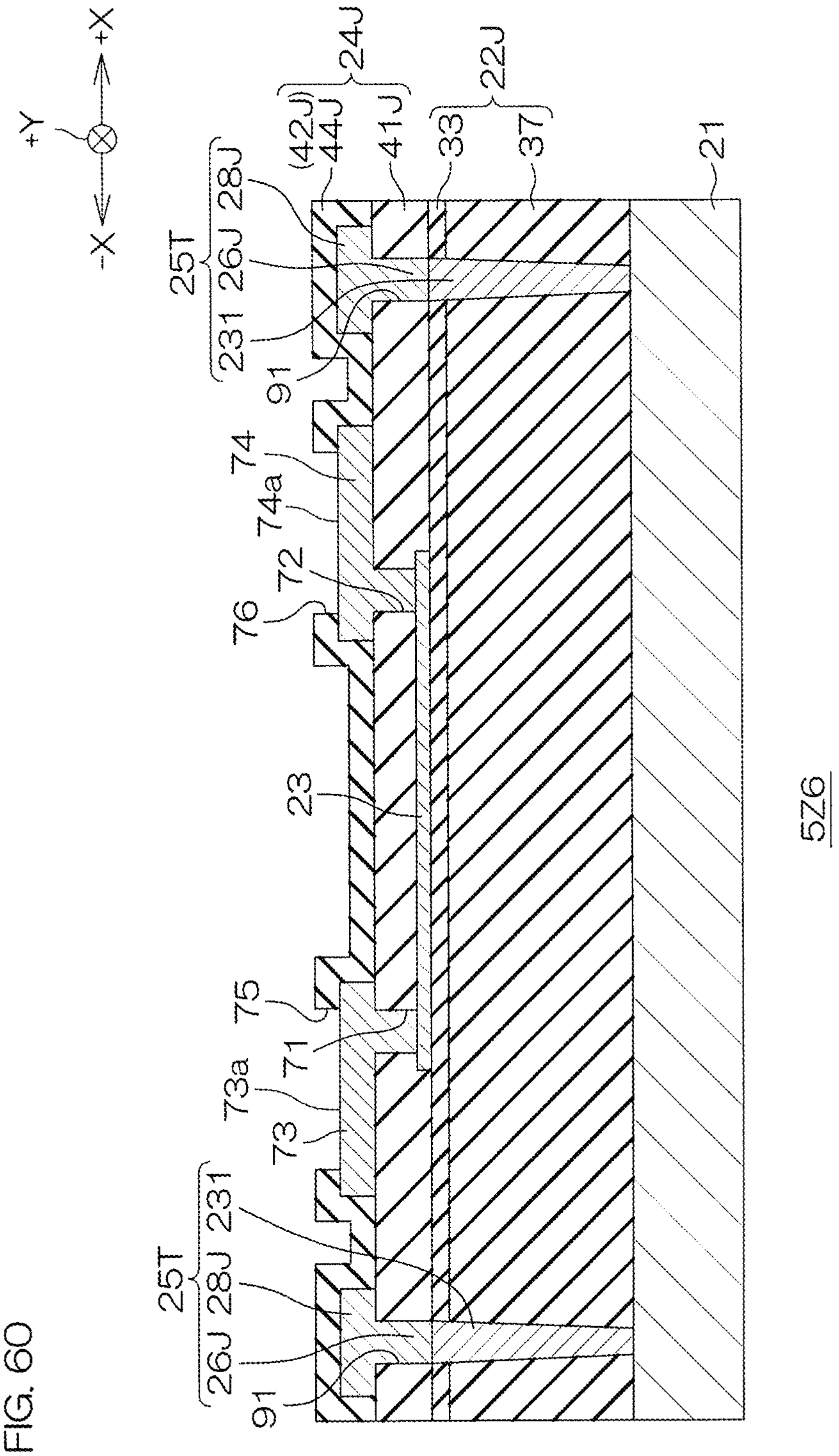
FIG. 60 is an illustrative sectional view for describing a thirty-first modification example of the first chip in the third disclosure.

FIG. 60 is a sectional view for describing the thirty-first modification examples of the first chip.

A first chip 526 of FIG. 60 has substantially the same arrangement as the first chip 5J of FIG. 38. In FIG. 60, portions corresponding to respective portions in FIG. 38 are indicated with the same reference signs attached as in FIG. 38.

The first chip 526 of FIG. 60 differs in comparison to the first chip 5J in the point that a seal ring 25T has a lower end ring portion 231.

The lower end ring portion 231 penetrates through the lower insulating film 22J and an upper surface thereof is joined to a lower surface of the ring main body portion 26J.

While the preferred embodiments of the third disclosure and the first to thirty-first modification examples of the first chip 5 of the third disclosure were described above, the third disclosure can be implemented in yet other preferred embodiments.

For example, although in the preferred embodiments of the third disclosure and the first to thirty-first modification examples of the first chip 5 of the third disclosure described above, $SiO_2$ films are used as the "SiO-based insulating films," SiON films and other SiO-based insulating films besides $SiO_2$ films may be used instead as the "SiO-based insulating films." Also, although in the preferred embodiments of the third disclosure and the first to thirteenth modification examples of the first chip 5 of the third disclosure, SiN films are used as the "nitride films," nitride films besides SiN films may be used instead.

Also, although in the first chips 5 and 5A to 5M of the third disclosure described above, the dummy resistors rb (see FIG. 3) are provided, the dummy resistors rb do not have to be provided.

Also, an arrangement pattern of the resistors r shown in FIG. 3 is one example and the arrangement pattern of the resistors r may be an arrangement pattern besides that of FIG. 3.

[4] While preferred embodiments of the present disclosures were described in detail above, these are merely specific examples used to clarify the technical contents of the present disclosures and the present disclosures should not be interpreted as being limited to these specific examples and the scope of the present disclosures is limited only by the appended claims.

The invention claimed is:

1. A semiconductor device comprising:
- a substrate;
- a lower insulating film that is formed on the substrate;
- a resistor that is formed on the lower insulating film;
- an upper insulating film that is formed on the lower insulating film such as to cover the resistor; and
- wherein the lower insulating film includes a first nitride film and a first SiO-based insulating film that is formed on the first nitride film,
- the upper insulating film includes a second nitride film,
- the resistor is formed on the first SiO-based insulating film, and
- a lower surface of a peripheral edge portion of the second nitride film is joined to an upper surface of the first nitride film.

2. The semiconductor device according to claim 1, wherein the lower insulating film includes
- an insulating film laminated structure that is formed on the substrate and in which a nitride film and an SiO-based insulating film are laminated alternately,
- a second SiO-based insulating film that is formed on the insulating film laminated structure,
- the first nitride film that is formed on the second SiO-based insulating film, and
- the first SiO-based insulating film that is formed in a region of the first nitride film upper surface excluding a peripheral edge portion and
- the resistor is formed on the first SiO-based insulating film.

3. The semiconductor device according to claim 2, comprising:
- a first metal and a second metal that are formed on the insulating film laminated structure and are covered by the second SiO-based insulating film;
- a first via that penetrates through a laminated film of the second SiO-based insulating film, the first nitride film, and the first SiO-based insulating film and electrically connects the first metal and one end portion of the resistor; and
- a second via that penetrates through the laminated film and electrically connects the second metal and another end portion of the resistor.

4. The semiconductor device according to claim 3, wherein the upper insulating film includes a third SiO-based insulating film that is formed on the first SiO-based insulating film such as to cover the resistor and
- the second nitride film that is formed on the first nitride film such as to cover the third SiO-based insulating film.

5. The semiconductor device according to claim 4, comprising: a third metal that is formed on the third SiO-based insulating film and is a third metal electrically connected to the first metal or the second metal via a third via that penetrates through a laminated film of the second SiO-based insulating film, the first nitride film, the first SiO-based insulating film, and the third SiO-based insulating film; and
- wherein the second nitride film is formed on the first nitride film such as to cover exposed surfaces of the third metal, the third SiO-based insulating film, the first SiO-based insulating film, and the first nitride film.

6. The semiconductor device according to claim 5, wherein an opening that exposes a portion of an upper surface of the third metal is formed in the second nitride film.

7. The semiconductor device according to claim 1, wherein the lower insulating film includes
- an insulating film laminated structure that is formed on the substrate and in which a nitride film and an SiO-based insulating film are laminated alternately,
- the first nitride film that is formed on the insulating film laminated structure,
- a fourth SiO-based insulating film that is formed in a region on the first nitride film excluding a peripheral edge portion, and
- a fifth SiO-based insulating film that is formed on the fourth SiO-based insulating film,
- the first SiO-based insulating film is constituted of the fourth SiO-based insulating film and the fifth SiO-based insulating film, and
- the resistor is formed on the fifth SiO-based insulating film.

8. The semiconductor device according to claim 7, comprising:
- a first metal and a second metal that are formed on the fourth SiO-based insulating film and are covered by the fifth SiO-based insulating film;
- a first via that penetrates through the fifth SiO-based insulating film and electrically connects the first metal and one end portion of the resistor; and
- a second via that penetrates through the fifth SiO-based insulating film and electrically connects the second metal and another end portion of the resistor.

9. The semiconductor device according to claim 8, wherein the upper insulating film includes a sixth SiO-based insulating film that is formed on the fifth SiO-based insulating film such as to cover the resistor and the second nitride film that is formed on the first nitride film such as to cover the first SiO-based insulating film.

10. The semiconductor device according to claim 9, comprising: a third metal that is formed on the sixth SiO-based insulating film and is a third metal electrically connected to the first metal or the second metal via a third via that penetrates through a laminated film of the fifth SiO-based insulating film and the sixth SiO-based insulating film; and wherein the second nitride film is formed on the first nitride film such as to cover exposed surfaces of the third metal, the sixth SiO-based insulating film, the fifth SiO-based insulating film, the fourth SiO-based insulating film, and the first nitride film.

11. The semiconductor device according to claim 10, wherein an opening that exposes a portion of an upper surface of the third metal is formed in the second nitride film.

12. The semiconductor device according to claim 1, wherein the lower insulating film includes a seventh SiO-based insulating film that is formed on the substrate, the first nitride film that is formed on the seventh SiO-based insulating film, and the first SiO-based insulating film that is formed in a region of the first nitride film upper surface excluding a peripheral edge portion and the resistor is formed on the first SiO-based insulating film.

13. The semiconductor device according to claim 12, wherein the upper insulating film includes an eighth SiO-based insulating film that is formed on the first SiO-based insulating film such as to cover the resistor and the second nitride film that is formed on the eighth SiO-based insulating film.

14. The semiconductor device according to claim 13, comprising:

a first lead-out electrode that is formed on the eighth SiO-based insulating film and is electrically connected to one end portion of the resistor; and a second lead-out electrode that is formed on the eighth SiO-based insulating film and is electrically connected to another end portion of the resistor; and wherein the second nitride film is formed on the first nitride film such as to cover exposed surfaces of the first lead-out electrode, the second lead-out electrode, the eighth SiO-based insulating film, the first SiO-based insulating film, and the first nitride film.

15. The semiconductor device according to claim 14, wherein a first opening that exposes a portion of an upper surface of the first lead-out electrode and a second opening that exposes a portion of an upper surface of the second lead-out electrode are formed in the second nitride film.

16. A method for manufacturing a semiconductor device comprising:

a step of forming a lower insulating film on a substrate;

a step of forming a resistor on the lower insulating film; and a step of forming an upper insulating film, including a second nitride film, on the lower insulating film such as to cover the resistor; and wherein the step of forming the lower insulating film includes a step of forming a first nitride film on the substrate and a step of forming a first SiO-based insulating film on the first nitride film and, in the step of forming the upper insulating film, a lower surface of a peripheral edge portion of the second nitride film is joined to an upper surface of the first nitride film.

* * * * *